US012410515B2

(12) United States Patent
Kimtee et al.

(10) Patent No.: US 12,410,515 B2
(45) Date of Patent: Sep. 9, 2025

(54) CONTAMINANT TRAP SYSTEM FOR A REACTOR SYSTEM

(71) Applicant: ASM IP Holding B.V., Almere (NL)

(72) Inventors: Ankit Kimtee, Phoenix, AZ (US); Rohan Rane, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 412 days.

(21) Appl. No.: 17/159,488

(22) Filed: Jan. 27, 2021

(65) Prior Publication Data

US 2021/0230744 A1 Jul. 29, 2021

Related U.S. Application Data

(60) Provisional application No. 62/967,320, filed on Jan. 29, 2020.

(51) Int. Cl.

*C23C 16/44* (2006.01)
*B01D 46/00* (2022.01)
*B01D 46/10* (2006.01)
*B01D 46/62* (2022.01)

(52) U.S. Cl.

CPC .......... *C23C 16/4402* (2013.01); *B01D 46/10* (2013.01); *B01D 46/62* (2022.01); *B01D 2221/14* (2013.01)

(58) Field of Classification Search

CPC .... C23C 16/4402; B01D 46/62; B01D 46/10; B01D 2221/14; B01D 45/08; F24F 1/40
USPC ....................... 96/392; 55/445, 446, DIG. 15
See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| 1,203,007 | A | 10/1916 | Kegler |
| D56,051 | S | 8/1920 | Cohn |

(Continued)

FOREIGN PATENT DOCUMENTS

| | | |
|---|---|---|
| AT | 520629 | 6/2019 |
| CA | 2969589 A1 | 8/2017 |

(Continued)

OTHER PUBLICATIONS

CNIPA; Office Action dated Mar. 30, 2021 in Application No. 201610131743.1.

(Continued)

*Primary Examiner* — Qianping He
(74) *Attorney, Agent, or Firm* — Snell & Wilmer L.L.P.

(57) ABSTRACT

A contaminant trap system of a reactor system may comprise a baffle plate stack comprising at least one baffle plate comprising an aperture spanning through a baffle plate body of the baffle plate, and a solid body portion; and at least one complementary baffle plate comprising a complementary aperture spanning through a complementary baffle plate body of the complementary baffle plate, and a complementary solid body portion. The at least one baffle plate and the at least one complementary baffle plate may be disposed in a baffle plate order between a first end and a second end of the baffle plate stack in which the baffle plates alternate with the complementary baffle plates, such that no two baffle plates or no two complementary baffle plates are adjacent in the baffle plate order.

10 Claims, 14 Drawing Sheets

(56) References Cited

U.S. PATENT DOCUMENTS

| | | | | |
|---|---|---|---|---|
| 1,746,774 | A * | 2/1930 | Jenkins ................. B05B 7/2491 55/485 | |
| 1,767,089 | A | 6/1930 | Miller et al. | |
| 1,857,348 | A * | 5/1932 | Bokenkroger ......... B01D 46/00 55/524 | |
| 2,059,480 | A | 11/1936 | Obermaier | |
| 2,161,626 | A | 6/1939 | Loughner et al. | |
| 2,240,163 | A | 4/1941 | Pick | |
| 2,252,242 | A | 8/1941 | Wood | |
| 2,266,416 | A | 12/1941 | Duclos | |
| 2,280,778 | A | 4/1942 | Andersen | |
| D142,841 | S | 11/1945 | D'Algodt | |
| 2,410,420 | A | 11/1946 | Bennett | |
| 2,441,253 | A | 5/1948 | Sarver | |
| 2,480,557 | A | 8/1949 | Cummins | |
| 2,563,931 | A | 8/1951 | Harrison | |
| 2,660,061 | A | 11/1953 | Lewis | |
| 2,745,640 | A | 5/1956 | Cushman | |
| 2,847,320 | A | 8/1958 | Bulloff | |
| 2,990,045 | A | 6/1961 | Root | |
| 3,038,951 | A | 6/1962 | Mead | |
| 3,089,507 | A | 5/1963 | Drake et al. | |
| 3,094,396 | A | 6/1963 | Flugge et al. | |
| 3,137,551 | A * | 6/1964 | Mark ........................ F04F 9/00 165/181 | |
| 3,197,682 | A | 7/1965 | Klass et al. | |
| 3,232,437 | A | 2/1966 | Hultgren | |
| 3,263,502 | A | 8/1966 | Springfield | |
| 3,332,286 | A | 7/1967 | Strong | |
| 3,410,349 | A | 11/1968 | Troutman | |
| 3,420,622 | A | 1/1969 | Donges et al. | |
| 3,588,192 | A | 6/1971 | Drutchas et al. | |
| 3,606,738 | A * | 9/1971 | Kraus, Jr. ................ B01D 3/20 55/465 | |
| 3,634,740 | A | 1/1972 | Stevko | |
| 3,647,387 | A | 3/1972 | Benson | |
| 3,647,716 | A | 3/1972 | Koches | |
| 3,713,899 | A | 1/1973 | Sebestyen | |
| 3,718,429 | A | 2/1973 | Williamson | |
| 3,779,221 | A * | 12/1973 | Gartner .................. F01M 13/04 123/573 | |
| 3,795,091 | A | 3/1974 | Rennie | |
| 3,796,182 | A | 3/1974 | Rosler | |
| 3,814,128 | A | 6/1974 | Grantham | |
| 3,833,492 | A | 9/1974 | Bollyky | |
| 3,854,443 | A | 12/1974 | Baerg | |
| 3,862,397 | A | 1/1975 | Anderson et al. | |
| 3,867,205 | A | 2/1975 | Schley | |
| 3,885,504 | A | 5/1975 | Baermann | |
| 3,887,790 | A | 6/1975 | Ferguson | |
| 3,904,371 | A | 9/1975 | Neti | |
| 3,913,058 | A | 10/1975 | Nishio et al. | |
| 3,913,617 | A | 10/1975 | van Laar | |
| 3,916,270 | A | 10/1975 | Wachtler et al. | |
| 3,917,458 | A | 11/1975 | Polak | |
| 3,947,685 | A | 3/1976 | Meinel | |
| 3,950,152 | A | 4/1976 | Guon | |
| 3,960,559 | A | 6/1976 | Suzuki | |
| 3,962,004 | A | 6/1976 | Sonneborn | |
| 3,983,401 | A | 9/1976 | Livesay | |
| 3,997,638 | A | 12/1976 | Manning et al. | |
| 4,048,110 | A | 9/1977 | Vanderspurt | |
| 4,054,071 | A | 10/1977 | Patejak | |
| 4,058,430 | A | 11/1977 | Suntola et al. | |
| 4,079,944 | A | 3/1978 | Durley et al. | |
| 4,093,491 | A | 6/1978 | Whelpton et al. | |
| 4,099,041 | A | 7/1978 | Berkman et al. | |
| D249,341 | S | 9/1978 | Mertz | |
| 4,126,027 | A | 11/1978 | Smith et al. | |
| 4,134,425 | A | 1/1979 | Gussefeld et al. | |
| 4,145,699 | A | 3/1979 | Hu et al. | |
| 4,149,237 | A | 4/1979 | Freitas | |
| 4,152,760 | A | 5/1979 | Freitas et al. | |
| 4,157,751 | A | 6/1979 | Grundken et al. | |
| 4,164,959 | A | 8/1979 | Wurzburger | |
| 4,176,630 | A | 12/1979 | Elmer | |
| 4,179,530 | A | 12/1979 | Koppl et al. | |
| 4,181,330 | A | 1/1980 | Kojima | |
| 4,184,188 | A | 1/1980 | Briglia | |
| 4,194,536 | A | 3/1980 | Stine et al. | |
| 4,217,463 | A | 8/1980 | Swearingen | |
| 4,229,064 | A | 10/1980 | Vetter et al. | |
| 4,234,449 | A | 11/1980 | Wolson et al. | |
| 4,241,000 | A | 12/1980 | McCauley et al. | |
| 4,314,763 | A | 2/1982 | Steigmeier et al. | |
| 4,322,592 | A | 3/1982 | Martin | |
| 4,324,611 | A | 4/1982 | Vogel et al. | |
| 4,333,735 | A | 6/1982 | Hardy | |
| 4,355,912 | A | 10/1982 | Haak | |
| 4,384,918 | A | 5/1983 | Abe | |
| 4,389,973 | A | 6/1983 | Suntola et al. | |
| D269,850 | S | 7/1983 | Preisler et al. | |
| 4,393,013 | A | 7/1983 | McMenamin | |
| 4,401,507 | A | 8/1983 | Engle | |
| 4,412,133 | A | 10/1983 | Eckes et al. | |
| 4,413,022 | A | 11/1983 | Suntola et al. | |
| 4,414,492 | A | 11/1983 | Hanlet | |
| 4,436,674 | A | 3/1984 | McMenamin | |
| 4,444,990 | A | 4/1984 | Villar | |
| D274,122 | S | 6/1984 | Stahel et al. | |
| 4,454,370 | A | 6/1984 | Voznick | |
| 4,455,193 | A | 6/1984 | Jeuch et al. | |
| 4,465,716 | A | 8/1984 | Baber et al. | |
| 4,466,766 | A | 8/1984 | Geren et al. | |
| 4,479,831 | A | 10/1984 | Sandow | |
| 4,480,284 | A | 10/1984 | Tojo et al. | |
| 4,481,300 | A | 11/1984 | Hartnett et al. | |
| 4,484,061 | A | 11/1984 | Zelinka et al. | |
| 4,488,506 | A | 12/1984 | Heinecke et al. | |
| 4,488,887 | A * | 12/1984 | Angel ...................... B01D 8/00 55/DIG. 15 | |
| 4,495,024 | A | 1/1985 | Bok | |
| 4,496,828 | A | 1/1985 | Kusmierz et al. | |
| 4,499,354 | A | 2/1985 | Hill et al. | |
| 4,502,094 | A | 2/1985 | Lewin et al. | |
| 4,504,439 | A | 3/1985 | Elter et al. | |
| 4,512,113 | A | 4/1985 | Budinger | |
| 4,512,841 | A | 4/1985 | Cunningham et al. | |
| 4,520,116 | A | 5/1985 | Gentilman et al. | |
| 4,520,421 | A | 5/1985 | Sakitani et al. | |
| 4,527,005 | A | 7/1985 | McKelvey et al. | |
| 4,534,816 | A | 8/1985 | Chen et al. | |
| 4,535,628 | A | 8/1985 | Hope | |
| 4,537,001 | A | 8/1985 | Uppstrom | |
| 4,548,688 | A | 10/1985 | Mathews | |
| 4,551,192 | A | 11/1985 | Di Milia et al. | |
| 4,554,611 | A | 11/1985 | Lewin | |
| 4,560,590 | A | 12/1985 | Bok | |
| 4,570,328 | A | 2/1986 | Price et al. | |
| 4,575,408 | A | 3/1986 | Bok | |
| 4,575,636 | A | 3/1986 | Caprari | |
| 4,578,560 | A | 3/1986 | Tanaka et al. | |
| 4,579,080 | A | 4/1986 | Martin et al. | |
| 4,579,378 | A | 4/1986 | Snyders | |
| 4,579,623 | A | 4/1986 | Suzuki et al. | |
| 4,581,520 | A | 4/1986 | Vu et al. | |
| 4,590,326 | A | 5/1986 | Woldy | |
| 4,611,966 | A | 9/1986 | Johnson | |
| 4,620,998 | A | 11/1986 | Lalvani | |
| 4,622,918 | A | 11/1986 | Bok | |
| 4,624,728 | A | 11/1986 | Bithell et al. | |
| D288,556 | S | 3/1987 | Wallgren | |
| 4,653,541 | A | 3/1987 | Oehlschlaeger et al. | |
| 4,654,226 | A | 3/1987 | Jackson et al. | |
| 4,655,592 | A | 4/1987 | Allemand | |
| 4,662,987 | A | 5/1987 | Bok | |
| 4,664,769 | A | 5/1987 | Cuomo et al. | |
| 4,670,126 | A | 6/1987 | Messer et al. | |
| 4,681,134 | A | 7/1987 | Paris | |
| 4,693,211 | A | 9/1987 | Ogami et al. | |
| 4,700,089 | A | 10/1987 | Fujii et al. | |
| 4,707,815 | A | 11/1987 | Yamasaki | |
| 4,717,461 | A | 1/1988 | Strahl et al. | |

(56) References Cited

U.S. PATENT DOCUMENTS

| | | | |
|---|---|---|---|
| 4,718,637 | A | 1/1988 | Contin |
| 4,720,362 | A | 1/1988 | Gentilman et al. |
| 4,720,407 | A | 1/1988 | Sculke |
| 4,721,533 | A | 1/1988 | Phillippi et al. |
| 4,721,534 | A | 1/1988 | Phillippi et al. |
| 4,722,298 | A | 2/1988 | Rubin et al. |
| 4,724,272 | A | 2/1988 | Raniere et al. |
| 4,725,204 | A | 2/1988 | Powell |
| 4,735,259 | A | 4/1988 | Vincent |
| 4,738,618 | A | 4/1988 | Massey et al. |
| 4,738,748 | A | 4/1988 | Kisa |
| 4,747,367 | A | 5/1988 | Posa |
| 4,749,416 | A | 6/1988 | Greenspan |
| 4,750,520 | A | 6/1988 | Heim et al. |
| 4,753,192 | A | 6/1988 | Goldsmith et al. |
| 4,753,856 | A | 6/1988 | Haluska et al. |
| 4,756,794 | A | 7/1988 | Yoder |
| 4,764,076 | A | 8/1988 | Layman et al. |
| 4,770,590 | A | 9/1988 | Hugues et al. |
| 4,771,015 | A | 9/1988 | Kanai |
| 4,775,281 | A | 10/1988 | Prentakis |
| 4,776,744 | A | 10/1988 | Stonestreet et al. |
| 4,780,169 | A | 10/1988 | Stark et al. |
| 4,781,511 | A | 11/1988 | Harada et al. |
| 4,789,294 | A | 12/1988 | Sato et al. |
| 4,790,258 | A | 12/1988 | Drage et al. |
| 4,802,441 | A | 2/1989 | Waugh |
| 4,804,086 | A | 2/1989 | Grohrock |
| 4,808,387 | A | 2/1989 | Datta et al. |
| 4,812,201 | A | 3/1989 | Sakai et al. |
| 4,812,217 | A | 3/1989 | George et al. |
| 4,821,674 | A | 4/1989 | deBoer et al. |
| 4,827,430 | A | 5/1989 | Aid et al. |
| 4,828,224 | A | 5/1989 | Crabb et al. |
| 4,830,515 | A | 5/1989 | Cortes |
| 4,837,113 | A | 6/1989 | Luttmer et al. |
| 4,837,185 | A | 6/1989 | Yau et al. |
| 4,854,263 | A | 8/1989 | Chang et al. |
| 4,854,266 | A | 8/1989 | Simson et al. |
| 4,857,137 | A | 8/1989 | Tachi et al. |
| 4,857,382 | A | 8/1989 | Liu et al. |
| 4,858,557 | A | 8/1989 | Pozzetti et al. |
| 4,863,374 | A | 9/1989 | Vukovich |
| 4,867,629 | A | 9/1989 | Iwasawa et al. |
| 4,871,523 | A | 10/1989 | Datta et al. |
| 4,874,273 | A | 10/1989 | Tokisue et al. |
| 4,880,982 | A | 11/1989 | Hoksaas |
| 4,882,199 | A | 11/1989 | Sadoway et al. |
| 4,886,162 | A | 12/1989 | Ambrogio |
| 4,916,091 | A | 4/1990 | Freeman et al. |
| 4,917,556 | A | 4/1990 | Stark et al. |
| 4,920,918 | A | 5/1990 | Adams et al. |
| 4,925,388 | A | 5/1990 | Iseki et al. |
| 4,931,135 | A | 6/1990 | Horiuchi et al. |
| 4,934,831 | A | 6/1990 | Volbrecht |
| 4,938,815 | A | 7/1990 | McNeilly |
| D309,702 | S | 8/1990 | Hall |
| 4,949,671 | A | 8/1990 | Davis et al. |
| 4,949,848 | A | 8/1990 | Kos |
| 4,950,624 | A | 8/1990 | Inuzima et al. |
| 4,956,538 | A | 9/1990 | Moslehi |
| 4,958,061 | A | 9/1990 | Wakabayashi et al. |
| D311,126 | S | 10/1990 | Crowley |
| 4,962,063 | A | 10/1990 | Maydan et al. |
| 4,963,506 | A | 10/1990 | Liaw et al. |
| 4,976,996 | A | 12/1990 | Monkowski et al. |
| 4,978,567 | A | 12/1990 | Miller |
| 4,984,904 | A | 1/1991 | Nakano et al. |
| 4,985,114 | A | 1/1991 | Okudaira |
| 4,986,215 | A | 1/1991 | Yamada |
| 4,987,102 | A | 1/1991 | Nguyen et al. |
| 4,987,856 | A | 1/1991 | Hey |
| 4,989,992 | A | 2/1991 | Piai |
| 4,991,614 | A | 2/1991 | Hammel |
| 5,002,632 | A | 3/1991 | Loewenstein et al. |
| 5,013,691 | A | 5/1991 | Lory et al. |
| 5,022,961 | A | 6/1991 | Izumi et al. |
| 5,027,746 | A | 7/1991 | Frijlink |
| 5,028,366 | A | 7/1991 | Harakal et al. |
| D320,148 | S | 9/1991 | Andrews |
| 5,049,029 | A | 9/1991 | Mitsui et al. |
| 5,053,247 | A | 10/1991 | Moore |
| 5,057,436 | A | 10/1991 | Ball |
| 5,060,322 | A | 10/1991 | Delepine |
| 5,061,083 | A | 10/1991 | Grimm et al. |
| 5,062,386 | A | 11/1991 | Christensen |
| 5,064,337 | A | 11/1991 | Asakawa et al. |
| 5,065,698 | A | 11/1991 | Koike |
| 5,067,437 | A | 11/1991 | Watanabe et al. |
| 5,069,591 | A | 12/1991 | Kinoshita |
| 5,071,258 | A | 12/1991 | Usher et al. |
| 5,074,017 | A | 12/1991 | Toya et al. |
| 5,082,517 | A | 1/1992 | Moslehi |
| 5,084,126 | A | 1/1992 | McKee |
| 5,088,444 | A | 2/1992 | Ohmine et al. |
| 5,097,890 | A | 3/1992 | Nakao |
| 5,098,638 | A | 3/1992 | Sawada |
| 5,098,865 | A | 3/1992 | Machado |
| 5,104,514 | A | 4/1992 | Quartarone |
| 5,107,170 | A | 4/1992 | Ishikawa et al. |
| 5,108,192 | A | 4/1992 | Mailliet et al. |
| 5,110,407 | A | 5/1992 | Ono et al. |
| 5,114,683 | A | 5/1992 | Hirase |
| 5,116,018 | A | 5/1992 | Friemoth et al. |
| 5,117,121 | A | 5/1992 | Watanabe et al. |
| D327,534 | S | 6/1992 | Manville |
| 5,119,760 | A | 6/1992 | McMillan et al. |
| 5,124,272 | A | 6/1992 | Saito et al. |
| 5,125,358 | A | 6/1992 | Ueda et al. |
| 5,125,710 | A | 6/1992 | Gianelo |
| 5,130,003 | A | 7/1992 | Conrad |
| 5,134,965 | A | 8/1992 | Tokuda et al. |
| 5,137,286 | A | 8/1992 | Whitford |
| 5,151,296 | A | 9/1992 | Tokunaga |
| 5,154,301 | A | 10/1992 | Kos |
| 5,158,128 | A | 10/1992 | Inoue et al. |
| D330,900 | S | 11/1992 | Wakegijig |
| 5,167,716 | A | 12/1992 | Boitnott et al. |
| 5,167,761 | A | 12/1992 | Westendorp et al. |
| 5,174,881 | A | 12/1992 | Iwasaki et al. |
| 5,176,451 | A | 1/1993 | Sasada |
| 5,178,639 | A | 1/1993 | Nishi |
| 5,178,682 | A | 1/1993 | Tsukamoto et al. |
| 5,180,273 | A | 1/1993 | Sakaya et al. |
| 5,180,435 | A | 1/1993 | Markunas et al. |
| 5,181,779 | A | 1/1993 | Shia et al. |
| 5,182,232 | A | 1/1993 | Chhabra et al. |
| 5,183,511 | A | 2/1993 | Yamazaki et al. |
| 5,186,120 | A | 2/1993 | Ohnishi et al. |
| D333,606 | S | 3/1993 | Kanemitsu et al. |
| 5,192,717 | A | 3/1993 | Kawakami |
| 5,193,912 | A | 3/1993 | Saunders |
| 5,193,969 | A | 3/1993 | Rush et al. |
| 5,194,401 | A | 3/1993 | Adams et al. |
| 5,199,603 | A | 4/1993 | Prescott |
| 5,208,961 | A | 5/1993 | Lajoie |
| 5,213,650 | A | 5/1993 | Wang et al. |
| 5,219,226 | A | 6/1993 | James |
| 5,221,556 | A | 6/1993 | Hawkins et al. |
| 5,225,366 | A | 7/1993 | Yoder |
| 5,226,383 | A | 7/1993 | Bhat |
| 5,226,713 | A | 7/1993 | Matsumura |
| 5,226,967 | A | 7/1993 | Chen et al. |
| 5,228,114 | A | 7/1993 | Suzuki |
| 5,231,062 | A | 7/1993 | Mathers et al. |
| 5,232,508 | A | 8/1993 | Arena et al. |
| 5,234,526 | A | 8/1993 | Chen et al. |
| 5,242,501 | A | 9/1993 | McDiarmid |
| 5,242,539 | A | 9/1993 | Kumihashi et al. |
| 5,243,195 | A | 9/1993 | Nishi |
| 5,243,202 | A | 9/1993 | Mori et al. |
| 5,246,218 | A | 9/1993 | Yap et al. |
| 5,246,500 | A | 9/1993 | Samata et al. |
| 5,249,960 | A | 10/1993 | Monoe |

(56) References Cited

U.S. PATENT DOCUMENTS 5,250,092 A 10/1993 Nakano
5,252,133 A 10/1993 Miyazaki et al.
5,252,134 A 10/1993 Stauffer
5,259,881 A 11/1993 Edwards et al.
5,261,167 A 11/1993 Sakata
5,266,526 A 11/1993 Aoyama
5,268,989 A 12/1993 Moslehi et al.
5,271,967 A 12/1993 Kramer et al.
5,273,609 A 12/1993 Moslehi
5,277,932 A 1/1994 Spencer
5,278,494 A 1/1994 Obigane
5,279,886 A 1/1994 Kawai et al.
5,279,986 A 1/1994 Maloney et al.
5,280,894 A 1/1994 Witcraft et al.
5,281,274 A 1/1994 Yoder
5,284,519 A 2/1994 Gadgil
5,288,684 A 2/1994 Yamazaki et al.
5,294,572 A 3/1994 Granneman et al.
5,294,778 A 3/1994 Carman et al.
5,295,777 A 3/1994 Hodos
5,298,089 A 3/1994 Bowe et al.
5,305,417 A 4/1994 Najm et al.
5,306,666 A 4/1994 Izumi
5,306,946 A 4/1994 Yamamoto
5,308,650 A 5/1994 Krummel et al.
5,308,788 A 5/1994 Fitch et al.
5,310,410 A 5/1994 Begin et al.
5,310,456 A 5/1994 Kadomura
5,312,245 A 5/1994 Brannen et al.
5,313,061 A 5/1994 Drew et al.
5,314,538 A 5/1994 Maeda et al.
5,314,570 A 5/1994 Ikegaya et al.
5,315,092 A 5/1994 Takahashi et al.
5,320,218 A 6/1994 Yamashita et al.
5,326,427 A 7/1994 Jerbic
5,328,360 A 7/1994 Yokokawa
5,328,810 A 7/1994 Lowrey et al.
5,335,309 A 8/1994 Fujii et al.
5,336,327 A 8/1994 Lee
5,338,362 A 8/1994 Imahashi
5,340,261 A 8/1994 Oosawa et al.
5,346,961 A 9/1994 Shaw et al.
5,348,774 A 9/1994 Golecki et al.
5,350,480 A 9/1994 Gray
5,354,433 A 10/1994 Granneman et al.
5,354,580 A 10/1994 Goela et al.
5,356,478 A 10/1994 Chen et al.
5,356,672 A 10/1994 Schmitt et al.
5,360,269 A 11/1994 Ogawa et al.
5,362,328 A 11/1994 Gardiner et al.
5,364,667 A 11/1994 Rhieu
D353,452 S 12/1994 Groenhoff
5,374,315 A 12/1994 Deboer et al.
D354,898 S 1/1995 Nagy
5,378,501 A 1/1995 Foster et al.
5,380,367 A 1/1995 Bertone
5,382,311 A 1/1995 Ishikawa et al.
5,387,265 A 2/1995 Kakizaki et al.
5,388,945 A 2/1995 Garric et al.
5,393,577 A 2/1995 Uesugi et al.
5,397,395 A 3/1995 Sano et al.
5,403,630 A 4/1995 Matsui et al.
5,404,082 A 4/1995 Hernandez et al.
5,407,449 A 4/1995 Zinger
5,407,867 A 4/1995 Iwasaki et al.
5,413,813 A 5/1995 Cruse et al.
5,414,221 A 5/1995 Gardner
5,415,753 A 5/1995 Hurwitt et al.
5,418,382 A 5/1995 Blackwood et al.
5,421,893 A 6/1995 Perlov
5,422,139 A 6/1995 Fischer
5,423,942 A 6/1995 Robbins et al.
5,426,137 A 6/1995 Allen
5,427,824 A 6/1995 Inushima et al.
5,430,011 A 7/1995 Tanaka et al.
5,431,734 A 7/1995 Chapple-Sokol et al.
5,443,646 A 8/1995 Yamada et al.
5,443,648 A 8/1995 Ohkase
5,443,686 A 8/1995 Jones et al.
5,444,217 A 8/1995 Moore
5,447,294 A 9/1995 Sakata et al.
5,453,124 A 9/1995 Moslehi et al.
D363,464 S 10/1995 Fukasawa
5,456,207 A 10/1995 Gedridge et al.
5,456,757 A 10/1995 Aruga et al.
5,461,214 A 10/1995 Peck et al.
5,462,899 A 10/1995 Ikeda
5,463,176 A 10/1995 Eckert
5,464,313 A 11/1995 Ohsawa
5,474,410 A 12/1995 Ozawa et al.
5,474,612 A 12/1995 Sato et al.
5,478,429 A 12/1995 Komino et al.
5,480,488 A 1/1996 Bittner et al.
5,480,818 A 1/1996 Matsumoto et al.
5,482,559 A 1/1996 Imai et al.
5,484,484 A 1/1996 Yamaga et al.
5,494,439 A 2/1996 Goldstein et al.
5,494,494 A 2/1996 Mizuno et al.
5,496,408 A 3/1996 Motoda et al.
5,501,740 A 3/1996 Besen et al.
5,503,875 A 4/1996 Imai et al.
5,504,042 A 4/1996 Cho et al.
5,510,277 A 4/1996 Cunningham et al.
5,512,102 A 4/1996 Yamazaki
5,514,439 A 5/1996 Sibley
5,518,549 A 5/1996 Hellwig
5,518,780 A 5/1996 Tamor et al.
5,519,234 A 5/1996 Paz de Araujo
5,520,743 A 5/1996 Takahashi et al.
5,523,616 A 6/1996 Yasuhide
5,527,111 A 6/1996 Lysen et al.
5,527,417 A 6/1996 Iida et al.
5,531,218 A 7/1996 Krebs
5,531,835 A 7/1996 Fodor et al.
5,537,311 A 7/1996 Stevens
5,540,059 A 7/1996 Yokokawa
5,540,821 A 7/1996 Tepman
5,540,898 A 7/1996 Davidson
5,554,557 A 9/1996 Koh
5,556,275 A 9/1996 Sakata et al.
5,558,717 A 9/1996 Zhao et al.
5,559,046 A 9/1996 Oishi et al.
5,562,383 A 10/1996 Iwai et al.
5,562,947 A 10/1996 White et al.
5,562,952 A 10/1996 Nakahigashi et al.
5,565,038 A 10/1996 Ashley
5,569,402 A 10/1996 Meisser et al.
5,574,247 A 11/1996 Nishitani et al.
5,576,629 A 11/1996 Turner
5,577,331 A 11/1996 Suzuki
5,583,736 A 12/1996 Anderson et al.
5,584,936 A 12/1996 Pickering et al.
5,584,963 A 12/1996 Takahashi
5,586,585 A 12/1996 Bonora et al.
5,589,002 A 12/1996 Su
5,589,110 A 12/1996 Motoda et al.
5,595,606 A 1/1997 Fujikawa et al.
5,601,641 A 2/1997 Stephens
5,602,060 A 2/1997 Kobayashi et al.
5,604,410 A 2/1997 Vollkommer et al.
5,611,448 A 3/1997 Chen
5,616,264 A 4/1997 Nishi et al.
5,616,947 A 4/1997 Tamura
5,621,982 A 4/1997 Yamashita
5,632,919 A 5/1997 MacCracken et al.
5,637,153 A 6/1997 Niino et al.
D380,527 S 7/1997 Velez
5,645,646 A 7/1997 Beinglass et al.
5,650,013 A 7/1997 Yamazaki
5,650,351 A 7/1997 Wu
5,653,807 A 8/1997 Crumbaker
5,656,093 A 8/1997 Burkhart et al.
5,661,263 A 8/1997 Salvaggio
5,662,470 A 9/1997 Huussen et al.

(56) References Cited

U.S. PATENT DOCUMENTS

| | | | |
|---|---|---|---|
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |
| 5,695,567 | A | 12/1997 | Kordina |
| 5,697,706 | A | 12/1997 | Ciaravino et al. |
| 5,698,036 | A | 12/1997 | Ishii et al. |
| 5,700,729 | A | 12/1997 | Lee et al. |
| 5,708,825 | A | 1/1998 | Sotomayor |
| 5,709,745 | A | 1/1998 | Larkin et al. |
| 5,711,811 | A | 1/1998 | Suntola et al. |
| 5,716,133 | A | 2/1998 | Hosokawa et al. |
| 5,718,574 | A | 2/1998 | Shimazu |
| 5,720,927 | A | 2/1998 | Cripe et al. |
| D392,855 | S | 3/1998 | Pillow |
| 5,724,748 | A | 3/1998 | Brooks |
| 5,728,223 | A | 3/1998 | Murakarni et al. |
| 5,728,425 | A | 3/1998 | Ebe et al. |
| 5,730,801 | A | 3/1998 | Tepman et al. |
| 5,730,802 | A | 3/1998 | Ishizumi et al. |
| 5,732,597 | A | 3/1998 | Devenyi |
| 5,732,744 | A | 3/1998 | Barr et al. |
| 5,732,957 | A | 3/1998 | Yu |
| 5,736,314 | A | 4/1998 | Hayes et al. |
| 5,753,835 | A | 5/1998 | Gustin |
| 5,754,390 | A | 5/1998 | Sandhu et al. |
| 5,759,281 | A | 6/1998 | Gurary et al. |
| 5,761,328 | A | 6/1998 | Solberg et al. |
| 5,766,365 | A | 6/1998 | Umutoy et al. |
| 5,768,125 | A | 6/1998 | Zinger et al. |
| 5,769,952 | A | 6/1998 | Komino |
| 5,775,889 | A | 7/1998 | Kobayashi et al. |
| 5,777,838 | A | 7/1998 | Tamagawa et al. |
| 5,779,203 | A | 7/1998 | Edlinger |
| 5,781,693 | A | 7/1998 | Ballance et al. |
| 5,782,979 | A | 7/1998 | Kaneno |
| 5,788,747 | A | 8/1998 | Horiuchi et al. |
| 5,790,750 | A | 8/1998 | Anderson |
| 5,791,782 | A | 8/1998 | Wooten et al. |
| 5,792,272 | A | 8/1998 | van Os et al. |
| 5,796,074 | A | 8/1998 | Edelstein et al. |
| 5,801,104 | A | 9/1998 | Schuegraf et al. |
| 5,801,945 | A | 9/1998 | Comer |
| 5,804,505 | A | 9/1998 | Yamada et al. |
| 5,806,980 | A | 9/1998 | Berrian |
| 5,813,851 | A | 9/1998 | Nakao |
| 5,818,716 | A | 10/1998 | Chin et al. |
| 5,819,092 | A | 10/1998 | Ferguson et al. |
| 5,819,434 | A | 10/1998 | Herchen et al. |
| 5,820,366 | A | 10/1998 | Lee |
| 5,820,685 | A | 10/1998 | Kurihra et al. |
| 5,820,686 | A | 10/1998 | Moore |
| 5,826,129 | A | 10/1998 | Hasebe et al. |
| 5,827,420 | A | 10/1998 | Shirazi et al. |
| 5,827,435 | A | 10/1998 | Samukawa |
| 5,827,757 | A | 10/1998 | Robinson et al. |
| 5,836,483 | A | 11/1998 | Disel |
| 5,837,058 | A | 11/1998 | Chen et al. |
| 5,837,320 | A | 11/1998 | Hampden-Smith et al. |
| 5,844,683 | A | 12/1998 | Pavloski et al. |
| 5,846,332 | A | 12/1998 | Zhao et al. |
| 5,851,293 | A | 12/1998 | Lane et al. |
| 5,851,294 | A | 12/1998 | Young et al. |
| 5,851,299 | A | 12/1998 | Cheng et al. |
| 5,852,445 | A | 12/1998 | Yoshikawa et al. |
| 5,852,879 | A | 12/1998 | Schumaier |
| 5,853,484 | A | 12/1998 | Jeong |
| D403,949 | S | 1/1999 | Nakamura |
| D404,370 | S | 1/1999 | Kimura |
| D404,372 | S | 1/1999 | Ishii |
| 5,855,680 | A | 1/1999 | Soininen et al. |
| 5,855,681 | A | 1/1999 | Maydan et al. |
| 5,855,687 | A | 1/1999 | DuBois et al. |
| 5,855,726 | A | 1/1999 | Soraoka et al. |
| 5,857,777 | A | 1/1999 | Schuh |
| 5,861,233 | A | 1/1999 | Sekine et al. |
| 5,862,302 | A | 1/1999 | Okase |
| 5,863,123 | A | 1/1999 | Lee et al. |
| 5,865,205 | A | 2/1999 | Wilmer |
| 5,866,795 | A | 2/1999 | Wang et al. |
| 5,871,586 | A | 2/1999 | Crawley et al. |
| 5,872,065 | A | 2/1999 | Sivaramakrishnan |
| 5,873,942 | A | 2/1999 | Park |
| 5,877,095 | A | 3/1999 | Tamura et al. |
| 5,879,128 | A | 3/1999 | Tietz et al. |
| 5,879,459 | A | 3/1999 | Gadgil et al. |
| 5,880,980 | A | 3/1999 | Rothacher et al. |
| 5,882,165 | A | 3/1999 | Maydan et al. |
| 5,884,640 | A | 3/1999 | Fishkin et al. |
| 5,888,304 | A | 3/1999 | Umotoy et al. |
| 5,891,251 | A | 4/1999 | MacLeish et al. |
| 5,893,741 | A | 4/1999 | Huang |
| 5,897,348 | A | 4/1999 | Wu |
| 5,897,378 | A | 4/1999 | Eriguchi |
| 5,897,379 | A | 4/1999 | Ulrich et al. |
| 5,897,710 | A | 4/1999 | Sato et al. |
| D409,894 | S | 5/1999 | McClurg |
| 5,904,170 | A | 5/1999 | Harvey et al. |
| 5,904,757 | A | 5/1999 | Hayashi et al. |
| D411,516 | S | 6/1999 | Imafuku et al. |
| 5,908,672 | A | 6/1999 | Ryu |
| 5,915,200 | A | 6/1999 | Tokumasu et al. |
| 5,915,562 | A | 6/1999 | Nyseth et al. |
| 5,916,365 | A | 6/1999 | Sherman |
| D412,270 | S | 7/1999 | Fredrickson |
| 5,920,798 | A | 7/1999 | Higuchi et al. |
| 5,928,426 | A | 7/1999 | Aitchison |
| D412,512 | S | 8/1999 | Boisvert |
| 5,937,142 | A | 8/1999 | Moslehi et al. |
| 5,937,323 | A | 8/1999 | Orczyk et al. |
| 5,939,886 | A | 8/1999 | Turner et al. |
| 5,947,718 | A | 9/1999 | Weaver |
| 5,950,327 | A | 9/1999 | Peterson et al. |
| 5,950,925 | A | 9/1999 | Fukunaga et al. |
| 5,954,375 | A | 9/1999 | Trickle et al. |
| 5,961,775 | A | 10/1999 | Fujimura |
| 5,968,275 | A | 10/1999 | Lee et al. |
| 5,970,621 | A | 10/1999 | Bazydola |
| 5,972,196 | A | 10/1999 | Murphy et al. |
| 5,975,492 | A | 11/1999 | Brenes |
| 5,976,973 | A | 11/1999 | Ohira et al. |
| 5,979,506 | A | 11/1999 | Aarseth |
| 5,982,931 | A | 11/1999 | Ishimaru |
| 5,984,391 | A | 11/1999 | Vanderpot et al. |
| 5,987,480 | A | 11/1999 | Donohue et al. |
| 5,989,342 | A | 11/1999 | Ikeda et al. |
| 5,992,453 | A | 11/1999 | Zimmer |
| 5,997,588 | A | 12/1999 | Goodwin |
| 5,997,768 | A | 12/1999 | Scully |
| 5,998,870 | A | 12/1999 | Lee et al. |
| 6,000,732 | A | 12/1999 | Scheler et al. |
| 6,001,183 | A | 12/1999 | Gurary et al. |
| 6,001,267 | A | 12/1999 | Van Os et al. |
| 6,004,204 | A | 12/1999 | Luxton et al. |
| D419,652 | S | 1/2000 | Hall et al. |
| 6,013,553 | A | 1/2000 | Wallace |
| 6,013,920 | A | 1/2000 | Gordon et al. |
| 6,014,677 | A | 1/2000 | Hayashi et al. |
| 6,015,459 | A | 1/2000 | Jamison et al. |
| 6,015,465 | A | 1/2000 | Kholodenko et al. |
| 6,017,779 | A | 1/2000 | Miyasaka |
| 6,017,818 | A | 1/2000 | Lu |
| 6,022,180 | A | 2/2000 | Motoyama et al. |
| 6,022,802 | A | 2/2000 | Jang |
| 6,024,799 | A | 2/2000 | Chen et al. |
| 6,025,117 | A | 2/2000 | Nakano et al. |

(56) References Cited

U.S. PATENT DOCUMENTS

| | | | |
|---|---|---|---|
| 6,027,163 | A | 2/2000 | Longenecker et al. |
| 6,029,602 | A | 2/2000 | Bhatnagar |
| 6,030,900 | A | 2/2000 | Grassl et al. |
| 6,033,215 | A | 3/2000 | Ohsawa |
| 6,035,101 | A | 3/2000 | Sajoto et al. |
| 6,035,804 | A | 3/2000 | Arami et al. |
| 6,039,809 | A | 3/2000 | Toyama et al. |
| 6,042,652 | A | 3/2000 | Hyun |
| 6,044,860 | A | 4/2000 | Neu |
| 6,045,260 | A | 4/2000 | Schwartz et al. |
| 6,048,154 | A | 4/2000 | Wytman |
| 6,050,506 | A | 4/2000 | Guo et al. |
| 6,053,982 | A | 4/2000 | Halpin et al. |
| 6,053,983 | A | 4/2000 | Saeki et al. |
| 6,054,013 | A | 4/2000 | Collins et al. |
| 6,054,678 | A | 4/2000 | Miyazaki |
| 6,060,691 | A | 5/2000 | Minami et al. |
| 6,060,721 | A | 5/2000 | Huang |
| 6,063,196 | A | 5/2000 | Li et al. |
| 6,066,204 | A | 5/2000 | Haven |
| 6,068,441 | A | 5/2000 | Raaijmakers et al. |
| 6,071,572 | A | 6/2000 | Mosely et al. |
| 6,072,163 | A | 6/2000 | Armstrong et al. |
| 6,073,973 | A | 6/2000 | Boscaljon et al. |
| 6,074,154 | A | 6/2000 | Ueda et al. |
| 6,074,443 | A | 6/2000 | Venkatesh |
| 6,074,514 | A | 6/2000 | Bjorkman et al. |
| 6,077,027 | A | 6/2000 | Kawamura et al. |
| 6,079,356 | A | 6/2000 | Umotoy et al. |
| 6,079,927 | A | 6/2000 | Muka |
| 6,083,321 | A | 7/2000 | Lei et al. |
| 6,086,677 | A | 7/2000 | Umotoy et al. |
| 6,090,212 | A | 7/2000 | Mahawili |
| 6,090,442 | A | 7/2000 | Klaus et al. |
| 6,090,659 | A | 7/2000 | Laibowitz et al. |
| 6,091,062 | A | 7/2000 | Pfahnl et al. |
| 6,093,252 | A | 7/2000 | Wengert et al. |
| 6,093,253 | A | 7/2000 | Lofgren |
| 6,093,611 | A | 7/2000 | Gardner et al. |
| 6,095,083 | A | 8/2000 | Rice et al. |
| 6,096,133 | A | 8/2000 | Yuuki et al. |
| 6,096,267 | A | 8/2000 | Kishkovich |
| 6,099,302 | A | 8/2000 | Hong et al. |
| 6,099,649 | A | 8/2000 | Schmitt et al. |
| 6,099,651 | A | 8/2000 | Sajoto et al. |
| 6,102,565 | A | 8/2000 | Kita et al. |
| 6,104,002 | A | 8/2000 | Hirose et al. |
| 6,104,011 | A | 8/2000 | Juliano |
| 6,104,401 | A | 8/2000 | Parsons |
| 6,106,625 | A | 8/2000 | Koai et al. |
| 6,106,678 | A | 8/2000 | Shufflebotham |
| 6,110,531 | A | 8/2000 | Paz de Araujo et al. |
| 6,113,703 | A | 9/2000 | Anderson et al. |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,744 | A | 10/2000 | Hawkins et al. |
| 6,126,848 | A | 10/2000 | Li et al. |
| 6,127,249 | A | 10/2000 | Hu |
| 6,129,044 | A | 10/2000 | Zhao et al. |
| 6,129,546 | A | 10/2000 | Sada |
| 6,132,207 | A | 10/2000 | Stoutjesdijk |
| 6,134,807 | A | 10/2000 | Komino |
| 6,135,460 | A | 10/2000 | Wise et al. |
| 6,137,240 | A | 10/2000 | Bogdan |
| 6,139,239 | A | 10/2000 | Snijders |
| 6,139,983 | A | 10/2000 | Ohashi et al. |
| 6,140,252 | A | 10/2000 | Cho et al. |
| 6,143,079 | A | 11/2000 | Halpin |
| 6,143,082 | A | 11/2000 | McInerney et al. |
| 6,143,129 | A | 11/2000 | Savas et al. |
| 6,146,463 | A | 11/2000 | Yudovsky et al. |
| 6,148,761 | A | 11/2000 | Majewski et al. |
| 6,151,446 | A | 11/2000 | Hunter et al. |
| 6,152,070 | A | 11/2000 | Fairbairn et al. |
| 6,152,669 | A | 11/2000 | Morita et al. |
| 6,156,107 | A | 12/2000 | Hayashi et al. |
| 6,156,151 | A | 12/2000 | Komino et al. |
| 6,158,941 | A | 12/2000 | Muka et al. |
| 6,159,301 | A | 12/2000 | Sato et al. |
| 6,160,244 | A | 12/2000 | Ohashi |
| 6,161,500 | A | 12/2000 | Kopacz et al. |
| 6,162,323 | A | 12/2000 | Koshimizu |
| 6,164,894 | A | 12/2000 | Cheng |
| 6,174,809 | B1 | 1/2001 | Kang et al. |
| 6,176,929 | B1 | 1/2001 | Fukunaga et al. |
| 6,177,688 | B1 | 1/2001 | Linthicum et al. |
| 6,178,918 | B1 | 1/2001 | Van Os et al. |
| 6,179,955 | B1 | 1/2001 | Shin et al. |
| 6,180,979 | B1 | 1/2001 | Hofman et al. |
| 6,182,603 | B1 | 2/2001 | Shang et al. |
| 6,183,564 | B1 | 2/2001 | Reynolds et al. |
| 6,183,565 | B1 | 2/2001 | Granneman et al. |
| 6,187,672 | B1 | 2/2001 | Zhao et al. |
| 6,187,691 | B1 | 2/2001 | Fukuda |
| 6,189,482 | B1 | 2/2001 | Zhao et al. |
| 6,190,037 | B1 | 2/2001 | Das et al. |
| 6,190,113 | B1 | 2/2001 | Bui et al. |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,200,897 | B1 | 3/2001 | Wang et al. |
| 6,201,999 | B1 | 3/2001 | Jevtic |
| 6,203,613 | B1 | 3/2001 | Gates et al. |
| 6,203,618 | B1 | 3/2001 | Hashizume et al. |
| 6,207,932 | B1 | 3/2001 | Yoo |
| 6,207,936 | B1 | 3/2001 | de Waard |
| 6,209,221 | B1 | 4/2001 | Beulens |
| 6,210,485 | B1 | 4/2001 | Zhao et al. |
| 6,212,789 | B1 | 4/2001 | Kato |
| 6,213,708 | B1 | 4/2001 | Allen |
| 6,214,122 | B1 | 4/2001 | Thompson |
| 6,214,717 | B1 | 4/2001 | Yan et al. |
| 6,217,658 | B1 | 4/2001 | Orczyk et al. |
| 6,217,662 | B1 | 4/2001 | Kong et al. |
| 6,218,288 | B1 | 4/2001 | Li et al. |
| 6,224,679 | B1 | 5/2001 | Sasaki et al. |
| 6,225,020 | B1 | 5/2001 | Jung et al. |
| 6,225,602 | B1 | 5/2001 | Buiijze et al. |
| 6,225,745 | B1 | 5/2001 | Srivastava |
| 6,230,650 | B1 | 5/2001 | Yamazaki |
| 6,231,290 | B1 | 5/2001 | Kikuchi et al. |
| 6,235,121 | B1 | 5/2001 | Honma et al. |
| 6,235,858 | B1 | 5/2001 | Swarup et al. |
| 6,238,734 | B1 | 5/2001 | Senzaki et al. |
| 6,239,402 | B1 | 5/2001 | Araki et al. |
| 6,239,715 | B1 | 5/2001 | Belton |
| 6,240,875 | B1 | 6/2001 | Wijck et al. |
| 6,241,822 | B1 | 6/2001 | Ide |
| 6,242,359 | B1 | 6/2001 | Misra |
| 6,243,654 | B1 | 6/2001 | Johnson et al. |
| 6,245,647 | B1 | 6/2001 | Akiyama et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,255,221 | B1 | 7/2001 | Hudson et al. |
| 6,257,758 | B1 | 7/2001 | Culbertson |
| 6,261,648 | B1 | 7/2001 | Akiba et al. |
| 6,264,467 | B1 | 7/2001 | Lue et al. |
| 6,265,113 | B1 | 7/2001 | Rosasco et al. |
| 6,265,311 | B1 | 7/2001 | Hautala et al. |
| 6,270,572 | B1 | 8/2001 | Kim et al. |
| 6,271,148 | B1 | 8/2001 | Kao |
| 6,271,320 | B1 | 8/2001 | Keller et al. |
| 6,274,496 | B1 | 8/2001 | Leusink et al. |
| 6,274,878 | B1 | 8/2001 | Li et al. |
| 6,281,098 | B1 | 8/2001 | Wang |
| 6,281,141 | B1 | 8/2001 | Das et al. |
| 6,283,692 | B1 | 9/2001 | Perlov et al. |
| 6,284,050 | B1 | 9/2001 | Shi et al. |
| 6,284,149 | B1 | 9/2001 | Li et al. |

(56) References Cited

U.S. PATENT DOCUMENTS 6,287,965 B1 9/2001 Kang et al.
6,287,988 B1 9/2001 Nagamine et al.
6,293,700 B1 9/2001 Lund et al.
D449,873 S 10/2001 Bronson
6,296,710 B1 10/2001 Allen et al.
6,296,711 B1 10/2001 Loan et al.
6,296,909 B1 10/2001 Spitsberg
6,297,539 B1 10/2001 Ma et al.
6,299,133 B2 10/2001 Waragai et al.
6,302,964 B1 10/2001 Umotoy et al.
6,303,523 B2 10/2001 Cheung
6,305,898 B1 10/2001 Yamagishi et al.
6,311,016 B1 10/2001 Yanagawa et al.
6,312,525 B1 11/2001 Bright et al.
6,315,512 B1 11/2001 Tabrizi et al.
6,316,162 B1 11/2001 Jung et al.
6,316,371 B1 11/2001 Oosterlaken et al.
6,320,320 B1 11/2001 Bailey et al.
6,321,680 B2 11/2001 Cook et al.
6,321,780 B1 11/2001 Iwabuchi
D451,893 S 12/2001 Robson
D452,220 S 12/2001 Robson
6,325,858 B1 12/2001 Wengert
6,326,322 B1 12/2001 Kim et al.
6,326,597 B1 12/2001 Lubomirsky et al.
6,328,561 B1 12/2001 Hasper et al.
6,328,864 B1 12/2001 Ishizawa et al.
6,329,297 B1 12/2001 Balish
6,333,275 B1 12/2001 Mayer et al.
6,335,049 B1 1/2002 Basceri
6,335,240 B1 1/2002 Kim et al.
6,335,293 B1 1/2002 Luo et al.
6,342,427 B1 1/2002 Choi et al.
6,343,239 B1 1/2002 Toda et al.
6,344,084 B1 2/2002 Koinuma et al.
6,344,232 B1 2/2002 Jones et al.
6,346,419 B1 2/2002 Ryerson et al.
6,347,636 B1 2/2002 Xia
6,350,391 B1 2/2002 Livshits et al.
6,352,049 B1 3/2002 Yin et al.
6,352,945 B1 3/2002 Matsuki
6,357,984 B1 3/2002 Zinger et al.
6,363,294 B1 3/2002 Coronel et al.
D455,024 S 4/2002 Mimick et al.
6,367,410 B1 4/2002 Leahey et al.
6,368,773 B1 4/2002 Jung et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
6,375,749 B1 4/2002 Boydston et al.
6,375,750 B1 4/2002 Van Os et al.
6,379,466 B1 4/2002 Sahin et al.
D457,609 S 5/2002 Piano
6,383,300 B1 5/2002 Saito et al.
6,383,566 B1 5/2002 Zagdoun
6,383,955 B1 5/2002 Matsuki
6,387,207 B1 5/2002 Janakiraman
6,387,823 B1 5/2002 Sonderman et al.
6,387,827 B1 5/2002 Mertens et al.
6,390,753 B1 5/2002 de Ridder et al.
6,390,754 B2 5/2002 Yamaga et al.
6,391,803 B1 5/2002 Kim et al.
6,395,650 B1 5/2002 Callegari et al.
6,398,184 B1 6/2002 Sowada et al.
6,399,022 B1 6/2002 Schuler et al.
6,402,806 B1 6/2002 Schmitt et al.
6,410,433 B1 6/2002 Hautala et al.
6,410,459 B2 6/2002 Blalock et al.
6,410,463 B1 6/2002 Matsuki
6,413,321 B1 7/2002 Kim et al.
6,413,583 B1 7/2002 Moghadam et al.
6,420,279 B1 7/2002 Ono et al.
6,423,949 B1 7/2002 Chen et al.
D461,233 S 8/2002 Whalen
D461,882 S 8/2002 Piano
6,428,859 B1 8/2002 Chiang et al.
6,429,465 B1 8/2002 Yagi et al.
6,432,206 B1 8/2002 Tolt
6,432,255 B1 8/2002 Sun et al.
6,432,479 B2 8/2002 Chang et al.
6,432,849 B1 8/2002 Endo et al.
6,433,298 B1 8/2002 Ishii
6,435,798 B1 8/2002 Satoh
6,435,865 B1 8/2002 Tseng et al.
6,436,819 B1 8/2002 Zhang
6,437,444 B2 8/2002 Andideh
6,438,502 B1 8/2002 Awtrey
6,439,822 B1 8/2002 Kimura et al.
6,440,261 B1 8/2002 Tepman et al.
6,441,350 B1 8/2002 Stoddard et al.
6,445,574 B1 9/2002 Saw et al.
6,446,573 B2 9/2002 Hirayama et al.
6,447,232 B1 9/2002 Davis et al.
6,447,651 B1 9/2002 Ishikawa et al.
6,447,937 B1 9/2002 Murakawa et al.
6,448,192 B1 9/2002 Kaushik
6,450,117 B1 9/2002 Murugesh et al.
6,450,757 B1 9/2002 Saeki
6,451,713 B1 9/2002 Tay et al.
6,452,017 B1 9/2002 Uhlenbrock et al.
6,454,860 B2 9/2002 Metzner et al.
6,454,909 B1 9/2002 Matsuse et al.
6,455,098 B2 9/2002 Tran et al.
6,455,225 B1 9/2002 Kong et al.
6,455,445 B2 9/2002 Matsuki
6,460,482 B1 10/2002 Kuibira et al.
6,461,435 B1 10/2002 Littau et al.
6,461,436 B1 10/2002 Campbell et al.
6,461,439 B1 10/2002 Granneman et al.
6,462,310 B1 10/2002 Ratliff et al.
6,464,825 B1 10/2002 Shinozaki
6,468,924 B2 10/2002 Lee
6,471,779 B1 10/2002 Nishio et al.
6,472,266 B1 10/2002 Yu et al.
6,474,987 B1 11/2002 Huang et al.
6,475,276 B1 11/2002 Elers et al.
6,475,902 B1 11/2002 Hausmann et al.
6,475,930 B1 11/2002 Junker et al.
6,478,872 B1 11/2002 Chae et al.
6,481,945 B1 11/2002 Hasper et al.
6,482,331 B2 11/2002 Lu et al.
6,482,663 B1 11/2002 Buckland
6,483,989 B1 11/2002 Okada et al.
6,488,774 B1 12/2002 Horie et al.
6,490,493 B1 12/2002 Dharnipragada
6,492,625 B1 12/2002 Boguslavskiy et al.
6,494,065 B2 12/2002 Babbitt
6,494,998 B1 12/2002 Brcka
6,496,819 B1 12/2002 Bello et al.
6,497,734 B1 12/2002 Barber et al.
6,497,767 B1 12/2002 Okase et al.
6,498,091 B1 12/2002 Chen et al.
6,499,533 B2 12/2002 Yamada
6,500,487 B1 12/2002 Holst et al.
6,502,530 B1 1/2003 Turlot et al.
6,503,079 B2 1/2003 Kogano et al.
6,503,330 B1 1/2003 Sneh et al.
6,503,365 B1 1/2003 Kim et al.
6,503,562 B1 1/2003 Saito et al.
6,503,826 B1 1/2003 Oda
6,506,009 B1 1/2003 Nulman et al.
6,506,253 B2 1/2003 Sakuma
6,507,410 B1 1/2003 Robertson et al.
6,511,539 B1 1/2003 Raaijmakers
6,514,313 B1 2/2003 Spiegelman
6,514,666 B1 2/2003 Choi et al.
6,521,295 B1 2/2003 Remington
6,521,547 B1 2/2003 Chang et al.
6,527,884 B1 3/2003 Takakuwa et al.
6,528,171 B1 3/2003 Endler et al.
6,528,430 B2 3/2003 Kwan
6,528,752 B1 3/2003 Ishii et al.

(56) References Cited

U.S. PATENT DOCUMENTS

| | | | |
|---|---|---|---|
| 6,528,767 | B2 | 3/2003 | Bagley et al. |
| 6,530,994 | B1 | 3/2003 | Mahawili |
| 6,531,193 | B2 | 3/2003 | Fonash et al. |
| 6,531,412 | B2 | 3/2003 | Conti et al. |
| 6,534,133 | B1 | 3/2003 | Kaloyeros et al. |
| 6,534,395 | B2 | 3/2003 | Werkhoven et al. |
| 6,536,950 | B1 | 3/2003 | Green |
| 6,539,891 | B1 | 4/2003 | Kang et al. |
| 6,540,469 | B2 | 4/2003 | Matsunaga et al. |
| 6,540,838 | B2 | 4/2003 | Sneh et al. |
| 6,544,906 | B2 | 4/2003 | Rotondaro et al. |
| 6,547,844 | B2 | 4/2003 | Rikyuu et al. |
| 6,552,209 | B1 | 4/2003 | Lei et al. |
| 6,554,879 | B1 | 4/2003 | Nomura |
| 6,558,517 | B2 | 5/2003 | Basceri |
| 6,558,755 | B2 | 5/2003 | Berry et al. |
| 6,559,026 | B1 | 5/2003 | Rossman et al. |
| 6,562,094 | B2 | 5/2003 | Denker et al. |
| 6,565,763 | B1 | 5/2003 | Asakawa et al. |
| 6,566,278 | B1 | 5/2003 | Harvey et al. |
| 6,569,239 | B2 | 5/2003 | Arai et al. |
| 6,569,971 | B2 | 5/2003 | Roh et al. |
| 6,573,030 | B1 | 6/2003 | Fairbairn et al. |
| 6,574,644 | B2 | 6/2003 | Hsu et al. |
| 6,576,062 | B2 | 6/2003 | Matsuse |
| 6,576,064 | B2 | 6/2003 | Griffiths et al. |
| 6,576,300 | B1 | 6/2003 | Berry et al. |
| 6,576,564 | B2 | 6/2003 | Agarwal |
| 6,578,589 | B1 | 6/2003 | Mayusumi |
| 6,579,833 | B1 | 6/2003 | McNallan et al. |
| 6,580,050 | B1 | 6/2003 | Miller et al. |
| 6,582,174 | B1 | 6/2003 | Hayashi |
| 6,583,048 | B2 | 6/2003 | Vincent et al. |
| 6,583,572 | B2 | 6/2003 | Veltrop et al. |
| 6,587,108 | B1 | 7/2003 | Guerlain et al. |
| 6,589,352 | B1 | 7/2003 | Yudovsky et al. |
| 6,589,707 | B2 | 7/2003 | Lee et al. |
| 6,589,868 | B2 | 7/2003 | Rossman |
| 6,590,251 | B2 | 7/2003 | Kang et al. |
| 6,594,550 | B1 | 7/2003 | Okrah |
| 6,596,398 | B1 | 7/2003 | Russo et al. |
| 6,596,653 | B2 | 7/2003 | Tan |
| 6,598,559 | B1 | 7/2003 | Vellore et al. |
| 6,602,806 | B1 | 8/2003 | Xia et al. |
| 6,607,602 | B1 | 8/2003 | Granneman et al. |
| 6,607,868 | B2 | 8/2003 | Choi |
| 6,607,948 | B1 | 8/2003 | Sugiyama et al. |
| 6,608,745 | B2 | 8/2003 | Tsuruta et al. |
| 6,610,375 | B2 | 8/2003 | Akiba et al. |
| 6,613,685 | B1 | 9/2003 | Granneman et al. |
| 6,616,986 | B2 | 9/2003 | Sherman |
| 6,617,253 | B1 | 9/2003 | Chu et al. |
| 6,620,251 | B2 | 9/2003 | Kitano |
| 6,623,799 | B1 | 9/2003 | Lee et al. |
| 6,624,064 | B1 | 9/2003 | Sahin |
| 6,627,268 | B1 | 9/2003 | Fair et al. |
| 6,627,503 | B2 | 9/2003 | Ma et al. |
| 6,630,030 | B1 | 10/2003 | Suntola et al. |
| 6,632,478 | B2 | 10/2003 | Gaillard et al. |
| 6,633,364 | B2 | 10/2003 | Hayashi |
| 6,635,115 | B1 | 10/2003 | Fairbairn et al. |
| 6,635,117 | B1 | 10/2003 | Kinnard et al. |
| 6,635,578 | B1 | 10/2003 | Xu et al. |
| 6,638,839 | B2 | 10/2003 | Deng et al. |
| 6,640,145 | B2 | 10/2003 | Hoffberg et al. |
| 6,645,304 | B2 | 11/2003 | Yamaguchi |
| 6,648,974 | B1 | 11/2003 | Ogliari et al. |
| 6,649,921 | B1 | 11/2003 | Cekic et al. |
| 6,652,924 | B2 | 11/2003 | Sherman |
| 6,656,281 | B1 | 12/2003 | Ueda |
| 6,656,282 | B2 | 12/2003 | Kim et al. |
| 6,658,933 | B2 | 12/2003 | Allegre et al. |
| 6,659,111 | B1 | 12/2003 | Mouri et al. |
| 6,660,662 | B2 | 12/2003 | Ishikawa et al. |
| 6,662,817 | B2 | 12/2003 | Yamagishi |
| 6,663,332 | B1 | 12/2003 | Sluijk et al. |
| 6,669,750 | B2 | 12/2003 | Liao et al. |
| 6,673,196 | B1 | 1/2004 | Oyabu |
| 6,676,290 | B1 | 1/2004 | Lu |
| 6,676,759 | B1 | 1/2004 | Takagi |
| 6,679,194 | B2 | 1/2004 | Ham et al. |
| 6,682,971 | B2 | 1/2004 | Tsuneda et al. |
| 6,682,973 | B1 | 1/2004 | Paton et al. |
| 6,683,274 | B1 | 1/2004 | Kwon et al. |
| D486,891 | S | 2/2004 | Cronce |
| 6,684,659 | B1 | 2/2004 | Tanaka et al. |
| 6,684,719 | B2 | 2/2004 | Gehner et al. |
| 6,686,281 | B2 | 2/2004 | Yamazaki et al. |
| 6,688,784 | B1 | 2/2004 | Templeton |
| 6,689,220 | B1 | 2/2004 | Nguyen |
| 6,692,575 | B1 | 2/2004 | Omstead et al. |
| 6,692,576 | B2 | 2/2004 | Halpin et al. |
| 6,692,903 | B2 | 2/2004 | Chen et al. |
| 6,696,367 | B1 | 2/2004 | Aggarwal |
| 6,699,003 | B2 | 3/2004 | Saeki |
| 6,699,399 | B1 | 3/2004 | Qian et al. |
| 6,700,089 | B1 | 3/2004 | Hirooka |
| 6,709,989 | B2 | 3/2004 | Ramdani et al. |
| 6,710,364 | B2 | 3/2004 | Guldi et al. |
| 6,710,857 | B2 | 3/2004 | Kondo |
| 6,712,949 | B2 | 3/2004 | Gopal |
| 6,713,824 | B1 | 3/2004 | Mikata |
| 6,715,949 | B1 | 4/2004 | Fisher et al. |
| 6,716,477 | B1 | 4/2004 | Komiyama et al. |
| 6,716,571 | B2 | 4/2004 | Gabriel |
| 6,719,499 | B1 | 4/2004 | Kuznetsov et al. |
| 6,720,260 | B1 | 4/2004 | Fair et al. |
| 6,720,262 | B2 | 4/2004 | Koh et al. |
| 6,720,531 | B1 | 4/2004 | Jacobson et al. |
| 6,722,837 | B2 | 4/2004 | Inui |
| 6,723,642 | B1 | 4/2004 | Lim et al. |
| 6,730,614 | B1 | 5/2004 | Lim et al. |
| 6,732,006 | B2 | 5/2004 | Haanstra et al. |
| 6,734,090 | B2 | 5/2004 | Agarwala et al. |
| 6,734,631 | B2 | 5/2004 | Juestel et al. |
| 6,737,716 | B1 | 5/2004 | Matsuo et al. |
| 6,740,853 | B1 | 5/2004 | Johnson et al. |
| 6,743,475 | B2 | 6/2004 | Skarp et al. |
| 6,743,738 | B2 | 6/2004 | Todd et al. |
| 6,745,095 | B1 | 6/2004 | Ben-Dov |
| 6,746,240 | B2 | 6/2004 | de Ridder et al. |
| 6,746,308 | B1 | 6/2004 | Bode et al. |
| 6,749,671 | B2 | 6/2004 | Holst et al. |
| 6,753,507 | B2 | 6/2004 | Fure et al. |
| 6,755,221 | B2 | 6/2004 | Jeong et al. |
| 6,756,085 | B2 | 6/2004 | Waldfried |
| 6,756,293 | B2 | 6/2004 | Li et al. |
| 6,756,318 | B2 | 6/2004 | Nguyen et al. |
| 6,759,098 | B2 | 7/2004 | Han |
| 6,760,981 | B2 | 7/2004 | Leap |
| 6,766,545 | B2 | 7/2004 | Hodges |
| 6,767,447 | B2 | 7/2004 | Uno et al. |
| D494,552 | S | 8/2004 | Tezuka et al. |
| 6,776,849 | B2 | 8/2004 | Aggarwal et al. |
| 6,780,704 | B1 | 8/2004 | Raaijmakers et al. |
| 6,783,875 | B2 | 8/2004 | Yamada et al. |
| 6,784,033 | B1 | 8/2004 | Yamazaki |
| 6,784,108 | B1 | 8/2004 | Donohoe et al. |
| D496,008 | S | 9/2004 | Takahashi et al. |
| 6,786,997 | B1 | 9/2004 | Yamazaki |
| D497,536 | S | 10/2004 | Fujiwara |
| D497,977 | S | 11/2004 | Engelbrektsson |
| 6,811,960 | B2 | 11/2004 | Lee et al. |
| 6,812,157 | B1 | 11/2004 | Gadgil |
| 6,815,350 | B2 | 11/2004 | Kim et al. |
| 6,815,352 | B1 | 11/2004 | Tamura et al. |
| 6,818,566 | B2 | 11/2004 | Leeson et al. |
| 6,818,864 | B2 | 11/2004 | Ptak |
| 6,820,570 | B2 | 11/2004 | Kilpela et al. |
| 6,821,889 | B2 | 11/2004 | Elers et al. |
| 6,821,910 | B2 | 11/2004 | Adomaitis et al. |
| 6,824,665 | B2 | 11/2004 | Shelnut et al. |
| 6,825,106 | B1 | 11/2004 | Gao et al. |
| 6,825,134 | B2 | 11/2004 | Law et al. |

(56) References Cited

U.S. PATENT DOCUMENTS

D499,620 S 12/2004 Horner-Richardson et al.
6,827,789 B2 12/2004 Lee et al.
6,828,235 B2 12/2004 Takano
6,831,004 B2 12/2004 Byun
6,833,024 B2 12/2004 Holst et al.
6,835,039 B2 12/2004 Van Den Berg
6,838,122 B2 1/2005 Basceri et al.
6,841,201 B2 1/2005 Shanov et al.
6,843,202 B2 1/2005 Kusuda
6,843,858 B2 1/2005 Rossman
6,846,146 B2 1/2005 Inui
6,846,515 B2 1/2005 Vrtis
6,846,742 B2 1/2005 Rossman
6,847,014 B1 1/2005 Benjamin et al.
6,849,241 B2 2/2005 Dauelsberg et al.
6,849,857 B2 2/2005 Ichiki et al.
6,854,580 B2 2/2005 Braford
6,858,524 B2 2/2005 Haukka et al.
6,858,547 B2 2/2005 Metzner
6,861,642 B2 3/2005 Ichiki et al.
6,863,019 B2 3/2005 Shamouilian
6,863,281 B2 3/2005 Endou et al.
6,864,041 B2 3/2005 Brown
6,867,086 B1 3/2005 Chen et al.
6,867,153 B2 3/2005 Tokunaga
6,867,859 B1 3/2005 Powell
6,872,258 B2 3/2005 Park et al.
6,872,259 B2 3/2005 Strang
D504,142 S 4/2005 Horner-Richardson et al.
6,874,247 B1 4/2005 Hsu
6,874,480 B1 4/2005 Ismailov
6,875,477 B2 4/2005 Trickett et al.
6,875,677 B1 4/2005 Conley, Jr. et al.
6,876,017 B2 4/2005 Goodner
6,876,191 B2 4/2005 de Ridder
6,878,206 B2 4/2005 Tzu et al.
6,878,402 B2 4/2005 Chiang et al.
6,883,733 B1 4/2005 Lind
6,884,066 B2 4/2005 Nguyen et al.
6,884,295 B2 4/2005 Ishii
6,884,319 B2 4/2005 Kim
6,884,475 B2 4/2005 Basceri
D505,590 S 5/2005 Greiner
6,889,211 B1 5/2005 Yoshiura et al.
6,889,864 B2 5/2005 Lindfors et al.
6,890,596 B2 5/2005 Sarigiannis et al.
6,895,158 B2 5/2005 Alyward et al.
6,899,507 B2 5/2005 Yamagishi et al.
6,902,395 B2 6/2005 Oosterlaken et al.
6,902,647 B2 6/2005 Hasper
6,909,839 B2 6/2005 Wang et al.
6,911,092 B2 6/2005 Sneh
6,913,152 B2 7/2005 Zuk
6,913,796 B2 7/2005 Albano et al.
6,916,398 B2 7/2005 Chen et al.
6,916,559 B2 7/2005 Murakawa et al.
6,917,755 B2 7/2005 Nguyen et al.
6,924,078 B2 8/2005 Lee et al.
6,928,890 B2 8/2005 Gehner et al.
6,929,699 B2 8/2005 Whitesell
6,929,700 B2 8/2005 Tan et al.
6,930,041 B2 8/2005 Agarwal
6,930,059 B2 8/2005 Conley, Jr. et al.
6,935,269 B2 8/2005 Lee et al.
6,939,579 B2 9/2005 Bondestam et al.
6,939,817 B2 9/2005 Sandhu et al.
6,942,753 B2 9/2005 Choi et al.
6,949,204 B1 9/2005 Lenz et al.
6,951,587 B1 10/2005 Narushima
6,952,656 B1 10/2005 Cordova et al.
6,953,609 B2 10/2005 Carollo
6,955,741 B2 10/2005 Yamagishi
6,955,836 B2 10/2005 Kumagai et al.
6,955,928 B1 10/2005 Brennan
6,963,052 B2 11/2005 Kuibira et al.
6,966,936 B2 11/2005 Yamasaki et al.
6,972,055 B2 12/2005 Sferlazzo
6,972,478 B1 12/2005 Waite et al.
6,974,781 B2 12/2005 Timmermans et al.
6,975,921 B2 12/2005 Verhaar
6,976,822 B2 12/2005 Woodruff
RE38,937 E 1/2006 Nakamura
6,981,832 B2 1/2006 Zinger et al.
6,982,046 B2 1/2006 Srivastava et al.
6,982,103 B2 1/2006 Basceri et al.
6,984,591 B1 1/2006 Buchanan et al.
6,984,595 B1 1/2006 Yamazaki
6,985,788 B2 1/2006 Haanstra et al.
6,986,914 B2 1/2006 Elers et al.
6,987,155 B2 1/2006 Roh et al.
6,990,430 B2 1/2006 Hosek
7,005,227 B2 2/2006 Yueh et al.
7,005,391 B2 2/2006 Min
7,008,879 B2 3/2006 Lee et al.
7,010,580 B1 3/2006 Fu et al.
7,017,514 B1 3/2006 Shepherd et al.
7,018,941 B2 3/2006 Cui et al.
7,021,330 B2 4/2006 Maula et al.
7,021,881 B2 4/2006 Yamagishi
7,036,453 B2 5/2006 Ishikawa et al.
7,041,609 B2 5/2006 Vaartstra
7,045,430 B2 5/2006 Ahn et al.
7,049,226 B2 5/2006 Chung et al.
7,049,247 B2 5/2006 Gates et al.
7,052,584 B2 5/2006 Basceri
7,053,009 B2 5/2006 Conley, Jr. et al.
7,055,263 B2 6/2006 Wu et al.
7,055,875 B2 6/2006 Bonora
7,062,161 B2 6/2006 Kusuda et al.
D524,600 S 7/2006 Austin et al.
D525,127 S 7/2006 Cogley et al.
7,070,178 B2 7/2006 Van Der Toorn et al.
7,071,051 B1 7/2006 Jeon et al.
7,073,834 B2 7/2006 Matsumoto et al.
7,074,690 B1 7/2006 Gauri et al.
7,077,614 B1 7/2006 Hasper et al.
7,080,545 B2 7/2006 Dimeo et al.
7,084,060 B1 8/2006 Furukawa
7,084,079 B2 8/2006 Conti et al.
7,085,623 B2 8/2006 Siegers
7,086,347 B2 8/2006 Howald et al.
7,088,003 B2 8/2006 Gates et al.
7,090,394 B2 8/2006 Hashikura et al.
7,092,287 B2 8/2006 Beulens et al.
7,098,149 B2 8/2006 Lukas
7,098,150 B2 8/2006 Misra et al.
7,100,459 B2 9/2006 Gehner et al.
7,101,763 B1 9/2006 Anderson et al.
7,108,753 B2 9/2006 Wood
7,109,098 B1 9/2006 Ramaswamy et al.
7,109,114 B2 9/2006 Chen et al.
7,111,232 B1 9/2006 Bascom
7,115,305 B2 10/2006 Bronikowski et al.
7,115,838 B2 10/2006 Kurara et al.
7,122,085 B2 10/2006 Shero et al.
7,122,222 B2 10/2006 Xiao et al.
7,122,844 B2 10/2006 Nakamura et al.
7,129,165 B2 10/2006 Basol et al.
7,132,360 B2 11/2006 Schaeffer et al.
7,135,421 B2 11/2006 Ahn et al.
7,140,558 B2 11/2006 McCracken et al.
7,141,499 B2 11/2006 Raaijmakers
7,143,897 B1 12/2006 Guzman et al.
7,144,806 B1 12/2006 Fair et al.
7,144,809 B2 12/2006 Elers et al.
7,147,766 B2 12/2006 Uzoh et al.
7,153,542 B2 12/2006 Nguyen et al.
D535,673 S 1/2007 Conway et al.
7,156,380 B2 1/2007 Soininen
7,163,393 B2 1/2007 Adachi et al.
7,163,721 B2 1/2007 Zhang et al.
7,163,900 B2 1/2007 Weber
7,168,852 B2 1/2007 Linnarsson
7,172,497 B2 2/2007 Basol et al.

(56) References Cited

U.S. PATENT DOCUMENTS 7,173,216 B2 2/2007 Ptak
7,183,229 B2 2/2007 Yamanaka
7,186,648 B1 3/2007 Rozbicki
7,192,824 B2 3/2007 Ahn et al.
7,192,892 B2 3/2007 Ahn et al.
7,195,479 B2 3/2007 Beatty et al.
7,195,693 B2 3/2007 Cowans
D541,125 S 4/2007 Gaudron
7,198,447 B2 4/2007 Morimitsu et al.
7,199,513 B2 4/2007 Huber et al.
7,201,943 B2 4/2007 Park et al.
7,202,148 B2 4/2007 Chen et al.
7,202,512 B2 4/2007 Chen et al.
7,204,886 B2 4/2007 Chen et al.
7,204,887 B2 4/2007 Kawamura et al.
7,205,246 B2 4/2007 MacNeil et al.
7,205,247 B2 4/2007 Lee et al.
7,207,763 B2 4/2007 Lee
7,208,198 B2 4/2007 Basceri et al.
7,208,389 B1 4/2007 Tipton et al.
7,208,413 B2 4/2007 Byun et al.
7,210,925 B2 5/2007 Adachi
7,211,524 B2 5/2007 Ryu et al.
7,211,525 B1 5/2007 Shanker
7,214,630 B1 5/2007 Varadarajan et al.
7,217,617 B2 5/2007 Basceri
7,223,014 B2 5/2007 Lojen
7,229,502 B2 6/2007 Wang et al.
7,234,476 B2 6/2007 Arai
7,235,137 B2 6/2007 Kitayama et al.
7,235,482 B2 6/2007 Wu
7,235,501 B2 6/2007 Ahn et al.
7,238,596 B2 7/2007 Kouvetakis et al.
7,238,616 B2 7/2007 Agarwal
7,238,653 B2 7/2007 Lee et al.
D549,815 S 8/2007 Murphy
7,256,375 B2 8/2007 Oosterlaken
7,265,061 B1 9/2007 Cho et al.
7,274,867 B2 9/2007 Peukert
D553,104 S 10/2007 Oohashi et al.
7,279,256 B2 10/2007 Son
7,290,813 B2 11/2007 Bonora
7,294,581 B2 11/2007 Haverkort et al.
7,296,460 B2 11/2007 Dimeo et al.
7,297,641 B2 11/2007 Todd et al.
7,298,009 B2 11/2007 Yan et al.
7,301,623 B1 11/2007 Madsen et al.
D556,704 S 12/2007 Nakamura et al.
D557,226 S 12/2007 Uchino et al.
D558,021 S 12/2007 Lawrence
7,307,028 B2 12/2007 Goto et al.
7,307,178 B2 12/2007 Kiyomori et al.
7,311,977 B2 12/2007 Yokota et al.
7,312,148 B2 12/2007 Ramaswamy et al.
7,312,162 B2 12/2007 Ramaswamy et al.
7,312,494 B2 12/2007 Ahn et al.
D559,993 S 1/2008 Nagakubo et al.
D559,994 S 1/2008 Nagakubo et al.
7,320,544 B2 1/2008 Hsieh
7,323,401 B2 1/2008 Ramaswamy et al.
D562,357 S 2/2008 Hardy
7,326,656 B2 2/2008 Brask et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,351,057 B2 4/2008 Berenbak et al.
7,354,482 B2 4/2008 Konishi et al.
7,354,847 B2 4/2008 Chan et al.
7,354,873 B2 4/2008 Fukazawa et al.
7,356,762 B2 4/2008 van Driel
7,357,138 B2 4/2008 Ji et al.
7,361,447 B2 4/2008 Jung
7,375,035 B2 5/2008 Heden et al.
7,376,520 B2 5/2008 Wong
7,378,618 B1 5/2008 Sorabji et al.
7,379,785 B2 5/2008 Higashi et al.
D571,383 S 6/2008 Ota et al.
D571,831 S 6/2008 Ota et al.
7,381,644 B1 6/2008 Soubramonium et al.
7,387,685 B2 6/2008 Choi et al.
7,393,207 B2 7/2008 Imai
7,393,418 B2 7/2008 Yokogawa
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,399,570 B2 7/2008 Lee et al.
7,402,534 B2 7/2008 Mahajani
7,405,166 B2 7/2008 Liang et al.
7,405,454 B2 7/2008 Ahn et al.
D575,713 S 8/2008 Ratcliffe
7,408,225 B2 8/2008 Shinriki et al.
7,410,290 B2 8/2008 Tanaka
7,410,666 B2 8/2008 Elers
7,411,352 B2 8/2008 Madocks
7,414,281 B1 8/2008 Fastow
D576,001 S 9/2008 Brunderman
7,422,635 B2 9/2008 Zheng et al.
7,422,636 B2 9/2008 Ishizaka
7,422,653 B2 9/2008 Blahnik et al.
7,422,775 B2 9/2008 Ramaswamy et al.
7,425,224 B2 9/2008 Nguyen
7,427,571 B2 9/2008 Lindeboom et al.
7,429,532 B2 9/2008 Ramaswamy et al.
7,431,966 B2 10/2008 Derderian et al.
7,432,476 B2 10/2008 Morita et al.
7,437,060 B2 10/2008 Wang et al.
7,442,275 B2 10/2008 Cowans
7,456,429 B2 11/2008 Levy
D583,395 S 12/2008 Ueda
7,467,632 B2 12/2008 Lee et al.
7,473,655 B2 1/2009 Wang et al.
7,475,588 B2 1/2009 Dimeo et al.
7,476,291 B2 1/2009 Wang et al.
7,479,198 B2 1/2009 Guffrey
7,482,247 B1 1/2009 Papasouliotis
7,482,283 B2 1/2009 Yamasaki et al.
D585,968 S 2/2009 Elkins et al.
7,489,389 B2 2/2009 Shibazaki et al.
7,494,882 B2 2/2009 Vitale
7,497,614 B2 3/2009 Gaff
7,498,242 B2 3/2009 Kumar et al.
7,501,292 B2 3/2009 Matsushita et al.
7,501,355 B2 3/2009 Bhatia et al.
7,503,980 B2 3/2009 Kida et al.
7,504,344 B2 3/2009 Matsuki et al.
D590,933 S 4/2009 Vansell
7,514,058 B1 4/2009 Hitzman et al.
7,514,375 B1 4/2009 Shanker et al.
D593,585 S 6/2009 Ota et al.
D593,969 S 6/2009 Li
7,541,297 B2 6/2009 Mallick et al.
7,544,398 B1 6/2009 Chang et al.
7,547,363 B2 6/2009 Tomiyasu et al.
7,547,633 B2 6/2009 Ranish et al.
7,550,396 B2 6/2009 Frohberg et al.
D596,476 S 7/2009 Welch
7,561,982 B2 7/2009 Rund et al.
7,563,715 B2 7/2009 Haukka et al.
7,566,891 B2 7/2009 Rocha-Alvarez et al.
7,569,193 B2 8/2009 Ferron et al.
7,575,968 B2 8/2009 Sadaka et al.
7,579,285 B2 8/2009 Zimmerman et al.
7,579,785 B2 8/2009 Shinmen et al.
D600,223 S 9/2009 Aggarwal
7,582,555 B1 9/2009 Lang
7,582,575 B2 9/2009 Fukazawa et al.
7,589,003 B2 9/2009 Kouvetakis et al.
7,589,028 B1 9/2009 Cho et al.
7,589,029 B2 9/2009 Derderian et al.
7,591,601 B2 9/2009 Matsuoka et al.
7,591,907 B2 9/2009 Chen et al.
D602,575 S 10/2009 Breda

(56) References Cited

U.S. PATENT DOCUMENTS 7,598,513 B2 10/2009 Kouvetakis et al.
7,601,223 B2 10/2009 Lindfors et al.
7,601,225 B2 10/2009 Tuominen et al.
7,601,652 B2 10/2009 Singh et al.
7,611,640 B1 11/2009 Howald et al.
7,611,751 B2 11/2009 Elers
7,611,980 B2 11/2009 Wells et al.
7,618,226 B2 11/2009 Takizawa
7,621,672 B2 11/2009 Ripley
7,622,369 B1 11/2009 Lee et al.
7,622,378 B2 11/2009 Liu et al.
7,623,940 B2 11/2009 Huskamp et al.
D606,952 S 12/2009 Lee et al.
7,625,820 B1 12/2009 Papasouliotis
7,629,277 B2 12/2009 Ghatnagar
7,632,549 B2 12/2009 Goundar
7,638,951 B2 12/2009 DeVincentis et al.
7,640,142 B2 12/2009 Tachikawa et al.
7,645,341 B2 1/2010 Kennedy et al.
7,645,484 B2 1/2010 Ishizaka
7,648,895 B2 1/2010 Kurokawa et al.
7,648,927 B2 1/2010 Singh et al.
7,651,269 B2 1/2010 Comendant
7,651,583 B2 1/2010 Kent et al.
7,651,955 B2 1/2010 Ranish et al.
7,651,959 B2 1/2010 Fukazawa et al.
7,651,961 B2 1/2010 Clark
D609,652 S 2/2010 Nagasaka et al.
D609,655 S 2/2010 Sugimoto
7,661,299 B2 2/2010 Kusunoki
7,662,689 B2 2/2010 Boyanov et al.
7,670,432 B2 3/2010 Li
7,674,726 B2 3/2010 Hasper et al.
7,678,197 B2 3/2010 Maki
7,678,715 B2 3/2010 Mungekar et al.
7,682,454 B2 3/2010 Sneh
7,682,657 B2 3/2010 Sherman
D613,829 S 4/2010 Griffin et al.
D614,153 S 4/2010 Fondurulia et al.
D614,258 S 4/2010 Kojima
D614,267 S 4/2010 Breda
D614,268 S 4/2010 Breda
D614,593 S 4/2010 Lee et al.
7,690,881 B2 4/2010 Yamagishi
7,691,205 B2 4/2010 Ikedo
7,692,171 B2 4/2010 Kaszuba et al.
7,695,808 B2 4/2010 Tuma
D616,390 S 5/2010 Sato
D616,394 S 5/2010 Sato
7,712,435 B2 5/2010 Yoshizaki et al.
7,713,874 B2 5/2010 Milligan
7,716,993 B2 5/2010 Ozawa et al.
7,718,930 B2 5/2010 Kawasaki et al.
7,720,560 B2 5/2010 Menser et al.
7,723,648 B2 5/2010 Tsukamoto et al.
7,725,012 B2 5/2010 Aggarwal et al.
7,727,296 B2 6/2010 Tojo et al.
7,727,864 B2 6/2010 Elers
7,727,880 B1 6/2010 Chattopadhyay et al.
7,732,343 B2 6/2010 Niroomand et al.
7,736,437 B2 6/2010 Cadwell et al.
7,736,528 B2 6/2010 Okita et al.
7,736,600 B2 6/2010 Clark et al.
7,737,035 B1 6/2010 Lind et al.
7,740,437 B2 6/2010 de Ridder et al.
7,740,705 B2 6/2010 Li
7,745,346 B2 6/2010 Hausmann et al.
7,748,760 B2 7/2010 Kushida
7,749,563 B2 7/2010 Zheng et al.
7,753,584 B2 7/2010 Gambino et al.
7,754,621 B2 7/2010 Putjkonen
7,758,698 B2 7/2010 Bang et al.
7,763,869 B2 7/2010 Matsushita et al.
7,767,262 B2 8/2010 Clark
7,771,796 B2 8/2010 Kohno et al.
7,780,440 B2 8/2010 Shibagaki et al.
7,780,789 B2 8/2010 Wu et al.
7,781,352 B2 8/2010 Fukazawa et al.
7,789,559 B2 9/2010 Waser et al.
7,789,965 B2 9/2010 Matsushita et al.
7,790,633 B1 9/2010 Tarafdar et al.
7,794,546 B2 9/2010 Li
7,795,160 B2 9/2010 Wang et al.
7,798,096 B2 9/2010 Mahajani et al.
7,799,300 B2 9/2010 Lindfors et al.
7,799,706 B2 9/2010 Yeom et al.
7,803,722 B2 9/2010 Liang
D625,977 S 10/2010 Watson et al.
7,806,587 B2 10/2010 Kobayashi
7,807,566 B2 10/2010 Tsuji et al.
7,807,578 B2 10/2010 Bencher et al.
7,816,278 B2 10/2010 Reed et al.
7,824,492 B2 11/2010 Tois et al.
7,825,040 B1 11/2010 Fukazawa et al.
7,829,460 B2 11/2010 Streck et al.
7,833,348 B2 11/2010 Wada et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,850,449 B2 12/2010 Yang et al.
7,851,019 B2 12/2010 Tuominen et al.
7,851,232 B2 12/2010 van Schravendijk et al.
7,858,519 B2 12/2010 Liu et al.
7,858,533 B2 12/2010 Liu et al.
7,858,898 B2 12/2010 Bailey et al.
7,865,070 B2 1/2011 Nakamura
7,871,198 B2 1/2011 Rempe et al.
7,874,726 B2 1/2011 Jacobs et al.
7,884,918 B2 2/2011 Hattori
7,888,233 B1 2/2011 Gauri
7,894,474 B1 2/2011 Bell
D633,452 S 3/2011 Namiki et al.
D634,329 S 3/2011 Wastrom
D634,719 S 3/2011 Yasuda et al.
7,897,215 B1 3/2011 Fair et al.
7,897,217 B2 3/2011 Faguet
7,902,009 B2 3/2011 Simonelli et al.
7,902,582 B2 3/2011 Forbes et al.
7,906,174 B1 3/2011 Wu et al.
7,910,288 B2 3/2011 Abatchev et al.
7,910,452 B2 3/2011 Roh et al.
7,910,494 B2 3/2011 Dip et al.
7,915,139 B1 3/2011 Lang
7,915,667 B2 3/2011 Knoefler et al.
7,919,142 B2 4/2011 Yeom et al.
7,919,416 B2 4/2011 Lee et al.
7,923,382 B2 4/2011 Huotari et al.
7,925,378 B2 4/2011 Gilchrist et al.
7,927,395 B2 4/2011 Szepessy et al.
7,935,940 B1 5/2011 Smargiassi
7,939,447 B2 5/2011 Bauer et al.
7,942,969 B2 5/2011 Riker et al.
7,946,762 B2 5/2011 Yednak
7,951,262 B2 5/2011 Koshiishi et al.
7,955,516 B2 6/2011 Chandrachood
7,955,646 B2 6/2011 Cruse et al.
7,955,650 B2 6/2011 Tsuji
7,957,708 B2 6/2011 Karschnia et al.
7,963,736 B2 6/2011 Takizawa et al.
7,967,913 B2 6/2011 Hua et al.
7,972,980 B2 7/2011 Lee et al.
7,977,256 B2 7/2011 Liu et al.
7,981,751 B2 7/2011 Zhu et al.
D643,055 S 8/2011 Takahashi
7,989,365 B2 8/2011 Park et al.
7,989,736 B2 8/2011 Park et al.
7,992,318 B2 8/2011 Kawaji
7,993,457 B1 8/2011 Krotov et al.
7,994,070 B1 8/2011 Dip et al.
7,994,721 B2 8/2011 Espiau et al.
7,997,795 B2 8/2011 Schwagerman et al.
7,998,875 B2 8/2011 DeYoung

(56) References Cited

U.S. PATENT DOCUMENTS 8,003,174 B2 8/2011 Fukazawa
8,003,919 B2 8/2011 Goto et al.
8,004,198 B2 8/2011 Bakre et al.
8,020,315 B2 9/2011 Nishimura
8,030,129 B2 10/2011 Jeong
8,033,771 B1 10/2011 Gage et al.
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,046,193 B2 10/2011 Yetter et al.
8,047,711 B2 11/2011 Ploechinger
8,048,783 B2 11/2011 Chung et al.
8,051,799 B2 11/2011 Itagaki et al.
8,052,794 B2 11/2011 Sumakeris et al.
8,055,378 B2 11/2011 Numakura
8,060,252 B2 11/2011 Gage et al.
RE43,023 E 12/2011 Nakashima et al.
D649,986 S 12/2011 Fujikata et al.
D651,291 S 12/2011 Liebson et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,083,853 B2 12/2011 Choi et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.
8,100,583 B2 1/2012 Aggarwal
D653,734 S 2/2012 Sisk
D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,128,333 B2 3/2012 Aburatani
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Bera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk et al.
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,253,204 B2 8/2012 Lee et al.
8,267,633 B2 9/2012 Obikane
8,272,516 B2 9/2012 Salvador
8,278,176 B2 10/2012 Bauer et al.
8,278,224 B1 10/2012 Mui et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,318,584 B2 11/2012 Li et al.
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss et al.
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,044 B2 3/2013 Arai
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,435,894 B2 5/2013 Chandrashekar et al.
8,440,259 B2 5/2013 Chiang et al.
8,443,484 B2 5/2013 Ozaki et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,507,720 B2 8/2013 Shay
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.

(56) References Cited

U.S. PATENT DOCUMENTS 8,562,272 B2 10/2013 Lenz
8,563,443 B2 10/2013 Fukazawa
8,569,184 B2 10/2013 Oka
D693,200 S 11/2013 Saunders
D693,782 S 11/2013 Mori et al.
8,573,152 B2 11/2013 de La Llera et al.
8,573,154 B2 11/2013 Yorozuya
8,586,484 B2 11/2013 Matsuyama et al.
8,591,659 B1 11/2013 Fang et al.
8,592,005 B2 11/2013 Ueda
D694,790 S 12/2013 Matsumoto et al.
D695,240 S 12/2013 Iida et al.
8,608,885 B2 12/2013 Goto et al.
8,614,047 B2 12/2013 Ayothi et al.
8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
8,637,384 B2 1/2014 Ando et al.
D698,904 S 2/2014 Milligan et al.
8,642,488 B2 2/2014 Liu et al.
8,647,439 B2 2/2014 Sanchez et al.
8,647,722 B2 2/2014 Kobayashi et al.
8,647,993 B1 2/2014 Lavoie et al.
8,651,788 B1 2/2014 Budde
8,657,942 B2 2/2014 Shaw et al.
8,664,127 B2 3/2014 Bhatia et al.
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee
8,703,002 B2 4/2014 Matsudo et al.
8,709,162 B2 4/2014 Leung et al.
8,710,580 B2 4/2014 Sakuma et al.
8,711,338 B2 4/2014 Liu et al.
D705,745 S 5/2014 Kurs et al.
D705,762 S 5/2014 Yu
8,720,965 B2 5/2014 Hino et al.
8,721,791 B2 5/2014 Choi et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,728,956 B2 5/2014 Lavoie et al.
8,741,062 B2 6/2014 Lindfors et al.
8,741,065 B2 6/2014 Odagiri et al.
8,742,668 B2 6/2014 Nakano et al.
8,758,512 B2 6/2014 Lee
8,759,223 B2 6/2014 Sapre et al.
D709,536 S 7/2014 Yoshimura et al.
D709,537 S 7/2014 Kuwabara et al.
8,764,085 B2 7/2014 Urabe
8,771,791 B2 7/2014 Lee et al.
8,771,807 B2 7/2014 Xiao et al.
8,779,502 B2 7/2014 Sakuma et al.
8,784,676 B2 7/2014 Guha et al.
8,784,950 B2 7/2014 Fukazawa et al.
8,784,951 B2 7/2014 Fukazawa et al.
8,785,215 B2 7/2014 Kobayashi et al.
8,785,311 B2 7/2014 Miyoshi
8,790,743 B1 7/2014 Omari
8,790,749 B2 7/2014 Omori et al.
8,802,201 B2 8/2014 Raisanen et al.
8,809,170 B2 8/2014 Bauer
D712,358 S 9/2014 Allen et al.
D712,359 S 9/2014 Allen et al.
8,820,809 B2 9/2014 Ando et al.
8,821,640 B2 9/2014 Cleary et al.
8,821,985 B2 9/2014 Shao et al.
8,823,672 B2 9/2014 Kim
8,828,886 B2 9/2014 Samukawa et al.
8,841,182 B1 9/2014 Chen et al.
8,845,806 B2 9/2014 Aida et al.
8,846,502 B2 9/2014 Haukka et al.
D715,410 S 10/2014 Lohmann
8,859,368 B2 10/2014 Deniz
8,860,955 B2 10/2014 Rodnick et al.
8,864,202 B1 10/2014 Schrameyer
8,864,375 B2 10/2014 Abe et al.
D716,742 S 11/2014 Jang et al.
8,876,974 B2 11/2014 Wan
8,877,300 B2 11/2014 Lee
8,877,655 B2 11/2014 Shero et al.
8,882,923 B2 11/2014 Saido et al.
8,883,270 B2 11/2014 Shero et al.
8,895,108 B2 11/2014 Lee
8,895,395 B1 11/2014 Kerber et al.
8,900,935 B2 12/2014 Guo et al.
8,900,999 B1 12/2014 Wu et al.
8,901,016 B2 12/2014 Jeongseok et al.
8,911,553 B2 12/2014 Baluja et al.
8,911,826 B2 12/2014 Adachi et al.
8,912,101 B2 12/2014 Tsuji et al.
D720,838 S 1/2015 Yamagishi et al.
8,927,906 B2 1/2015 Tadokoro et al.
8,932,802 B2 1/2015 Wu et al.
8,933,375 B2 1/2015 Dunn et al.
8,937,800 B2 1/2015 Lubomirsky et al.
8,940,646 B1 1/2015 Chandrasekharan
D723,153 S 2/2015 Borkholder
8,945,305 B2 2/2015 Marsh
8,945,306 B2 2/2015 Tsuda
8,945,339 B2 2/2015 Kakimoto
8,946,830 B2 2/2015 Jung et al.
8,956,971 B2 2/2015 Huakka
8,956,983 B2 2/2015 Swaminathan
D723,330 S 3/2015 York
D724,553 S 3/2015 Choi
D724,701 S 3/2015 Yamagishi et al.
D725,168 S 3/2015 Yamagishi
8,967,608 B2 3/2015 Mitsumori et al.
8,968,989 B2 3/2015 Ouattara et al.
8,969,934 B1 3/2015 Cheng et al.
8,974,868 B2 3/2015 Ishikawa et al.
8,980,006 B2 3/2015 Huh et al.
8,986,456 B2 3/2015 Fondurulia et al.
8,991,214 B2 3/2015 Hoshino et al.
8,991,887 B2 3/2015 Shin et al.
8,993,054 B2 3/2015 Jung et al.
8,993,072 B2 3/2015 Xiao et al.
8,993,457 B1 3/2015 Ramkumar et al.
D726,365 S 4/2015 Weigensberg
D726,884 S 4/2015 Yamagishi et al.
8,999,102 B2 4/2015 Miyoshi et al.
9,004,744 B1 4/2015 Kemp
9,005,539 B2 4/2015 Halpin et al.
9,017,481 B1 4/2015 Pettinger et al.
9,017,933 B2 4/2015 Liu et al.
9,018,093 B2 4/2015 Tsuji et al.
9,018,111 B2 4/2015 Milligan et al.
9,018,567 B2 4/2015 de Ridder et al.
9,021,985 B2 5/2015 Alokozai et al.
9,023,737 B2 5/2015 Beynet et al.
9,023,738 B2 5/2015 Kato et al.
9,029,244 B2 5/2015 Won et al.
9,029,253 B2 5/2015 Milligan et al.
9,029,272 B1 5/2015 Nakano
D732,145 S 6/2015 Yamagishi
D732,644 S 6/2015 Yamagishi et al.
D733,257 S 6/2015 Schoenherr et al.
D733,261 S 6/2015 Yamagishi et al.
D733,262 S 6/2015 Kang
9,057,388 B2 6/2015 Comeau et al.
9,064,815 B2 6/2015 Zhang et al.
D733,843 S 7/2015 Yamagishi
D734,377 S 7/2015 Hirakida
9,076,635 B2 7/2015 Gross et al.
9,076,726 B2 7/2015 Kauerauf et al.
D735,836 S 8/2015 Yamagishi et al.

(56) References Cited

U.S. PATENT DOCUMENTS

D736,348 S 8/2015 Tan
9,095,869 B2 8/2015 Kilpi et al.
9,096,931 B2 8/2015 Yednak et al.
9,099,423 B2 8/2015 Weeks et al.
9,099,505 B2 8/2015 Kusakabe et al.
9,111,972 B2 8/2015 Takeshita et al.
9,117,657 B2 8/2015 Nakano et al.
9,117,866 B2 8/2015 Marquardt et al.
D739,222 S 9/2015 Chadbourne
9,123,510 B2 9/2015 Nakano et al.
9,123,577 B2 9/2015 Fujimoto et al.
9,127,358 B2 9/2015 Inoue et al.
9,127,362 B2 9/2015 Scheible et al.
9,129,897 B2 9/2015 Pore et al.
9,136,108 B2 9/2015 Matsushita et al.
9,136,180 B2 9/2015 Machkaoutsan
9,142,393 B2 9/2015 Okabe et al.
9,142,437 B2 9/2015 Fosnight et al.
9,142,764 B1 9/2015 Wang
9,153,441 B2 10/2015 Takamure et al.
9,163,310 B2 10/2015 Lee
9,166,012 B2 10/2015 Sim et al.
9,169,975 B2 10/2015 Sarin et al.
9,171,714 B2 10/2015 Mori
9,171,715 B2 10/2015 Matero
9,171,716 B2 10/2015 Fukuda
D742,202 S 11/2015 Cyphers et al.
D743,357 S 11/2015 Vyne
D743,513 S 11/2015 Yamagishi
9,174,178 B2 11/2015 Berger et al.
9,175,394 B2 11/2015 Yudovsky et al.
9,177,784 B2 11/2015 Raisanen et al.
9,184,047 B2 11/2015 Liu et al.
9,184,054 B1 11/2015 Huang et al.
9,190,263 B2 11/2015 Ishikawa et al.
9,190,264 B2 11/2015 Yuasa et al.
9,196,483 B1 11/2015 Lee et al.
D745,641 S 12/2015 Blum
9,202,727 B2 12/2015 Dunn et al.
9,214,333 B1 12/2015 Sims et al.
9,214,340 B2 12/2015 Kurita et al.
9,219,006 B2 12/2015 Chatterjee
9,223,203 B2 12/2015 Farm et al.
9,228,259 B2 1/2016 Haukka et al.
9,240,412 B2 1/2016 Xie et al.
9,245,742 B2 1/2016 Haukka
9,252,024 B2 2/2016 Lam et al.
9,252,238 B1 2/2016 Trevino et al.
9,257,274 B2 2/2016 Kang et al.
9,263,298 B2 2/2016 Matsumoto et al.
9,267,204 B2 2/2016 Honma
9,267,850 B2 2/2016 Aggarwal
D751,176 S 3/2016 Schoenherr et al.
9,275,834 B1 3/2016 Park et al.
9,281,223 B2 3/2016 Hara
9,281,277 B2 3/2016 Baek et al.
9,284,642 B2 3/2016 Nakano
9,287,273 B2 3/2016 Ragnarsson et al.
9,297,705 B2 3/2016 Aggarwal
9,299,557 B2 3/2016 Tolle et al.
9,299,595 B2 3/2016 Dunn et al.
D753,269 S 4/2016 Yamagishi et al.
D753,629 S 4/2016 Plattard
9,305,836 B1 4/2016 Gates et al.
9,309,598 B2 4/2016 Wang et al.
9,309,978 B2 4/2016 Hatch et al.
9,310,684 B2 4/2016 Meyers et al.
9,312,155 B2 4/2016 Mori
9,315,897 B2 4/2016 Byun
9,324,811 B2 4/2016 Weeks
9,324,846 B1 4/2016 Camillo
D756,929 S 5/2016 Harck et al.
9,331,200 B1 5/2016 Wang et al.
9,337,031 B2 5/2016 Kim et al.
9,337,054 B2 5/2016 Hunks et al.
9,337,057 B2 5/2016 Park et al.
9,341,296 B2 5/2016 Yednak
9,343,297 B1 5/2016 Fukazawa et al.
9,343,308 B2 5/2016 Isii
9,343,343 B2 5/2016 Mori
9,343,350 B2 5/2016 Arai
9,349,620 B2 5/2016 Kamata et al.
9,353,440 B2 5/2016 Ge et al.
9,353,441 B2 5/2016 Chung
9,355,876 B2 5/2016 Reuter et al.
9,355,882 B2 5/2016 Wu et al.
D759,137 S 6/2016 Hassan
D759,193 S 6/2016 Gutierrez et al.
9,362,107 B2 6/2016 Thadani et al.
9,362,137 B2 6/2016 Kang et al.
9,362,180 B2 6/2016 Lee et al.
9,365,924 B2 6/2016 Nonaka
9,368,352 B2 6/2016 Takamure et al.
9,370,863 B2 6/2016 Tsuji et al.
9,378,969 B2 6/2016 Hsu et al.
D761,325 S 7/2016 Abed
9,384,987 B2 7/2016 Jung et al.
9,390,909 B2 7/2016 Pasquale et al.
9,394,608 B2 7/2016 Shero et al.
9,396,934 B2 7/2016 Tolle
9,396,956 B1 7/2016 Fukazawa
9,399,228 B2 7/2016 Breiling et al.
D764,196 S 8/2016 Handler et al.
9,404,587 B2 8/2016 Shugrue
9,410,247 B2 8/2016 Lee et al.
9,412,564 B2 8/2016 Milligan
9,412,581 B2 8/2016 Thadani et al.
9,412,582 B2 8/2016 Sasaki et al.
9,418,885 B2 8/2016 Sung et al.
9,425,078 B2 8/2016 Tang et al.
9,428,833 B1 8/2016 Duvall et al.
9,443,725 B2 9/2016 Liu et al.
9,447,498 B2 9/2016 Shiba et al.
9,449,793 B2 9/2016 Shaji et al.
9,449,795 B2 9/2016 Sabri et al.
9,449,843 B1 9/2016 Korolik et al.
9,449,987 B1 9/2016 Miyata et al.
9,455,138 B1 9/2016 Fukazawa
9,455,177 B1 9/2016 Park et al.
9,460,954 B2 10/2016 De Jong et al.
9,464,352 B2 10/2016 Nakano et al.
9,472,410 B2 10/2016 Sadjadi et al.
9,472,432 B1 10/2016 Blank
9,474,163 B2 10/2016 Tolle et al.
9,478,414 B2 10/2016 Kobayashi et al.
9,478,415 B2 10/2016 Kimura
D770,993 S 11/2016 Yoshida et al.
9,484,191 B2 11/2016 Winkler
9,496,225 B1 11/2016 Adusumilli et al.
9,514,927 B2 12/2016 Tolle et al.
9,514,932 B2 12/2016 Mallick et al.
9,520,289 B2 12/2016 Park et al.
9,523,148 B1 12/2016 Pore et al.
D777,546 S 1/2017 Ishii et al.
9,543,180 B2 1/2017 Kamiya
9,556,516 B2 1/2017 Takamure
9,558,931 B2 1/2017 Tang
9,564,312 B2 2/2017 Henri et al.
9,564,314 B2 2/2017 Takamure et al.
9,570,302 B1 2/2017 Chang et al.
9,574,268 B1 2/2017 Dunn et al.
9,576,952 B2 2/2017 Joshi et al.
9,583,333 B2 2/2017 Chatterjee
9,583,345 B2 2/2017 Chen et al.
D782,419 S 3/2017 Willette
9,589,770 B2 3/2017 Winkler
9,605,342 B2 3/2017 Alokozai et al.
9,605,343 B2 3/2017 Winkler
9,605,736 B1 3/2017 Foshage et al.
9,607,837 B1 3/2017 Namba
D783,351 S 4/2017 Fujino et al.
D784,276 S 4/2017 Tiner et al.
9,613,801 B2 4/2017 Carcasi et al.
9,618,846 B2 4/2017 Shamma et al.

(56) References Cited

U.S. PATENT DOCUMENTS 9,627,221 B1 4/2017 Zaitsu et al.
D785,766 S 5/2017 Sato
D787,458 S 5/2017 Kim et al.
9,640,416 B2 5/2017 Arai
9,640,448 B2 5/2017 Ikegawa et al.
9,640,542 B2 5/2017 Lee et al.
9,644,266 B2 5/2017 Nasu et al.
9,647,114 B2 5/2017 Margetis
9,653,267 B2 5/2017 Carducci et al.
9,657,845 B2 5/2017 Shugrue
9,659,799 B2 5/2017 Lawson
9,663,857 B2 5/2017 Nakano et al.
9,666,528 B1 5/2017 Bergendahl et al.
D789,888 S 6/2017 Jang et al.
D790,041 S 6/2017 Jang et al.
9,680,268 B1 6/2017 Finona
9,684,234 B2 6/2017 Darling et al.
9,685,320 B2 6/2017 Kang et al.
9,691,668 B2 6/2017 Chang et al.
9,691,771 B2 6/2017 Lansalot-Matras
9,698,031 B2 7/2017 Kobayashi et al.
9,708,707 B2 7/2017 Ditizio et al.
9,708,708 B2 7/2017 Isobe et al.
9,711,345 B2 7/2017 Shiba et al.
D793,352 S 8/2017 Hill
D793,526 S 8/2017 Behdjat
D793,572 S 8/2017 Kozuka et al.
D793,976 S 8/2017 Fukushima et al.
D794,753 S 8/2017 Miller
D795,208 S 8/2017 Sasaki et al.
9,735,024 B2 8/2017 Zaitsu
9,741,546 B2 8/2017 Carducci et al.
9,741,559 B2 8/2017 Shimura et al.
9,745,658 B2 8/2017 Kang et al.
9,748,104 B2 8/2017 Sasaki et al.
9,748,145 B1 8/2017 Kannan et al.
D796,458 S 9/2017 Jang et al.
D796,670 S 9/2017 Dolk et al.
D797,067 S 9/2017 Zhang et al.
D798,248 S 9/2017 Hanson et al.
9,754,779 B1 9/2017 Ishikawa
9,754,818 B2 9/2017 Shiu et al.
9,759,489 B2 9/2017 Kaneko
9,765,432 B2 9/2017 Ge et al.
9,773,818 B2 9/2017 Kimura
D800,782 S 10/2017 Bever et al.
9,778,561 B2 10/2017 Marks et al.
9,780,225 B2 10/2017 Venkatasubramanian et al.
9,786,491 B2 10/2017 Suzuki et al.
9,786,570 B2 10/2017 Kang et al.
9,790,595 B2 10/2017 Jung et al.
9,793,115 B2 10/2017 Tolle
9,793,135 B1 10/2017 Zaitsu et al.
9,793,148 B2 10/2017 Yamagishi et al.
9,798,308 B2 10/2017 Mimura
9,799,736 B1 10/2017 Ebrish et al.
9,803,926 B2 10/2017 Kikuchi et al.
D801,942 S 11/2017 Riker et al.
D802,472 S 11/2017 Sasaki et al.
D802,546 S 11/2017 Jang et al.
D803,802 S 11/2017 Sasaki et al.
9,808,246 B2 11/2017 Shelton et al.
9,812,319 B1 11/2017 Fukazawa et al.
9,812,320 B1 11/2017 Pore et al.
9,812,372 B2 11/2017 Choi et al.
9,820,289 B1 11/2017 Pawar et al.
9,824,881 B2 11/2017 Niskanen et al.
9,824,884 B1 11/2017 Sims et al.
9,824,893 B1 11/2017 Smith et al.
9,837,355 B2 12/2017 Briggs et al.
9,842,835 B1 12/2017 Cheng et al.
9,847,221 B1 12/2017 McLaughlin et al.
9,847,247 B2 12/2017 Huang et al.
9,850,573 B1 12/2017 Sun
D807,494 S 1/2018 Kim et al.
D808,254 S 1/2018 Deleu
9,859,151 B1 1/2018 Zhu
9,865,455 B1 1/2018 Sims et al.
9,865,456 B1 1/2018 Pandey et al.
9,865,815 B2 1/2018 Hausmann
9,868,131 B2 1/2018 Kilpi et al.
9,870,964 B1 1/2018 Yoshino et al.
9,875,891 B2 1/2018 Henri et al.
9,875,893 B2 1/2018 Takamure et al.
9,881,788 B2 1/2018 Kim et al.
D810,705 S 2/2018 Krishnan et al.
9,887,082 B1 2/2018 Pore et al.
9,890,456 B2 2/2018 Tolle et al.
9,891,521 B2 2/2018 Kang et al.
9,892,908 B2 2/2018 Pettinger et al.
9,892,913 B2 2/2018 Margetis et al.
9,895,715 B2 2/2018 Haukka et al.
9,896,761 B2 2/2018 Hara et al.
9,899,291 B2 2/2018 Kato
9,899,405 B2 2/2018 Kim
9,905,420 B2 2/2018 Margetis et al.
9,905,492 B2 2/2018 Tang et al.
9,909,214 B2 3/2018 Suemori
9,909,492 B2 3/2018 Jeswine
9,911,595 B1 3/2018 Smith et al.
9,911,676 B2 3/2018 Tang
9,916,980 B1 3/2018 Knaepen
9,920,451 B2 3/2018 Sivaramakrishnan et al.
9,922,824 B2 3/2018 Okada
9,929,005 B1 3/2018 Shimamoto et al.
9,929,011 B2 3/2018 Hawryluk et al.
9,929,055 B2 3/2018 Dube et al.
9,951,421 B2 4/2018 Lind
9,960,033 B1 5/2018 Nozawa
9,960,072 B2 5/2018 Coomer
9,966,299 B2 5/2018 Tang et al.
9,970,112 B2 5/2018 Koshi et al.
9,984,869 B1 5/2018 Blanquart
D819,580 S 6/2018 Krishnan et al.
9,987,747 B2 6/2018 Hwang et al.
9,991,138 B2 6/2018 Lin et al.
9,996,004 B2 6/2018 Smith et al.
9,997,357 B2 6/2018 Arghavani et al.
9,997,373 B2 6/2018 Hudson
10,014,212 B2 7/2018 Chen et al.
10,017,856 B1 7/2018 Arnepalli et al.
10,018,920 B2 7/2018 Chang et al.
10,023,960 B2 7/2018 Alokozai
10,032,628 B2 7/2018 Xie et al.
10,032,792 B2 7/2018 Kim et al.
D825,505 S 8/2018 Hanson et al.
D825,614 S 8/2018 Bever et al.
10,043,661 B2 8/2018 Kato et al.
10,047,435 B2 8/2018 Haukka et al.
10,053,774 B2 8/2018 Tolle et al.
10,060,473 B2 8/2018 Davey et al.
D827,592 S 9/2018 Ichino et al.
D829,306 S 9/2018 Ikedo et al.
10,083,836 B2 9/2018 Milligan
D830,981 S 10/2018 Jeong et al.
10,087,522 B2 10/2018 Raisanen et al.
10,087,525 B2 10/2018 Schmotzer et al.
10,090,316 B2 10/2018 Ootsuka
10,103,040 B1 10/2018 Oosterlaken et al.
10,106,892 B1 10/2018 Siddiqui et al.
RE47,145 E 11/2018 Hashimoto
D834,686 S 11/2018 Yamada et al.
10,121,671 B2 11/2018 Fu et al.
10,134,617 B2 11/2018 Gurary et al.
10,134,757 B2 11/2018 Chun et al.
RE47,170 E 12/2018 Beynet et al.
10,147,600 B2 12/2018 Takamure et al.
10,167,557 B2 1/2019 Hawkins et al.
10,177,024 B2 1/2019 Gomm et al.
10,177,025 B2 1/2019 Pore
10,179,947 B2 1/2019 Fukazawa
10,186,420 B2 1/2019 Fukazawa
10,190,213 B2 1/2019 Zhu et al.
10,190,214 B2 1/2019 Shon et al.

(56) References Cited

U.S. PATENT DOCUMENTS 10,190,701 B2 1/2019 Raj et al.
10,192,734 B2 1/2019 Sanchez et al.
10,193,429 B2 1/2019 Smith et al.
D840,364 S 2/2019 Ichino et al.
10,204,788 B1 2/2019 Ye et al.
10,211,308 B2 2/2019 Zhu et al.
10,229,833 B2 3/2019 Raisanen et al.
10,229,851 B2 3/2019 Briggs et al.
10,229,985 B1 3/2019 Li et al.
10,236,177 B1 3/2019 Kohen et al.
D846,008 S 4/2019 Geldenhuys et al.
10,249,524 B2 4/2019 den Hartog Besselink et al.
10,249,577 B2 4/2019 Lee et al.
10,262,859 B2 4/2019 Margetis et al.
10,269,558 B2 4/2019 Blanquart et al.
10,276,355 B2 4/2019 White et al.
D849,055 S 5/2019 Kneip
D849,662 S 5/2019 Rike
10,283,353 B2 5/2019 Kobayashi et al.
10,287,684 B2 5/2019 Yanai et al.
10,290,508 B1 5/2019 Kubota et al.
10,297,440 B2 5/2019 Yamazaki et al.
RE47,440 E 6/2019 Yudovsky et al.
10,312,055 B2 6/2019 Suzuki
10,312,129 B2 6/2019 Coomer
10,319,588 B2 6/2019 Mattinen et al.
10,322,384 B2 6/2019 Stumpf et al.
10,332,747 B1 6/2019 Watanabe et al.
10,332,963 B1 6/2019 Xie
D855,089 S 7/2019 Hopkins
10,337,103 B2 7/2019 Hyon et al.
10,340,125 B2 7/2019 Winkler
10,340,135 B2 7/2019 Blanquart
10,343,920 B2 7/2019 Haukka
10,347,547 B2 7/2019 Varadarajan et al.
10,354,873 B2 7/2019 Ko et al.
10,361,201 B2 7/2019 Xie et al.
10,361,366 B2 7/2019 Hakamata et al.
10,367,080 B2 7/2019 Tang et al.
10,388,513 B1 8/2019 Blanquart
10,395,917 B2 8/2019 Niskanen et al.
10,395,919 B2 8/2019 Masaru et al.
10,395,963 B2 8/2019 Cooke
D859,136 S 9/2019 Tenander et al.
10,400,335 B2 9/2019 Ge et al.
10,410,943 B2 9/2019 Jiang et al.
10,424,476 B2 9/2019 Suzuki et al.
10,424,477 B2 9/2019 Niskanen et al.
D864,134 S 10/2019 Watarai et al.
10,428,419 B2 10/2019 Huotari et al.
10,435,790 B2 10/2019 Fukazawa et al.
D867,867 S 11/2019 Tenander et al.
10,468,244 B2 11/2019 Li et al.
10,468,251 B2 11/2019 Ishikawa et al.
10,483,154 B1 11/2019 Smith et al.
10,510,529 B2 12/2019 Suzuki et al.
10,510,871 B1 12/2019 More et al.
10,529,554 B2 1/2020 Ishikawa et al.
D876,504 S 2/2020 Lee et al.
10,590,531 B1 3/2020 Shirako et al.
10,590,535 B2 3/2020 Huggare
10,600,637 B2 3/2020 Suzuki et al.
D880,437 S 4/2020 Lee et al.
D881,338 S 4/2020 Chen
10,622,196 B2 4/2020 Nagayama et al.
10,622,236 B2 4/2020 Kuo et al.
10,648,788 B2 5/2020 Boyd et al.
10,662,525 B2 5/2020 Jang et al.
10,704,143 B1 7/2020 Hisamitsu et al.
10,714,335 B2 7/2020 Kim et al.
10,731,249 B2 8/2020 Hatanpää et al.
10,734,497 B2 8/2020 Zhu et al.
10,741,386 B2 8/2020 Chen et al.
10,763,139 B2 9/2020 Shindo
10,770,336 B2 9/2020 Hill et al.
D900,036 S 10/2020 Wuester et al.
D903,477 S 12/2020 Goratela et al.
D913,980 S 3/2021 Lee et al.
D914,620 S 3/2021 Rokkam et al.
10,950,477 B2 3/2021 Lin et al.
11,018,003 B2 5/2021 Huang et al.
D922,229 S 6/2021 Jun et al.
11,053,584 B2 7/2021 Hsieh et al.
11,173,439 B2 11/2021 Cho et al.
11,872,515 B2 1/2024 Cho et al.
11,872,516 B2 1/2024 Cho et al.
2001/0000141 A1 4/2001 Zhou et al.
2001/0001953 A1 5/2001 Griffiths et al.
2001/0002581 A1 6/2001 Nishikawa et al.
2001/0003015 A1 6/2001 Chang et al.
2001/0003191 A1 6/2001 Kovacs et al.
2001/0003271 A1 6/2001 Otsuki
2001/0003892 A1* 6/2001 Rikyuu .............. C23C 16/4412
55/444
2001/0004880 A1 6/2001 Cho et al.
2001/0006070 A1 7/2001 Shang
2001/0007244 A1 7/2001 Matsuse
2001/0007246 A1 7/2001 Ueda et al.
2001/0007645 A1 7/2001 Honma
2001/0014267 A1 8/2001 Yamaga et al.
2001/0014514 A1 8/2001 Geusic
2001/0015343 A1 8/2001 Sprey et al.
2001/0016273 A1 8/2001 Narasimhan et al.
2001/0017103 A1 8/2001 Takeshita et al.
2001/0018267 A1 8/2001 Shinriki et al.
2001/0019347 A1 9/2001 Hauck
2001/0019777 A1 9/2001 Tanaka et al.
2001/0019900 A1 9/2001 Hasegawa
2001/0020715 A1 9/2001 Yamasaki
2001/0021591 A1 9/2001 Srinivasan et al.
2001/0022215 A1 9/2001 Donohoe
2001/0024387 A1 9/2001 Raaijmakers et al.
2001/0027026 A1 10/2001 Dhindsa et al.
2001/0027585 A1 10/2001 Lee
2001/0028924 A1 10/2001 Sherman
2001/0031535 A1 10/2001 Agnello et al.
2001/0031541 A1 10/2001 Madan et al.
2001/0034097 A1 10/2001 Lim et al.
2001/0038783 A1 11/2001 Nakashima et al.
2001/0039922 A1 11/2001 Nakahara
2001/0039966 A1 11/2001 Walpole et al.
2001/0040511 A1 11/2001 Bushner et al.
2001/0041250 A1 11/2001 Werkhoven et al.
2001/0042511 A1 11/2001 Liu et al.
2001/0042514 A1 11/2001 Mizuno et al.
2001/0042594 A1 11/2001 Shamouilian et al.
2001/0046765 A1 11/2001 Cappellani et al.
2001/0047761 A1 12/2001 Wijck et al.
2001/0048981 A1 12/2001 Suzuki
2001/0049080 A1 12/2001 Asano
2001/0049202 A1 12/2001 Maeda et al.
2001/0052556 A1 12/2001 Ting et al.
2001/0054381 A1 12/2001 Umotoy et al.
2001/0054388 A1 12/2001 Qian
2002/0000195 A1 1/2002 Bang et al.
2002/0000202 A1 1/2002 Yuda et al.
2002/0001971 A1 1/2002 Cho
2002/0001974 A1 1/2002 Chan
2002/0001976 A1 1/2002 Danek
2002/0005400 A1 1/2002 Gat et al.
2002/0005943 A1 1/2002 Voinalovich
2002/0008270 A1 1/2002 Marsh
2002/0009119 A1 1/2002 Matthew et al.
2002/0009560 A1 1/2002 Ozono
2002/0009861 A1 1/2002 Narwankar et al.
2002/0011210 A1 1/2002 Satoh et al.
2002/0011211 A1 1/2002 Halpin
2002/0011310 A1 1/2002 Kamarehi et al.
2002/0013792 A1 1/2002 Imielinski et al.
2002/0014204 A1 2/2002 Pyo
2002/0014483 A1 2/2002 Suzuki et al.
2002/0015853 A1 2/2002 Wataya et al.
2002/0016829 A1 2/2002 Defosse
2002/0020429 A1 2/2002 Selbrede et al.

(56) References Cited

U.S. PATENT DOCUMENTS

| | | | |
|---|---|---|---|
| 2002/0022347 | A1 | 2/2002 | Park et al. |
| 2002/0023677 | A1 | 2/2002 | Zheng |
| 2002/0025688 | A1 | 2/2002 | Kato |
| 2002/0027945 | A1 | 3/2002 | Hirano et al. |
| 2002/0030047 | A1 | 3/2002 | Shao et al. |
| 2002/0031644 | A1 | 3/2002 | Malofsky et al. |
| 2002/0033183 | A1 | 3/2002 | Sun et al. |
| 2002/0036065 | A1 | 3/2002 | Yamagishi et al. |
| 2002/0041931 | A1 | 4/2002 | Suntola et al. |
| 2002/0043337 | A1 | 4/2002 | Goodman et al. |
| 2002/0045336 | A1 | 4/2002 | Locati et al. |
| 2002/0047705 | A1 | 4/2002 | Tada et al. |
| 2002/0048634 | A1 | 4/2002 | Basceri |
| 2002/0050648 | A1 | 5/2002 | Kishida et al. |
| 2002/0052119 | A1 | 5/2002 | Cleemput |
| 2002/0061716 | A1 | 5/2002 | Korovin et al. |
| 2002/0062633 | A1 | 5/2002 | Denker et al. |
| 2002/0064592 | A1 | 5/2002 | Datta et al. |
| 2002/0064598 | A1 | 5/2002 | Wang et al. |
| 2002/0066532 | A1 | 6/2002 | Shih et al. |
| 2002/0068458 | A1 | 6/2002 | Chiang et al. |
| 2002/0069222 | A1 | 6/2002 | McNeely |
| 2002/0073922 | A1 | 6/2002 | Frankel et al. |
| 2002/0073923 | A1 | 6/2002 | Saito et al. |
| 2002/0076490 | A1 | 6/2002 | Chiang et al. |
| 2002/0076507 | A1 | 6/2002 | Chiang et al. |
| 2002/0076944 | A1 | 6/2002 | Wang et al. |
| 2002/0078893 | A1 | 6/2002 | Van Os et al. |
| 2002/0079056 | A1 | 6/2002 | Kudo et al. |
| 2002/0079714 | A1 | 6/2002 | Soucy et al. |
| 2002/0081826 | A1 | 6/2002 | Rotondaro et al. |
| 2002/0084185 | A1 | 7/2002 | Sundberg |
| 2002/0086501 | A1 | 7/2002 | O'Donnell et al. |
| 2002/0088542 | A1 | 7/2002 | Nishikawa et al. |
| 2002/0090735 | A1 | 7/2002 | Kishkovich et al. |
| 2002/0094378 | A1 | 7/2002 | O'Donnell et al. |
| 2002/0094388 | A1 | 7/2002 | Fonash et al. |
| 2002/0096211 | A1 | 7/2002 | Zheng |
| 2002/0098627 | A1 | 7/2002 | Pomarede et al. |
| 2002/0099470 | A1 | 7/2002 | Zinger et al. |
| 2002/0100418 | A1 | 8/2002 | Sandhu et al. |
| 2002/0104481 | A1 | 8/2002 | Chiang et al. |
| 2002/0104751 | A1 | 8/2002 | Drewery et al. |
| 2002/0106909 | A1 | 8/2002 | Kato et al. |
| 2002/0108570 | A1 | 8/2002 | Lindfors |
| 2002/0108670 | A1 | 8/2002 | Baker et al. |
| 2002/0108714 | A1 | 8/2002 | Doering et al. |
| 2002/0109115 | A1 | 8/2002 | Cederstav et al. |
| 2002/0110695 | A1 | 8/2002 | Yang et al. |
| 2002/0110991 | A1 | 8/2002 | Li |
| 2002/0112114 | A1 | 8/2002 | Blair et al. |
| 2002/0114886 | A1 | 8/2002 | Chou et al. |
| 2002/0115252 | A1 | 8/2002 | Haukka et al. |
| 2002/0117113 | A1 | 8/2002 | Tsuruno et al. |
| 2002/0117262 | A1 | 8/2002 | Pang et al. |
| 2002/0122885 | A1 | 9/2002 | Ahn |
| 2002/0123200 | A1 | 9/2002 | Yamamoto et al. |
| 2002/0123230 | A1 | 9/2002 | Hubacek |
| 2002/0123237 | A1 | 9/2002 | Nguyen et al. |
| 2002/0124883 | A1 | 9/2002 | Zheng |
| 2002/0124906 | A1 | 9/2002 | Suzuki et al. |
| 2002/0127350 | A1 | 9/2002 | Ishikawa et al. |
| 2002/0127956 | A1 | 9/2002 | Ashjaee et al. |
| 2002/0129768 | A1 | 9/2002 | Carpenter et al. |
| 2002/0132408 | A1 | 9/2002 | Ma et al. |
| 2002/0134244 | A1 | 9/2002 | Gu |
| 2002/0134511 | A1 | 9/2002 | Ushioda et al. |
| 2002/0136214 | A1 | 9/2002 | Do et al. |
| 2002/0136909 | A1 | 9/2002 | Yang |
| 2002/0139775 | A1 | 10/2002 | Chang |
| 2002/0146512 | A1 | 10/2002 | Rossman |
| 2002/0151327 | A1 | 10/2002 | Levitt |
| 2002/0152244 | A1 | 10/2002 | Dean et al. |
| 2002/0155219 | A1 | 10/2002 | Wang et al. |
| 2002/0155708 | A1 | 10/2002 | Lo et al. |
| 2002/0157611 | A1 | 10/2002 | Bondestam et al. |
| 2002/0160112 | A1 | 10/2002 | Sakai et al. |
| 2002/0164420 | A1 | 11/2002 | Derderian et al. |
| 2002/0164423 | A1 | 11/2002 | Chiang et al. |
| 2002/0168870 | A1 | 11/2002 | Matsuki |
| 2002/0170676 | A1 | 11/2002 | Mitrovic et al. |
| 2002/0172768 | A1 | 11/2002 | Endo et al. |
| 2002/0174106 | A1 | 11/2002 | Martin |
| 2002/0179011 | A1 | 12/2002 | Jonnalagadda et al. |
| 2002/0181612 | A1 | 12/2002 | Warble et al. |
| 2002/0184111 | A1 | 12/2002 | Swanson |
| 2002/0187650 | A1 | 12/2002 | Blalock et al. |
| 2002/0187656 | A1 | 12/2002 | Tan et al. |
| 2002/0188376 | A1 | 12/2002 | Derderian et al. |
| 2002/0192370 | A1 | 12/2002 | Metzner et al. |
| 2002/0197402 | A1 | 12/2002 | Chiang et al. |
| 2002/0197849 | A1 | 12/2002 | Mandal |
| 2003/0000647 | A1 | 1/2003 | Yudovsky et al. |
| 2003/0002562 | A1 | 1/2003 | Yerlikaya et al. |
| 2003/0003607 | A1 | 1/2003 | Kagoshima |
| 2003/0003635 | A1 | 1/2003 | Paranjpe et al. |
| 2003/0003696 | A1 | 1/2003 | Gelatos et al. |
| 2003/0003719 | A1 | 1/2003 | Lim et al. |
| 2003/0008528 | A1 | 1/2003 | Xia et al. |
| 2003/0008602 | A1 | 1/2003 | Ashjaee et al. |
| 2003/0010355 | A1 | 1/2003 | Nowak et al. |
| 2003/0010451 | A1 | 1/2003 | Tzu |
| 2003/0010452 | A1 | 1/2003 | Park et al. |
| 2003/0012632 | A1 | 1/2003 | Saeki |
| 2003/0013314 | A1 | 1/2003 | Ying et al. |
| 2003/0015141 | A1 | 1/2003 | Takagi |
| 2003/0015294 | A1 | 1/2003 | Wang |
| 2003/0015596 | A1 | 1/2003 | Evans |
| 2003/0017265 | A1 | 1/2003 | Basceri et al. |
| 2003/0017266 | A1 | 1/2003 | Basceri et al. |
| 2003/0017268 | A1 | 1/2003 | Hu |
| 2003/0019428 | A1 | 1/2003 | Ku et al. |
| 2003/0019580 | A1 | 1/2003 | Strang |
| 2003/0022468 | A1 | 1/2003 | Shioya et al. |
| 2003/0022523 | A1 | 1/2003 | Irino et al. |
| 2003/0023338 | A1 | 1/2003 | Chin et al. |
| 2003/0024901 | A1 | 2/2003 | Ishikawa |
| 2003/0025146 | A1 | 2/2003 | Narwankar et al. |
| 2003/0026904 | A1 | 2/2003 | Yadav et al. |
| 2003/0027431 | A1 | 2/2003 | Sneh et al. |
| 2003/0029303 | A1 | 2/2003 | Hasegawa et al. |
| 2003/0029381 | A1 | 2/2003 | Nishibayashi |
| 2003/0029475 | A1 | 2/2003 | Hua et al. |
| 2003/0029563 | A1 | 2/2003 | Kaushal et al. |
| 2003/0032297 | A1 | 2/2003 | Lindstrom et al. |
| 2003/0035002 | A1 | 2/2003 | Moles |
| 2003/0035705 | A1 | 2/2003 | Johnson |
| 2003/0036272 | A1 | 2/2003 | Shamouilian et al. |
| 2003/0037800 | A1 | 2/2003 | Bailey et al. |
| 2003/0040120 | A1 | 2/2003 | Allen et al. |
| 2003/0040158 | A1 | 2/2003 | Saitoh |
| 2003/0040196 | A1 | 2/2003 | Lim et al. |
| 2003/0040841 | A1 | 2/2003 | Nasr et al. |
| 2003/0041971 | A1 | 3/2003 | Kido et al. |
| 2003/0042419 | A1 | 3/2003 | Katsumata et al. |
| 2003/0045961 | A1 | 3/2003 | Nakao |
| 2003/0049372 | A1 | 3/2003 | Cook et al. |
| 2003/0049375 | A1 | 3/2003 | Nguyen et al. |
| 2003/0049499 | A1 | 3/2003 | Murakawa et al. |
| 2003/0049571 | A1 | 3/2003 | Hallock et al. |
| 2003/0049580 | A1 | 3/2003 | Goodman |
| 2003/0049937 | A1 | 3/2003 | Suzuki |
| 2003/0054670 | A1 | 3/2003 | Wang et al. |
| 2003/0056726 | A1 | 3/2003 | Holst et al. |
| 2003/0057848 | A1 | 3/2003 | Yuasa et al. |
| 2003/0059535 | A1 | 3/2003 | Luo et al. |
| 2003/0059980 | A1 | 3/2003 | Chen et al. |
| 2003/0062359 | A1 | 4/2003 | Ho et al. |
| 2003/0065413 | A1 | 4/2003 | Liteplo et al. |
| 2003/0066482 | A1 | 4/2003 | Pokharna et al. |
| 2003/0066541 | A1 | 4/2003 | Sun et al. |
| 2003/0066826 | A1 | 4/2003 | Lee et al. |
| 2003/0070617 | A1 | 4/2003 | Kim et al. |
| 2003/0071015 | A1 | 4/2003 | Chinn et al. |

(56) References Cited

U.S. PATENT DOCUMENTS

2003/0072882 A1 4/2003 Niinisto et al.
2003/0075107 A1 4/2003 Miyano et al.
2003/0075925 A1 4/2003 Lindfors et al.
2003/0077857 A1 4/2003 Xia et al.
2003/0077883 A1 4/2003 Ohtake
2003/0082296 A1 5/2003 Elers et al.
2003/0082307 A1 5/2003 Chung et al.
2003/0085663 A1 5/2003 Horsky
2003/0091938 A1 5/2003 Fairbairn et al.
2003/0094133 A1 5/2003 Yoshidome et al.
2003/0101938 A1 6/2003 Ronsse et al.
2003/0109107 A1 6/2003 Hsieh et al.
2003/0109951 A1 6/2003 Hsiung et al.
2003/0111012 A1 6/2003 Takeshima
2003/0111013 A1 6/2003 Oosterlaken et al.
2003/0111963 A1 6/2003 Tolmachev et al.
2003/0113995 A1 6/2003 Xia et al.
2003/0116087 A1 6/2003 Nguyen
2003/0121608 A1 7/2003 Chen
2003/0124792 A1 7/2003 Jeon et al.
2003/0124818 A1 7/2003 Luo et al.
2003/0124820 A1 7/2003 Johnsgard et al.
2003/0124842 A1 7/2003 Hytros et al.
2003/0127049 A1 7/2003 Han et al.
2003/0132319 A1 7/2003 Hytros et al.
2003/0133854 A1 7/2003 Tabata et al.
2003/0134038 A1 7/2003 Paranjpe
2003/0140851 A1 7/2003 Janakiraman et al.
2003/0141527 A1 7/2003 Joo et al.
2003/0141820 A1 7/2003 White et al.
2003/0143328 A1 7/2003 Chen
2003/0143846 A1 7/2003 Sekiya et al.
2003/0145789 A1 8/2003 Bauch et al.
2003/0149506 A1 8/2003 Haanstra et al.
2003/0150386 A1 8/2003 Shimada
2003/0153177 A1 8/2003 Tepman et al.
2003/0153186 A1 8/2003 Bar-Gadda
2003/0157345 A1 8/2003 Beldi et al.
2003/0157432 A1 8/2003 Rottsegge
2003/0157436 A1 8/2003 Manger et al.
2003/0159653 A1 8/2003 Dando et al.
2003/0159656 A1 8/2003 Tan
2003/0162412 A1 8/2003 Chung
2003/0168001 A1 9/2003 Sneh
2003/0168008 A1 9/2003 Ohmi et al.
2003/0168012 A1 9/2003 Tamura et al.
2003/0168174 A1 9/2003 Foree
2003/0168699 A1 9/2003 Honda
2003/0168750 A1 9/2003 Basceri et al.
2003/0168948 A1 9/2003 Yamagishi et al.
2003/0170153 A1 9/2003 Bar-Gadda
2003/0170583 A1 9/2003 Nakashima
2003/0170945 A1 9/2003 Igeta et al.
2003/0173030 A1 9/2003 Ishii et al.
2003/0173490 A1 9/2003 Lappen
2003/0176074 A1 9/2003 Paterson et al.
2003/0178145 A1 9/2003 Anderson et al.
2003/0180458 A1 9/2003 Sneh
2003/0181065 A1 9/2003 O'Donnell
2003/0183156 A1 10/2003 Dando
2003/0183856 A1 10/2003 Wieczorek et al.
2003/0188682 A1 10/2003 Tois et al.
2003/0188685 A1 10/2003 Wang
2003/0190804 A1 10/2003 Glenn et al.
2003/0192875 A1 10/2003 Bieker et al.
2003/0198587 A1 10/2003 Kaloyeros
2003/0200926 A1 10/2003 Dando et al.
2003/0201541 A1 10/2003 Kim
2003/0205096 A1 11/2003 Gehner et al.
2003/0205202 A1 11/2003 Funaki et al.
2003/0205237 A1 11/2003 Sakuma
2003/0205327 A1 11/2003 Howald et al.
2003/0207032 A1 11/2003 Ahn et al.
2003/0209323 A1 11/2003 Yokogaki
2003/0209326 A1 11/2003 Lee et al.
2003/0209746 A1 11/2003 Horii
2003/0210901 A1 11/2003 Donald et al.
2003/0211735 A1 11/2003 Rossman
2003/0213435 A1 11/2003 Okuda et al.
2003/0213560 A1 11/2003 Wang et al.
2003/0213562 A1 11/2003 Gondhalekar et al.
2003/0215963 A1 11/2003 AmRhein et al.
2003/0217915 A1 11/2003 Ouellet
2003/0219972 A1 11/2003 Green
2003/0221780 A1 12/2003 Lei et al.
2003/0226840 A1 12/2003 Dalton
2003/0228772 A1 12/2003 Cowans
2003/0230986 A1 12/2003 Horsky et al.
2003/0231698 A1 12/2003 Yamaguchi
2003/0232138 A1 12/2003 Tuominen et al.
2003/0232491 A1 12/2003 Yamaguchi
2003/0232497 A1 12/2003 Xi et al.
2003/0232511 A1 12/2003 Metzner et al.
2003/0234371 A1 12/2003 Ziegler
2004/0002224 A1 1/2004 Chono et al.
2004/0005147 A1 1/2004 Wang et al.
2004/0005753 A1 1/2004 Kostamo et al.
2004/0009307 A1 1/2004 Koh et al.
2004/0009679 A1 1/2004 Yeo et al.
2004/0010772 A1 1/2004 McKenna et al.
2004/0011504 A1 1/2004 Ku et al.
2004/0013577 A1 1/2004 Ganguli et al.
2004/0013818 A1 1/2004 Moon et al.
2004/0015300 A1 1/2004 Ganguli et al.
2004/0016637 A1 1/2004 Yang
2004/0018304 A1 1/2004 Chung et al.
2004/0018307 A1 1/2004 Park et al.
2004/0018694 A1 1/2004 Lee et al.
2004/0018723 A1 1/2004 Byun et al.
2004/0018750 A1 1/2004 Sophie et al.
2004/0023125 A1 2/2004 Nozawa et al.
2004/0023516 A1 2/2004 Londergan et al.
2004/0025786 A1 2/2004 Kontani et al.
2004/0025787 A1 2/2004 Selbrede et al.
2004/0026372 A1 2/2004 Takenaka et al.
2004/0029052 A1 2/2004 Park et al.
2004/0031564 A1 2/2004 Gottscho et al.
2004/0035358 A1 2/2004 Basceri et al.
2004/0036129 A1 2/2004 Forbes et al.
2004/0037339 A1 2/2004 Watson et al.
2004/0037675 A1 2/2004 Zinger et al.
2004/0038525 A1 2/2004 Meng et al.
2004/0043149 A1 3/2004 Gordon et al.
2004/0043544 A1 3/2004 Asai et al.
2004/0048439 A1 3/2004 Soman
2004/0048452 A1 3/2004 Sugawara et al.
2004/0048492 A1 3/2004 Ishikawa et al.
2004/0050325 A1 3/2004 Samoilov
2004/0050496 A1 3/2004 Iwai et al.
2004/0052972 A1 3/2004 Schmitt
2004/0056017 A1 3/2004 Renken
2004/0058517 A1 3/2004 Nallan et al.
2004/0062081 A1 4/2004 Drewes
2004/0063289 A1 4/2004 Ohta
2004/0065255 A1 4/2004 Yang et al.
2004/0069226 A1 4/2004 Yoshida et al.
2004/0071897 A1 4/2004 Verplancken et al.
2004/0077182 A1 4/2004 Lim et al.
2004/0079286 A1 4/2004 Lindfors
2004/0079960 A1 4/2004 Shakuda
2004/0080697 A1 4/2004 Song
2004/0082171 A1 4/2004 Shin et al.
2004/0083961 A1 5/2004 Basceri
2004/0083962 A1 5/2004 Bang et al.
2004/0083964 A1 5/2004 Ingle et al.
2004/0083975 A1 5/2004 Tong et al.
2004/0087141 A1 5/2004 Ramanathan et al.
2004/0087168 A1 5/2004 Granneman et al.
2004/0089078 A1 5/2004 Gehner et al.
2004/0089236 A1 5/2004 Yokogawa et al.
2004/0092073 A1 5/2004 Cabral et al.
2004/0092120 A1 5/2004 Wicker
2004/0093963 A1 5/2004 Gehner et al.
2004/0094206 A1 5/2004 Ishida

(56) References Cited

U.S. PATENT DOCUMENTS

2004/0094402 A1 5/2004 Gopalraja
2004/0095074 A1 5/2004 Ishii et al.
2004/0099213 A1 5/2004 Adomaitis et al.
2004/0099635 A1 5/2004 Nishikawa
2004/0101622 A1 5/2004 Park et al.
2004/0103914 A1 6/2004 Cheng et al.
2004/0104439 A1 6/2004 Haukka et al.
2004/0105738 A1 6/2004 Ahn et al.
2004/0106249 A1 6/2004 Huotari
2004/0112288 A1 6/2004 Whitesell
2004/0115936 A1 6/2004 DePetrillo et al.
2004/0118342 A1 6/2004 Cheng et al.
2004/0121620 A1 6/2004 Pomarede et al.
2004/0124131 A1 7/2004 Aitchison
2004/0124549 A1 7/2004 Curran
2004/0126213 A1 7/2004 Pelzmann et al.
2004/0126929 A1 7/2004 Tang et al.
2004/0126990 A1 7/2004 Ohta
2004/0127069 A1 7/2004 Yamazaki et al.
2004/0129211 A1 7/2004 Blonigan et al.
2004/0129671 A1 7/2004 Ji et al.
2004/0134429 A1 7/2004 Yamanaka
2004/0137756 A1 7/2004 Li et al.
2004/0142577 A1 7/2004 Sugawara et al.
2004/0144311 A1 7/2004 Chen
2004/0144323 A1 7/2004 Kai
2004/0144980 A1 7/2004 Ahn et al.
2004/0146644 A1 7/2004 Xia et al.
2004/0151844 A1 8/2004 Zhang et al.
2004/0151845 A1 8/2004 Nguyen et al.
2004/0152287 A1 8/2004 Sherrill et al.
2004/0154746 A1 8/2004 Park
2004/0159343 A1 8/2004 Shimbara et al.
2004/0163590 A1 8/2004 Tran et al.
2004/0166037 A1 8/2004 Youdell
2004/0168627 A1 9/2004 Conley et al.
2004/0168742 A1 9/2004 Kim et al.
2004/0168769 A1 9/2004 Matsuoka et al.
2004/0169032 A1 9/2004 Murayama et al.
2004/0185177 A1 9/2004 Basceri et al.
2004/0187304 A1 9/2004 Chen et al.
2004/0187777 A1 9/2004 Okamoto et al.
2004/0187784 A1 9/2004 Sferlazzo
2004/0187790 A1 9/2004 Bader
2004/0187928 A1 9/2004 Ambrosina
2004/0198069 A1 10/2004 Metzner et al.
2004/0200499 A1 10/2004 Harvey et al.
2004/0202786 A1 10/2004 Wongsenakhum et al.
2004/0203251 A1 10/2004 Kawaguchi et al.
2004/0206305 A1 10/2004 Choi et al.
2004/0208228 A1 10/2004 Hashikura et al.
2004/0209477 A1 10/2004 Buxbaum et al.
2004/0211357 A1 10/2004 Gadgil
2004/0212947 A1 10/2004 Nguyen
2004/0213921 A1 10/2004 Leu
2004/0214399 A1 10/2004 Ahn et al.
2004/0214445 A1 10/2004 Shimizu et al.
2004/0217217 A1 11/2004 Han et al.
2004/0219793 A1 11/2004 Hishiya et al.
2004/0220699 A1 11/2004 Heden et al.
2004/0221807 A1 11/2004 Verghese et al.
2004/0221808 A1 11/2004 Kawano
2004/0223893 A1 11/2004 Tabata et al.
2004/0224478 A1 11/2004 Chudzik et al.
2004/0226507 A1 11/2004 Carpenter et al.
2004/0226515 A1 11/2004 Yendler et al.
2004/0228968 A1 11/2004 Basceri
2004/0231600 A1 11/2004 Lee
2004/0231799 A1 11/2004 Lee et al.
2004/0238523 A1 12/2004 Kuibira et al.
2004/0241322 A1 12/2004 Basceri et al.
2004/0241341 A1 12/2004 Lin
2004/0241998 A1 12/2004 Hanson
2004/0245091 A1 12/2004 Karim et al.
2004/0247779 A1 12/2004 Selvamanickam et al.
2004/0250600 A1 12/2004 Bevers et al.
2004/0253790 A1 12/2004 Ootsuka
2004/0253867 A1 12/2004 Matsumoto
2004/0261492 A1 12/2004 Zarkar et al.
2004/0261706 A1 12/2004 Lindfors et al.
2004/0261712 A1 12/2004 Hayashi et al.
2004/0261946 A1 12/2004 Endoh et al.
2004/0266011 A1 12/2004 Lee et al.
2005/0000428 A1 1/2005 Shero et al.
2005/0001062 A1 1/2005 McCracken et al.
2005/0003089 A1 1/2005 Won et al.
2005/0003600 A1 1/2005 Kasai et al.
2005/0003662 A1 1/2005 Jurisch et al.
2005/0006682 A1 1/2005 Bae et al.
2005/0008799 A1 1/2005 Tomiyasu et al.
2005/0009325 A1 1/2005 Chung et al.
2005/0016452 A1 1/2005 Ryu et al.
2005/0016470 A1 1/2005 Kang et al.
2005/0016956 A1 1/2005 Liu et al.
2005/0017272 A1 1/2005 Yamashita et al.
2005/0019026 A1 1/2005 Wang et al.
2005/0019494 A1 1/2005 Moghadam et al.
2005/0019960 A1 1/2005 Lee et al.
2005/0020071 A1 1/2005 Sonobe et al.
2005/0023231 A1 2/2005 Huang et al.
2005/0023624 A1 2/2005 Ahn et al.
2005/0026402 A1 2/2005 Jurgensen
2005/0033075 A1 2/2005 Chi et al.
2005/0034664 A1 2/2005 Koh et al.
2005/0034674 A1 2/2005 Ono
2005/0037154 A1 2/2005 Koh et al.
2005/0037578 A1 2/2005 Chen et al.
2005/0037610 A1 2/2005 Cha
2005/0037619 A1 2/2005 Granneman et al.
2005/0040144 A1 2/2005 Sellers
2005/0042778 A1 2/2005 Peukert
2005/0046825 A1 3/2005 Powell et al.
2005/0048797 A1 3/2005 Fukazawa
2005/0051093 A1 3/2005 Makino et al.
2005/0051100 A1 3/2005 Chiang et al.
2005/0051854 A1 3/2005 Cabral et al.
2005/0054175 A1 3/2005 Bauer
2005/0054198 A1 3/2005 Um
2005/0054228 A1 3/2005 March
2005/0056218 A1 3/2005 Sun et al.
2005/0056780 A1 3/2005 Miller et al.
2005/0059261 A1 3/2005 Basceri et al.
2005/0059262 A1 3/2005 Yin et al.
2005/0059264 A1 3/2005 Cheung
2005/0061964 A1 3/2005 Nagano et al.
2005/0062773 A1 3/2005 Fouet
2005/0063451 A1 3/2005 Abe et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070128 A1 3/2005 Xia et al.
2005/0070729 A1 3/2005 Kiyomori et al.
2005/0072357 A1 4/2005 Shero et al.
2005/0074576 A1 4/2005 Chaiken et al.
2005/0074983 A1 4/2005 Shinriki et al.
2005/0079124 A1 4/2005 Sanderson
2005/0079691 A1 4/2005 Kim et al.
2005/0081786 A1 4/2005 Kubista et al.
2005/0085090 A1 4/2005 Mui et al.
2005/0090123 A1 4/2005 Nishimura et al.
2005/0092247 A1 5/2005 Schmidt
2005/0092249 A1 5/2005 Kilpela et al.
2005/0092439 A1 5/2005 Keeton et al.
2005/0092733 A1 5/2005 Ito et al.
2005/0095770 A1 5/2005 Kumagai et al.
2005/0095779 A1 5/2005 Park et al.
2005/0095859 A1 5/2005 Chen et al.
2005/0098107 A1 5/2005 Du Bois et al.
2005/0100669 A1 5/2005 Kools et al.
2005/0101154 A1 5/2005 Huang
2005/0101843 A1 5/2005 Quinn et al.
2005/0104112 A1 5/2005 Haukka et al.

(56) References Cited

U.S. PATENT DOCUMENTS

2005/0106762 A1 5/2005 Chakrapani et al.
2005/0106893 A1 5/2005 Wilk
2005/0107627 A1 5/2005 Dussarrat et al.
2005/0109461 A1 5/2005 Sun
2005/0110069 A1 5/2005 Kil et al.
2005/0112282 A1 5/2005 Gordon et al.
2005/0115946 A1 6/2005 Shim et al.
2005/0118804 A1 6/2005 Byun et al.
2005/0118837 A1 6/2005 Todd
2005/0120805 A1 6/2005 Lane
2005/0120962 A1 6/2005 Ushioda et al.
2005/0121145 A1 6/2005 Du Bois et al.
2005/0123690 A1 6/2005 Derderian et al.
2005/0130427 A1 6/2005 Seok-Jun
2005/0132957 A1 6/2005 El-Raghy
2005/0133160 A1 6/2005 Kennedy et al.
2005/0133161 A1 6/2005 Carpenter et al.
2005/0133166 A1 6/2005 Satitpunwaycha et al.
2005/0136188 A1 6/2005 Chang
2005/0136657 A1 6/2005 Yokoi et al.
2005/0139160 A1 6/2005 Lei et al.
2005/0141591 A1 6/2005 Sakano
2005/0142361 A1 6/2005 Nakanishi
2005/0145338 A1 7/2005 Park et al.
2005/0148162 A1 7/2005 Chen et al.
2005/0150601 A1 7/2005 Srivastava
2005/0151184 A1 7/2005 Lee et al.
2005/0153571 A1 7/2005 Senzaki
2005/0153573 A1 7/2005 Okudaira et al.
2005/0160987 A1 7/2005 Kasai et al.
2005/0161434 A1 7/2005 Sugawara et al.
2005/0164469 A1 7/2005 Haupt
2005/0170306 A1 8/2005 Oosterlaken et al.
2005/0172895 A1 8/2005 Kijima et al.
2005/0173003 A1 8/2005 Laverdiere et al.
2005/0175789 A1 8/2005 Helms
2005/0178333 A1 8/2005 Loke et al.
2005/0181535 A1 8/2005 Yun et al.
2005/0181555 A1 8/2005 Haukka et al.
2005/0183827 A1 8/2005 White et al.
2005/0186688 A1 8/2005 Basceri
2005/0187647 A1 8/2005 Wang et al.
2005/0191828 A1 9/2005 Al-Bayati et al.
2005/0193948 A1 9/2005 Oohirabaru et al.
2005/0193952 A1 9/2005 Goodman et al.
2005/0199013 A1 9/2005 Vandroux et al.
2005/0199342 A1 9/2005 Shajii et al.
2005/0201908 A1 9/2005 Nakamura et al.
2005/0208217 A1 9/2005 Shinriki et al.
2005/0208219 A1 9/2005 Basceri
2005/0208718 A1 9/2005 Lim et al.
2005/0208778 A1 9/2005 Li
2005/0211167 A1 9/2005 Gunji
2005/0211384 A1 9/2005 Hayashi
2005/0212119 A1 9/2005 Shero
2005/0214457 A1 9/2005 Schmitt et al.
2005/0214458 A1 9/2005 Meiere
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda et al.
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0285208 A1 12/2005 Ren et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0008997 A1 1/2006 Jang et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019495 A1 1/2006 Marcadal et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057799 A1 3/2006 Horiguchi et al.
2006/0057828 A1 3/2006 Omura
2006/0057858 A1 3/2006 Chung et al.
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0097220 A1 5/2006 Kim et al.
2006/0097305 A1 5/2006 Lee
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110930 A1 5/2006 Senzaki

(56) References Cited

U.S. PATENT DOCUMENTS

2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0115589 A1 6/2006 Vukovic
2006/0118240 A1 6/2006 Holber et al.
2006/0118241 A1 6/2006 Ohmi et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130751 A1 6/2006 Volfovski et al.
2006/0130767 A1 6/2006 Herchen
2006/0133955 A1 6/2006 Peters
2006/0137608 A1 6/2006 Choi et al.
2006/0137609 A1 6/2006 Puchacz et al.
2006/0141155 A1 6/2006 Gordon et al.
2006/0141758 A1 6/2006 Naumann et al.
2006/0144820 A1 7/2006 Sawin et al.
2006/0147626 A1 7/2006 Blomberg
2006/0148151 A1 7/2006 Murthy et al.
2006/0148180 A1 7/2006 Ahn et al.
2006/0151117 A1 7/2006 Kasanami et al.
2006/0154424 A1 7/2006 Yang et al.
2006/0156979 A1 7/2006 Thakur et al.
2006/0156981 A1 7/2006 Fondurulia
2006/0162658 A1 7/2006 Weidman
2006/0162661 A1 7/2006 Jung et al.
2006/0162863 A1 7/2006 Kim et al.
2006/0163612 A1 7/2006 Kouvetakis et al.
2006/0163683 A1 7/2006 Roth et al.
2006/0165892 A1 7/2006 Weidman
2006/0166428 A1 7/2006 Kamioka
2006/0172531 A1 8/2006 Lin et al.
2006/0175669 A1 8/2006 Kim et al.
2006/0176928 A1 8/2006 Nakamura et al.
2006/0177855 A1 8/2006 Utermohlen
2006/0182885 A1 8/2006 Lei et al.
2006/0185589 A1 8/2006 Zehavi et al.
2006/0188360 A1 8/2006 Bonora et al.
2006/0191555 A1 8/2006 Yoshida et al.
2006/0193979 A1 8/2006 Meiere et al.
2006/0193980 A1 8/2006 Hasegawa
2006/0196418 A1 9/2006 Lindfors et al.
2006/0196420 A1 9/2006 Ushakov et al.
2006/0196421 A1 9/2006 Ronsse et al.
2006/0199357 A1 9/2006 Wan et al.
2006/0205194 A1 9/2006 Bauer
2006/0205223 A1 9/2006 Smayling
2006/0205231 A1 9/2006 Chou et al.
2006/0208215 A1 9/2006 Metzner et al.
2006/0211224 A1 9/2006 Matsuda
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0213441 A1 9/2006 Kobrin et al.
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0223337 A1 10/2006 Ahn et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0228898 A1 10/2006 Wajda
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249175 A1 11/2006 Nowak et al.
2006/0249253 A1 11/2006 Dando
2006/0251827 A1 11/2006 Nowak
2006/0252228 A1 11/2006 Jeng
2006/0252244 A1 11/2006 Vaartstra et al.
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0026654 A1 2/2007 Huotari et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0065597 A1 3/2007 Kaido et al.
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.

(56) References Cited

U.S. PATENT DOCUMENTS

2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087515 A1 4/2007 Yieh et al.
2007/0087579 A1 4/2007 Kitayama et al.
2007/0089670 A1 4/2007 Ikedo
2007/0092696 A1 4/2007 Tsukatani et al.
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111030 A1 5/2007 Nakano et al.
2007/0111470 A1 5/2007 Smythe
2007/0111545 A1 5/2007 Lee et al.
2007/0113788 A1 5/2007 Nozawa et al.
2007/0116872 A1 5/2007 Li et al.
2007/0116873 A1 5/2007 Li et al.
2007/0116887 A1 5/2007 Faguet
2007/0116888 A1 5/2007 Faguet
2007/0119370 A1 5/2007 Ma et al.
2007/0120275 A1 5/2007 Liu
2007/0123037 A1 5/2007 Lee et al.
2007/0123060 A1 5/2007 Rahtu
2007/0123189 A1 5/2007 Saito et al.
2007/0125762 A1 6/2007 Cui et al.
2007/0128538 A1 6/2007 Fairbairn et al.
2007/0128570 A1 6/2007 Goto et al.
2007/0128858 A1 6/2007 Haukka et al.
2007/0128876 A1 6/2007 Fukiage
2007/0128888 A1 6/2007 Goto et al.
2007/0129621 A1 6/2007 Kellogg et al.
2007/0131168 A1 6/2007 Gomi et al.
2007/0134821 A1 6/2007 Thakur et al.
2007/0134919 A1 6/2007 Gunji et al.
2007/0134942 A1 6/2007 Ahn et al.
2007/0137794 A1 6/2007 Qiu et al.
2007/0144442 A1 6/2007 Migita
2007/0146621 A1 6/2007 Yeom
2007/0148347 A1 6/2007 Hatanpaa et al.
2007/0148350 A1 6/2007 Rahtu
2007/0148990 A1 6/2007 Deboer et al.
2007/0153625 A1 7/2007 Lundgren et al.
2007/0155138 A1 7/2007 Tomasini et al.
2007/0157466 A1 7/2007 Kida et al.
2007/0157683 A1 7/2007 Li
2007/0158026 A1 7/2007 Amikura
2007/0163440 A1 7/2007 Kim et al.
2007/0163490 A1 7/2007 Habel et al.
2007/0163625 A1 7/2007 Lee
2007/0163996 A1 7/2007 Horiguchi
2007/0166457 A1 7/2007 Yamoto et al.
2007/0166459 A1 7/2007 Chang et al.
2007/0166966 A1 7/2007 Todd et al.
2007/0166999 A1 7/2007 Vaarstra
2007/0170372 A1 7/2007 Horsky
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0181066 A1 8/2007 Cadwell et al.
2007/0184179 A1 8/2007 Waghray et al.
2007/0186849 A1 8/2007 Furuya
2007/0186952 A1 8/2007 Honda et al.
2007/0187362 A1 8/2007 Nakagawa et al.
2007/0187363 A1 8/2007 Oka et al.
2007/0190266 A1 8/2007 Fu et al.
2007/0190362 A1 8/2007 Weidman
2007/0190744 A1 8/2007 Hiraiwa et al.
2007/0190782 A1 8/2007 Park
2007/0199510 A1 8/2007 Weiner et al.
2007/0202678 A1 8/2007 Plombon et al.
2007/0205788 A1 9/2007 Natsuhara et al.
2007/0207275 A1 9/2007 Nowak et al.
2007/0209588 A1 9/2007 Li et al.
2007/0209590 A1 9/2007 Li
2007/0210890 A1 9/2007 Hsu et al.
2007/0212484 A1 9/2007 Li
2007/0212811 A1 9/2007 Hanawa et al.
2007/0212827 A1 9/2007 Girotra et al.
2007/0215048 A1 9/2007 Suzuki et al.
2007/0215278 A1 9/2007 Furuse et al.
2007/0215580 A1 9/2007 Koshiishi et al.
2007/0218200 A1 9/2007 Suzuki et al.
2007/0218705 A1 9/2007 Matsuki et al.
2007/0222131 A1 9/2007 Fukumoto et al.
2007/0224777 A1 9/2007 Hamelin
2007/0224833 A1 9/2007 Morisada et al.
2007/0227665 A1 10/2007 Matsumoto et al.
2007/0231488 A1 10/2007 Von Kaenel
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0238305 A1 10/2007 Delgadino et al.
2007/0241688 A1 10/2007 DeVancentis et al.
2007/0243317 A1 10/2007 Du Bois et al.
2007/0247075 A1 10/2007 Kim et al.
2007/0248767 A1 10/2007 Okura
2007/0248832 A1 10/2007 Maeda et al.
2007/0249131 A1 10/2007 Allen et al.
2007/0251444 A1 11/2007 Gros-Jean et al.
2007/0251456 A1 11/2007 Herchen et al.
2007/0252233 A1 11/2007 Yamazaki et al.
2007/0252244 A1 11/2007 Srividya et al.
2007/0252532 A1 11/2007 DeVancentis et al.
2007/0254414 A1 11/2007 Miyanami
2007/0258506 A1 11/2007 Schwagerman et al.
2007/0258855 A1 11/2007 Turcot et al.
2007/0259778 A1 11/2007 Spencer et al.
2007/0261868 A1 11/2007 Gross
2007/0264427 A1 11/2007 Shinriki et al.
2007/0264793 A1 11/2007 Oh et al.
2007/0264807 A1 11/2007 Leone et al.
2007/0266932 A1 11/2007 Hiramatsu
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281106 A1 12/2007 Lubomirsky et al.
2007/0281496 A1 12/2007 Ingle et al.
2007/0286957 A1 12/2007 Suzuki et al.
2007/0289534 A1 12/2007 Lubomirsky et al.
2007/0292974 A1 12/2007 Mizuno et al.
2007/0295602 A1 12/2007 Tiller et al.
2007/0298362 A1 12/2007 Rocha-Alvarez et al.
2007/0298565 A1 12/2007 Nieh et al.
2008/0003425 A1 1/2008 Spencer et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026162 A1 1/2008 Dickey et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0032514 A1 2/2008 Sano et al.
2008/0035055 A1 2/2008 Dip et al.
2008/0035306 A1 2/2008 White et al.
2008/0035607 A1 2/2008 O'Hara et al.
2008/0036354 A1 2/2008 Letz et al.
2008/0038485 A1 2/2008 Fukazawa et al.

(56) References Cited

U.S. PATENT DOCUMENTS

2008/0038934 A1 2/2008 Vrtis et al.
2008/0042165 A1 2/2008 Sugizaki
2008/0042192 A1 2/2008 Park et al.
2008/0043803 A1 2/2008 Bandoh
2008/0044932 A1 2/2008 Samoilov et al.
2008/0044938 A1 2/2008 England et al.
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0063798 A1 3/2008 Kher et al.
2008/0066778 A1 3/2008 Matsushita et al.
2008/0067146 A1 3/2008 Onishi et al.
2008/0069951 A1 3/2008 Chacin et al.
2008/0069955 A1 3/2008 Hong et al.
2008/0072821 A1 3/2008 Dalton et al.
2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0092821 A1 4/2008 Otsuka et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.
2008/0102630 A1 5/2008 Saito
2008/0105276 A1 5/2008 Yeh et al.
2008/0110401 A1 5/2008 Fujikawa et al.
2008/0110568 A1 5/2008 Son et al.
2008/0113094 A1 5/2008 Casper
2008/0113096 A1 5/2008 Mahajani
2008/0113097 A1 5/2008 Mahajani et al.
2008/0118334 A1 5/2008 Bonora
2008/0121177 A1 5/2008 Bang et al.
2008/0121626 A1 5/2008 Thomas et al.
2008/0121962 A1 5/2008 Forbes et al.
2008/0124197 A1 5/2008 van der Meulen et al.
2008/0124908 A1 5/2008 Forbes et al.
2008/0124945 A1 5/2008 Miya et al.
2008/0124946 A1 5/2008 Xiao et al.
2008/0128726 A1 6/2008 Sakata et al.
2008/0129209 A1 6/2008 Deakins et al.
2008/0132046 A1 6/2008 Walther
2008/0133154 A1 6/2008 Krauss et al.
2008/0134887 A1 6/2008 Sherer
2008/0135516 A1 6/2008 Yokogawa et al.
2008/0135936 A1 6/2008 Nakajima
2008/0142046 A1 6/2008 Johnson et al.
2008/0142483 A1 6/2008 Hua
2008/0146033 A1 6/2008 Park
2008/0149031 A1 6/2008 Chu et al.
2008/0149593 A1 6/2008 Bai et al.
2008/0152463 A1 6/2008 Chidambaram et al.
2008/0153308 A1 6/2008 Ogawa et al.
2008/0153311 A1 6/2008 Padhi et al.
2008/0156769 A1 7/2008 Weiner et al.
2008/0157157 A1 7/2008 Tonomura
2008/0157212 A1 7/2008 Lavoie et al.
2008/0157365 A1 7/2008 Ott et al.
2008/0173237 A1 7/2008 Collins
2008/0173238 A1 7/2008 Nakashima et al.
2008/0173240 A1 7/2008 Furukawahara
2008/0173326 A1 7/2008 Gu et al.
2008/0176335 A1 7/2008 Alberti et al.
2008/0176375 A1 7/2008 Erben et al.
2008/0176412 A1 7/2008 Komeda
2008/0178608 A1 7/2008 Tandou et al.
2008/0178805 A1 7/2008 Paterson et al.
2008/0179104 A1 7/2008 Zhang
2008/0179291 A1 7/2008 Collins et al.
2008/0179715 A1 7/2008 Coppa
2008/0182075 A1 7/2008 Chopra
2008/0182390 A1 7/2008 Lemmi et al.
2008/0182411 A1 7/2008 Elers
2008/0191193 A1 8/2008 Li et al.
2008/0193643 A1 8/2008 Dip
2008/0194088 A1 8/2008 Srinivasan et al.
2008/0194105 A1 8/2008 Dominguez et al.
2008/0194113 A1 8/2008 Kim et al.
2008/0194169 A1 8/2008 Sterling et al.
2008/0199977 A1 8/2008 Weigel et al.
2008/0202416 A1 8/2008 Provencher
2008/0202689 A1 8/2008 Kim
2008/0203487 A1 8/2008 Hohage et al.
2008/0205483 A1 8/2008 Rempe et al.
2008/0210162 A1 9/2008 Yonebayashi
2008/0210278 A1 9/2008 Orii et al.
2008/0211423 A1 9/2008 Shinmen et al.
2008/0211526 A1 9/2008 Shinma
2008/0213696 A1 9/2008 Meeus et al.
2008/0214003 A1 9/2008 Xia et al.
2008/0216077 A1 9/2008 Emani et al.
2008/0216742 A1 9/2008 Takebayashi
2008/0216958 A1 9/2008 Goto et al.
2008/0220619 A1 9/2008 Matsushita et al.
2008/0223130 A1 9/2008 Snell et al.
2008/0223725 A1 9/2008 Han et al.
2008/0224240 A1 9/2008 Ahn et al.
2008/0228306 A1 9/2008 Yetter et al.
2008/0229811 A1 9/2008 Zhao et al.
2008/0230352 A1 9/2008 Hirata
2008/0230371 A1 9/2008 McHugh
2008/0233288 A1 9/2008 Clark
2008/0237572 A1 10/2008 Chui et al.
2008/0237604 A1 10/2008 Alshareef et al.
2008/0241052 A1 10/2008 Hooper et al.
2008/0241384 A1 10/2008 Jeong
2008/0241387 A1 10/2008 Keto
2008/0242116 A1 10/2008 Clark
2008/0246101 A1 10/2008 Li et al.
2008/0248310 A1 10/2008 Kim et al.
2008/0248597 A1 10/2008 Qin et al.
2008/0257102 A1 10/2008 Packer
2008/0257494 A1 10/2008 Hayashi et al.
2008/0260345 A1 10/2008 Mertesdorf et al.
2008/0260963 A1 10/2008 Yoon et al.
2008/0261405 A1 10/2008 Yang et al.
2008/0261413 A1 10/2008 Mahajani
2008/0264337 A1 10/2008 Sano et al.
2008/0264443 A1 10/2008 Shrinivasan et al.
2008/0267598 A1 10/2008 Nakamura
2008/0268171 A1 10/2008 Ma et al.
2008/0268635 A1 10/2008 Yu et al.
2008/0272424 A1 11/2008 Kim et al.
2008/0274369 A1 11/2008 Lee et al.
2008/0276864 A1 11/2008 Koelmel et al.
2008/0277647 A1 11/2008 Kouvetakis et al.
2008/0277656 A1 11/2008 Park et al.
2008/0277715 A1 11/2008 Ohmi et al.
2008/0282970 A1 11/2008 Heys et al.
2008/0283962 A1 11/2008 Dyer
2008/0286463 A1 11/2008 Tiner et al.
2008/0289574 A1 11/2008 Jacobs et al.
2008/0289650 A1 11/2008 Arena
2008/0289767 A1 11/2008 Tandou et al.
2008/0291964 A1 11/2008 Shrimpling
2008/0293198 A1 11/2008 Kojima et al.

(56) References Cited

U.S. PATENT DOCUMENTS

2008/0295872 A1 12/2008 Riker et al.
2008/0298945 A1 12/2008 Cox
2008/0299326 A1 12/2008 Fukazawa
2008/0299758 A1 12/2008 Harada et al.
2008/0302303 A1 12/2008 Choi et al.
2008/0303744 A1 12/2008 Hirayama et al.
2008/0305014 A1 12/2008 Honda
2008/0305246 A1 12/2008 Choi et al.
2008/0305443 A1 12/2008 Nakamura
2008/0314319 A1 12/2008 Hamano et al.
2008/0314892 A1 12/2008 Graham
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0000769 A1 1/2009 Lin et al.
2009/0004875 A1 1/2009 Shen et al.
2009/0011145 A1 1/2009 Yun
2009/0011150 A1 1/2009 Jeon et al.
2009/0011608 A1 1/2009 Nabatame
2009/0014879 A1 1/2009 Park et al.
2009/0017227 A1 1/2009 Fu et al.
2009/0017631 A1 1/2009 Bencher
2009/0017733 A1 1/2009 Takahashi et al.
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.
2009/0031954 A1 2/2009 Nishikido et al.
2009/0033907 A1 2/2009 Watson
2009/0035463 A1 2/2009 Dip
2009/0035584 A1 2/2009 Tran et al.
2009/0035927 A1 2/2009 Olsen et al.
2009/0035946 A1 2/2009 Pierreux et al.
2009/0035947 A1 2/2009 Horii
2009/0036292 A1 2/2009 Sun et al.
2009/0039475 A1 2/2009 Shioya
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045749 A1 2/2009 Ganachev et al.
2009/0045829 A1 2/2009 Awazu
2009/0047426 A1 2/2009 Park et al.
2009/0047433 A1 2/2009 Kim et al.
2009/0047447 A1 2/2009 Sawin et al.
2009/0050621 A1 2/2009 Awazu
2009/0052498 A1 2/2009 Halpin et al.
2009/0053023 A1 2/2009 Wakabayashi
2009/0053900 A1 2/2009 Nozawa et al.
2009/0053906 A1 2/2009 Miya et al.
2009/0056112 A1 3/2009 Kobayashi
2009/0056629 A1 3/2009 Katz et al.
2009/0057269 A1 3/2009 Katz et al.
2009/0060480 A1 3/2009 Herchen
2009/0061083 A1 3/2009 Chiang et al.
2009/0061644 A1 3/2009 Chiang et al.
2009/0061647 A1 3/2009 Mallick et al.
2009/0075490 A1 3/2009 Dussarrat
2009/0075491 A1 3/2009 Liu et al.
2009/0080136 A1 3/2009 Nagayama et al.
2009/0081879 A1 3/2009 Sukekawa et al.
2009/0084317 A1 4/2009 Wu
2009/0085156 A1 4/2009 Dewey et al.
2009/0087585 A1 4/2009 Lee et al.
2009/0087964 A1 4/2009 Maeda et al.
2009/0087967 A1 4/2009 Todd
2009/0090382 A1 4/2009 Morisada
2009/0093080 A1 4/2009 Choi et al.
2009/0093094 A1 4/2009 Ye et al.
2009/0093100 A1 4/2009 Xia et al.
2009/0095221 A1 4/2009 Tam et al.
2009/0104351 A1 4/2009 Kakegawa
2009/0104594 A1 4/2009 Webb
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0116936 A1 5/2009 Marubayashi et al.
2009/0117717 A1 5/2009 Tomasini et al.
2009/0117723 A1 5/2009 Kim et al.
2009/0117746 A1 5/2009 Masuda
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136665 A1 5/2009 Choi et al.
2009/0136668 A1 5/2009 Gregg et al.
2009/0136683 A1 5/2009 Fukasawa et al.
2009/0137055 A1 5/2009 Bognar
2009/0139657 A1 6/2009 Lee et al.
2009/0142905 A1 6/2009 Yamazaki
2009/0142933 A1 6/2009 Yajima et al.
2009/0142935 A1 6/2009 Fukazawa et al.
2009/0146322 A1 6/2009 Weling et al.
2009/0147819 A1 6/2009 Goodman et al.
2009/0155488 A1 6/2009 Nakano et al.
2009/0156015 A1 6/2009 Park et al.
2009/0156017 A1 6/2009 Fukazawa et al.
2009/0159000 A1 6/2009 Aggarwal et al.
2009/0159002 A1 6/2009 Bera et al.
2009/0159424 A1 6/2009 Liu et al.
2009/0162647 A1 6/2009 Sun et al.
2009/0162996 A1 6/2009 Ramaswarmy et al.
2009/0163038 A1 6/2009 Miyoshi
2009/0165715 A1 7/2009 Oh
2009/0165721 A1 7/2009 Pitney et al.
2009/0165722 A1 7/2009 Ha
2009/0166616 A1 7/2009 Uchiyama
2009/0176018 A1 7/2009 Zou et al.
2009/0179365 A1 7/2009 Lerner et al.
2009/0183520 A1 7/2009 Yukimoto
2009/0186479 A1 7/2009 Okabe et al.
2009/0186571 A1 7/2009 Haro
2009/0194233 A1 8/2009 Tamura et al.
2009/0197015 A1 8/2009 Kudela et al.
2009/0197411 A1 8/2009 Dussarrat et al.
2009/0200494 A1 8/2009 Hatem
2009/0200547 A1 8/2009 Griffin et al.
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0214825 A1 8/2009 Sun et al.
2009/0217871 A1 9/2009 Kim et al.
2009/0221149 A1 9/2009 Hammond et al.
2009/0221151 A1 9/2009 Honda et al.
2009/0223441 A1 9/2009 Arena et al.
2009/0227094 A1 9/2009 Bateman
2009/0230211 A1 9/2009 Kobayashi et al.
2009/0232985 A1 9/2009 Dussarrat et al.
2009/0236014 A1 9/2009 Wilson
2009/0236276 A1 9/2009 Kurth et al.
2009/0236315 A1 9/2009 Willwerth et al.
2009/0239386 A1 9/2009 Suzaki et al.
2009/0242130 A1 10/2009 Tian et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250004 A1 10/2009 Yamada et al.
2009/0250955 A1 10/2009 Aoki
2009/0255901 A1 10/2009 Okita
2009/0256127 A1 10/2009 Feist et al.
2009/0261331 A1 10/2009 Yang et al.
2009/0266296 A1 10/2009 Tachibana et al.
2009/0267135 A1 10/2009 Tanaka et al.
2009/0267225 A1 10/2009 Eguchi
2009/0269506 A1 10/2009 Okura et al.

(56) References Cited

U.S. PATENT DOCUMENTS

2009/0269507 A1 10/2009 Yu et al.
2009/0269941 A1 10/2009 Raisanen
2009/0275205 A1 11/2009 Kiehlbauch et al.
2009/0275210 A1 11/2009 Shanker et al.
2009/0277510 A1 11/2009 Shikata
2009/0277874 A1 11/2009 Rui et al.
2009/0280248 A1 11/2009 Goodman et al.
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0286405 A1 11/2009 Okesaku et al.
2009/0289300 A1 11/2009 Sasaki et al.
2009/0291208 A1 11/2009 Gordon et al.
2009/0291566 A1 11/2009 Ueno et al.
2009/0297696 A1 12/2009 Pore et al.
2009/0297710 A1 12/2009 Lindfors
2009/0297731 A1 12/2009 Goundar
2009/0298257 A1 12/2009 Lee et al.
2009/0302002 A1 12/2009 Collins et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.
2009/0313996 A1 12/2009 Riley et al.
2009/0314208 A1 12/2009 Zhou et al.
2009/0314309 A1 12/2009 Sankarakrishnan et al.
2009/0315093 A1 12/2009 Li et al.
2009/0317214 A1 12/2009 Hsiao et al.
2009/0320754 A1 12/2009 Oya
2009/0320881 A1 12/2009 Aitchison
2009/0324971 A1 12/2009 De Vries et al.
2009/0324989 A1 12/2009 Witz et al.
2009/0325391 A1 12/2009 De Vusser et al.
2009/0325469 A1 12/2009 Koo et al.
2010/0000608 A1 1/2010 Goto et al.
2010/0001409 A1 1/2010 Humbert et al.
2010/0003406 A1 1/2010 Lam et al.
2010/0006031 A1 1/2010 Choi et al.
2010/0006923 A1 1/2010 Fujitsuka
2010/0008656 A1 1/2010 Sorabji et al.
2010/0011723 A1 * 1/2010 Szepessy .................. B04B 5/12
55/438
2010/0012036 A1 1/2010 Silva et al.
2010/0012153 A1 1/2010 Shigemoto et al.
2010/0014479 A1 1/2010 Kim
2010/0015813 A1 1/2010 McGinnis et al.
2010/0018460 A1 1/2010 Singh et al.
2010/0018913 A1 1/2010 Blum
2010/0022097 A1 1/2010 Yamoto et al.
2010/0024727 A1 2/2010 Kim et al.
2010/0024872 A1 2/2010 Kishimoto
2010/0025766 A1 2/2010 Nuttinck et al.
2010/0025796 A1 2/2010 Dabiran
2010/0031884 A1 2/2010 Aggarwal et al.
2010/0032587 A1 2/2010 Hosch et al.
2010/0032842 A1 2/2010 Herdt et al.
2010/0034719 A1 2/2010 Dussarrat et al.
2010/0038687 A1 2/2010 Klaus et al.
2010/0040441 A1 2/2010 Obikane
2010/0041179 A1 2/2010 Lee
2010/0041243 A1 2/2010 Cheng et al.
2010/0046321 A1 2/2010 McLaughlin et al.
2010/0050943 A1 3/2010 Kato et al.
2010/0051584 A1 3/2010 Okita et al.
2010/0051597 A1 3/2010 Morita et al.
2010/0055312 A1 3/2010 Kato et al.
2010/0055316 A1 3/2010 Honma
2010/0055318 A1 3/2010 Volf et al.
2010/0055442 A1 3/2010 Kellock
2010/0055898 A1 3/2010 Chang et al.
2010/0058984 A1 3/2010 Marubayashi
2010/0065758 A1 3/2010 Liu et al.
2010/0068009 A1 3/2010 Kimura
2010/0068383 A1 3/2010 Kato et al.
2010/0068414 A1 3/2010 Takahashi et al.
2010/0068891 A1 3/2010 Hatanaka et al.
2010/0075037 A1 3/2010 Marsh et al.
2010/0075488 A1 3/2010 Collins et al.
2010/0075507 A1 3/2010 Chang et al.
2010/0078601 A1 4/2010 Pallem et al.
2010/0078746 A1 4/2010 Jung
2010/0081094 A1 4/2010 Hasebe et al.
2010/0081293 A1 4/2010 Mallick et al.
2010/0086703 A1 4/2010 Mangum et al.
2010/0087069 A1 4/2010 Miya et al.
2010/0089320 A1 4/2010 Kim
2010/0089870 A1 4/2010 Hiroshima et al.
2010/0090149 A1 4/2010 Thompson et al.
2010/0092679 A1 4/2010 Lee et al.
2010/0092696 A1 4/2010 Shinriki
2010/0093187 A1 4/2010 Lee et al.
2010/0094430 A1 4/2010 Krumdieck
2010/0098862 A1 4/2010 Xu et al.
2010/0101728 A1 4/2010 Iwasaki
2010/0102417 A1 4/2010 Ganguli et al.
2010/0105936 A1 4/2010 Tada et al.
2010/0111648 A1 5/2010 Tamura et al.
2010/0112496 A1 5/2010 Nakajima et al.
2010/0116207 A1 5/2010 Givens
2010/0116208 A1 5/2010 Sangam
2010/0116209 A1 5/2010 Kato
2010/0119439 A1 5/2010 Shindou
2010/0119727 A1 5/2010 Takagi
2010/0119844 A1 5/2010 Sun et al.
2010/0120261 A1 5/2010 Kim et al.
2010/0121100 A1 5/2010 Shay
2010/0124610 A1 5/2010 Aikawa et al.
2010/0124618 A1 5/2010 Kobayashi et al.
2010/0124621 A1 5/2010 Kobayashi et al.
2010/0126415 A1 5/2010 Ishino et al.
2010/0126539 A1 5/2010 Lee et al.
2010/0126605 A1 5/2010 Stones
2010/0126666 A1 5/2010 Tandou et al.
2010/0129548 A1 5/2010 Sneh
2010/0129670 A1 5/2010 Sun et al.
2010/0129990 A1 5/2010 Nishizawa et al.
2010/0130015 A1 5/2010 Nakajima et al.
2010/0130017 A1 5/2010 Luo et al.
2010/0130105 A1 5/2010 Lee
2010/0133255 A1 6/2010 Bahng et al.
2010/0134023 A1 6/2010 Mills
2010/0136216 A1 6/2010 Tsuei et al.
2010/0140221 A1 6/2010 Kikuchi et al.
2010/0140684 A1 6/2010 Ozawa
2010/0143609 A1 6/2010 Fukazawa et al.
2010/0144150 A1 6/2010 Sills et al.
2010/0144162 A1 6/2010 Lee et al.
2010/0144968 A1 6/2010 Lee et al.
2010/0145547 A1 6/2010 Darabnia et al.
2010/0147396 A1 6/2010 Yamagishi et al.
2010/0151206 A1 6/2010 Wu et al.
2010/0159638 A1 6/2010 Jeong
2010/0159707 A1 6/2010 Huang et al.
2010/0162752 A1 7/2010 Tabata et al.
2010/0162956 A1 7/2010 Murakami et al.
2010/0163187 A1 7/2010 Yokogawa et al.
2010/0163524 A1 7/2010 Arai
2010/0163937 A1 7/2010 Clendenning
2010/0166630 A1 7/2010 Gu et al.
2010/0168404 A1 7/2010 Girolami et al.
2010/0170441 A1 7/2010 Won et al.
2010/0170868 A1 7/2010 Lin et al.
2010/0173432 A1 7/2010 White et al.
2010/0178137 A1 7/2010 Chintalapati et al.
2010/0178423 A1 7/2010 Shimizu et al.
2010/0180819 A1 7/2010 Hatanaka et al.
2010/0183825 A1 7/2010 Becker et al.
2010/0184302 A1 7/2010 Lee et al.
2010/0186669 A1 7/2010 Shin et al.
2010/0189923 A1 7/2010 Goundar et al.
2010/0193501 A1 8/2010 Zucker et al.

(56) References Cited

U.S. PATENT DOCUMENTS

2010/0193955 A1 8/2010 Milligan et al.
2010/0195392 A1 8/2010 Freeman
2010/0195690 A1 8/2010 Moench et al.
2010/0197107 A1 8/2010 Matsuzaki
2010/0202860 A1 8/2010 Reed
2010/0203242 A1 8/2010 Borden
2010/0206767 A1 8/2010 Odashima et al.
2010/0209598 A1 8/2010 Xu et al.
2010/0210108 A1 8/2010 Ishizaka et al.
2010/0219757 A1 9/2010 Benzerrouk et al.
2010/0221452 A1 9/2010 Kang
2010/0224130 A1 9/2010 Smith et al.
2010/0227458 A1 9/2010 Chung et al.
2010/0229795 A1 9/2010 Tanabe
2010/0229965 A1 9/2010 Kashima et al.
2010/0230051 A1 9/2010 Iizuka
2010/0230863 A1 9/2010 Moench et al.
2010/0233885 A1 9/2010 Kushibiki et al.
2010/0233886 A1 9/2010 Yang et al.
2010/0236691 A1 9/2010 Yamazaki
2010/0243166 A1 9/2010 Hayashi et al.
2010/0244688 A1 9/2010 Braun et al.
2010/0246630 A1 9/2010 Kaszynski et al.
2010/0248465 A1 9/2010 Yi et al.
2010/0252434 A1 10/2010 Roy
2010/0255196 A1 10/2010 Geisler et al.
2010/0255198 A1 10/2010 Cleary et al.
2010/0255218 A1 10/2010 Oka et al.
2010/0255625 A1 10/2010 De Vries
2010/0255658 A1 10/2010 Aggarwal
2010/0258809 A1 10/2010 Muller
2010/0259152 A1 10/2010 Yasuda et al.
2010/0266765 A1 10/2010 White et al.
2010/0267224 A1 10/2010 Choi et al.
2010/0267248 A1 10/2010 Ma
2010/0270675 A1 10/2010 Harada
2010/0275846 A1 11/2010 Kitagawa
2010/0279008 A1 11/2010 Takagi
2010/0279512 A1 11/2010 Udea et al.
2010/0282163 A1 11/2010 Aggarwal et al.
2010/0282170 A1 11/2010 Nishizawa
2010/0282645 A1 11/2010 Wang
2010/0285237 A1 11/2010 Ditizio et al.
2010/0285319 A1 11/2010 Kwak et al.
2010/0294199 A1 11/2010 Tran et al.
2010/0297391 A1 11/2010 Kley
2010/0301752 A1 12/2010 Bakre et al.
2010/0304047 A1 12/2010 Yang et al.
2010/0307415 A1 12/2010 Shero et al.
2010/0317177 A1 12/2010 Huang et al.
2010/0317198 A1 12/2010 Antonelli
2010/0322604 A1 12/2010 Fondurulia et al.
2010/0322822 A1 12/2010 Fritchie et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 van Schravendijk et al.
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hombach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089419 A1 4/2011 Yamazaki et al.
2011/0089469 A1 4/2011 Merckling
2011/0091650 A1 4/2011 Noguchi et al.
2011/0092077 A1 4/2011 Xu et al.
2011/0097772 A1 4/2011 Huang et al.
2011/0097901 A1 4/2011 Banna et al.
2011/0098841 A1 4/2011 Tsuda
2011/0100489 A1 5/2011 Orito et al.
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117728 A1 5/2011 Su et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0127702 A1 6/2011 Gautam et al.
2011/0132542 A1 6/2011 Ilzuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171380 A1 7/2011 Higashi et al.
2011/0171775 A1 7/2011 Yamamoto et al.
2011/0175011 A1 7/2011 Ehrne et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0186984 A1 8/2011 Saito et al.
2011/0192820 A1 8/2011 Yeom et al.
2011/0195574 A1 8/2011 Blasco et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0212625 A1 9/2011 Toyoda et al.

(56) References Cited

U.S. PATENT DOCUMENTS

| | | | |
|---|---|---|---|
| 2011/0217838 A1 | 9/2011 | Hsieh et al. | |
| 2011/0220874 A1 | 9/2011 | Hanrath | |
| 2011/0223334 A1 | 9/2011 | Yudovsky et al. | |
| 2011/0226421 A1 | 9/2011 | Hayashi | |
| 2011/0232678 A1 | 9/2011 | Shih et al. | |
| 2011/0236201 A1 | 9/2011 | Shende | |
| 2011/0236594 A1 | 9/2011 | Haverkamp et al. | |
| 2011/0236600 A1 | 9/2011 | Fox et al. | |
| 2011/0237040 A1 | 9/2011 | Ng et al. | |
| 2011/0237082 A1 | 9/2011 | Nakajima et al. | |
| 2011/0239936 A1 | 10/2011 | Suzaki et al. | |
| 2011/0239940 A1 | 10/2011 | Benvenuti et al. | |
| 2011/0244673 A1 | 10/2011 | Cho et al. | |
| 2011/0252969 A1* | 10/2011 | Fischer | C23C 16/4412 55/434.2 |
| 2011/0253044 A1 | 10/2011 | Tam et al. | |
| 2011/0254052 A1 | 10/2011 | Kouvetakis | |
| 2011/0256675 A1 | 10/2011 | Avouris | |
| 2011/0256692 A1 | 10/2011 | Tam et al. | |
| 2011/0256724 A1 | 10/2011 | Chandrasekharan et al. | |
| 2011/0256726 A1 | 10/2011 | Lavoie et al. | |
| 2011/0256727 A1 | 10/2011 | Beynet et al. | |
| 2011/0256734 A1 | 10/2011 | Hausmann et al. | |
| 2011/0259519 A1 | 10/2011 | Kenworthy et al. | |
| 2011/0262642 A1 | 10/2011 | Xiao et al. | |
| 2011/0263107 A1 | 10/2011 | Chung et al. | |
| 2011/0263115 A1 | 10/2011 | Ganguli et al. | |
| 2011/0264250 A1 | 10/2011 | Nishimura et al. | |
| 2011/0265549 A1 | 11/2011 | Cruse et al. | |
| 2011/0265715 A1 | 11/2011 | Keller | |
| 2011/0265725 A1 | 11/2011 | Tsuji | |
| 2011/0265951 A1 | 11/2011 | Xu et al. | |
| 2011/0266611 A1 | 11/2011 | Kim et al. | |
| 2011/0269314 A1 | 11/2011 | Lee et al. | |
| 2011/0275018 A1 | 11/2011 | Matteo et al. | |
| 2011/0275166 A1 | 11/2011 | Shero et al. | |
| 2011/0277690 A1 | 11/2011 | Rozenzon et al. | |
| 2011/0281417 A1 | 11/2011 | Gordon et al. | |
| 2011/0283933 A1 | 11/2011 | Makarov et al. | |
| 2011/0286819 A1 | 11/2011 | Shibata et al. | |
| 2011/0291243 A1 | 12/2011 | Seamons | |
| 2011/0294075 A1 | 12/2011 | Chen et al. | |
| 2011/0294288 A1 | 12/2011 | Lee et al. | |
| 2011/0297088 A1 | 12/2011 | Song et al. | |
| 2011/0298062 A1 | 12/2011 | Ganguli et al. | |
| 2011/0300720 A1 | 12/2011 | Fu | |
| 2011/0305102 A1 | 12/2011 | Berger et al. | |
| 2011/0305856 A1 | 12/2011 | Bonn | |
| 2011/0308453 A1 | 12/2011 | Su et al. | |
| 2011/0308460 A1 | 12/2011 | Hong et al. | |
| 2011/0312191 A1 | 12/2011 | Ohkura et al. | |
| 2011/0318142 A1 | 12/2011 | Gage et al. | |
| 2011/0318888 A1 | 12/2011 | Komatsu et al. | |
| 2011/0318935 A1 | 12/2011 | Oyabu et al. | |
| 2012/0001172 A1 | 1/2012 | Shang et al. | |
| 2012/0003500 A1 | 1/2012 | Yoshida et al. | |
| 2012/0003599 A1 | 1/2012 | Patalay et al. | |
| 2012/0003726 A1 | 1/2012 | Jones et al. | |
| 2012/0003831 A1 | 1/2012 | Kang et al. | |
| 2012/0006489 A1 | 1/2012 | Okita | |
| 2012/0009802 A1 | 1/2012 | Lavoie | |
| 2012/0012556 A1 | 1/2012 | Matsumoto et al. | |
| 2012/0021252 A1 | 1/2012 | Lee | |
| 2012/0024223 A1 | 2/2012 | Torres et al. | |
| 2012/0024227 A1 | 2/2012 | Takasuka et al. | |
| 2012/0024231 A1 | 2/2012 | Horino | |
| 2012/0024478 A1 | 2/2012 | Huang et al. | |
| 2012/0024479 A1 | 2/2012 | Palagashvili et al. | |
| 2012/0027547 A1 | 2/2012 | Jager et al. | |
| 2012/0028454 A1 | 2/2012 | Swaminathan et al. | |
| 2012/0028469 A1 | 2/2012 | Onizawa et al. | |
| 2012/0031333 A1 | 2/2012 | Kurita et al. | |
| 2012/0031500 A1 | 2/2012 | Hirose et al. | |
| 2012/0032311 A1 | 2/2012 | Gates | |
| 2012/0033695 A1 | 2/2012 | Hayashi et al. | |
| 2012/0034793 A1 | 2/2012 | Narushima et al. | |
| 2012/0036732 A1 | 2/2012 | Varadarajan | |
| 2012/0040097 A1 | 2/2012 | Volf et al. | |
| 2012/0040528 A1 | 2/2012 | Kim et al. | |
| 2012/0043556 A1 | 2/2012 | Dube et al. | |
| 2012/0043617 A1 | 2/2012 | Nakagawa et al. | |
| 2012/0046421 A1 | 2/2012 | Darling et al. | |
| 2012/0052681 A1 | 3/2012 | Marsh | |
| 2012/0055401 A1 | 3/2012 | Tozawa | |
| 2012/0058270 A1 | 3/2012 | Winter et al. | |
| 2012/0058630 A1 | 3/2012 | Quinn | |
| 2012/0064690 A1 | 3/2012 | Hirota et al. | |
| 2012/0064726 A1 | 3/2012 | Nozawa et al. | |
| 2012/0064764 A1 | 3/2012 | Islam | |
| 2012/0068242 A1 | 3/2012 | Shin et al. | |
| 2012/0070136 A1 | 3/2012 | Koelmel et al. | |
| 2012/0070997 A1 | 3/2012 | Larson | |
| 2012/0073400 A1 | 3/2012 | Wang | |
| 2012/0074533 A1 | 3/2012 | Aoyama | |
| 2012/0077349 A1 | 3/2012 | Li et al. | |
| 2012/0077350 A1 | 3/2012 | Miya et al. | |
| 2012/0080756 A1 | 4/2012 | Suzuki | |
| 2012/0083134 A1 | 4/2012 | Wu et al. | |
| 2012/0088031 A1 | 4/2012 | Neel | |
| 2012/0088369 A1 | 4/2012 | Weidman et al. | |
| 2012/0090704 A1 | 4/2012 | Laverdiere et al. | |
| 2012/0091522 A1 | 4/2012 | Ozaki et al. | |
| 2012/0094010 A1 | 4/2012 | Sugiura et al. | |
| 2012/0094468 A1 | 4/2012 | Bhatia et al. | |
| 2012/0098107 A1 | 4/2012 | Raisanen et al. | |
| 2012/0100464 A1 | 4/2012 | Kageyama | |
| 2012/0103264 A1 | 5/2012 | Choi et al. | |
| 2012/0103522 A1 | 5/2012 | Hohenwarter | |
| 2012/0103939 A1 | 5/2012 | Wu et al. | |
| 2012/0104514 A1 | 5/2012 | Park et al. | |
| 2012/0107607 A1 | 5/2012 | Takaki et al. | |
| 2012/0108039 A1 | 5/2012 | Zojaji et al. | |
| 2012/0108048 A1 | 5/2012 | Lim et al. | |
| 2012/0111271 A1 | 5/2012 | Begarney et al. | |
| 2012/0114877 A1 | 5/2012 | Lee | |
| 2012/0115250 A1 | 5/2012 | Ariga et al. | |
| 2012/0115257 A1 | 5/2012 | Matsuyam et al. | |
| 2012/0119337 A1 | 5/2012 | Sasaki et al. | |
| 2012/0121823 A1 | 5/2012 | Chhabra | |
| 2012/0122275 A1 | 5/2012 | Koo et al. | |
| 2012/0122302 A1 | 5/2012 | Weisman et al. | |
| 2012/0122319 A1 | 5/2012 | Shimizu | |
| 2012/0125258 A1 | 5/2012 | Lee | |
| 2012/0126300 A1 | 5/2012 | Park et al. | |
| 2012/0128897 A1 | 5/2012 | Xiao et al. | |
| 2012/0135145 A1 | 5/2012 | Je et al. | |
| 2012/0139009 A1 | 6/2012 | Ning et al. | |
| 2012/0145078 A1 | 6/2012 | Huang et al. | |
| 2012/0146113 A1 | 6/2012 | Suzuki et al. | |
| 2012/0149207 A1 | 6/2012 | Graff | |
| 2012/0149213 A1 | 6/2012 | Nittala | |
| 2012/0156108 A1 | 6/2012 | Fondurulia et al. | |
| 2012/0156890 A1 | 6/2012 | Yim et al. | |
| 2012/0160172 A1 | 6/2012 | Wamura et al. | |
| 2012/0160809 A1 | 6/2012 | Ishibashi et al. | |
| 2012/0161126 A1 | 6/2012 | Yamazaki | |
| 2012/0161405 A1 | 6/2012 | Mohn | |
| 2012/0164327 A1 | 6/2012 | Sato | |
| 2012/0164837 A1 | 6/2012 | Tan et al. | |
| 2012/0164842 A1 | 6/2012 | Watanabe | |
| 2012/0164846 A1 | 6/2012 | Ha et al. | |
| 2012/0170170 A1 | 7/2012 | Gros-Jean | |
| 2012/0171391 A1 | 7/2012 | Won | |
| 2012/0171874 A1 | 7/2012 | Thridandam et al. | |
| 2012/0175518 A1 | 7/2012 | Godet et al. | |
| 2012/0175751 A1 | 7/2012 | Gatineau et al. | |
| 2012/0177845 A1 | 7/2012 | Odedra et al. | |
| 2012/0180719 A1 | 7/2012 | Inoue et al. | |
| 2012/0180954 A1 | 7/2012 | Yang et al. | |
| 2012/0183689 A1 | 7/2012 | Suzuki et al. | |
| 2012/0186521 A1 | 7/2012 | Iwasaki et al. | |
| 2012/0186573 A1 | 7/2012 | Jdira et al. | |
| 2012/0187083 A1 | 7/2012 | Hashizume | |
| 2012/0187305 A1 | 7/2012 | Elam et al. | |

(56) References Cited

U.S. PATENT DOCUMENTS

2012/0187375 A1 7/2012 Guo et al.
2012/0190178 A1 7/2012 Wang et al.
2012/0190185 A1 7/2012 Rogers
2012/0190208 A1 7/2012 Ozu et al.
2012/0196048 A1 8/2012 Ueda
2012/0196242 A1 8/2012 Volfovski et al.
2012/0196450 A1 8/2012 Balseanu et al.
2012/0202358 A1 8/2012 Gealy et al.
2012/0206033 A1 8/2012 Matsuyama
2012/0207456 A1 8/2012 Kim et al.
2012/0212121 A1 8/2012 Lin
2012/0213947 A1 8/2012 Lee
2012/0214318 A1 8/2012 Fukazawa et al.
2012/0216743 A1 8/2012 Itoh et al.
2012/0219735 A1 8/2012 Bakker et al.
2012/0219824 A1 8/2012 Prolier
2012/0220139 A1 8/2012 Lee et al.
2012/0222813 A1 9/2012 Pal et al.
2012/0222815 A1 9/2012 Sabri et al.
2012/0225192 A1 9/2012 Yudovsky et al.
2012/0225561 A1 9/2012 Watanabe
2012/0231611 A1 9/2012 Gatineau et al.
2012/0231771 A1 9/2012 Marcus
2012/0232340 A1 9/2012 Levy et al.
2012/0238074 A1 9/2012 Santhanam et al.
2012/0240858 A1 9/2012 Taniyama et al.
2012/0241089 A1 9/2012 Dielmann et al.
2012/0241411 A1 9/2012 Darling et al.
2012/0244703 A1 9/2012 Nakayama et al.
2012/0247386 A1 10/2012 Sanchez et al.
2012/0252229 A1 10/2012 Timans et al.
2012/0258257 A1 10/2012 Nguyen et al.
2012/0263875 A1 10/2012 Brenninger et al.
2012/0263876 A1 10/2012 Haukka et al.
2012/0263887 A1 10/2012 Papasouliotis et al.
2012/0264051 A1 10/2012 Angelov et al.
2012/0264305 A1 10/2012 Nakano
2012/0267048 A1 10/2012 Moyama et al.
2012/0269962 A1 10/2012 Blomberg et al.
2012/0269967 A1 10/2012 Yudovsky et al.
2012/0270339 A1 10/2012 Xie et al.
2012/0270384 A1 10/2012 Sanchez et al.
2012/0270393 A1 10/2012 Pore et al.
2012/0270407 A1 10/2012 Werner et al.
2012/0273052 A1 11/2012 Ye et al.
2012/0273162 A1 11/2012 Mahadeswaraswamy
2012/0276306 A1 11/2012 Ueda
2012/0288625 A1 11/2012 Furuya et al.
2012/0289053 A1 11/2012 Holland et al.
2012/0289056 A1 11/2012 Bergman et al.
2012/0289057 A1 11/2012 DeDontney
2012/0295427 A1 11/2012 Bauer
2012/0295449 A1 11/2012 Fukazawa
2012/0302055 A1 11/2012 Pore et al.
2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Hanada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1 12/2012 Isobayashi
2012/0320491 A1 12/2012 Doh et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2012/0329208 A1 12/2012 Pore et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011630 A1 1/2013 Sullivan et al.
2013/0011983 A1 1/2013 Tsai
2013/0011984 A1 1/2013 Wang et al.
2013/0012003 A1 1/2013 Haukka et al.
2013/0012034 A1 1/2013 Ahn et al.
2013/0014697 A1 1/2013 Kanayama
2013/0014896 A1 1/2013 Shoji et al.
2013/0017503 A1 1/2013 De Ridder et al.
2013/0019944 A1 1/2013 Hekmatshoar-Tabai et al.
2013/0019945 A1 1/2013 Hekmatshoar-Tabai et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037532 A1 2/2013 Volfovski et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0059415 A1 3/2013 Kato et al.
2013/0061755 A1 3/2013 Frederick
2013/0061969 A1* 3/2013 Koike .................... B01D 45/08
138/37
2013/0062753 A1 3/2013 Nguyen et al.
2013/0062839 A1 3/2013 Tschinderle et al.
2013/0064973 A1 3/2013 Chen et al.
2013/0065189 A1 3/2013 Yoshii et al.
2013/0068391 A1 3/2013 Mazzocco et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0075788 A1 3/2013 Tomabechi
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0085618 A1 4/2013 Ding
2013/0089667 A1 4/2013 Lai et al.
2013/0089716 A1 4/2013 Krishnamurthy et al.
2013/0089988 A1 4/2013 Wang et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.
2013/0109172 A1 5/2013 Collins et al.
2013/0109192 A1 5/2013 Hawkins et al.
2013/0112251 A1 5/2013 Hang et al.
2013/0113085 A1 5/2013 Michaelson et al.
2013/0115383 A1 5/2013 Lu et al.
2013/0115763 A1 5/2013 Takamure et al.
2013/0115768 A1 5/2013 Pore et al.
2013/0118405 A1 5/2013 Ho et al.
2013/0118895 A1 5/2013 Roozeboom et al.
2013/0119018 A1 5/2013 Kanarik et al.
2013/0122712 A1 5/2013 Kim et al.

(56) References Cited

U.S. PATENT DOCUMENTS

2013/0122722 A1 5/2013 Cissell et al.
2013/0126515 A1 5/2013 Shero et al.
2013/0129577 A1 5/2013 Halpin et al.
2013/0130490 A1 5/2013 Lee et al.
2013/0130505 A1 5/2013 Diana et al.
2013/0134148 A1 5/2013 Tachikawa
2013/0137279 A1 5/2013 Yamamoto et al.
2013/0143401 A1 6/2013 Yu et al.
2013/0143415 A1 6/2013 Yudovsky et al.
2013/0145587 A1 6/2013 Adhiprakasha
2013/0145984 A1 6/2013 Zhang et al.
2013/0147050 A1 6/2013 Bonner, III et al.
2013/0149874 A1 6/2013 Hirose et al.
2013/0152933 A1 6/2013 Lischer et al.
2013/0157409 A1 6/2013 Vaidya
2013/0157521 A1 6/2013 Aldrich et al.
2013/0160709 A1 6/2013 White et al.
2013/0161629 A1 6/2013 Han et al.
2013/0162142 A1 6/2013 Nishino et al.
2013/0164458 A1 6/2013 Soininen et al.
2013/0168353 A1 7/2013 Okita et al.
2013/0168354 A1 7/2013 Kanarik
2013/0171818 A1 7/2013 Kim et al.
2013/0175596 A1 7/2013 Cheng et al.
2013/0177706 A1 7/2013 Baluja et al.
2013/0180448 A1 7/2013 Sakaue et al.
2013/0183814 A1 7/2013 Huang et al.
2013/0186340 A1 7/2013 Omori et al.
2013/0189635 A1 7/2013 Lim et al.
2013/0189854 A1 7/2013 Hausmann et al.
2013/0196502 A1 8/2013 Haukka et al.
2013/0196507 A1 8/2013 Ma et al.
2013/0200518 A1 8/2013 Ahmed et al.
2013/0202387 A1 8/2013 Hiroki
2013/0203258 A1 8/2013 Chen et al.
2013/0203266 A1 8/2013 Hintze
2013/0203267 A1 8/2013 Pomarede et al.
2013/0206066 A1 8/2013 Han et al.
2013/0209940 A1 8/2013 Sakamoto et al.
2013/0210241 A1 8/2013 Lavoie et al.
2013/0213300 A1 8/2013 Sung et al.
2013/0214232 A1 8/2013 Tendulkar et al.
2013/0216710 A1 8/2013 Masuda et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0219853 A1 8/2013 Little et al.
2013/0220550 A1 8/2013 Koo et al.
2013/0224964 A1 8/2013 Fukazawa
2013/0228225 A1 9/2013 Leeser
2013/0228902 A1 9/2013 Tomizawa et al.
2013/0230814 A1 9/2013 Dunn et al.
2013/0230987 A1 9/2013 Draeger et al.
2013/0234203 A1 9/2013 Tsai et al.
2013/0242287 A1 9/2013 Schlezinger
2013/0247937 A1 9/2013 Nunomura et al.
2013/0256265 A1 10/2013 Darling et al.
2013/0256838 A1 10/2013 Sanchez et al.
2013/0256962 A1 10/2013 Ranish
2013/0260371 A1 10/2013 Holt
2013/0264659 A1 10/2013 Jung
2013/0267045 A1 10/2013 Lee et al.
2013/0267100 A1 10/2013 Takagi
2013/0269609 A1 10/2013 Leeser
2013/0269612 A1 10/2013 Cheng et al.
2013/0270600 A1 10/2013 Helander et al.
2013/0270676 A1 10/2013 Lindert et al.
2013/0273330 A1 10/2013 Wang et al.
2013/0276978 A1 10/2013 Bluck et al.
2013/0280891 A1 10/2013 Kim et al.
2013/0285155 A1 10/2013 Glass
2013/0287526 A1 10/2013 Bluck et al.
2013/0288427 A1 10/2013 Hung et al.
2013/0288471 A1 10/2013 Chi
2013/0288480 A1 10/2013 Sanchez et al.
2013/0288485 A1 10/2013 Liang et al.
2013/0292047 A1 11/2013 Tian et al.
2013/0292676 A1 11/2013 Milligan et al.
2013/0292807 A1 11/2013 Raisanen et al.
2013/0295779 A1 11/2013 Chandra et al.
2013/0299944 A1 11/2013 Lai et al.
2013/0302520 A1 11/2013 Wang et al.
2013/0302999 A1 11/2013 Won et al.
2013/0303803 A1 11/2013 Doerr et al.
2013/0309876 A1 11/2013 Ogawa
2013/0312663 A1 11/2013 Khosla et al.
2013/0313656 A1 11/2013 Tong
2013/0319290 A1 12/2013 Xiao et al.
2013/0320429 A1 12/2013 Thomas
2013/0323435 A1 12/2013 Xiao et al.
2013/0323859 A1 12/2013 Chen et al.
2013/0323935 A1 12/2013 Suzuki et al.
2013/0330165 A1 12/2013 Wimplinger
2013/0330911 A1 12/2013 Huang et al.
2013/0330933 A1 12/2013 Fukazawa et al.
2013/0333619 A1 12/2013 Omari
2013/0337172 A1 12/2013 Lee
2013/0337583 A1 12/2013 Kobayashi et al.
2013/0337639 A1 12/2013 Ivanstov et al.
2013/0337653 A1 12/2013 Kovalgin et al.
2013/0340619 A1 12/2013 Tammera
2013/0340678 A1 12/2013 Wamura et al.
2013/0344248 A1 12/2013 Clark
2014/0000843 A1 1/2014 Dunn et al.
2014/0001520 A1 1/2014 Glass
2014/0004274 A1 1/2014 Thompson
2014/0007808 A1 1/2014 Okabe et al.
2014/0014642 A1 1/2014 Elliot et al.
2014/0014644 A1 1/2014 Akiba et al.
2014/0015108 A1 1/2014 Kim et al.
2014/0015186 A1 1/2014 Wessel et al.
2014/0017408 A1 1/2014 Gandikota et al.
2014/0017414 A1 1/2014 Fukazawa et al.
2014/0017908 A1 1/2014 Beynet et al.
2014/0020619 A1 1/2014 Vincent et al.
2014/0020764 A1 1/2014 Woelk et al.
2014/0020839 A1 1/2014 Kenney et al.
2014/0023794 A1 1/2014 Mahajani et al.
2014/0024223 A1 1/2014 Kilpi et al.
2014/0027884 A1 1/2014 Tang et al.
2014/0030447 A1 1/2014 Lee
2014/0033978 A1 2/2014 Adachi et al.
2014/0034240 A1 2/2014 Kim et al.
2014/0034632 A1 2/2014 Pan et al.
2014/0036274 A1 2/2014 Marquardt et al.
2014/0045324 A1 2/2014 Brabant et al.
2014/0045342 A1 2/2014 Mallick et al.
2014/0047705 A1 2/2014 Singh
2014/0048765 A1 2/2014 Ma et al.
2014/0053866 A1 2/2014 Baluja et al.
2014/0056679 A1 2/2014 Yamabe et al.
2014/0056770 A1 2/2014 Bedard et al.
2014/0057187 A1 2/2014 Suzuki et al.
2014/0057454 A1 2/2014 Subramonium
2014/0058179 A1 2/2014 Stevens et al.
2014/0060147 A1 3/2014 Sarin et al.
2014/0060572 A1 3/2014 Yasumuro et al.
2014/0061770 A1 3/2014 Lee
2014/0062304 A1 3/2014 Nakano et al.
2014/0065841 A1 3/2014 Matero
2014/0067110 A1 3/2014 Lawson et al.
2014/0072710 A1 3/2014 Valle
2014/0072726 A1 3/2014 Kim
2014/0072925 A1 3/2014 Kaneko
2014/0073082 A1 3/2014 Song
2014/0073143 A1 3/2014 Alokozai et al.
2014/0076861 A1 3/2014 Cornelius et al.
2014/0077240 A1 3/2014 Roucka et al.
2014/0080314 A1 3/2014 Sasajima et al.
2014/0084341 A1 3/2014 Weeks
2014/0087490 A1 3/2014 Kahlon
2014/0087544 A1 3/2014 Tolle
2014/0087564 A1 3/2014 Shimizu et al.

(56) References Cited

U.S. PATENT DOCUMENTS

2014/0094027 A1 4/2014 Azumo et al.
2014/0096716 A1 4/2014 Chung et al.
2014/0097468 A1 4/2014 Okita
2014/0099794 A1 4/2014 Ingle et al.
2014/0099798 A1 4/2014 Tsuji
2014/0103145 A1 4/2014 White et al.
2014/0106574 A1 4/2014 Kang et al.
2014/0110798 A1 4/2014 Cai
2014/0113457 A1 4/2014 Sims
2014/0116335 A1 5/2014 Tsuji et al.
2014/0117380 A1 5/2014 Loboda et al.
2014/0120312 A1 5/2014 He et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127422 A1 5/2014 Shao et al.
2014/0127907 A1 5/2014 Yang
2014/0130687 A1 5/2014 Shibusawa et al.
2014/0138779 A1 5/2014 Xie et al.
2014/0141165 A1 5/2014 Sato et al.
2014/0141625 A1 5/2014 Fukazawa et al.
2014/0141674 A1 5/2014 Galbreath et al.
2014/0144375 A1 5/2014 Kim et al.
2014/0144500 A1 5/2014 Cao et al.
2014/0145332 A1 5/2014 Ryan et al.
2014/0147587 A1 5/2014 Endo et al.
2014/0148924 A1 5/2014 Brak et al.
2014/0158154 A1 6/2014 Kondo et al.
2014/0158786 A1 6/2014 Santo
2014/0159170 A1 6/2014 Raisanen et al.
2014/0162401 A1 6/2014 Kawano et al.
2014/0167187 A1 6/2014 Kuo et al.
2014/0170320 A1 6/2014 Yamamoto et al.
2014/0170335 A1 6/2014 Shao et al.
2014/0174354 A1 6/2014 Arai
2014/0174357 A1 6/2014 Kim et al.
2014/0174927 A1 6/2014 Bashir et al.
2014/0175054 A1 6/2014 Carlson et al.
2014/0179091 A1 6/2014 Clark
2014/0179092 A1 6/2014 Kim
2014/0182053 A1 7/2014 Huang
2014/0182689 A1 7/2014 Shareef et al.
2014/0187022 A1 7/2014 Falster et al.
2014/0187045 A1 7/2014 Hua et al.
2014/0190581 A1 7/2014 Nagase et al.
2014/0191389 A1 7/2014 Lee et al.
2014/0193983 A1 7/2014 Lavoie
2014/0202382 A1 7/2014 Kim et al.
2014/0202386 A1 7/2014 Taga
2014/0202388 A1 7/2014 Um et al.
2014/0209976 A1 7/2014 Yang et al.
2014/0213061 A1 7/2014 Huang et al.
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.
2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0242808 A1 8/2014 Akiyama et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0252710 A1 9/2014 Cuvalci et al.
2014/0256160 A1 9/2014 Wada et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0271081 A1 9/2014 Lavitsky et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0327117 A1 11/2014 Bencher et al.
2014/0339981 A1 11/2014 Komatsu et al.
2014/0346142 A1 11/2014 Chapuis et al.
2014/0346600 A1 11/2014 Cheng et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0360430 A1 12/2014 Armour et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0004806 A1 1/2015 Ndiege et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024567 A1 1/2015 Tsai et al.
2015/0024609 A1 1/2015 Milligan et al.
2015/0030766 A1 1/2015 Lind et al.
2015/0030782 A1 1/2015 Ivanov et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa et al.
2015/0061078 A1 3/2015 Abel et al.
2015/0064923 A1 3/2015 Matsumoto et al.
2015/0069354 A1 3/2015 Helander et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.

(56) References Cited

U.S. PATENT DOCUMENTS

| | | | |
|---|---|---|---|
| 2015/0087139 | A1 | 3/2015 | O'Neill et al. |
| 2015/0087154 | A1 | 3/2015 | Guha et al. |
| 2015/0091057 | A1 | 4/2015 | Xie et al. |
| 2015/0091134 | A1 | 4/2015 | Amaratunga et al. |
| 2015/0094470 | A1 | 4/2015 | Sanchez et al. |
| 2015/0096973 | A1 | 4/2015 | Dunn et al. |
| 2015/0099065 | A1 | 4/2015 | Canizares et al. |
| 2015/0099072 | A1 | 4/2015 | Takamure et al. |
| 2015/0099123 | A1 | 4/2015 | Barbee et al. |
| 2015/0099342 | A1 | 4/2015 | Tsai |
| 2015/0099374 | A1 | 4/2015 | Kakimoto et al. |
| 2015/0099375 | A1 | 4/2015 | Haripin et al. |
| 2015/0102466 | A1 | 4/2015 | Colinge |
| 2015/0104574 | A1 | 4/2015 | Lee et al. |
| 2015/0104575 | A1 | 4/2015 | Takoudis et al. |
| 2015/0110147 | A1 | 4/2015 | Mizuno |
| 2015/0110968 | A1 | 4/2015 | Lavoie et al. |
| 2015/0111374 | A1 | 4/2015 | Bao |
| 2015/0111395 | A1 | 4/2015 | Hashimoto et al. |
| 2015/0114295 | A1 | 4/2015 | Kim et al. |
| 2015/0118009 | A1 | 4/2015 | Hsieh et al. |
| 2015/0118846 | A1 | 4/2015 | Isii et al. |
| 2015/0118863 | A1 | 4/2015 | Rathod et al. |
| 2015/0122180 | A1 | 5/2015 | Chang et al. |
| 2015/0125628 | A1 | 5/2015 | Kim et al. |
| 2015/0126036 | A1 | 5/2015 | Zhao |
| 2015/0132212 | A1 | 5/2015 | Winkler et al. |
| 2015/0132953 | A1 | 5/2015 | Nowling et al. |
| 2015/0137315 | A1 | 5/2015 | Chen et al. |
| 2015/0140210 | A1 | 5/2015 | Jung et al. |
| 2015/0144060 | A1 | 5/2015 | Park |
| 2015/0147482 | A1 | 5/2015 | Kang et al. |
| 2015/0147483 | A1 | 5/2015 | Fukazawa |
| 2015/0147488 | A1 | 5/2015 | Choi et al. |
| 2015/0147875 | A1 | 5/2015 | Takamure et al. |
| 2015/0147877 | A1 | 5/2015 | Jung |
| 2015/0152547 | A1 | 6/2015 | Nakamura et al. |
| 2015/0152553 | A1 | 6/2015 | Popp et al. |
| 2015/0155140 | A1 | 6/2015 | Lee et al. |
| 2015/0155177 | A1 | 6/2015 | Zhang et al. |
| 2015/0155370 | A1 | 6/2015 | Tsai et al. |
| 2015/0162168 | A1 | 6/2015 | Oehrlien |
| 2015/0162185 | A1 | 6/2015 | Pore |
| 2015/0162214 | A1 | 6/2015 | Thompson |
| 2015/0167159 | A1 | 6/2015 | Halpin et al. |
| 2015/0167161 | A1 | 6/2015 | Canizares et al. |
| 2015/0167162 | A1 | 6/2015 | Barik et al. |
| 2015/0167165 | A1 | 6/2015 | Lindfors |
| 2015/0167705 | A1 | 6/2015 | Lee et al. |
| 2015/0170907 | A1 | 6/2015 | Haukka et al. |
| 2015/0170914 | A1 | 6/2015 | Haukka et al. |
| 2015/0170945 | A1 | 6/2015 | Segawa et al. |
| 2015/0170947 | A1 | 6/2015 | Bluck |
| 2015/0170954 | A1 | 6/2015 | Agarwal |
| 2015/0170975 | A1 | 6/2015 | Blatchford et al. |
| 2015/0171177 | A1 | 6/2015 | Cheng et al. |
| 2015/0174768 | A1 | 6/2015 | Rodnick |
| 2015/0175467 | A1 | 6/2015 | Denifl et al. |
| 2015/0176124 | A1 | 6/2015 | Greer et al. |
| 2015/0176126 | A1 | 6/2015 | Ge et al. |
| 2015/0179415 | A1 | 6/2015 | Sasaki et al. |
| 2015/0179501 | A1 | 6/2015 | Jhaveri et al. |
| 2015/0179564 | A1 | 6/2015 | Lee et al. |
| 2015/0179640 | A1 | 6/2015 | Kim et al. |
| 2015/0184287 | A1 | 7/2015 | Tsung et al. |
| 2015/0184291 | A1 | 7/2015 | Alokozai et al. |
| 2015/0187559 | A1 | 7/2015 | Sano |
| 2015/0187568 | A1 | 7/2015 | Pettinger et al. |
| 2015/0187611 | A1 | 7/2015 | Sato |
| 2015/0187908 | A1 | 7/2015 | Zhang et al. |
| 2015/0203961 | A1 | 7/2015 | Ha et al. |
| 2015/0203967 | A1 | 7/2015 | Dhas et al. |
| 2015/0211124 | A1 | 7/2015 | Nozawa et al. |
| 2015/0211125 | A1 | 7/2015 | Yoshikawa et al. |
| 2015/0217330 | A1 | 8/2015 | Haukka |
| 2015/0217456 | A1 | 8/2015 | Tsuji et al. |
| 2015/0218695 | A1 | 8/2015 | Odedra |
| 2015/0218698 | A1 | 8/2015 | Yoon et al. |
| 2015/0218700 | A1 | 8/2015 | Nguyen et al. |
| 2015/0221479 | A1 | 8/2015 | Chen et al. |
| 2015/0221480 | A1 | 8/2015 | Duan et al. |
| 2015/0221519 | A1 | 8/2015 | Marks et al. |
| 2015/0225850 | A1 | 8/2015 | Arora et al. |
| 2015/0228513 | A1 | 8/2015 | Parkhe et al. |
| 2015/0228572 | A1 | 8/2015 | Yang et al. |
| 2015/0228645 | A1 | 8/2015 | Chuang et al. |
| 2015/0228749 | A1 | 8/2015 | Ando et al. |
| 2015/0240357 | A1 | 8/2015 | Tachibana et al. |
| 2015/0240359 | A1 | 8/2015 | Jdira et al. |
| 2015/0240360 | A1 | 8/2015 | Leeser |
| 2015/0241787 | A1 | 8/2015 | Yaegashi |
| 2015/0243522 | A1 | 8/2015 | Kitagaito et al. |
| 2015/0243542 | A1 | 8/2015 | Yoshihara et al. |
| 2015/0243545 | A1 | 8/2015 | Tang |
| 2015/0243563 | A1 | 8/2015 | Lee et al. |
| 2015/0243658 | A1 | 8/2015 | Joshi et al. |
| 2015/0247259 | A1 | 9/2015 | Hekmatshoar-Tabari et al. |
| 2015/0249013 | A1 | 9/2015 | Arghavani et al. |
| 2015/0255319 | A1 | 9/2015 | Kikuchi et al. |
| 2015/0255324 | A1 | 9/2015 | Li et al. |
| 2015/0255385 | A1 | 9/2015 | Lee et al. |
| 2015/0259790 | A1 | 9/2015 | Newman |
| 2015/0259801 | A1 | 9/2015 | Matsumoto et al. |
| 2015/0262828 | A1 | 9/2015 | Brand et al. |
| 2015/0263033 | A1 | 9/2015 | Aoyama |
| 2015/0267294 | A1 | 9/2015 | Itatani |
| 2015/0267295 | A1 | 9/2015 | Hill et al. |
| 2015/0267297 | A1 | 9/2015 | Shiba |
| 2015/0267298 | A1 | 9/2015 | Saitou et al. |
| 2015/0267299 | A1 | 9/2015 | Hawkins et al. |
| 2015/0267301 | A1 | 9/2015 | Hill et al. |
| 2015/0270140 | A1 | 9/2015 | Gupta et al. |
| 2015/0270146 | A1 | 9/2015 | Yoshihara et al. |
| 2015/0275355 | A1 | 10/2015 | Mallikarjunan et al. |
| 2015/0275357 | A1 | 10/2015 | Kamakura et al. |
| 2015/0279665 | A1 | 10/2015 | Zafiropoulo |
| 2015/0279681 | A1 | 10/2015 | Knoops |
| 2015/0279682 | A1 | 10/2015 | Nakatani et al. |
| 2015/0279708 | A1 | 10/2015 | Kobayashi et al. |
| 2015/0279956 | A1 | 10/2015 | Ozaki et al. |
| 2015/0280051 | A1 | 10/2015 | Xu |
| 2015/0284848 | A1 | 10/2015 | Nakano et al. |
| 2015/0287591 | A1 | 10/2015 | Pore et al. |
| 2015/0287612 | A1 | 10/2015 | Luere et al. |
| 2015/0287626 | A1 | 10/2015 | Arai |
| 2015/0287710 | A1 | 10/2015 | Yun et al. |
| 2015/0291830 | A1 | 10/2015 | Galbreath et al. |
| 2015/0292088 | A1 | 10/2015 | Canizares |
| 2015/0299848 | A1 | 10/2015 | Haukka et al. |
| 2015/0303056 | A1 | 10/2015 | Varadarajan et al. |
| 2015/0307982 | A1 | 10/2015 | Firouzdor et al. |
| 2015/0307989 | A1 | 10/2015 | Lindfors |
| 2015/0308586 | A1 | 10/2015 | Shugrue et al. |
| 2015/0311043 | A1 | 10/2015 | Sun et al. |
| 2015/0311151 | A1 | 10/2015 | Chi et al. |
| 2015/0315704 | A1 | 11/2015 | Nakano et al. |
| 2015/0321929 | A1 | 11/2015 | Legzdins |
| 2015/0322569 | A1 | 11/2015 | Kilpi et al. |
| 2015/0325432 | A1 | 11/2015 | Ishizaka |
| 2015/0332921 | A1 | 11/2015 | Lee et al. |
| 2015/0340247 | A1 | 11/2015 | Balakrishnan et al. |
| 2015/0340266 | A1 | 11/2015 | Ngo et al. |
| 2015/0340500 | A1 | 11/2015 | Brunco |
| 2015/0340609 | A1 | 11/2015 | Banno et al. |
| 2015/0343559 | A1 | 12/2015 | Morikazu et al. |
| 2015/0343741 | A1 | 12/2015 | Shibata et al. |
| 2015/0345018 | A1 | 12/2015 | Detavernier et al. |
| 2015/0345022 | A1 | 12/2015 | Yudovsky et al. |
| 2015/0348755 | A1 | 12/2015 | Han et al. |
| 2015/0349073 | A1 | 12/2015 | Kang |
| 2015/0353478 | A1 | 12/2015 | Hoshino et al. |
| 2015/0354060 | A1 | 12/2015 | Yabe et al. |
| 2015/0361550 | A1 | 12/2015 | Yabe et al. |
| 2015/0361553 | A1 | 12/2015 | Murakawa |

(56) References Cited

U.S. PATENT DOCUMENTS

2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 Voie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.
2016/0129432 A1 5/2016 Ozaki
2016/0133307 A1 5/2016 Lee et al.
2016/0133504 A1 5/2016 Chu et al.
2016/0133628 A1 5/2016 Xie
2016/0141172 A1 5/2016 Kang
2016/0145738 A1 5/2016 Liu et al.
2016/0148800 A1 5/2016 Henri et al.
2016/0148801 A1 5/2016 Yabe et al.
2016/0148806 A1 5/2016 Henri et al.
2016/0148811 A1 5/2016 Nakatani et al.
2016/0148821 A1 5/2016 Singh
2016/0152649 A1 6/2016 Gordon
2016/0153088 A1 6/2016 Tsuji et al.
2016/0155629 A1 6/2016 Hawryluk et al.
2016/0163556 A1 6/2016 Briggs et al.
2016/0163558 A1 6/2016 Hudson et al.
2016/0163561 A1 6/2016 Hudson et al.
2016/0163711 A1 6/2016 Arndt et al.
2016/0163972 A1 6/2016 Swaminathan et al.
2016/0168699 A1 6/2016 Fukazawa et al.
2016/0168704 A1 6/2016 Choi et al.
2016/0169766 A1 6/2016 Ishibashi et al.
2016/0172189 A1 6/2016 Tapily
2016/0172296 A1 6/2016 Lim et al.
2016/0175805 A1 6/2016 Catchpole et al.
2016/0177448 A1 6/2016 Ikeda
2016/0181117 A1 6/2016 Arghavani et al.
2016/0181128 A1 6/2016 Mori
2016/0181368 A1 6/2016 Weeks
2016/0190137 A1 6/2016 Tsai et al.
2016/0195331 A1 7/2016 Hyon et al.
2016/0196969 A1 7/2016 Berry et al.
2016/0196970 A1 7/2016 Takamure et al.
2016/0203995 A1 7/2016 Kanarik et al.
2016/0204005 A1 7/2016 Oki et al.
2016/0204436 A1 7/2016 Barker et al.
2016/0211135 A1 7/2016 Noda et al.
2016/0211147 A1 7/2016 Fukazawa
2016/0211166 A1 7/2016 Yan et al.
2016/0215387 A1 7/2016 Liu et al.
2016/0217857 A1 7/2016 Paudel
2016/0218028 A1 7/2016 Schaller et al.
2016/0222504 A1 8/2016 Haukka et al.
2016/0222509 A1 8/2016 Honma
2016/0222516 A1 8/2016 Ikeda et al.
2016/0225588 A1 8/2016 Shaikh et al.
2016/0225607 A1 8/2016 Yamamoto et al.
2016/0225632 A1 8/2016 Shaikh et al.
2016/0237559 A1 8/2016 Tsuji
2016/0245704 A1 8/2016 Osaka et al.
2016/0256187 A1 9/2016 Shelton et al.
2016/0268102 A1 9/2016 White
2016/0268107 A1 9/2016 White
2016/0273095 A1 9/2016 Lin et al.
2016/0273101 A1 9/2016 Komori et al.
2016/0273106 A1 9/2016 Kanjolia et al.
2016/0273128 A1 9/2016 Kang
2016/0276148 A1 9/2016 Qian et al.
2016/0276212 A1 9/2016 Horikoshi
2016/0279629 A1 9/2016 Michishita et al.
2016/0281223 A1 9/2016 Sowa et al.
2016/0281230 A1 9/2016 Varadarajan et al.
2016/0284517 A1 9/2016 Saido
2016/0284542 A1 9/2016 Noda et al.
2016/0289828 A1 10/2016 Shero et al.
2016/0293398 A1 10/2016 Danek et al.
2016/0293609 A1 10/2016 Jha et al.
2016/0305015 A1 10/2016 Nakamura et al.
2016/0307739 A1 10/2016 Lee et al.
2016/0307740 A1 10/2016 Kim et al.
2016/0307766 A1 10/2016 Jongbloed et al.
2016/0312360 A1 10/2016 Rasheed et al.
2016/0314960 A1 10/2016 Cheng et al.
2016/0314962 A1 10/2016 Higashino et al.
2016/0314964 A1 10/2016 Tang et al.
2016/0314967 A1 10/2016 Tolle
2016/0315168 A1 10/2016 Dussarrat et al.
2016/0334709 A1 11/2016 Huli et al.
2016/0336178 A1 11/2016 Swaminathan et al.
2016/0336392 A1 11/2016 Tominaga et al.
2016/0343612 A1 11/2016 Wang et al.
2016/0345384 A1 11/2016 Zhang et al.
2016/0351413 A1 12/2016 Schmidt et al.
2016/0351747 A1 12/2016 Forrest et al.
2016/0358772 A1 12/2016 Xie
2016/0362783 A1 12/2016 Tolle et al.
2016/0362813 A1 12/2016 Bao et al.
2016/0365280 A1 12/2016 Brink et al.
2016/0365414 A1 12/2016 Peng et al.
2016/0372321 A1 12/2016 Krishnan et al.
2016/0372365 A1 12/2016 Tang et al.
2016/0372744 A1 12/2016 Essaki et al.
2016/0376700 A1 12/2016 Haukka
2016/0376701 A1 12/2016 Takewaki et al.
2016/0376704 A1 12/2016 Raisanen
2016/0379826 A9 12/2016 Arghavani et al.
2016/0379851 A1 12/2016 Swaminathan et al.
2016/0381732 A1 12/2016 Moench et al.
2017/0009347 A1 1/2017 Jang et al.
2017/0009367 A1 1/2017 Harris et al.
2017/0011889 A1 1/2017 Winkler et al.

(56) References Cited

U.S. PATENT DOCUMENTS

| | | | |
|---|---|---|---|
| 2017/0011926 | A1 | 1/2017 | Harada et al. |
| 2017/0011950 | A1 | 1/2017 | Schmotzer |
| 2017/0018477 | A1 | 1/2017 | Kato |
| 2017/0018570 | A1 | 1/2017 | Lue et al. |
| 2017/0022612 | A1 | 1/2017 | Lei et al. |
| 2017/0025280 | A1 | 1/2017 | Milligan |
| 2017/0025291 | A1 | 1/2017 | Lin |
| 2017/0029945 | A1 | 2/2017 | Kamakura |
| 2017/0032942 | A1 | 2/2017 | Walfried |
| 2017/0032943 | A1 | 2/2017 | Spaulding et al. |
| 2017/0032992 | A1 | 2/2017 | Hoechbauer |
| 2017/0033004 | A1 | 2/2017 | Siew et al. |
| 2017/0036935 | A1 | 2/2017 | Peterson |
| 2017/0037513 | A1 | 2/2017 | Haukka |
| 2017/0040146 | A1 | 2/2017 | Huang et al. |
| 2017/0040164 | A1 | 2/2017 | Wang et al. |
| 2017/0040198 | A1 | 2/2017 | Lin et al. |
| 2017/0040206 | A1 | 2/2017 | Schmotzer et al. |
| 2017/0044664 | A1 | 2/2017 | Dussarrat et al. |
| 2017/0044665 | A1 | 2/2017 | Shon et al. |
| 2017/0044666 | A1 | 2/2017 | Jang et al. |
| 2017/0047446 | A1 | 2/2017 | Margetis et al. |
| 2017/0051402 | A1 | 2/2017 | Mori |
| 2017/0051405 | A1 | 2/2017 | Fukazawa et al. |
| 2017/0051406 | A1 | 2/2017 | Mori et al. |
| 2017/0051408 | A1 | 2/2017 | Kosuke et al. |
| 2017/0053811 | A1 | 2/2017 | Fung et al. |
| 2017/0058402 | A1 | 3/2017 | Wenxu et al. |
| 2017/0062204 | A1 | 3/2017 | Suzuki et al. |
| 2017/0062209 | A1 | 3/2017 | Shiba |
| 2017/0062210 | A1 | 3/2017 | Visser et al. |
| 2017/0062218 | A1 | 3/2017 | Duan et al. |
| 2017/0062224 | A1 | 3/2017 | Fu et al. |
| 2017/0062258 | A1 | 3/2017 | Bluck |
| 2017/0069725 | A1 | 3/2017 | Bhimarasetti et al. |
| 2017/0091320 | A1 | 3/2017 | Psota et al. |
| 2017/0092469 | A1 | 3/2017 | Kurita et al. |
| 2017/0092531 | A1 | 3/2017 | Coomer |
| 2017/0092535 | A1 | 3/2017 | Kimihiko et al. |
| 2017/0092847 | A1 | 3/2017 | Kim et al. |
| 2017/0100742 | A1 | 4/2017 | Pore et al. |
| 2017/0102612 | A1 | 4/2017 | Meyers et al. |
| 2017/0103907 | A1 | 4/2017 | Chu et al. |
| 2017/0104061 | A1 | 4/2017 | Peng et al. |
| 2017/0107621 | A1 | 4/2017 | Suemori |
| 2017/0110313 | A1 | 4/2017 | Tang et al. |
| 2017/0110601 | A1 | 4/2017 | Blomberg et al. |
| 2017/0114460 | A1 | 4/2017 | Kim et al. |
| 2017/0114464 | A1 | 4/2017 | Iriuda et al. |
| 2017/0114465 | A1 | 4/2017 | Kalutarage et al. |
| 2017/0117141 | A1 | 4/2017 | Zhu et al. |
| 2017/0117202 | A1 | 4/2017 | Tang et al. |
| 2017/0117203 | A1 | 4/2017 | Tang et al. |
| 2017/0117222 | A1 | 4/2017 | Kim et al. |
| 2017/0121845 | A1 | 5/2017 | Grutzmacher et al. |
| 2017/0130332 | A1 | 5/2017 | Stumpf |
| 2017/0136578 | A1 | 5/2017 | Yoshimura |
| 2017/0140924 | A1 | 5/2017 | Suzuki et al. |
| 2017/0140925 | A1 | 5/2017 | Suzuki et al. |
| 2017/0145564 | A1 | 5/2017 | Bertuch et al. |
| 2017/0146909 | A1 | 5/2017 | Smith et al. |
| 2017/0148918 | A1 | 5/2017 | Ye et al. |
| 2017/0152968 | A1 | 6/2017 | Raj et al. |
| 2017/0154757 | A1 | 6/2017 | Winkler et al. |
| 2017/0154770 | A1 | 6/2017 | Margetis et al. |
| 2017/0154895 | A1 | 6/2017 | Huo |
| 2017/0159177 | A1 | 6/2017 | Monsma et al. |
| 2017/0165624 | A1 | 6/2017 | Ravoin et al. |
| 2017/0167023 | A1 | 6/2017 | Proia et al. |
| 2017/0170033 | A1 | 6/2017 | Okabe et al. |
| 2017/0173696 | A1 | 6/2017 | Sheinman |
| 2017/0175290 | A1 | 6/2017 | Chen et al. |
| 2017/0178899 | A1 | 6/2017 | Kabansky et al. |
| 2017/0178939 | A1 | 6/2017 | Omori |
| 2017/0178942 | A1 | 6/2017 | Sakata et al. |
| 2017/0179036 | A1 | 6/2017 | Chen et al. |
| 2017/0186621 | A1 | 6/2017 | Zaitsu |
| 2017/0186754 | A1 | 6/2017 | Blomberg et al. |
| 2017/0191159 | A1 | 7/2017 | Polyak et al. |
| 2017/0191164 | A1 | 7/2017 | Alokozai et al. |
| 2017/0191685 | A1 | 7/2017 | Ronne et al. |
| 2017/0191861 | A1 | 7/2017 | Rondano et al. |
| 2017/0196562 | A1 | 7/2017 | Shelton |
| 2017/0200622 | A1 | 7/2017 | Shiokawa et al. |
| 2017/0204516 | A1 | 7/2017 | Nguyen et al. |
| 2017/0213960 | A1 | 7/2017 | de Araujo et al. |
| 2017/0216762 | A1 | 8/2017 | Shugrue et al. |
| 2017/0218515 | A1 | 8/2017 | Shin et al. |
| 2017/0222008 | A1 | 8/2017 | Hsu et al. |
| 2017/0226636 | A1 | 8/2017 | Xiao |
| 2017/0232457 | A1 | 8/2017 | Toshiki et al. |
| 2017/0233868 | A1 | 8/2017 | Donoso et al. |
| 2017/0243734 | A1 | 8/2017 | Ishikawa et al. |
| 2017/0250068 | A1 | 8/2017 | Ishikawa et al. |
| 2017/0250075 | A1 | 8/2017 | Caymax et al. |
| 2017/0253968 | A1 | 9/2017 | Yahata |
| 2017/0256393 | A1 | 9/2017 | Kim et al. |
| 2017/0256417 | A1 | 9/2017 | Chou |
| 2017/0256429 | A1 | 9/2017 | Lawson et al. |
| 2017/0260649 | A1 | 9/2017 | Coomer |
| 2017/0263437 | A1 | 9/2017 | Li et al. |
| 2017/0263438 | A1 | 9/2017 | Li et al. |
| 2017/0267527 | A1 | 9/2017 | Kim et al. |
| 2017/0267531 | A1 | 9/2017 | Huakka |
| 2017/0271143 | A1 | 9/2017 | Fukiage et al. |
| 2017/0271191 | A1 | 9/2017 | Yoo et al. |
| 2017/0271256 | A1 | 9/2017 | Inatsuka |
| 2017/0271501 | A1 | 9/2017 | Avci et al. |
| 2017/0278705 | A1 | 9/2017 | Murakami et al. |
| 2017/0278707 | A1 | 9/2017 | Margetis et al. |
| 2017/0283312 | A1 | 10/2017 | Lee et al. |
| 2017/0283313 | A1 | 10/2017 | Lee et al. |
| 2017/0287681 | A1 | 10/2017 | Nitadori et al. |
| 2017/0287744 | A1 | 10/2017 | Kobayashi et al. |
| 2017/0294318 | A1 | 10/2017 | Yoshida et al. |
| 2017/0294339 | A1 | 10/2017 | Tapily |
| 2017/0294499 | A1 | 10/2017 | Lu et al. |
| 2017/0301519 | A1 | 10/2017 | Naim et al. |
| 2017/0301542 | A1 | 10/2017 | Maes et al. |
| 2017/0303382 | A1 | 10/2017 | Smith et al. |
| 2017/0306478 | A1 | 10/2017 | Raisanen et al. |
| 2017/0306479 | A1 | 10/2017 | Raisanen et al. |
| 2017/0306480 | A1 | 10/2017 | Zhu et al. |
| 2017/0306494 | A1 | 10/2017 | Lin et al. |
| 2017/0309490 | A1 | 10/2017 | Ogawa |
| 2017/0309528 | A1 | 10/2017 | Bansal et al. |
| 2017/0313608 | A1 | 11/2017 | Peterson |
| 2017/0314125 | A1 | 11/2017 | Fenwick et al. |
| 2017/0316933 | A1 | 11/2017 | Xie et al. |
| 2017/0316940 | A1 | 11/2017 | Ishikawa et al. |
| 2017/0317194 | A1 | 11/2017 | Tang et al. |
| 2017/0323783 | A1 | 11/2017 | Sanchez et al. |
| 2017/0323784 | A1 | 11/2017 | Faguet et al. |
| 2017/0338111 | A1 | 11/2017 | Takamure et al. |
| 2017/0338133 | A1 | 11/2017 | Tan et al. |
| 2017/0338134 | A1 | 11/2017 | Tan et al. |
| 2017/0338192 | A1 | 11/2017 | Lee et al. |
| 2017/0342559 | A1 | 11/2017 | Fukazawa et al. |
| 2017/0343896 | A1 | 11/2017 | Darling et al. |
| 2017/0345674 | A1 | 11/2017 | Ranjan et al. |
| 2017/0350688 | A1 | 12/2017 | Boyd et al. |
| 2017/0358445 | A1 | 12/2017 | O'Shaugnessy et al. |
| 2017/0358482 | A1 | 12/2017 | Chen et al. |
| 2017/0358670 | A1 | 12/2017 | Kub et al. |
| 2017/0362710 | A1 | 12/2017 | Ge et al. |
| 2017/0365467 | A1 | 12/2017 | Shimamoto et al. |
| 2017/0369993 | A1 | 12/2017 | Sun |
| 2017/0372884 | A1 | 12/2017 | Margetis et al. |
| 2017/0372919 | A1 | 12/2017 | Manna et al. |
| 2017/0373188 | A1 | 12/2017 | Mochizuki et al. |
| 2018/0001249 | A1 | 1/2018 | Sher |
| 2018/0005814 | A1 | 1/2018 | Kumar et al. |
| 2018/0010243 | A1 | 1/2018 | Lee et al. |
| 2018/0010247 | A1 | 1/2018 | Niskanen |

(56) References Cited

U.S. PATENT DOCUMENTS

2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047621 A1 2/2018 Armini
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.
2018/0061851 A1 3/2018 Ootsuka
2018/0068844 A1 3/2018 Chen et al.
2018/0068862 A1 3/2018 Terakura et al.
2018/0068950 A1 3/2018 Bruley et al.
2018/0069019 A1 3/2018 Kim et al.
2018/0072600 A1 3/2018 Fujita
2018/0076021 A1 3/2018 Fukushima et al.
2018/0080148 A1 3/2018 Westerhoff
2018/0083435 A1 3/2018 Redler
2018/0087152 A1 3/2018 Yoshida
2018/0087154 A1 3/2018 Pore et al.
2018/0087156 A1 3/2018 Kohei et al.
2018/0090583 A1 3/2018 Choi et al.
2018/0094350 A1 4/2018 Verghese et al.
2018/0094351 A1 4/2018 Verghese et al.
2018/0096821 A1 4/2018 Lubomirsky
2018/0096844 A1 4/2018 Dutartre et al.
2018/0097076 A1 4/2018 Cheng et al.
2018/0102276 A1 4/2018 Zhu et al.
2018/0105701 A1 4/2018 Larsson et al.
2018/0105930 A1 4/2018 Kang et al.
2018/0108587 A1 4/2018 Jiang
2018/0114680 A1 4/2018 Kim et al.
2018/0119283 A1 5/2018 Fukazawa
2018/0122642 A1 5/2018 Raisanen
2018/0122709 A1 5/2018 Xie
2018/0122959 A1 5/2018 Calka et al.
2018/0126379 A1 5/2018 Ramsey et al.
2018/0127876 A1 5/2018 Tolle et al.
2018/0130652 A1 5/2018 Pettinger et al.
2018/0130701 A1 5/2018 Chun
2018/0135172 A1 5/2018 Nogami et al.
2018/0135173 A1 5/2018 Kim et al.
2018/0135179 A1 5/2018 Toshiyuki et al.
2018/0138036 A1 5/2018 Baldesseroni et al.
2018/0142353 A1 5/2018 Tetsuya et al.
2018/0142357 A1 5/2018 Yoshikazu
2018/0148832 A1 5/2018 Chatterjee et al.
2018/0151346 A1 5/2018 Blanquart
2018/0151358 A1 5/2018 Margetis et al.
2018/0151588 A1 5/2018 Tsutsumi et al.
2018/0155832 A1 6/2018 Hamalainen et al.
2018/0155836 A1 6/2018 Arai et al.
2018/0158688 A1 6/2018 Chen
2018/0158716 A1 6/2018 Konkola et al.
2018/0163305 A1 6/2018 Batzer et al.
2018/0166258 A1 6/2018 Kim et al.
2018/0166315 A1 6/2018 Coomer
2018/0171472 A1 6/2018 Yamada et al.
2018/0171475 A1 6/2018 Maes et al.
2018/0171477 A1 6/2018 Kim et al.
2018/0172172 A1 6/2018 Oehler et al.
2018/0173109 A1 6/2018 Gronheid et al.
2018/0174801 A1 6/2018 Chen et al.
2018/0174826 A1 6/2018 Raaijmakers et al.
2018/0179625 A1 6/2018 Takagi et al.
2018/0180509 A1 6/2018 Sawachi et al.
2018/0182613 A1 6/2018 Blanquart et al.
2018/0182618 A1 6/2018 Blanquart et al.
2018/0187303 A1 7/2018 Gatineau et al.
2018/0189923 A1 7/2018 Zhong et al.
2018/0190496 A1 7/2018 Ashihara et al.
2018/0195174 A1 7/2018 Kim et al.
2018/0204733 A1 7/2018 Sherpa et al.
2018/0209042 A1 7/2018 Wu et al.
2018/0211834 A1 7/2018 Takamure et al.
2018/0223047 A1 8/2018 Xiao et al.
2018/0223429 A1 8/2018 Fukazawa et al.
2018/0230595 A1 8/2018 Suda et al.
2018/0233372 A1 8/2018 Vayrynen et al.
2018/0245215 A1 8/2018 Lei et al.
2018/0246101 A1 8/2018 Sasisekharan et al.
2018/0254211 A1 9/2018 Kosakai et al.
2018/0258532 A1 9/2018 Kato et al.
2018/0265294 A1 9/2018 Hayashi
2018/0265972 A1 9/2018 Firouzdor et al.
2018/0265973 A1 9/2018 Firouzdor et al.
2018/0269057 A1 9/2018 Lei et al.
2018/0274098 A1 9/2018 Takagi et al.
2018/0277338 A1 9/2018 Fukada et al.
2018/0277423 A1 9/2018 Lottes
2018/0286638 A1 10/2018 Susa
2018/0286663 A1 10/2018 Kobayashi et al.
2018/0286668 A1 10/2018 Baum et al.
2018/0286672 A1 10/2018 Van Aerde et al.
2018/0286675 A1 10/2018 Blomberg et al.
2018/0286711 A1 10/2018 Oosterlaken et al.
2018/0294187 A1 10/2018 Thombare et al.
2018/0305247 A1 10/2018 Feng et al.
2018/0308686 A1 10/2018 Xie et al.
2018/0308701 A1 10/2018 Na et al.
2018/0312966 A1 11/2018 Chan et al.
2018/0315597 A1 11/2018 Varadarajan et al.
2018/0315838 A1 11/2018 Morrow et al.
2018/0323055 A1 11/2018 Woodruff et al.
2018/0323056 A1 11/2018 Woodruff et al.
2018/0323059 A1 11/2018 Bhargava et al.
2018/0325414 A1 11/2018 Marashdeh et al.
2018/0327892 A1 11/2018 Wu et al.
2018/0327898 A1 11/2018 Wu et al.
2018/0327899 A1 11/2018 Wu et al.
2018/0331117 A1 11/2018 Titus et al.
2018/0337087 A1 11/2018 Sandhu et al.
2018/0350587 A1 12/2018 Jia et al.
2018/0350588 A1 12/2018 Raisanen et al.
2018/0350620 A1 12/2018 Zaitsu et al.
2018/0350653 A1 12/2018 Jeong et al.
2018/0355480 A1 12/2018 Kondo
2018/0355484 A1 12/2018 Lansalot-Matras et al.
2018/0358222 A1 12/2018 Venkatasubramanian et al.
2018/0363131 A1 12/2018 Lee et al.
2018/0363139 A1 12/2018 Rajavelu et al.
2018/0366314 A1 12/2018 Niskanen et al.
2018/0371610 A1 12/2018 Banerjee et al.
2019/0003050 A1 1/2019 Dezelah et al.
2019/0003052 A1 1/2019 Shero et al.
2019/0006797 A1 1/2019 Paynter et al.
2019/0013199 A1 1/2019 Bhargava et al.
2019/0019670 A1 1/2019 Lin et al.
2019/0019714 A1 1/2019 Kosakai et al.
2019/0027573 A1 1/2019 Zhu et al.
2019/0027583 A1 1/2019 Margetis et al.
2019/0027584 A1 1/2019 Margetis et al.
2019/0027605 A1 1/2019 Tolle et al.
2019/0032209 A1 1/2019 Huggare
2019/0032998 A1 1/2019 Jdira et al.
2019/0035605 A1 1/2019 Suzuki
2019/0035647 A1 1/2019 Lee et al.
2019/0035698 A1 1/2019 Tanaka
2019/0035810 A1 1/2019 Chun et al.
2019/0040529 A1 2/2019 Verbaas et al.

(56) References Cited

U.S. PATENT DOCUMENTS

2019/0046947 A1 2/2019 Strohm et al.
2019/0051544 A1 2/2019 Verbaas
2019/0051548 A1 2/2019 den Hartog Besselink et al.
2019/0051555 A1 2/2019 Hill et al.
2019/0057857 A1 2/2019 Ishikawa et al.
2019/0057858 A1 2/2019 Hausmann et al.
2019/0058043 A1 2/2019 Dewey et al.
2019/0062907 A1 2/2019 Kim et al.
2019/0062917 A1 2/2019 Sung et al.
2019/0066978 A1 2/2019 Um et al.
2019/0066997 A1 2/2019 Klaver et al.
2019/0067003 A1 2/2019 Zope et al.
2019/0067004 A1 2/2019 Kohen et al.
2019/0067014 A1 2/2019 Shrestha et al.
2019/0067016 A1 2/2019 Zhu et al.
2019/0067085 A1 2/2019 Kweskin
2019/0067094 A1 2/2019 Zope et al.
2019/0067095 A1 2/2019 Zhu et al.
2019/0078206 A1 3/2019 Wu et al.
2019/0080903 A1 3/2019 Abel et al.
2019/0081072 A1 3/2019 Chun et al.
2019/0085451 A1 3/2019 Lei et al.
2019/0086807 A1 3/2019 Kachel et al.
2019/0088555 A1 3/2019 Xie et al.
2019/0089143 A1 3/2019 Malone et al.
2019/0093221 A1 3/2019 Jdira et al.
2019/0096708 A1 3/2019 Sharma
2019/0106788 A1 4/2019 Hawkins et al.
2019/0109002 A1 4/2019 Mattinen et al.
2019/0109009 A1 4/2019 Longrie et al.
2019/0109043 A1 4/2019 Wang et al.
2019/0112711 A1 4/2019 Lyons et al.
2019/0115206 A1 4/2019 Kim et al.
2019/0115237 A1 4/2019 den Hartog Besselink et al.
2019/0115451 A1 4/2019 Lee et al.
2019/0131124 A1 5/2019 Kohen et al.
2019/0140067 A1 5/2019 Zhu et al.
2019/0148177 A1 5/2019 Yin et al.
2019/0148224 A1 5/2019 Kuroda et al.
2019/0148398 A1 5/2019 Kim
2019/0148556 A1 5/2019 Wang et al.
2019/0153593 A1 5/2019 Zhu et al.
2019/0157054 A1 5/2019 White et al.
2019/0157067 A1 5/2019 Bhuyan et al.
2019/0163056 A1 5/2019 Maes et al.
2019/0164763 A1 5/2019 Raisanen et al.
2019/0172701 A1 6/2019 Jia et al.
2019/0172714 A1 6/2019 Bobek et al.
2019/0176435 A1 6/2019 Bellman et al.
2019/0181002 A1 6/2019 Iijima et al.
2019/0185999 A1 6/2019 Shanbhag et al.
2019/0189447 A1 6/2019 Kamp et al.
2019/0198297 A1 6/2019 Aramaki et al.
2019/0198359 A1 6/2019 Kamimura et al.
2019/0198571 A1 6/2019 Xu et al.
2019/0204029 A1 7/2019 Tanabe
2019/0211450 A1 7/2019 Adachi et al.
2019/0217277 A1 7/2019 Jeon et al.
2019/0221433 A1 7/2019 Raisanen et al.
2019/0229008 A1 7/2019 Rokkam et al.
2019/0233446 A1 8/2019 MacDonald et al.
2019/0233940 A1 8/2019 Guo et al.
2019/0237325 A1 8/2019 Wang et al.
2019/0237327 A1 8/2019 Kohen et al.
2019/0244803 A1 8/2019 Suzuki
2019/0249300 A1 8/2019 Hatanpaa et al.
2019/0249303 A1 8/2019 Kuroda et al.
2019/0252195 A1 8/2019 Haukka
2019/0252196 A1 8/2019 Vayrynen et al.
2019/0259611 A1 8/2019 Nakano et al.
2019/0259612 A1 8/2019 Nozawa et al.
2019/0263676 A1 8/2019 Powell
2019/0264324 A1 8/2019 Shugrue et al.
2019/0271078 A1 9/2019 Raisanen et al.
2019/0272981 A1 9/2019 Xu et al.
2019/0272993 A1 9/2019 Mattinen et al.
2019/0273133 A1 9/2019 Agrawal et al.
2019/0276934 A1 9/2019 Verghese et al.
2019/0287769 A1 9/2019 Blomberg et al.
2019/0295837 A1 9/2019 Pore et al.
2019/0301014 A1 10/2019 Pierreux et al.
2019/0304776 A1 10/2019 Choi
2019/0304780 A1 10/2019 Kohen et al.
2019/0304790 A1 10/2019 Mousa et al.
2019/0304821 A1 10/2019 Pierreux et al.
2019/0311894 A1 10/2019 Girard et al.
2019/0311897 A1 10/2019 Kang et al.
2019/0311940 A1 10/2019 Choi et al.
2019/0318910 A1 10/2019 Mori
2019/0318923 A1 10/2019 Blanquart et al.
2019/0319100 A1 10/2019 Chen et al.
2019/0322812 A1 10/2019 Wojtecki et al.
2019/0330740 A1 10/2019 Klaver
2019/0333753 A1 10/2019 Ueda et al.
2019/0333761 A1 10/2019 Tois et al.
2019/0338418 A1 11/2019 Goradia et al.
2019/0346300 A1 11/2019 Kim et al.
2019/0348261 A1 11/2019 Lin et al.
2019/0348273 A1 11/2019 Tang et al.
2019/0348515 A1 11/2019 Li et al.
2019/0362970 A1 11/2019 Wang et al.
2019/0362989 A1 11/2019 Reuter et al.
2019/0363006 A1 11/2019 Min
2019/0363015 A1 11/2019 Cheng et al.
2019/0368040 A1 12/2019 Kachel et al.
2019/0368041 A1 12/2019 Sreeram et al.
2019/0371594 A1 12/2019 Niskanen et al.
2019/0371640 A1 12/2019 Raisanen et al.
2019/0375638 A1 12/2019 Haukka
2019/0376180 A1 12/2019 Niskanen
2019/0378711 A1 12/2019 Suzuki et al.
2019/0378916 A1 12/2019 Tang et al.
2019/0385907 A1 12/2019 Gottheim et al.
2019/0390338 A1 12/2019 Raisanen et al.
2019/0390343 A1 12/2019 Min et al.
2019/0393304 A1 12/2019 Guillorn et al.
2019/0393308 A1 12/2019 Lo et al.
2020/0002811 A1 1/2020 Sreeram et al.
2020/0002812 A1 1/2020 Lee et al.
2020/0012081 A1 1/2020 Komai
2020/0013612 A1 1/2020 Blanquart et al.
2020/0013613 A1 1/2020 Blanquart
2020/0013626 A1 1/2020 Longrie et al.
2020/0013629 A1 1/2020 de Roest et al.
2020/0018421 A1 1/2020 Shugrue
2020/0035489 A1 1/2020 Huang et al.
2020/0040458 A1 2/2020 Ma et al.
2020/0048768 A1 2/2020 Wiegers et al.
2020/0052056 A1 2/2020 Park et al.
2020/0052089 A1 2/2020 Yu et al.
2020/0056282 A1 2/2020 Raisanen et al.
2020/0056286 A1 2/2020 Shero et al.
2020/0058469 A1 2/2020 Ranjan et al.
2020/0063262 A1 2/2020 Katou et al.
2020/0064737 A1 2/2020 de Roest
2020/0066512 A1 2/2020 Tois et al.
2020/0066552 A1 2/2020 Susa
2020/0080200 A1 3/2020 Um et al.
2020/0083054 A1 3/2020 Väyrynen et al.
2020/0083375 A1 3/2020 Tolle et al.
2020/0083469 A1 3/2020 Lhullier
2020/0102649 A1 4/2020 Reed
2020/0102653 A1 4/2020 Muralidhar et al.
2020/0105579 A1 4/2020 Zhu
2020/0105594 A1 4/2020 Cheng et al.
2020/0105895 A1 4/2020 Tang et al.
2020/0109472 A1 4/2020 Um et al.
2020/0111669 A1 4/2020 Zaitsu et al.
2020/0111690 A1 4/2020 Oosterlaken
2020/0118811 A1 4/2020 Utsuno et al.
2020/0118815 A1 4/2020 Fukazawa et al.
2020/0118817 A1 4/2020 Blomberg et al.
2020/0119038 A1 4/2020 Hopkins et al.
2020/0126771 A1 4/2020 Roh et al.

(56) References Cited

U.S. PATENT DOCUMENTS

| | | | |
|---|---|---|---|
| 2020/0126840 | A1 | 4/2020 | Roh et al. |
| 2020/0131634 | A1 | 4/2020 | Gao et al. |
| 2020/0135512 | A1 | 4/2020 | Oosterlaken et al. |
| 2020/0135915 | A1 | 4/2020 | Savant et al. |
| 2020/0140995 | A1 | 5/2020 | Blanquart et al. |
| 2020/0141003 | A1 | 5/2020 | Lee et al. |
| 2020/0144058 | A1 | 5/2020 | Kohen |
| 2020/0152473 | A1 | 5/2020 | Tapily et al. |
| 2020/0152750 | A1 | 5/2020 | Morrow et al. |
| 2020/0161129 | A1 | 5/2020 | Mattinen et al. |
| 2020/0161438 | A1 | 5/2020 | Tang et al. |
| 2020/0168485 | A1 | 5/2020 | Fluit |
| 2020/0173020 | A1 | 6/2020 | Huggare |
| 2020/0176244 | A1 | 6/2020 | Lee et al. |
| 2020/0176246 | A1 | 6/2020 | Huotari et al. |
| 2020/0181770 | A1 | 6/2020 | Longrie et al. |
| 2020/0185249 | A1 | 6/2020 | Rice et al. |
| 2020/0185257 | A1 | 6/2020 | Nishiwaki |
| 2020/0194253 | A1 | 6/2020 | Banerjee et al. |
| 2020/0194268 | A1 | 6/2020 | Sharma |
| 2020/0203157 | A1 | 6/2020 | Su |
| 2020/0224309 | A1 | 7/2020 | Sreeram et al. |
| 2020/0224311 | A1 | 7/2020 | Niskanen et al. |
| 2020/0227243 | A1 | 7/2020 | Kim et al. |
| 2020/0227250 | A1 | 7/2020 | Pore et al. |
| 2020/0227325 | A1 | 7/2020 | Xie et al. |
| 2020/0232096 | A1 | 7/2020 | Hatanpää et al. |
| 2020/0234989 | A1 | 7/2020 | Jeong |
| 2020/0251328 | A1 | 8/2020 | Zaitsu et al. |
| 2020/0258766 | A1 | 8/2020 | Garssen et al. |
| 2020/0266057 | A1 | 8/2020 | Lee et al. |
| 2020/0266097 | A1 | 8/2020 | Liu et al. |
| 2020/0266098 | A1 | 8/2020 | Pore et al. |
| 2020/0266208 | A1 | 8/2020 | Kim et al. |
| 2020/0270749 | A1 | 8/2020 | Li et al. |
| 2020/0270752 | A1 | 8/2020 | Pierreux et al. |
| 2020/0273728 | A1 | 8/2020 | Benjaminson et al. |
| 2020/0273729 | A1 | 8/2020 | Verbaas et al. |
| 2020/0279721 | A1 | 9/2020 | White et al. |
| 2020/0279758 | A1 | 9/2020 | Sharma |
| 2020/0283893 | A1 | 9/2020 | Byun et al. |
| 2020/0283894 | A1 | 9/2020 | Lehn et al. |
| 2020/0284467 | A1 | 9/2020 | Lindeboom et al. |
| 2020/0286725 | A1 | 9/2020 | Sharma et al. |
| 2020/0286726 | A1 | 9/2020 | Shero et al. |
| 2020/0294789 | A1 | 9/2020 | Woodruff et al. |
| 2020/0303180 | A1 | 9/2020 | Kim et al. |
| 2020/0303196 | A1 | 9/2020 | Chen et al. |
| 2020/0309455 | A1 | 10/2020 | Fluit |
| 2020/0312652 | A1 | 10/2020 | Kang et al. |
| 2020/0312681 | A1 | 10/2020 | Tanaka et al. |
| 2020/0318237 | A1 | 10/2020 | Fukazawa |
| 2020/0321209 | A1 | 10/2020 | Ishikawa et al. |
| 2020/0332416 | A1 | 10/2020 | Fluit |
| 2020/0340113 | A1 | 10/2020 | Hatanpää et al. |
| 2020/0340138 | A1 | 10/2020 | Tolle et al. |
| 2020/0343134 | A1 | 10/2020 | Kovalgin et al. |
| 2020/0343358 | A1 | 10/2020 | Zhu et al. |
| 2020/0350193 | A1 | 11/2020 | Garssen |
| 2020/0354836 | A1 | 11/2020 | Yednak et al. |
| 2020/0355296 | A1 | 11/2020 | Shugrue et al. |
| 2020/0357631 | A1 | 11/2020 | Ueda |
| 2020/0365391 | A1 | 11/2020 | Blanquart et al. |
| 2020/0365433 | A1 | 11/2020 | de Ridder et al. |
| 2020/0365434 | A1 | 11/2020 | de Ridder |
| 2020/0365444 | A1 | 11/2020 | Hill et al. |
| 2020/0373152 | A1 | 11/2020 | Blanquart |
| 2020/0385861 | A1 | 12/2020 | Deye et al. |
| 2020/0385867 | A1 | 12/2020 | Kim et al. |
| 2020/0385868 | A1 | 12/2020 | Kim et al. |
| 2020/0395199 | A1 | 12/2020 | Miyama |
| 2020/0395209 | A1 | 12/2020 | Yoshimoto et al. |
| 2020/0395444 | A1 | 12/2020 | Lo et al. |
| 2020/0402846 | A1 | 12/2020 | Collins et al. |
| 2021/0002762 | A1 | 1/2021 | Jun et al. |
| 2021/0005449 | A1 | 1/2021 | Blanquart et al. |
| 2021/0005450 | A1 | 1/2021 | Mattinen et al. |
| 2021/0005723 | A1 | 1/2021 | Tang et al. |
| 2021/0013010 | A1 | 1/2021 | Yoshikawa et al. |
| 2021/0013034 | A1 | 1/2021 | Wu et al. |
| 2021/0013037 | A1 | 1/2021 | Sun et al. |
| 2021/0013042 | A1 | 1/2021 | Väyrynen et al. |
| 2021/0013085 | A1 | 1/2021 | Roh et al. |
| 2021/0017648 | A1 | 1/2021 | Kubota et al. |
| 2021/0020429 | A1 | 1/2021 | Khazaka et al. |
| 2021/0020431 | A1 | 1/2021 | Blanquart et al. |
| 2021/0020432 | A1 | 1/2021 | Blanquart |
| 2021/0020467 | A1 | 1/2021 | Sekiguchi |
| 2021/0020470 | A1 | 1/2021 | Lee |
| 2021/0028021 | A1 | 1/2021 | Mousa et al. |
| 2021/0032754 | A1 | 2/2021 | White et al. |
| 2021/0033977 | A1 | 2/2021 | Raaijmakers et al. |
| 2021/0035785 | A1 | 2/2021 | Jeong et al. |
| 2021/0035786 | A1 | 2/2021 | Jeong et al. |
| 2021/0035802 | A1 | 2/2021 | Tolle et al. |
| 2021/0035824 | A1 | 2/2021 | de Ridder |
| 2021/0035839 | A1 | 2/2021 | de Ridder |
| 2021/0035840 | A1 | 2/2021 | de Ridder et al. |
| 2021/0035841 | A1 | 2/2021 | Fluit |
| 2021/0035842 | A1 | 2/2021 | de Ridder |
| 2021/0035854 | A1 | 2/2021 | Yoo et al. |
| 2021/0040613 | A1 | 2/2021 | White et al. |
| 2021/0040615 | A1 | 2/2021 | White et al. |
| 2021/0041284 | A1 | 2/2021 | Yednak, III |
| 2021/0043444 | A1 | 2/2021 | Blanquart |
| 2021/0050231 | A1 | 2/2021 | Oosterlaken |
| 2021/0054500 | A1 | 2/2021 | Zope et al. |
| 2021/0054504 | A1 | 2/2021 | Wang et al. |
| 2021/0057214 | A1 | 2/2021 | Kengoyama et al. |
| 2021/0057223 | A1 | 2/2021 | Stevens et al. |
| 2021/0057275 | A1 | 2/2021 | Pierreux et al. |
| 2021/0057570 | A1 | 2/2021 | Lin et al. |
| 2021/0066075 | A1 | 3/2021 | Zhang et al. |
| 2021/0066079 | A1 | 3/2021 | Lima et al. |
| 2021/0066080 | A1 | 3/2021 | Mattinen et al. |
| 2021/0066083 | A1 | 3/2021 | Haukka |
| 2021/0066084 | A1 | 3/2021 | Raisanen et al. |
| 2021/0070783 | A1 | 3/2021 | Odedra et al. |
| 2021/0071296 | A1 | 3/2021 | Watarai et al. |
| 2021/0071298 | A1 | 3/2021 | Maes et al. |
| 2021/0074527 | A1 | 3/2021 | Lee et al. |
| 2021/0082692 | A1 | 3/2021 | Kikuchi |
| 2021/0090878 | A1 | 3/2021 | Kang et al. |
| 2021/0095372 | A1 | 4/2021 | Minjauw et al. |
| 2021/0102289 | A1 | 4/2021 | Tsuji et al. |
| 2021/0102290 | A1 | 4/2021 | Acosta et al. |
| 2021/0102292 | A1 | 4/2021 | Lin et al. |
| 2021/0104384 | A1 | 4/2021 | Parkhe |
| 2021/0104399 | A1 | 4/2021 | Kuroda et al. |
| 2021/0108328 | A1 | 4/2021 | Yanagisawa |
| 2021/0111025 | A1 | 4/2021 | Zyulkov et al. |
| 2021/0111053 | A1 | 4/2021 | Ridder |
| 2021/0118667 | A1 | 4/2021 | Fukazawa et al. |
| 2021/0118679 | A1 | 4/2021 | Lima et al. |
| 2021/0118687 | A1 | 4/2021 | Wang et al. |
| 2021/0125827 | A1 | 4/2021 | Khazaka et al. |
| 2021/0125832 | A1 | 4/2021 | Bhatnagar |
| 2021/0134588 | A1 | 5/2021 | Kohen et al. |
| 2021/0134959 | A1 | 5/2021 | Lima et al. |
| 2021/0140043 | A1 | 5/2021 | Thombare et al. |
| 2021/0143003 | A1 | 5/2021 | Fukuda et al. |
| 2021/0151315 | A1 | 5/2021 | Pierreux et al. |
| 2021/0151348 | A1 | 5/2021 | Utsuno et al. |
| 2021/0151352 | A1 | 5/2021 | Zope et al. |
| 2021/0156024 | A1 | 5/2021 | Roh et al. |
| 2021/0156030 | A1 | 5/2021 | Shugrue |
| 2021/0159077 | A1 | 5/2021 | Longrie et al. |
| 2021/0166910 | A1 | 6/2021 | Kim et al. |
| 2021/0166924 | A1 | 6/2021 | Moon et al. |
| 2021/0166925 | A1 | 6/2021 | Moon et al. |
| 2021/0166940 | A1 | 6/2021 | Nozawa |
| 2021/0172064 | A1 | 6/2021 | Moon |
| 2021/0175052 | A1 | 6/2021 | Takahashi et al. |
| 2021/0180184 | A1 | 6/2021 | Verni et al. |

(56) References Cited

U.S. PATENT DOCUMENTS

2021/0180188 A1 6/2021 Kim et al.
2021/0180189 A1 6/2021 Shugrue et al.
2021/0193458 A1 6/2021 Salmi et al.
2021/0205758 A1 7/2021 Kimtee et al.
2021/0207269 A1 7/2021 Huang et al.
2021/0207270 A1 7/2021 de Ridder et al.
2021/0210373 A1 7/2021 Singu et al.
2021/0214842 A1 7/2021 Yoon et al.
2021/0225615 A1 7/2021 Yoshida
2021/0225622 A1 7/2021 Shoji
2021/0225642 A1 7/2021 Utsuno et al.
2021/0225643 A1 7/2021 Kuroda et al.
2021/0230744 A1 7/2021 Kimtee
2021/0230746 A1 7/2021 Shiba
2021/0233772 A1 7/2021 Zhu et al.
2021/0238736 A1 8/2021 Butail et al.
2021/0238742 A1 8/2021 Susa et al.
2021/0239614 A1 8/2021 Muralidhar et al.
2021/0242011 A1 8/2021 Shero et al.
2021/0246556 A1 8/2021 Mori
2021/0247693 A1 8/2021 Maes et al.
2021/0249303 A1 8/2021 Blanquart
2021/0254216 A1 8/2021 Mori et al.
2021/0254238 A1 8/2021 Khazaka et al.
2021/0257213 A1 8/2021 Kikuchi et al.
2021/0257509 A1 8/2021 Nishiwaki
2021/0265134 A1 8/2021 Singh et al.
2021/0265158 A1 8/2021 Kaneko
2021/0268554 A1 9/2021 Mori
2021/0269914 A1 9/2021 Väyrynen et al.
2021/0272821 A1 9/2021 Oosterlaken
2021/0273109 A1 9/2021 Yamazaki et al.
2021/0280448 A1 9/2021 Ganguli et al.
2021/0285102 A1 9/2021 Yoon et al.
2021/0287878 A1 9/2021 Um et al.
2021/0287912 A1 9/2021 Shiba et al.
2021/0287928 A1 9/2021 Kim et al.
2021/0288476 A1 9/2021 Wei
2021/0292902 A1 9/2021 Kajbafvala et al.
2021/0296130 A1 9/2021 Longrie et al.
2021/0296144 A1 9/2021 Lin et al.
2021/0310125 A1 10/2021 Ma et al.
2021/0313150 A1 10/2021 Kang et al.
2021/0313167 A1 10/2021 Pore et al.
2021/0313170 A1 10/2021 Suzuki
2021/0313178 A1 10/2021 Nakano
2021/0313182 A1 10/2021 Zhu et al.
2021/0317576 A1 10/2021 Väyrynen et al.
2021/0319982 A1 10/2021 Kim et al.
2021/0320003 A1 10/2021 Sugiura et al.
2021/0320010 A1 10/2021 Wang et al.
2021/0320020 A1 10/2021 Oosterlaken et al.
2021/0324510 A1 10/2021 Kuwano et al.
2021/0324518 A1 10/2021 de Ridder
2021/0327704 A1 10/2021 Kajbafvala et al.
2021/0327714 A1 10/2021 Lee et al.
2021/0327715 A1 10/2021 Xie et al.
2021/0328036 A1 10/2021 Li et al.

FOREIGN PATENT DOCUMENTS

CN 1186873 7/1998
CN 2588350 11/2003
CN 1563483 1/2005
CN 1655362 8/2005
CN 1664987 9/2005
CN 1257838 C 5/2006
CN 1825535 8/2006
CN 101047143 10/2007
CN 101142012 3/2008
CN 101609858 12/2009
CN 201404770 Y 2/2010
CN 101681873 3/2010
CN 101308794 9/2010
CN 102094183 6/2011
CN 102099120 B 6/2011
CN 202078794 U 12/2011
CN 102383106 3/2012
CN 202621032 U 12/2012
CN 102989238 B 3/2013
CN 103014846 4/2013
CN 102539019 9/2013
CN 103515222 1/2014
CN 102373440 7/2014
CN 203721699 7/2014
CN 104244620 12/2014
CN 104307264 1/2015
CN 104498895 4/2015
CN 104517892 4/2015
CN 204629865 9/2015
CN 105253917 1/2016
CN 205448240 8/2016
CN 104342637 2/2017
CN 106621698 A 5/2017
CN 206145834 5/2017
CN 104233226 6/2017
CN 106895521 6/2017
CN 104201108 11/2017
CN 104630735 12/2017
CN 206881336 U 1/2018
CN 206881375 U 1/2018
CN 107675144 2/2018
CN 207605518 U 7/2018
CN 108389798 8/2018
CN 106011785 10/2018
CN 108910843 11/2018
CN 109000352 12/2018
CN 208612140 U 3/2019
DE 8902307 8/1989
DE 3836696 12/1989
DE 3626724 6/1994
DE 10133013 1/2003
DE 102008052750 6/2009
EP 0058571 8/1982
EP 0499004 8/1992
EP 0634785 1/1995
EP 0550058 11/1998
EP 0887632 12/1998
EP 678909 7/1999
EP 1061567 12/2000
EP 1889817 2/2008
EP 2036600 3/2009
EP 2366449 A2 9/2011
EP 2426233 7/2012
EP 2436446 B1 9/2016
FR 686869 7/1930
FR 1408266 8/1965
FR 2233614 1/1975
FR 2517790 6/1983
FR 2610007 8/1990
FR 2708624 2/1995
GB 400010 10/1933
GB 752-277 7/1956
GB 1186889 6/1966
GB 1514921 6/1978
GB 2051875 1/1981
JP S5089964 U 7/1975
JP S52134182 U 10/1977
JP S5371374 A 6/1978
JP S55133209 U 9/1980
JP 58-19462 4/1983
JP S5979545 5/1984
JP S59127847 7/1984
JP 59-211779 11/1984
JP S60110133 6/1985
JP 61038863 2/1986
JP S62237236 10/1987
JP S63136532 6/1988
JP H0165766 6/1989
JP H01185176 7/1989
JP H01-296613 11/1989
JP H01-307229 12/1989
JP H01313954 12/1989
JP H02-93071 4/1990

(56) References Cited

FOREIGN PATENT DOCUMENTS

JP H02-185038 7/1990
JP H02-217469 8/1990
JP H03-044472 2/1991
JP H03-155625 7/1991
JP H03211753 9/1991
JP H03-248427 11/1991
JP H04-29313 1/1992
JP H04-115531 4/1992
JP H05-6880 1/1993
JP H05-23079 3/1993
JP H05-118928 5/1993
JP H05-171446 7/1993
JP H05-291142 11/1993
JP H06-053210 2/1994
JP H06-84888 3/1994
JP H06-140399 5/1994
JP H0616433 6/1994
JP 6204231 7/1994
JP H06-319177 11/1994
JP H06-338497 12/1994
JP H07-29836 1/1995
JP H07-297271 1/1995
JP H07-066267 3/1995
JP H07-74162 3/1995
JP H07-109576 4/1995
JP H07-034936 8/1995
JP H07-225214 8/1995
JP 7-272694 10/1995
JP H07-283149 10/1995
JP H07-209093 11/1995
JP H08-181135 7/1996
JP H08-335558 12/1996
JP H09-064149 3/1997
JP 9-89676 4/1997
JP H09-148322 6/1997
JP H10-41096 2/1998
JP H10-50635 2/1998
JP H10-50800 2/1998
JP H10-064696 3/1998
JP H10-153494 6/1998
JP H10-227703 8/1998
JP H10-0261620 9/1998
JP H11-097163 4/1999
JP H11-118615 4/1999
JP H11-183264 7/1999
JP H11-183265 7/1999
JP H11-195688 7/1999
JP H11-287715 10/1999
JP 2000068355 3/2000
JP 2000182949 6/2000
JP 2000269163 9/2000
JP 2001015698 1/2001
JP 2001023872 1/2001
JP 2001207265 7/2001
JP 2001207268 7/2001
JP 2001210602 8/2001
JP 2001220677 8/2001
JP 2001257199 9/2001
JP 2001287180 10/2001
JP 2001300259 A 10/2001
JP 2002118066 4/2002
JP 2002164342 6/2002
JP 2002170781 6/2002
JP 2002237375 8/2002
JP 2003035574 2/2003
JP 2003053688 2/2003
JP 2003133300 5/2003
JP 2003153706 5/2003
JP 2003303814 10/2003
JP 2004014952 1/2004
JP 2004023043 1/2004
JP 2004088077 3/2004
JP 2004091848 3/2004
JP 2004113270 4/2004
JP 2004128019 4/2004
JP 2004134553 4/2004
JP 2004163293 6/2004
JP 2004244298 9/2004
JP 2004244661 9/2004
JP 2005033221 9/2004
JP 2004294638 10/2004
JP 3589954 11/2004
JP 2004310019 11/2004
JP 2005079254 3/2005
JP 2005507030 3/2005
JP 2005172489 6/2005
JP 3725100 12/2005
JP 2006028572 2/2006
JP 2006049352 2/2006
JP 2006059931 3/2006
JP 2006090762 4/2006
JP 2006124831 5/2006
JP 2006124832 5/2006
JP 2006153706 6/2006
JP 2006186271 7/2006
JP 2006188729 7/2006
JP 2006278058 10/2006
JP 2006319261 11/2006
JP 2007027777 2/2007
JP 2007287902 11/2007
JP 3140111 3/2008
JP 2008060304 3/2008
JP 2008066159 3/2008
JP 2008085129 4/2008
JP 2008089320 4/2008
JP 2008172083 7/2008
JP 2008198629 8/2008
JP 2008202107 9/2008
JP 2009016815 1/2009
JP 2009088421 4/2009
JP 2009099938 5/2009
JP 2009194248 8/2009
JP 2009239082 10/2009
JP 2009251216 10/2009
JP 2009252851 10/2009
JP 2010067940 3/2010
JP 2010097834 4/2010
JP 2010205967 9/2010
JP 2010251444 10/2010
JP 2010255218 11/2010
JP 2011049592 3/2011
JP 2011114067 A 6/2011
JP 2011162830 8/2011
JP 2011181681 9/2011
JP 2009010412 2/2012
JP 2012146939 8/2012
JP 2012164736 8/2012
JP 2012195513 10/2012
JP 2013026479 2/2013
JP 2013196822 9/2013
JP 2013235912 11/2013
JP 2014002127 A 1/2014
JP D1422467 8/2014
JP 2014222693 11/2014
JP 2015021175 2/2015
JP 2015115461 6/2015
JP 2016098406 5/2016
JP 2010123843 6/2016
JP 2016174158 9/2016
JP 2017183242 10/2017
JP 2017220011 12/2017
JP 6519897 5/2019
KR 1998-0026850 7/1998
KR 19990078633 A 11/1999
KR 20000000946 1/2000
KR 10-0253664 4/2000
KR 10-2000-0031098 6/2000
KR 10-2000-0045257 7/2000
KR 100273261 12/2000
KR 10-0295043 4/2001
KR 20020010955 A 2/2002
KR 10-2002-0027695 4/2002
KR 10-2002-0064028 8/2002
KR 2002-0086763 11/2002

(56) References Cited

FOREIGN PATENT DOCUMENTS

| | | | |
|---|---|---|---|
| KR | 20030003833 | A | 1/2003 |
| KR | 10-0377095 | | 3/2003 |
| KR | 2003-0092305 | | 12/2003 |
| KR | 20040012390 | A | 2/2004 |
| KR | 20040025749 | A | 3/2004 |
| KR | 10-2005-0054122 | | 6/2005 |
| KR | 10-0547248 | | 1/2006 |
| KR | 10-0593960 | | 6/2006 |
| KR | 20060076372 | A | 7/2006 |
| KR | 10-2006-0129566 | | 12/2006 |
| KR | 100730377 | B1 | 1/2007 |
| KR | 10-0688484 | | 2/2007 |
| KR | 20070041701 | | 4/2007 |
| KR | 10-2007-0079797 | | 8/2007 |
| KR | 10-2007-0084683 | | 8/2007 |
| KR | 10-2007-0117817 | | 12/2007 |
| KR | 2008-0058620 | | 6/2008 |
| KR | 10-2009-0039936 | | 4/2009 |
| KR | 10-2009-0055443 | | 6/2009 |
| KR | 10-2009-0056475 | | 6/2009 |
| KR | 20090054743 | A | 6/2009 |
| KR | 10-2009-0086790 | | 8/2009 |
| KR | 10-2009-0105977 | | 10/2009 |
| KR | 10-0936694 | | 1/2010 |
| KR | 10-2010-0015073 | | 2/2010 |
| KR | 10-2010-0020834 | | 2/2010 |
| KR | 10-2010-0032812 | | 3/2010 |
| KR | 10-2010-0077442 | | 7/2010 |
| KR | 10-2010-0079920 | | 7/2010 |
| KR | 10-2010-0122701 | | 11/2010 |
| KR | 10-2010-0132779 | | 12/2010 |
| KR | 10-2011-0058534 | | 6/2011 |
| KR | 20110079156 | A | 7/2011 |
| KR | 10-1114219 | | 3/2012 |
| KR | 10-2012-0111060 | | 10/2012 |
| KR | 10-2013-0007806 | | 1/2013 |
| KR | 10-2013-0067600 | | 6/2013 |
| KR | 10-2013-0129149 | | 11/2013 |
| KR | 10-1347962 | | 1/2014 |
| KR | 10-1491726 | | 2/2015 |
| KR | 10-1535573 | | 7/2015 |
| KR | 101758892 | | 7/2017 |
| KR | 10-2019-0032077 | | 3/2019 |
| NL | 8600255 | | 9/1987 |
| NL | 8701549 | | 2/1989 |
| RO | 128367 | B1 | 11/2014 |
| SU | 494614 | | 2/1976 |
| SU | 1408319 | | 7/1988 |
| SU | 1786406 | | 1/1993 |
| TW | 439547 | U | 6/2001 |
| TW | 538327 | | 6/2003 |
| TW | 540093 | | 7/2003 |
| TW | 200532180 | A | 10/2005 |
| TW | M292692 | | 6/2006 |
| TW | 200731357 | | 8/2007 |
| TW | 200903625 | | 1/2009 |
| TW | 201213596 | | 4/2012 |
| TW | 201234453 | | 8/2012 |
| TW | 201247690 | | 12/2012 |
| TW | M446412 | | 2/2013 |
| TW | 201330086 | | 7/2013 |
| TW | I439547 | B | 6/2014 |
| TW | D162593 | | 8/2014 |
| TW | D164568 | | 12/2014 |
| TW | 201531587 | | 8/2015 |
| TW | M512254 | | 11/2015 |
| TW | I514509 | | 12/2015 |
| TW | I518830 | B | 1/2016 |
| TW | 201613231 | | 4/2016 |
| TW | M553518 | | 12/2017 |
| TW | D196097 | | 2/2019 |
| WO | 8404698 | A1 | 12/1984 |
| WO | 1987001508 | | 3/1987 |
| WO | 1990004045 | | 4/1990 |
| WO | 1991004522 | | 4/1991 |
| WO | 1991006975 | | 5/1991 |
| WO | 1992000477 | | 1/1992 |
| WO | 1994027315 | | 11/1994 |
| WO | 1996017107 | | 6/1996 |
| WO | 1997003223 | | 1/1997 |
| WO | 1998032893 | | 7/1998 |
| WO | 9924365 | A1 | 5/1999 |
| WO | 1999023690 | | 5/1999 |
| WO | DM/048579 | | 7/1999 |
| WO | 2004008491 | | 7/2002 |
| WO | 2004007800 | | 1/2004 |
| WO | 2004008827 | | 1/2004 |
| WO | 2004010467 | | 1/2004 |
| WO | 2004106584 | | 12/2004 |
| WO | 2005112082 | | 11/2005 |
| WO | 2005113126 | A1 | 12/2005 |
| WO | 2006035281 | | 4/2006 |
| WO | 2006054854 | | 5/2006 |
| WO | 2006056091 | | 6/2006 |
| WO | 2006078666 | | 7/2006 |
| WO | 2006080782 | | 8/2006 |
| WO | 2006097525 | | 9/2006 |
| WO | 2006101857 | | 9/2006 |
| WO | 2006114781 | | 11/2006 |
| WO | 2007024720 | | 3/2007 |
| WO | 2007027165 | | 3/2007 |
| WO | 2007076195 | | 7/2007 |
| WO | 2007088940 | | 8/2007 |
| WO | 2007088940 | A1 | 8/2007 |
| WO | 2007117718 | | 10/2007 |
| WO | 2007131051 | | 11/2007 |
| WO | 2007140376 | | 12/2007 |
| WO | 2008045972 | | 4/2008 |
| WO | 2008091900 | | 7/2008 |
| WO | 2008121463 | | 10/2008 |
| WO | 2008147731 | | 12/2008 |
| WO | 2009028619 | | 3/2009 |
| WO | 2009029532 | | 3/2009 |
| WO | 2009039251 | | 3/2009 |
| WO | 2009099776 | | 8/2009 |
| WO | 2009154889 | | 12/2009 |
| WO | 2009154896 | | 12/2009 |
| WO | 2010039363 | | 4/2010 |
| WO | 2010077533 | | 7/2010 |
| WO | 2010100702 | | 9/2010 |
| WO | 2010110558 | | 9/2010 |
| WO | 2010118051 | | 10/2010 |
| WO | 2010129428 | | 11/2010 |
| WO | 2010129430 | | 11/2010 |
| WO | 2010129431 | | 11/2010 |
| WO | 2011019950 | | 2/2011 |
| WO | 2011149640 | | 12/2011 |
| WO | 2012056592 | | 5/2012 |
| WO | 2012077590 | | 6/2012 |
| WO | 2013043330 | | 3/2013 |
| WO | 2013078065 | | 5/2013 |
| WO | 2013078066 | | 5/2013 |
| WO | 2013177269 | | 11/2013 |
| WO | 2014107290 | | 7/2014 |
| WO | 2015026230 | | 2/2015 |
| WO | 2015107009 | | 7/2015 |
| WO | 2015112728 | | 7/2015 |
| WO | 2015127614 | | 9/2015 |
| WO | 2016019795 | | 2/2016 |
| WO | 2018109553 | | 6/2016 |
| WO | 2018109554 | | 6/2016 |
| WO | 2017108713 | | 6/2017 |
| WO | 2017108714 | | 6/2017 |
| WO | 2017125401 | | 7/2017 |
| WO | 2017212546 | | 12/2017 |
| WO | 2018003072 | | 1/2018 |
| WO | 2018008088 | | 1/2018 |
| WO | 2018013778 | | 1/2018 |
| WO | 2018020316 | | 2/2018 |
| WO | 2018020318 | | 2/2018 |
| WO | 2018020320 | | 2/2018 |
| WO | 2018020327 | | 2/2018 |
| WO | 2018105349 | | 6/2018 |
| WO | 2018109551 | | 6/2018 |

(56) References Cited

FOREIGN PATENT DOCUMENTS

| | | | |
|---|---|---|---|
| WO | 2018109552 | | 6/2018 |
| WO | 2018178771 | | 10/2018 |
| WO | 2018231048 | A1 | 12/2018 |
| WO | 2019030565 | | 2/2019 |
| WO | 2019103610 | | 5/2019 |
| WO | 2019103613 | | 5/2019 |
| WO | 2007081519 | A2 | 7/2019 |
| WO | 2019142055 | | 7/2019 |
| WO | 2019158960 | | 8/2019 |
| WO | 2019214578 | | 11/2019 |
| WO | 2019217749 | | 11/2019 |
| WO | 2019229537 | | 12/2019 |
| WO | 2020002995 | | 1/2020 |
| WO | 2020003000 | | 1/2020 |
| WO | 2020118100 | | 6/2020 |
| WO | 2021072042 | | 4/2021 |

OTHER PUBLICATIONS

CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 21 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.

(56) References Cited

OTHER PUBLICATIONS

USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.

(56) References Cited

OTHER PUBLICATIONS

USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C.) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of A12O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of SilxGex using Si2H6 and Ge2H6" Solid-State Electronics, 88, pp. 2-9 (2013).
Yanguas-Gil et al. "Modulation of the Growth Per Cycle in Atomic Layer Deposition Using Reversible Surface Functionalization" Chemistry of Materials, 25, pp. 4849-4860 (2013).
CNIPA; Notice of Allowance dated Dec. 21, 2020 in Application No. 201610982040.X.
CNIPA; Office Action dated Nov. 20, 2020 in Application No. 201710762817.6.
CNIPA; Notice of Allowance dated Dec. 28, 2020 in Application No. 201930704935.1.
CNIPA; Notice of Allowance dated Dec. 10, 2020 in Application No. 202030352604.9.
CNIPA; Office Action dated Jan. 25, 2021 in Application No. 202030579755.8.
JPO; Notice of Allowance dated Nov. 27, 2020 in Application No. 2016-206625.
JPO; Office Action dated Jan. 26, 2021 in Application No. 2017-139817.
JPO; Notice of Allowance dated Nov. 26, 2020 in Application No. 2020-502653.
KIPO; Office Action dated Jan. 25, 2021 in Application No. 10-2014-0011765.
KIPO; Notice of Allowance dated Jan. 4, 2021 in Application No. 10-2014-0060120.
KIPO; Notice of Allowance dated Jan. 4, 2021 in Application No. 10-2014-0071653.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Jan. 25, 2021 in Application No. 10-2014-0145220.
KIPO; Office Action dated Jan. 6, 2021 in Application No. 10-2015-0025314.
KIPO; Office Action dated Dec. 23, 2020 in Application No. 10-2019-0044213.
KIPO; Office Action dated Nov. 14, 2020 in Application No. 10-2020-0101096.
KIPO; Notice of Allowance dated Oct. 20, 2020 in Application No. 30-2019-0054642.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Sep. 30, 2020 in Application No. 106113604.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Office Action dated Dec. 24, 2019 in Application No. 108105002.
TIPO; Notice of Allowance dated Nov. 24, 2020 in Application No. 108307599.

(56) References Cited

OTHER PUBLICATIONS

TIPO; Notice of Allowance dated Jan. 11, 2021 in Application No. 108307599D01.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in U.S. Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.
USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Non-Final Office Action dated Nov. 24, 2020 in U.S. Appl. No. 16/039,938.
USPTO; Advisory Action dated Jan. 14, 2021 in U.S. Appl. No. 16/055,532.
USPTO; Final Office Action dated Dec. 15, 2020 in U.S. Appl. No. 16/108,950.
USPTO; Final Office Action dated Jan. 6, 2021 in U.S. Appl. No. 16/117,530.
USPTO; Notice of Allowance dated Feb. 12, 2021 in U.S. Appl. No. 16/128,282.
USPTO; Notice of Allowance dated Feb. 8, 2021 in U.S. Appl. No. 16/132,142.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Final Office Action dated Dec. 18, 2020 in U.S. Appl. No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.
USPTO; Non-Final Office Action dated Jan. 12, 2021 in U.S. Appl. No. 16/453,249.
USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Non-Final Office Action dated Dec. 28, 2020 in U.S. Appl. No. 16/833,279.
USPTO; Non-Final Office Action dated Nov. 23, 2020 in U.S. Appl. No. 29/726,623.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages (1999).
Kim et al. "High Growth Rate in Atomic Layer Deposition of TiO2 Thin Films by UV Irradiation" Electrochemical and Solid-State Letters, 14(4), pp. H146-H148 (2011).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VCl4 as Precursor" Coatings, 8, 431, pp. 1-11 (2018).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of Y2O3 Thin Films from β-Diketonate Precursors" Chemical Vapor Deposition 7(1) pp. 44-50 (2001).
U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.

(56) References Cited

OTHER PUBLICATIONS

CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.

(56) References Cited

OTHER PUBLICATIONS

TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.

(56) References Cited

OTHER PUBLICATIONS

USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.

(56) References Cited

OTHER PUBLICATIONS

Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pages, G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
PUURUNEN "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1-xO2-d (x=0.25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).
CNIPA; Office Action dated Jan. 10, 2013 in Application No. 201080015699.9.
CNIPA; Office Action dated Aug. 1, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
CNIPA; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.

(56) References Cited

OTHER PUBLICATIONS

CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.
CNIPA; Office Action dated Sep. 9, 2016 in Application No. 201280057542.1.
CNIPA; Notice of Allowance dated Jan. 3, 2017 in Application No. 201280057542.1.
CNIPA; Office Action dated Dec. 5, 2016 in Application No. 201310412808.6.
CNIPA; Notice of Allowance dated Jul. 20, 2017 in Application No. 201310412808.6.
CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.
CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Oct. 16, 2020 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Jun. 16, 2020 in Application No. 201610897958.4.
CNIPA; Office Action dated Nov. 4, 2019 in Application No. 201610898822.5.
CNIPA; Office Action dated Jul. 3, 2020 in Application No. 201610898822.5.
CNIPA; Notice of Allowance dated Oct. 9, 2020 in Application No. 201610898822.5.
CNIPA; Office Action dated May 18, 2020 in Application No. 201610982040.X.
CNIPA; Office Action dated May 29, 2020 in Application No. 201710131319.1.
CNIPA; Office Action dated Jun. 1, 2020 in Application No. 201710173292.2.
CNIPA; Notice of Allowance dated Nov. 4, 2020 in Application No. 201710173292.2.
CNIPA; Office Action dated Dec. 20, 2018 in Application No. 201710738549.4.
CNIPA; Office Action dated Jun. 20, 2019 in Application No. 201711120632.1.
CNIPA; Notice of Allowance dated May 25, 2017 in Application No. 201730010308.9.
CNIPA; Office Action dated Aug. 31, 2020 in Application No. 201780044761.9.
CNIPA; Office Action dated Nov. 11, 2019 in Application No. 201810379112.0.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Jun. 2, 2020 in Application No. 202030048819.1.
CNIPA; Notice of Allowance dated May 15, 2020 in Application No. 202030048854.3.
CNIPA; Notice of Allowance dated May 15, 2020 in Application No. 202030053560.X.
CNIPA; Notice of Allowance dated Aug. 7, 2020 in Application No. 202030053609.1.
CNIPA; Notice of Allowance dated May 20, 2020 in Application No. 202030053634.X.
EPO; Office Action dated Jul. 29, 2008 in Application No. 00902194.0.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Notice of Allowance dated Jan. 10, 2001 in Application No. 98911263.6.
EPO; Office Action dated Jun. 6, 2001 in Application No. 98911277.6.
EPO; Office Action dated Jun. 27, 2003 in Application No. 98967122.7.

(56) References Cited

OTHER PUBLICATIONS

EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
JPO; Office Action dated Jun. 1, 2020 in Application No. 2016-206625.
JPO; Office Action dated Aug. 28, 2020 in Application No. 2017-139817.
JPO; Notice of Allowance dated Jul. 1, 2020 in Application No. 2019-025168.
JPO; Office Action dated Aug. 24, 2020 in Application No. 2019-119908.
JPO; Office Action dated Jun. 29, 2020 in Application No. 2020-502653.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.

(56) References Cited

OTHER PUBLICATIONS

KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Decision of Intellectual Property Trial and Appeal Board dated Jun. 23, 2020 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.
KIPO; Notice of Allowance dated Sep. 25, 2020 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Notice of Allowance dated Aug. 13, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.
KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Notice of Allowance dated Oct. 27, 2020 in Application No. 10-2014-0011764.
KIPO; Office Action dated Jul. 21, 2020 in Application No. 10-2014-0011765.
KIPO; Office Action dated Feb. 3, 2020 in Application No. 10-2014-0021615.
KIPO; Notice of Allowance dated Sep. 8, 2020 in Application No. 10-2014-0021615.
KIPO; Office Action dated Oct. 26, 2020 in Application No. 10-2014-0027217.

(56) References Cited

OTHER PUBLICATIONS

KIPO; Office Action dated Feb. 15, 2020 in Application No. 10-2014-0027305.
KIPO; Notice of Allowance dated Oct. 12, 2020 in Application No. 10-2014-0027305.
KIPO; Office Action dated Jul. 9, 2020 in Application No. 10-2014-0060120.
KIPO; Office Action dated Aug. 18, 2020 in Application No. 10-2014-0071653.
KIPO; Office Action dated May 21, 2020 in Application No. 10-2014-0086902.
KIPO; Notice of Allowance dated Oct. 19, 2020 in Application No. 10-2014-0086902.
KIPO; Office Action dated May 21, 2020 in Application No. 10-2014-0091092.
KIPO; Notice of Allowance dated Sep. 27, 2020 in Application No. 10-2014-0091092.
KIPO; Office Action dated Mar. 11, 2020 in Application No. 10-2014-0103853.
KIPO; Office Action dated Oct. 5, 2020 in Application No. 10-2014-0103853.
KIPO; Office Action dated Oct. 7, 2020 in Application No. 10-2014-0128626.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Nov. 9, 2016 in Application No. 10-2016-7023913.
KIPO; Notice of Allowance dated May 30, 2017 in Application No. 10-2016-7023913.
KIPO; Office Action dated Jul. 21, 2020 in Application No. 10-2017-0087308.
KIPO; Notice of Allowance dated Oct. 26, 2020 in Application No. 10-2017-0087308.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Office Action dated Jun. 30, 2020 in Application No. 10-2019-0044213.
KIPO; Notice of Allowance dated Nov. 29, 2019 in Application No. 10-2019-0127773.
KIPO; Offie Action dated Apr. 22, 2020 in Application No. 10-2020-0009462.
KIPO; Notice of Allowance dated Oct. 28, 2020 in Application No. 10-2020-0009462.
KIPO; Office Action dated Feb. 12, 2020 in Application No. 10-2020-7000992.
KIPO; Notice of Allowance dated Jul. 20, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 22, 2020 in Application No. 30-2019-0058076.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Applicaton No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Notice of Allowance dated Jul. 18, 2017 in Application No. 102127065.

(56) References Cited

OTHER PUBLICATIONS

TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.
TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.
TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated Jul. 1, 2020 in Application No. 105101537.
TIPO; Notice of Allowance dated May 7, 2019 in Application No. 105104453.
TIPO; Office Action dated Dec. 13, 2019 in Application No. 105111990.
TIPO; Notice of Allowance dated Sep. 4, 2020 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.

(56) References Cited

OTHER PUBLICATIONS

TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Sep. 7, 2020 in Application No. 105122394.
TIPO; Office Action dated Jan. 17, 2020 in Application No. 105122586.
TIPO; Notice of Allowance dated Aug. 31, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Sep. 18, 2020 in Application No. 105129977.
TIPO; Office Action dated Mar. 17, 2020 in Application No. 105130130.
TIPO; Notice of Allowance dated Sep. 25, 2020 in Application No. 105130130.
TIPO; Office Action Received Aug. 25, 2020 in Application No. 105131284.
TIPO; Office Action dated Aug. 25, 2020 in Application No. 105131896.
TIPO; Office Action dated Sep. 30, 2020 in Application No. 105142668.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Aug. 11, 2020 in Application No. 106100823.
TIPO; Office Action dated Jun. 17, 2020 in Application No. 106108152.
TIPO; Office Action dated Oct. 7, 2020 in Application No. 106108522.
TIPO; Office Action dated Aug. 21, 2020 in Application No. 106111548.
TIPO; Office Action dated Oct. 8, 2020 in Application No. 106111693.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Oct. 8, 2020 in Application No. 106123203.
TIPO; Office Action dated Dec. 26, 2018 in Application No. 106127690.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 19 in Application No. 107303723.
TIPO; Office Action dated Jun. 28, 2019 in Application No. 108102948.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Sep. 25, 2020 in Application No. 108307759.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.
USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.
USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.

(56) References Cited

OTHER PUBLICATIONS

USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.
USPTO; Non- Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.

(56) References Cited

OTHER PUBLICATIONS

USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.

(56) References Cited

OTHER PUBLICATIONS

USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Notice of Allowance dated Jul. 6, 2020 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.
USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Examiner's Answer to Appeal Brief dated Apr. 20, 2018 in U.S. Appl. No. 13/187,300.

(56) References Cited

OTHER PUBLICATIONS

USPTO; Patent Board Decision dated Sep. 23, 2019 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.

(56) References Cited

OTHER PUBLICATIONS

USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.
USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.

(56) References Cited

OTHER PUBLICATIONS

USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.
USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.

(56) References Cited

OTHER PUBLICATIONS

USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Advisory Action dated Nov. 10, 2015 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.
USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.

(56) References Cited

OTHER PUBLICATIONS

USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Advisory Action dated Apr. 24, 2020 in U.S. Appl. No. 14/219,879.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action Dated Jul. 27, 2018 in U.S. Appl. No. 14/444,744.
USPTO; Final Office Action dated Feb. 7, 2019 in Application No. 14/444, 744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated Apr. 28, 2020 in U.S. Appl. No. 14/444,744.
USPTO; Notice of Allowance dated Sep. 3, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.
USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.

(56) References Cited

OTHER PUBLICATIONS

USPTO; Notice of Allowance dated Aug. 6, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.
USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.

(56) References Cited

OTHER PUBLICATIONS

USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Aug. 3, 2020 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.
USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.

(56) References Cited

OTHER PUBLICATIONS

USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Aug. 18, 2020 in U.S. Appl. No. 15/135,258.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.
USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.

(56) References Cited

OTHER PUBLICATIONS

USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Oct. 6, 2020 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.
USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Final Office Action dated Oct. 2, 2020 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Non-Final Office Action dated Sep. 2, 2020 in U.S. Appl. No. 15/377,439.
USPTO; Notice of Allowance dated Aug. 8, 2017 in U.S. Appl. No. 15/380,895.
USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jul. 1, 2020 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Final Office Action dated Jul. 23, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.

(56) References Cited

OTHER PUBLICATIONS

USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Sep. 30, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.
USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.

(56) References Cited

OTHER PUBLICATIONS

USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Non-Final Office Action dated Sep. 3, 2020 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Notice of Allowance dated Jul. 2, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.
USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Oct. 6, 2020 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.

(56) References Cited

OTHER PUBLICATIONS

USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Final Office Action dated Sep. 24, 2020 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.
USPTO; Non-Final Office Action dated Apr. 24, 2020 in U.S. Appl. No. 15/815,483.
USPTO; Notice of Allowance dated Sep. 30, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Final Office Action dated Sep. 17, 2020 in U.S. Appl. No. 15/835,328.
USPTO; Non-Final Office Action dated Feb. 20, 2020 in U.S. Appl. No. 15/835,352.
USPTO; Final Office Action dated Aug. 6, 2020 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Notice of Allowance dated Aug. 17, 2020 in U.S. Appl. No. 15/843,899.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Notice of Allowance dated Jun. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Notice of Allowance dated Aug. 19, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.

(56) References Cited

OTHER PUBLICATIONS

USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Non-Final Office Action dated Sep. 2, 2020 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Final Office Action dated Jun. 15, 2020 in U.S. Appl. No. 15/896,986.
USPTO; Notice of Allowance dated Aug. 26, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Sep. 9, 2020 in U.S. Appl. No. 15/909,705.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Final Office Action dated Sep. 24, 2020 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.
USPTO; Non-Final Office Action dated May 8, 2019 in U.S. Appl. No. 15/925,532.
USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Final Office Action dated Oct. 15, 2020 in U.S. Appl. No. 15/925,532.
USPTO; Non-Final Office Action dated Oct. 6, 2020 in U.S. Appl. No. 15/940,729.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Aug. 3, 2020 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Non-Final Office Action dated Oct. 6, 2020 in U.S. Appl. No. 15/967,146.
USPTO; Non-Final Office Action dated Apr. 2, 2020 in U.S. Appl. No. 15/974,948.
USPTO; Final Office Action dated Sep. 3, 2020 in U.S. Appl. No. 15/974,948.
USPTO; Non-Final Office Action dated May 15, 2020 in U.S. Appl. No. 15/974,988.
USPTO; Notice of Allowance dated Oct. 14, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Final Office Action dated Nov. 25, 2020 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Non-Final Office Action dated Apr. 1, 2020 in U.S. Appl. No. 15/997,445.
USPTO; Final Office Action dated Oct. 2, 2020 in U.S. Appl. No. 15/997,445.
USPTO; Notice of Allowance dated Jul. 10, 2020 in U.S. Appl. No. 15/998,775.

(56) References Cited

OTHER PUBLICATIONS

USPTO; Non-Final Office Action dated Mar. 3, 2020 in U.S. Appl. No. 16/000,109.
USPTO; Final Office Action dated Sep. 14, 2020 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Final Office Action dated Oct. 6, 2020 in U.S. Appl. No. 16/000,125.
USPTO; Non-Final Office Action dated Apr. 22, 2020 in U.S. Appl. No. 16/000,156.
USPTO; Final Office Action dated Oct. 22, 2020 in U.S. Appl. No. 16/000,156.
USPTO; Non-Final Office Action dated May 7, 2020 in U.S. Appl. No. 16/004,041.
USPTO; Final Office Action dated Oct. 15, 2020 in U.S. Appl. No. 16/004,041.
USPTO; Non-Final Office Action dated Jul. 16, 2019 in U.S. Appl. No. 16/014,981.
USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Sep. 8, 2020 in U.S. Appl. No. 16/039,817.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Non-Final Office Action dated Aug. 4, 2020 in U.S. Appl. No. 16/042,791.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Non-Final Office Action dated May 27, 2020 in U.S. Appl. No. 16/100,012.
USPTO; Notice of Allowance dated Sep. 14, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.
USPTO; Final Office Action dated Nov. 17, 2020 in U.S. Appl. No. 16/105,802.
USPTO; Non-Final Office Action dated Sep. 8, 2020 in U.S. Appl. No. 16/108,950.
USPTO; Non-Final Office Action dated Mar. 16, 2020 in U.S. Appl. No. 16/116,708.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Non-Final Office Action dated Feb. 6, 2020 in U.S. Appl. No. 16/117,530.
USPTO; Non-Final Office Action dated Jun. 22, 2020 in U.S. Appl. No. 16/128,282.
USPTO; Final Office Action dated Nov. 19, 2020 in U.S. Appl. No. 16/128,282.
USPTO; Non-Final Office Action dated Apr. 21, 2020 in U.S. Appl. No. 16/130,798.
USPTO; Notice of Allowance dated Aug. 5, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Non-Final Office Action dated Feb. 28, 2020 in U.S. Appl. No. 16/137,974.
USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Jul. 30, 2020 in U.S. Appl. No. 16/151,074.
USPTO; Non-Final Office Action dated Nov. 5, 2019 in U.S. Appl. No. 16/152,260.

(56) References Cited

OTHER PUBLICATIONS

USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Notice of Allowance dated Jul. 24, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Notice of Allowance dated Jun. 19, 2020 in U.S. Appl. No. 16/161,744.
USPTO; Non-Final Office Action dated Jul. 23, 2020 in U.S. Appl. No. 16/167,164.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Non-Final Office Action dated Nov. 4, 2020 in U.S. Appl. No. 16/176,517.
USPTO; Non-Final Office Action dated Oct. 29, 2020 in U.S. Appl. No. 16/183,258.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Notice of Allowance dated Oct. 3, 2019 in U.S. Appl. No. 16/200,100.
USPTO; Non-Final Office Action dated May 29, 2020 in U.S. Appl. No. 16/205,899.
USPTO; Final Office Action dated Nov. 27, 2020 in U.S. Appl. No. 16/205,899.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Jul. 15, 2020 in U.S. Appl. No. 16/210,922.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Non-Final Office Action dated Feb. 19, 2020 in U.S. Appl. No. 16/242,829.
USPTO; Final Office Action dated Jun. 15, 2020 in U.S. Appl. No. 16/242,829.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Final Office Action dated Oct. 14, 2020 in U.S. Appl. No. 16/251,534.
USPTO; Non-Final Office Action dated May 27, 2020 in U.S. Appl. No. 16/252,567.
USPTO; Final Office Action dated Nov. 18, 2020 in U.S. Appl. No. 16/252,567.
USPTO; Non-Final Office Action dated Apr. 16, 2020 in U.S. Appl. No. 16/255,639.
USPTO; Notice of Allowance dated Aug. 6, 2020 in U.S. Appl. No. 16/255,639.
USPTO; Non-Final Office Action dated Jun. 30, 2020 in U.S. Appl. No. 16/258,187.
USPTO; Notice of Allowance dated Aug. 5, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Notice of Allowance dated Jun. 13, 2019 in U.S. Appl. No. 16/396,475.
USPTO; Non-Final Office Action dated Aug. 5, 2020 in U.S. Appl. No. 16/397,045.
USPTO; Non-Final Office Action dated Aug. 19, 2020 in U.S. Appl. No. 16/400,814.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.
USPTO; Non-Final Office Action dated May 12, 2020 in U.S. Appl. No. 16/454,063.

(56) References Cited

OTHER PUBLICATIONS

USPTO; Notice of Allowance dated Sep. 18, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Nov. 27, 2020 in U.S. Appl. No. 16/468,258.
USPTO; Non-Final Office Action dated Nov. 5, 2020 in U.S. Appl. No. 16/546,543.
USPTO; Non-Final Office Action dated Jun. 11, 2020 in U.S. Appl. No. 16/598,768.
USPTO; Notice of Allowance dated Sep. 16, 2020 in U.S. Appl. No. 16/598,768.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Oct. 16, 2020 in U.S. Appl. No. 16/679,885.
USPTO; Non-Final Office Action dated Nov. 16, 2020 in U.S. Appl. No. 16/713,311.
USPTO; Non-Final Office Action dated Apr. 13, 2020 in U.S. Appl. No. 16/833,279.
USPTO; Final Office Action dated Oct. 2, 2020 in U.S. Appl. No. 16/833,279.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Aug. 4, 2020 in U.S. Appl. No. 16/926,192.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Non-Final Office Action dated Apr. 24, 2020 in U.S. Appl. No. 29/726,623.
USPTO; Final Office Action dated Sep. 9, 2020 in U.S. Appl. No. 29/726,623.
USPTO; Notice of Allowance dated Nov. 23, 2020 in U.S. Appl. No. 29/726,623.
WIPO; International Search Report dated Oct. 13, 1998 in Application No. PCT/FI1998/000571.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.

(56) References Cited

OTHER PUBLICATIONS

WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/0000020.
WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search Report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/033248.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Akiyama et al. "Macro- and micro-scale simulation of growth rate and composition in MOCVD of yttria-stabilized zirconia" J. Crystal Growth 241, pp. 352-362 (2002).
Alen, "Atomic layer deposition of TaN, NbN and MON films for Cu Metallizations," University of Helsinki Finland, 72 pages, (2005).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Atta et al. "The Catalytic Activity of Ruthenates ARuO3 (A = Ca, Sr or Ba) for the Hydrogen Evolution Reaction in Acidic Medium" Int. J. Electrochem. Sci. 7, pp. 725-746 (2012).
Ballal "Mass Transfer in Porous Solids under Pulsating Pressure Conditions" SLJ International, vol. 35, Nov. 4, pp. 446-448 (1995).
Bark et al. "Large-area niobium disulfide thin films as transparent electrodes for devices based on two- dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Basuvalingam et al. "NS-WeA6—Low Temperature ALD for Phase-controlled Synthesis of 2D Transition Metal (M=Ti, Nb) di-(MX2) and Tri-(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Brewin et al. "UPS to deploy Bluetooth, wireless LAN network" Internet, pp. 1-5 (2001).
Bulletin Plasma Source—12/02: Type AX7610—Downstream Plasma Source. Source location: MKS Instruments, Inc. http://www.mksinst.com/. Accessed: Aug. 6, 2015. pp. 1-4 (2002).
Bulletin ASTRONe—4/02: Type AX7680—Reactive Gas Generator. Source location: MKS Instruments, Inc. http://www.mksinst.com/. Accessed: Aug. 6, 2015. pp. 1-2 (2002).
Bulletin ASTRONex—7/09: Type AX7685—Reactive Gas Generator. Source location: MKS Instruments, Inc. http://www.mksinst.com/. Accessed: Aug. 6, 2015. pp. 1-2 (2002).
Bulletin ASTRON hf-s—3/05: Type AX7645—Reactive Gas Generator. Source location: MKS Instruments, Inc. http://www.mksinst.com/. Accessed: Aug. 6, 2015. pp. 1-2 (2005).
Bulletin ENG-XSTREAM-340-09 OM 8/06: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).
Bulletin R*evolution—9/06: Type AX7690—Remote Plasma Source. Source location: MKS Instruments, Inc. http://www.mksinst.com/. Accessed: Aug. 6, 2015. pp. 1-2 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Callaghan et al. "Magnetic Interactions in Ternary Ruthenium Oxides" Inorganic Chemistry, vol. 5, No. 9, pp. 1572-1576 (1966).

(56) References Cited

OTHER PUBLICATIONS

Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Choi et al. "UV irradiation effects on the bonding structure and electrical properties of ultra low-k SiOC(-H) thin films for 45 nm technology node" Current Applied Physics, 11, S109-S113 (2011).
Closser et al., "Molecular Layer Deposition Of A Highly Stable Silicon Oxycarbide Thin Film Using An Organic Chlorosilane And Water," ACS Applied Materials & Interfaces 10, pp. 24266-24274 (2018).
Coates, "Process Analytical Technology: Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
Crystal IS "Application Note: Using UV Reflective Materials to Maximize Disinfection"; AN011; Jun. 16, 2016, found at https://www.klaran.com/using-uv-reflective-materials-to-maximize-disinfection.
De Silva et al., "Inorganic Hardmask Development For Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE Pvcs, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3]. pp. 287-300. (1999).
Esposito et al. "Preparation and characterization of lead ruthenate based composite cathodes for SOFC applications" Mater. Res. Soc. Symp. Proc., vol. 835, 6 pages (2005).
Fallica et al., "Dynamic Absorption Coefficients Of Chemically Amplified Resists And Nonchemically Amplified Resists At Extreme Ultraviolet", J. Micro/Nanolith. MEMS MOEMS 15(3), pp. 033506-1-033506-7 (2016).
"Fiji F200 200mm Thermal/Plasma ALD Systems: Installation and Use Manual." CAW-02635 Rev. 0.6 (Mar. 13, 2012). Cambridge NanoTech Inc. pp 1-164 (2012).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestly Asked Question, "What is a load lock chamber?", Kurt J. Lesker Company, www.lesker.com, p. 1 (2020).
Fu et al., "Controlled Synthesis of Atomically Thin 1T-TaS2 for Tunable Charge Density Wave Phase Transitions" Chem. Mater. 28, pp. 7613-7618 (2016).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Microstructure of Black Molybdenum Photothermal Converter Layers Deposited by the Pyrolytic Hydrogen Reduction of $MoO_2Cl_2$" Thin Solid Films, 79, pp. 39-49 (1981).
Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2]. pp 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c-Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of

(56) References Cited

OTHER PUBLICATIONS

SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics. vol. 89, No. 12, pp. 7924-7931 (2001).
Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E = 50-30,000 eV, Z = 1-92," Atomic Data and Nuclear Data Tables, 54, 181-342 (1993).
Heyne et al., "The conversion mechanism of amorphous silicon to stoichiometric WS2" J. Materials Chemistry C, 6, pp. 4122-4130 (2018).
Hong et al. "Ultralow-dielectric-constant amoprhous boron nitride" Nature, vol. 582, 16 pages (2020).
Hossain et al., "Recent Advances in Two-Dimensional Materials with Charge Density Waves: Synthesis, Characterization and Applications" Crystals 7, 298, 19 pages (2017).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Hudis, "Surface Crosslinking of Polyethylene Using a Hydrogen Glow Discharge," J. Appl. Polym. Sci., 16 (1972) 2397.
Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MC12 (M=Co, Ni, Cu, Zn) complexes with diamine ligands," Inorganica Chimica Acta 358, pp. 3293-3302 (2005).
Johnson et al. "A brief review of atomic layer deposition: from fundamentals to applications" Materials Today, vol. 17, Issue 5, pp. 236-246 (2014).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. Of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Juppo et al. "Deposition of molybdenum thin films by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al., "Passivation Effect on Low-k S/OC Dielectrics by H2 Plasma Treatment," Journal of the Korean Physical Society, "40, 1, 94-98 (2002).
Kim et al., "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al., "Novel Flowable CVD Process Technology for sub-20nm Interlayer Dielectrics, " IEEE International Interconnect Technology Conference (IITC 2012), San Jose, California, USA, Jun. 4-6, 2012, pp. 1-3 (2012).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
King, Plasma Enhanced Atomic Layer Deposition of SiNx: H and SiO2, J. Vac. Sci. Technol., A29(4) (2011).
Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kogelschatz et al. "Ozone Generation from Oxygen and Air: Discharge Physics And Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Microstructure Evolution in Single-Phase TixTal-xN Alloys of Rocksalt Structure," Journal of Applied Physics, 110, pp. 043535-1-043535-6, (2011).

(56) References Cited

OTHER PUBLICATIONS

Kovalgin et al. "Hot-Wire Assisted ALD: A Study Powered by In Situ Spectroscopic Ellipsometry" Adv. Mater. Interfaces 4, 1700058, 11 pages (2017).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kucheyev et al. "Mechanisms of Atomic Layer Deposition on Substrates with Ultrahigh Aspect Ratios." Langmuir. 24 [3]. pp 943-948 (2008).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kukli et al., "Influence of atomic layer deposition parameters on the phase content of Ta205 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kumar et al. "Bringing the benefits of Java to Bluetooth" http://www.allembedded.com/story/OEG20020519S001, pp. 1-3 (2002).
Kurosawa et al., "Synthesis and Characterization of Plasma-Polymerized Hexamethyldisiloxane Films," Thin Solid Films, 506-507, 176-179 (2006).
Kwon et al., "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al., "Characteristics Of Low-K Sioc Films Deposited Via Atomic Layer Deposition," Thin Solid Films 645, pp. 334-339 (2018).
Lee et al., Layer Selection by Multi-Level Permutation in 3-D Stacked NAND Flash Memory, IEEE Electron Device Letters, vol. 37, No. 7, 866-869 (2016).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al., "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).
Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2A1)2O]n and (RAIO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H20 and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).

(56) References Cited

OTHER PUBLICATIONS

Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnC14 Precursor," ECS Transactions, 69 (5), 279-285 (2015).
Mukai et al., "A Study of CD Budget in Spacer Patterning Technology," Proc. Of SPIE, 6924, 1-8 (2008).
Naito et al. "Electrical Transport Properties in 2H—NbS2, -NbSe2, -TaS2 and -TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Naslain et al. "Synthesis of highly tailored ceramic matrix composites by pressure-pulsed CVI" Solid State Ionics, 141-142, pp. 541-548 (2001).
Ngo et al. "Atomic layer deposition of photoactive CoO/SrTiO3 and CoO/TiO2 on Si(001) for visible light driven photoelectrochemical water oxidation," J. Applied Physics, 114, 9 pages (2013).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Nogueira et al., "Production of Highly Hydrophobic Films Using Low Frequency and High Density Plasma," Revista Brasileira de Aplicacoes de Vacuo, 25(1), 45-53 (2006).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
Okamoto et al., "Luminescent Properties of Pr3+-sensitized LaPO4: Gd3-Ultraviolet-B Phosphor Under Vacuum-Ultraviolet Light Excitation," J. App. Phys. 106, 013522 (2009).
O'Malley et al. "Structure and properties of ordered Li2IrO3 and Li2PtO3" Journal of Solid State Chemistry 181, pp. 1803-1809 (2008).
Park et al. "Atomic layer deposition of Y2O3 films using hetroleptic liquid (iPrCp)2Y(iPr-amd) precursor" J. Mater. Chem. C, 2, 9 pages (2014).
Park, "Substituted Aluminum Metal Gate on High-K Dielectric for Low Work-Function and Fermi-Level Pinning Free," 4 pages, IEEE 0-7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Posseme et al. "Alternative process for thin layer etching: Application to nitride spacer etching stopping on silicon germanium" Apply. Phys. Lett. 105, 051604, pp. 1-4 (2014).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al. "Atomic Layer Deposition: Introduction to the Theory and Cambridge Nanotech Savannah & Fiji" Nnin Ald Roadshow Presentation, 49 pages (2012).
Provine et al., "Correlation of Film Density and Wet Etch Rate in Hydrofluoric Acid of Plasma Enhanced Atomic Layer Deposited Silicon Nitride," AIP Advances, 6 (2016).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).
Radamson et al. "Growth of Sn-alloyed Group IV Materials for Photonic and Electronic Applications" Chapter 5 pp. 129-144, Manufacturing Nano Structures (2014).
Roddy, "Transport Reactions and Vaporization Studies of Some Vanadium Halides", Iowa State university of Science and Technology dissertation, 207 pages (1962).
Rosemount 1199 Diaphragm Seal Systems, Product Data Sheet, 92 pages (2008).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D Nand Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).
Sanders et al., "Crystalline and electronic structure of single-layer TaS2" Phys. Rev. B. 94, 081404, 6 pages (2016).
Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Senateur et al. "Pulsed Injection MOCVD of Functional Electronic Oxides" Adv. Mater. Opt. Electron, 10, pp. 155-161 (2000).
Seshadri et al., "Ultrathin Extreme Ultraviolet Patterning Stack Using Polymer Brush As An Adhesion Promotion Layer," Journal of Micro/Nanolithography, MEMS, and MOEMS 16(3) (2017).
Shamma et al., "PDL Oxide Enabled Doubling," Proc. Of SPIE, 6924, 69240D, 1-10 (2008).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).

(56) References Cited

OTHER PUBLICATIONS

Simchi et al., "Sulfidation of 2D transition metals (Mo, W, Re, Nb, Ta): thermodynamics, processing, and characterization" J. Materials Science 52: 17, 9 pages (2017).
Spear et al., "Chemical Transport Reactions in the Vanadium-Silicon-Oxygen System and the Ternary Phase Diagram", Journal of the Less-Common Metals, 14, pp. 69-75 (1968).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).
Stannowski et al. "Growth process and properties of silicon nitride deposited by hot-wire chemical vapor deposition" J Applied Physics, vol. 93 No. 5, 9 pages (2013).
Su et al. "A Polymer Precursor Route to Metal Borides", Chem. Mater., 5, pp. 1659-1668 (1993).
Svetin et al., "Three-dimensional resistivity and switching between correlated electronic states in 1T-$TaS_2$" Nature, Scientific Reports Apr. 12, 2017, 7:46048, 10 pages (2017).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt—Ru Binary Alloy Thin Films for Work Function Tuning," IEEE Electron Device Letters, vol. 27, No. 7, pp. 542-545 (2006).
Tomozeiu et al. "Effects of UV photon irradiation on SiOx (0<x<2) structural properties" Applied Surface Science 253, pp. 376-380 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
U.S. Appl. No. 60/394,086, filed Jul. 3, 2002 in the name of Jacques Schmitt, and entitled "ALD on a Rotary Susceptor" pp. 1-23 (2002).
U.S. Appl. No. 62/293,897, filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Venkatesan et al. "A rugged lead-ruthenate pyrochlore membrane catalyst for highly seelctive oxidation of alcohols" J. Molecular Catalysis A: Chemical 250, pp. 87-93 (2006).
Voltaix, "Meterial Safety Data Sheet for: Trisilylamine", pp. 1-8, (2014).
Wang et al., "Tritertiarybutylaluminum as an Organometallic Source for Epitaxial Growth of AlGaSb," Appl. Phys. Lett. 67 (10), September 4, pp. 1384-1386, American Institute of Physics (1995).
Wirths, et al., "SiGeSn Growth tudies Using Reduced Pressure Chemical Vapor Deposition Towards Optoeleconic Applications," This Soid Films, 557, 183-187 (2014).
Xiao "Introduction to Semiconductor Manufacturing Technology" SPIE Press, ISBN 978-0-08194-9092-6, pp. 237-245 (2012).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," Smic et al. (2016).
Xu et al., "Contacts between Two- and Three-Dimensional Materials: Ochmic, Schottky, and p-n Heterojunctions" ACS Nano 10, pp. 4895-4919 (2016).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yuan et al. "A Bifunctional Air Electrode Catalyzed by Lead Ruthenate for Li-Air Batteries" ECS Transactions 69(19), pp. 23-32 (2015).
Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma- Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl. Mater. Interfac. 12(2), 9 pages (2019).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.
USPTO; Non-Final Office Action dated Aug. 21, 2024 in U.S. Appl. No. 17/825,460.

* cited by examiner

CONTAMINANT TRAP SYSTEM FOR A REACTOR SYSTEM

CROSS-REFERENCE TO RELATED APPLICATIONS

This application is a non-provisional of, and claims priority to and the benefit of, U.S. Provisional Patent Application No. 62/967,320, filed Jan. 29, 2020 and entitled "CONTAMINANT TRAP SYSTEM FOR A REACTOR SYSTEM," which is hereby incorporated by reference herein.

FIELD OF THE DISCLOSURE

The present disclosure relates generally to a semiconductor processing or reactor system and components comprised therein, and particularly to reactor system components that prevent contamination of other components.

BACKGROUND OF THE DISCLOSURE

Reaction chambers may be used for depositing various material layers onto semiconductor substrates. A semiconductor may be placed on a susceptor inside a reaction chamber. Both the substrate and the susceptor may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and other processes, these layers are made into integrated circuits.

For any given process, reactant gases and/or any byproduct gases may then be evacuated via a vacuum and/or purged from the reaction chamber. Reactant gases, and other gases or materials from the reaction chamber may be passed through a filter or a contaminant trap system, wherein the reactant gases or other materials (e.g., reaction products and/or byproducts) are trapped to prevent contamination of reactor system components downstream of the contaminant trap system. However, materials from the contaminant trap system may outgas under certain conditions, which may cause contamination of the reaction chamber or a substrate disposed therein.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

In some embodiments, a contaminant trap system for a reactor system is provided. The contaminant trap system disclosed herein may allow collection of materials from a reaction chamber of the reactor system to reduce or prevent contamination of reactor system components downstream of the contaminant trap system. The contaminant trap system disclosed herein may also reduce or prevent possible contaminants from traveling to and contaminating the reaction chamber or a substrate disposed therein.

In various embodiments, a baffle plate stack for a contaminant trap system may comprise a plurality of baffle plates, each comprising an aperture spanning through a baffle plate body of each baffle plate of the plurality of baffle plates, and a solid body portion; and a plurality of complementary baffle plates, each comprising a complementary aperture spanning through a complementary baffle plate body of each complementary baffle plate of the plurality of complementary baffle plates, and a complementary solid body portion. The plurality of baffle plates and the plurality of complementary baffle plates may be disposed in a baffle plate order between a first end and a second end of the baffle plate stack in which the plurality of baffle plates alternates with the plurality of complementary baffle plates, such that no two of the plurality of baffle plates and no two of the plurality of complementary baffle plates are adjacent in the baffle plate order. The plurality of baffle plates and the plurality of complementary baffle plates may be disposed in a baffle plate orientation wherein at least a portion of the apertures of the plurality of baffle plates and at least a portion of the complementary solid body portions of the plurality of complementary baffle plates may be aligned along a first axis spanning between the first end and the second end of the baffle plate stack, and such that at least a portion of the solid body portions of the plurality of baffle plates and at least a portion of the complementary apertures of the plurality of complementary baffle plates may be aligned along a second axis spanning between the first end and the second end of the baffle plate stack.

In various embodiments, a baffle plate stack may further comprise a coupling rod coupled to each of the plurality of baffle plates and/or each of the plurality of complementary baffle plates, wherein the coupling rod may span between the first end and the second end of the baffle plate stack, wherein the coupling rod comprises a cross-section. Each of the plurality of baffle plates may comprise a coupling hole and each of the plurality of complementary baffle plates may comprise a complementary coupling hole, wherein the coupling holes and the complementary coupling holes each may comprise a shape complementary to the cross-section of the coupling rod. In various embodiments, the cross-section of the coupling rod may be noncircular, wherein the coupling hole of each of the plurality of baffle plates may be disposed in a first orientation, and the complementary coupling hole of each of the plurality of complementary baffle plates may be disposed in a second orientation. The first orientation and the second orientation may dispose the plurality of baffle plates and the plurality of complementary baffle plates about the coupling rod to achieve the baffle plate orientation.

In various embodiments, a baffle plate stack may further comprise a plurality of spacers coupled to the coupling rod, wherein at least one of the plurality of spacers may be disposed between each baffle plate and complementary baffle plate of the plurality of baffle plates and the plurality of complementary baffle plates in the baffle plate order. In various embodiments, a baffle plate stack may further comprise an end plate disposed at least one of at the first end or the second end of the baffle plate stack, wherein the end plate may comprise an end plate aperture and an end plate solid body portion.

In various embodiments, there may be one more of the plurality of baffle plates than the plurality of complementary baffle plates, such that baffle plate stack may comprise the same order of the plurality of baffle plates and the plurality of complementary baffle plates from the first end and the second end of the baffle plate stack. In various embodiments, at least one of the plurality of baffle plates and the plurality of complementary baffle plates may comprise a textured surface.

In various embodiments, a contaminant trap system of a reactor system may comprise a trap housing comprising a housing outer wall; a first baffle plate disposed in the trap housing, wherein the first baffle plate may comprise a first aperture spanning through a first baffle plate body between a first top baffle plate surface and a first bottom baffle plate surface of the first baffle plate, and a first solid body portion; a first complementary baffle plate disposed in the trap housing in series with the first baffle plate between a first end and a second end of the trap housing, wherein the first complementary baffle plate may comprise a first complementary aperture spanning through a first complementary baffle plate body between a first top complementary baffle plate surface and a first bottom complementary baffle plate surface of the first complementary baffle plate, and a first complementary solid body portion. The first baffle plate and the first complementary baffle plate may be comprised in a baffle plate stack. The first baffle plate and the first complementary baffle plate may be disposed in a baffle plate orientation in the trap housing wherein at least a portion of the first aperture of the first baffle plate and at least a portion of the first complementary solid body portion of the first complementary baffle plate may be aligned along a first axis spanning between the first end and the second end of the trap housing, and such that at least a portion of the first solid body portion of the first baffle plate and at least a portion of the first complementary aperture of the first complementary baffle plate may be aligned along a second axis spanning between the first end and the second end of the trap housing. In various embodiments, the first aperture of the first baffle plate may be comprised in a radially inward portion of the first baffle plate, and/or the first complementary aperture of the first complementary baffle plate may be comprised in a radially outward portion of the first complementary baffle plate. In various embodiments, the contaminant trap system may further comprise a heater jacket coupled to the trap housing.

In various embodiments, the contaminant trap system may further comprise a coupling rod disposed in the trap housing and spanning between the first end and the second end of the trap housing. The first baffle plate may comprise a first coupling hole disposed through the first baffle plate body, wherein the coupling rod may be disposed through the first coupling hole. The first complementary baffle plate may comprise a first complementary coupling hole disposed through the first complementary baffle plate body, wherein the coupling rod may be disposed through the first complementary coupling hole. In various embodiments, the coupling rod may comprise a noncircular cross-section, wherein the first coupling hole of the first baffle plate and the first complementary coupling hole of the first complementary baffle plate each may comprise a shape complementary to the noncircular cross-section of the coupling rod. In various embodiments, a reference point of the first coupling hole may be disposed in a first orientation, and a complementary reference point of the first complementary coupling hole may be disposed in a first complementary orientation, wherein the first orientation and the first complementary orientation may dispose the first baffle plate and the first complementary baffle plate about the coupling rod to achieve the baffle plate orientation.

In various embodiments, the contaminant trap system may further comprise a spacer between the first baffle plate and the first complementary baffle plate to provide a space therebetween.

In various embodiments, the contaminant trap system may further comprise a second baffle plate disposed in the trap housing, wherein the second baffle plate may comprise a second aperture spanning through a second baffle plate body between a second top baffle plate surface and a second bottom baffle plate surface of the second baffle plate, and a second solid body portion. The second baffle plate may be disposed in the trap housing such that the first complementary baffle plate may be between the first baffle plate and the second baffle plate, and wherein the baffle plate orientation may further comprise at least a portion of the second aperture of the second baffle plate and at least a portion of the first complementary solid body portion of the first complementary baffle plate being aligned along the first axis, and such that at least a portion of the second solid body portion of the second baffle plate and at least a portion of the first complementary aperture of the first complementary baffle plate may be aligned along the second axis. In various embodiments, the first baffle plate and the second baffle plate may comprise an identical design.

In various embodiments, the baffle plate stack may further comprise an end plate disposed such that the first baffle plate is between the end plate and the first complementary baffle plate, or the first complementary baffle plate is between the end plate and the first baffle plate. The end plate may comprise an end plate aperture and an end plate solid body portion.

In various embodiments, the housing outer wall of the trap housing may comprise an interior wall surface. An outer edge of at least one of the first baffle plate and the first complementary baffle plate may be disposed adjacent to the interior wall surface such that at least a partial seal may be formed between the outer edge of the first baffle plate and/or the first complementary baffle plate, and the interior wall surface.

In various embodiments, the first top baffle plate surface, the first bottom baffle plate surface, the first top complementary baffle plate surface, the first bottom complementary baffle plate surface, the outer edge of at least one of the first baffle plate and the first complementary baffle plate, and/or the interior wall surface is textured.

In various embodiments, a method may comprise flowing a fluid from a reaction chamber into a trap housing of a contaminant trap system; flowing the fluid through a baffle plate stack disposed in the trap housing and comprising a plurality of baffle plates and a plurality of complementary baffle plates; flowing the fluid through an aperture of a first baffle plate of the plurality of baffle plates; flowing the fluid into the complementary solid body portion of a first complementary baffle plate of the plurality of complementary baffle plates in response to the flowing the fluid through the aperture of the first baffle plate; depositing contaminants onto the complementary solid body portion of the first complementary baffle plate in response to the flowing the fluid into the complementary solid body portion of the first complementary baffle plate; flowing the fluid through a complementary aperture of the first complementary baffle plate in response to the flowing the fluid into the complementary solid body portion of the first complementary baffle plate; flowing the fluid into the solid body portion of a second baffle plate of the plurality of baffle plates in response to the flowing the fluid through the complementary aperture of the first complementary baffle plate; and/or depositing contaminants onto the solid body portion of the second baffle plate in response to the flowing the fluid into the solid body portion of the second baffle plate. Each of the plurality of baffle plates may comprise a solid body portion and an aperture spanning through a baffle plate body of each baffle plate of the plurality of baffle plates. Each of the plurality of complementary baffle plates may comprise a complementary solid body portion and a complementary aperture spanning through a complementary baffle plate body of each complementary baffle plate of the plurality of complementary baffle plates. The plurality of baffle plates and the plurality of complementary baffle plates may be disposed in a baffle plate order between a first end and a second end of the baffle plate stack in which the plurality of baffle plates may alternate with the plurality of complementary baffle plates, such that no two of the plurality of baffle plates and no two of the plurality of complementary baffle plates are adjacent in the baffle plate order. The plurality of baffle plates and the plurality of complementary baffle plates may be disposed in a baffle plate orientation wherein at least a portion of the apertures of the plurality of baffle plates and at least a portion of the complementary solid body portions of the plurality of complementary baffle plates may be aligned along a first axis spanning between the first end and the second end of the baffle plate stack, and such that at least a portion of the solid body portions of the plurality of baffle plates and at least a portion of the complementary apertures of the plurality of complementary baffle plates may be aligned along a second axis spanning between the first end and the second end of the baffle plate stack.

In various embodiments, a contaminant trap system of a reactor system may comprise a trap housing; and a trap structure disposed in the trap housing. The trap structure may comprise a baffle plate; a base plate; and a plurality of rods spanning between and coupled to the baffle plate and the base plate. The rods may be disposed about a flow hole disposed through the base plate.

In various embodiments, a contaminant trap system of a reactor system may comprise a trap housing comprising a housing bottom surface and a housing top surface; and a trap structure disposed in the trap housing. The trap structure may comprise a plurality of tubes disposed in an arrangement having an outer shape complementary to a shape of the trap housing; a support disposed within the arrangement of the plurality of tubes and protruding outwardly from an end of the plurality of tubes, wherein the support contacts the housing bottom surface, creating a space between the end of the plurality of tubes and the housing bottom surface; and a tensioning device coupled around the plurality of tubes configured to hold the plurality of tubes together. The plurality of tubes may be packed hexagonally, wherein each tube of the plurality of tubes comprises a bore and may span at least partially between the housing bottom surface and the housing top surface.

In various embodiments, a contaminant trap of a reactor system may comprise a trap housing; and a trap structure disposed in the trap housing. The trap structure may comprise a corrugated sheet coupled to a noncorrugated sheet. The corrugated and noncorrugated sheets may be spiraled such that portions of the corrugated sheet are disposed between portions of the noncorrugated sheet, and such that portions of the noncorrugated sheet are disposed between portions of the corrugated sheet.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
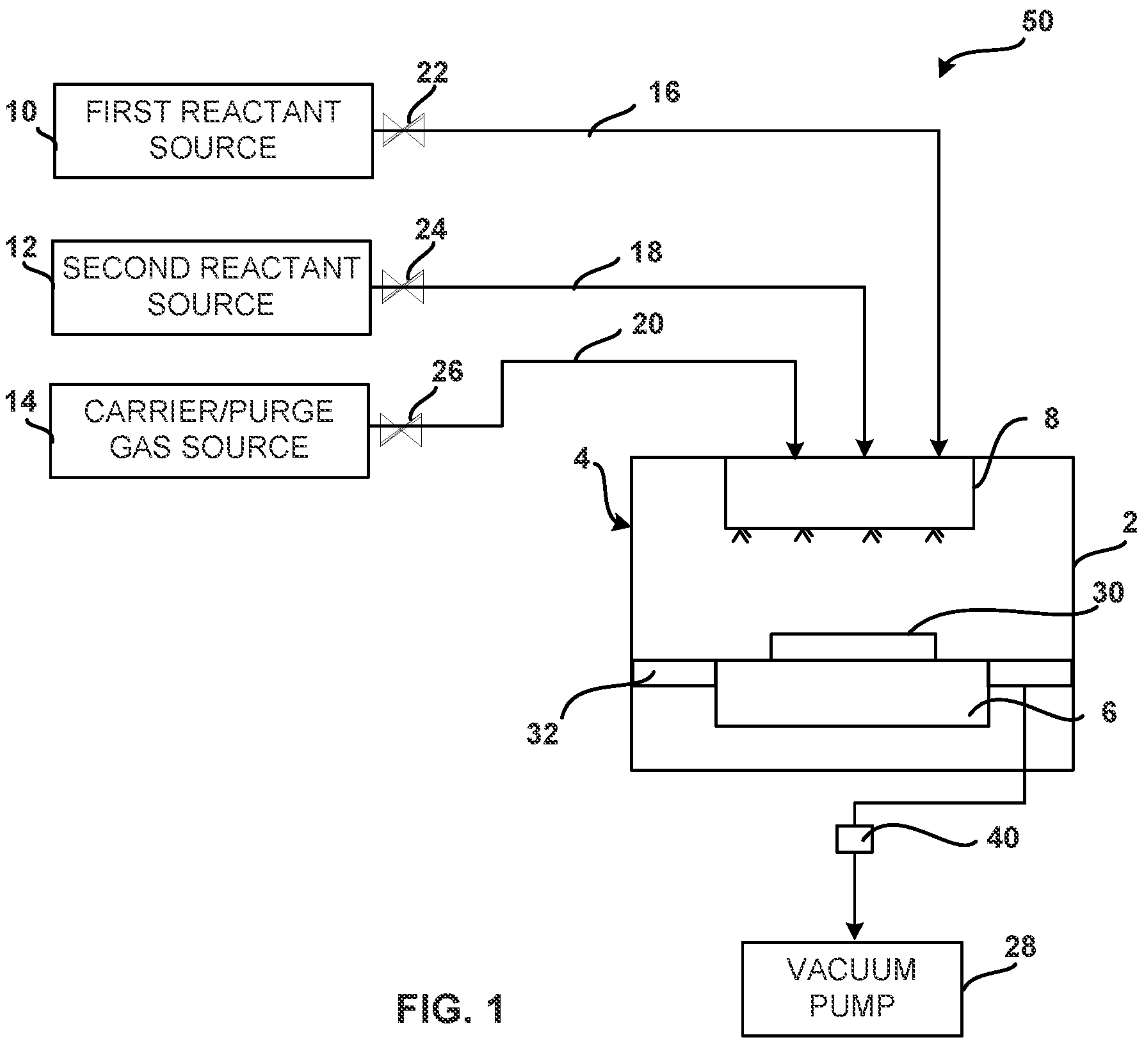
FIG. 1 illustrates a schematic diagram of an exemplary reactor system, in accordance with various embodiments.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate disposed in the reaction chamber, or any unwanted material in any component of a reaction system. The term "contaminant" may refer to, but is not limited to, unwanted deposits, metal and non-metal particles, impurities, and waste products, disposed within the reaction chamber or other components of the reactor system.

Reactor systems used for ALD, CVD, and/or the like, may be used for a variety of applications, including depositing and etching materials on a substrate surface. In various embodiments, a reactor system 50 may comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20, and valves or controllers 22-26. Reactant gases or other materials from reactant sources 10, 12 may be applied to substrate 30 in reaction chamber 4. A purge gas from purge gas source 14 may be flowed to and through reaction chamber 4 to remove any excess reactant or other undesired materials from reaction chamber 4. System 50 may also comprise a vacuum source 28 fluidly coupled to the reaction chamber 4, which may be configured to suck reactants, a purge gas, or other materials out of reaction chamber 4. System 50 may comprise a contaminant trap system 40 disposed between reaction chamber 4 and vacuum source 28 to trap (i.e., accumulate) materials (e.g., contaminants) coming from reaction chamber 4, reducing or preventing contamination of reactor system 50 components downstream of contaminant trap system 40.

Figure 2:
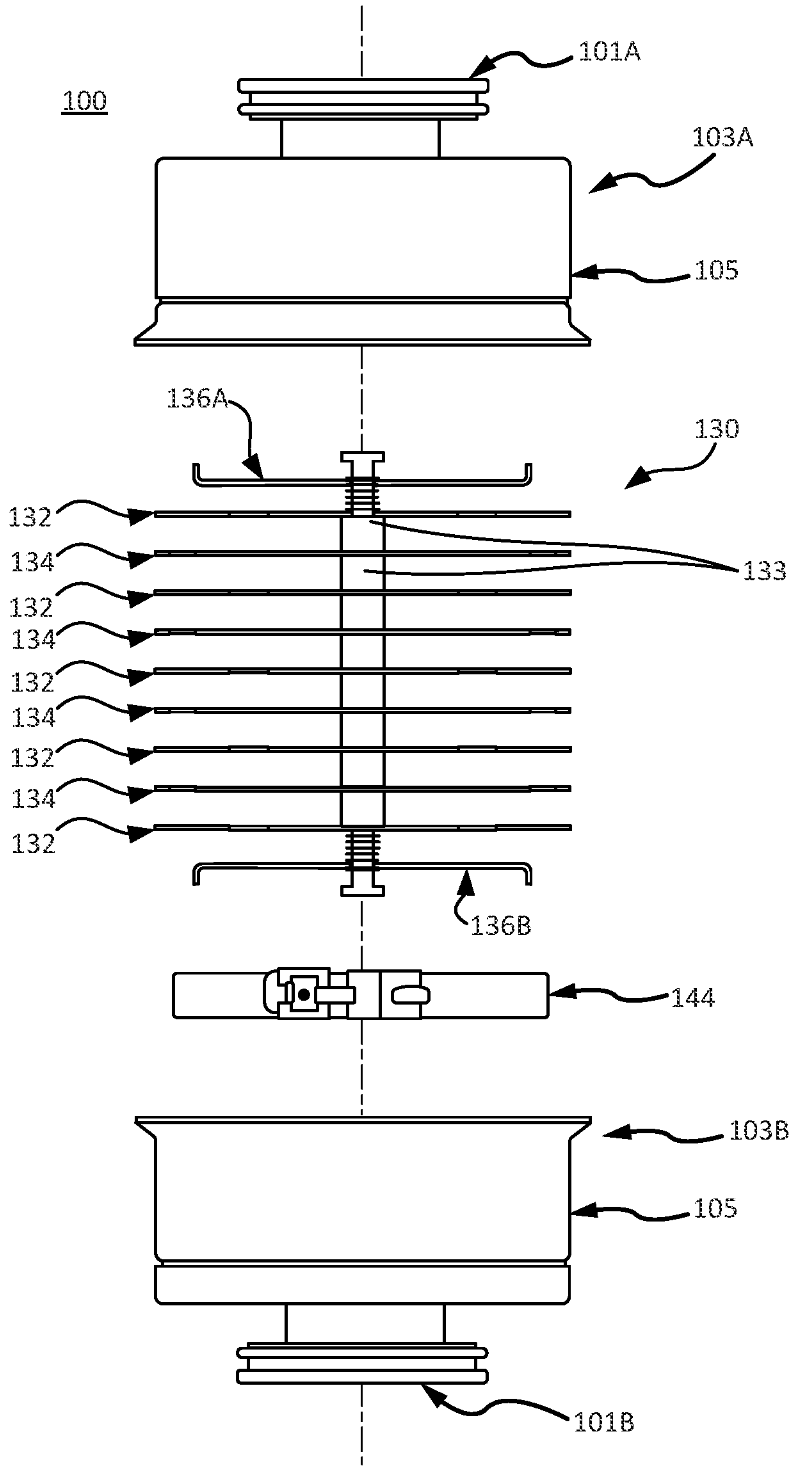
FIG. 2 illustrates an exploded view of an exemplary contaminant trap system, in accordance with various embodiments.

With reference to FIG. 2, a contaminant trap system 100 (an exploded view thereof) is illustrated (an example of contaminant trap system 40 in FIG. 1), in accordance with various embodiments. In various embodiments, contaminant trap system 100 may comprise a trap housing 103, which may comprise multiple components (e.g., upper housing 103A and lower housing 103B). In various embodiments, upper housing 103A and lower housing 103B may couple to enclose other components of contaminant trap system 100. Upper housing 103A may comprise a fluid inlet 101A, through which the interior of trap housing 103 may be fluidly coupled to a reaction chamber (e.g., reaction chamber 4). Gases and other material may flow from the reaction chamber into contaminant trap system 100 through fluid inlet 101A, and may exit contaminant trap system 100 through fluid outlet 101B.

In various embodiments, trap housing 103 may comprise an outer wall 105 comprising an interior wall surface. The interior wall surface may define the internal space enclosed within trap housing 103 (e.g., when upper housing 103A and lower housing 103B are coupled). The internal space of trap housing 103 may be in fluid communication with fluid inlet 101A and fluid outlet 101B.

In various embodiments, contaminant trap system 100 may comprise a trap structure (e.g., housed within the trap housing) configured to trap contaminants traveling therethrough. The contaminants may deposit on the surfaces of the trap structure as fluid travels through the trap system. In various embodiments, the trap structure may comprise a baffle plate stack (e.g., baffle plate stack 130). Baffle plate stack 130 may comprise at least two plates, which may cause fluid flow entering the internal space of trap housing 103 to take a certain path (e.g., a path that will increase or maximize fluid flow through the internal space of trap housing 103, and/or allow increased or maximum removal of contaminants from the fluid flow by the contaminant trap system and its components). The fluid flow path through the internal space of trap housing 103 may increase the fluid path to increase contact with the components of contaminant trap system 100 (e.g., the surfaces of the baffle plates in trap housing 103), therefore, allowing more opportunities for contaminant deposition on such surfaces as the fluid flows through contaminant trap system 100.

In various embodiments, baffle plate stack 130 may comprise at least one baffle plate 132 and at least one complementary baffle plate 134. Each baffle plate 132 may have substantially the same design (e.g., comprising apertures therethrough), and each complementary baffle plate 134 may have substantially the same design (e.g., comprising complementary apertures therethrough). Baffle plates 132 and complementary baffle plates 134 may be disposed in a baffle plate order in baffle plate stack 130 between a first end of x 103 (proximate x 101A) and a second end of trap housing 103 (proximate fluid outlet 101B). A first end of baffle plate stack 130 may be proximate the first end of trap housing 103, and a second end of baffle plate stack 130 may be proximate the second end of trap housing 103. The baffle plate order may comprise baffle plates 132 alternating positions with complementary baffle plates 134, such that no two baffle plates 132, and no two complementary baffle plates 134, are adjacent in the baffle plate order.

Baffle plate stack 130 may comprise any suitable number of baffle plates of any design, order, and/or composition. For example, in various embodiments, baffle plate stack 130 may comprise all of one type of baffle plate (e.g., all of baffle plates 132 or all of complementary baffle plates 134). In various embodiments, baffle plate stack 130 may comprise any suitable mixture of baffle plate designs. For example, baffle plate stack 130 may comprise baffle plates comprising two or more designs. As a further example, baffle plate stack 130 may comprise a first number of baffle plates 132 and a second number of complementary baffle plates 134. In various embodiments, baffle plate stack 130 may comprise an equal number of baffle plates 132 and complementary baffle plates 134 (e.g., alternating in the baffle plate order between the first and second ends of baffle plate stack 130). In various embodiments, baffle plate stack 130 may comprise one more baffle plate 132 than complementary baffle plates 134, such that the baffle plate order starts and ends with a baffle plate 132 (i.e., a baffle plate 132 is the baffle plate most proximate the first and second ends of trap housing 103).

In various embodiments, the baffle plate stack may comprise at least one end plate coupled to each end of the baffle plate stack. For example, a first end plate 136A may be comprised in baffle plate stack 130 as the end plate on a first end of baffle plate stack 130, and a second end plate 136B may be comprised in baffle plate stack 130 as the end plate on a second end of baffle plate stack 130. The first end of baffle plate stack 130 may be disposed in the internal space of trap housing 103 proximate the first end of trap housing 103, and the second end of baffle plate stack 130 may be disposed in the internal space of trap housing 103 proximate the second end of trap housing 103. The end plate(s) comprised in a baffle plate stack may comprise any suitable design, including a design different than the baffle plates and/or complementary baffle plates comprised in the baffle plate stack.

The arrangement of the baffle plates in baffle plate stack 130 may comprise any suitable arrangement, including any suitable spacing arrangement. The baffle plates may each be separated by a spacer 133. That is, a spacer 133 may be disposed between every two plates in the baffle plate stack. The plates in the baffle plate stack may be spaced apart by any suitable distance, for example, to accomplish a desired pressure drop of the fluid flow through trap housing 103. To decrease the amount of pressure drop through trap housing 103, there may be fewer baffle plates in the baffle plate stack, and/or more space between the baffle plates. Conversely, to increase the amount of pressure drop through trap housing 103, there may be more baffle plates in the baffle plate stack, and/or less space between the baffle plates.

Each baffle plate (e.g., baffle plates 132 and complementary baffle plates 134 in baffle plate stack 130) may comprise a shape that is complementary to the internal space of trap housing 103 such that baffle plate stack 130 and the baffle plates comprised therein may be disposed in the internal space of trap housing 103. In various embodiments, an outer edge of one or more plates comprised in the baffle plate stack disposed in the internal space of trap housing 103 may be disposed adjacent to and/or in contact with the interior wall of trap housing 103. The outer edge of one or more of the plates may form at least a partial seal between the respective baffle plate and the interior wall of trap housing 103. Therefore, a limited amount of fluid flow (or no fluid flow) may pass between the outer edges of the plates in a baffle plate stack and the interior wall of trap housing 103.

Figure 3B:
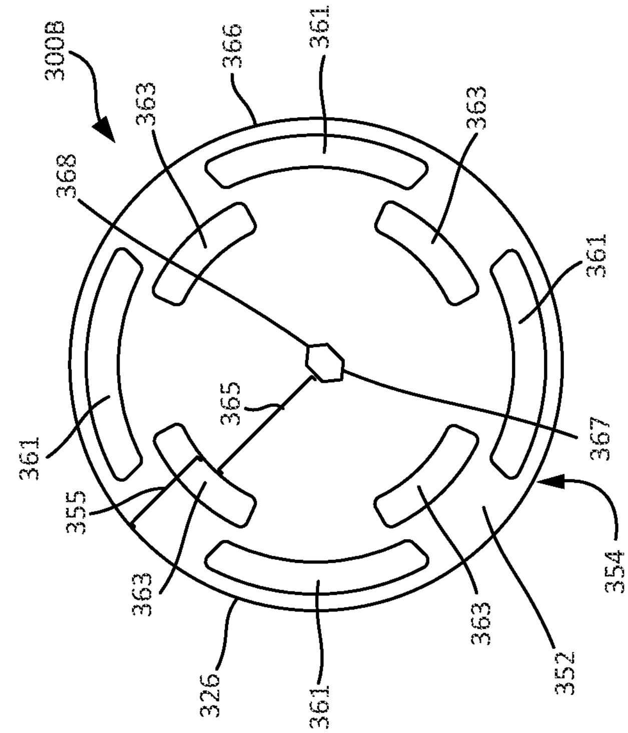
FIG. 3B illustrates an exemplary complementary baffle plate, in accordance with various embodiments.
Figure 3A:
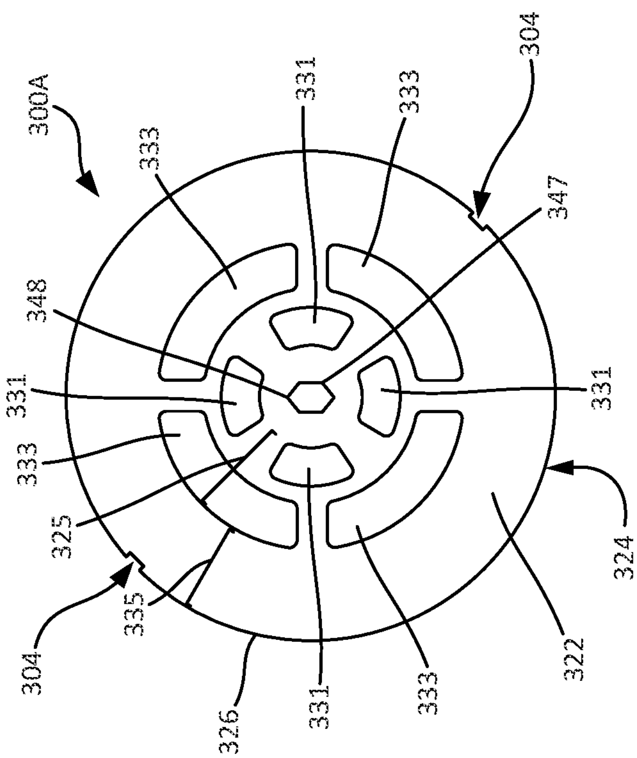
FIG. 3A illustrates an exemplary baffle plate, in accordance with various embodiments.
Figure 4A:
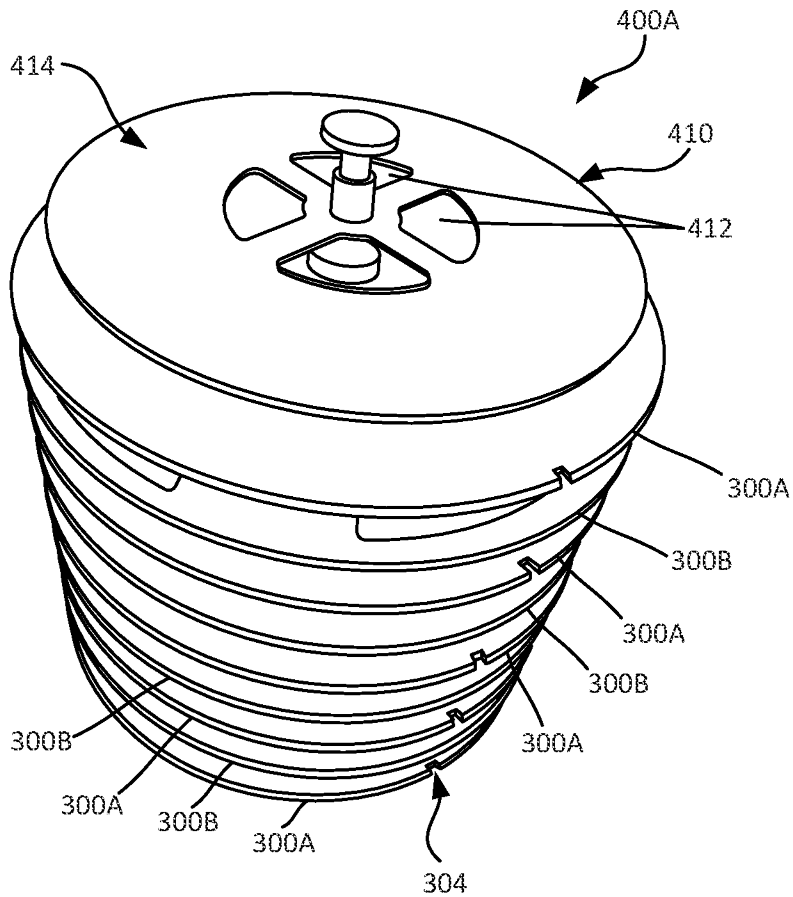
FIG. 4A illustrates a perspective view of an exemplary filter baffle plate stack of a contaminant trap system, in accordance with various embodiments.

With reference to FIGS. 3A, 3B and 4A, in various embodiments, a baffle plate (e.g., baffle plate 300A, which is an example of baffle plate 132 in FIG. 2) may comprise a top surface 322, a bottom surface 324, a baffle plate body therebetween, and a baffle plate outer edge 326. A baffle plate may comprise at least one aperture disposed through the baffle plate body between top surface 322 and bottom surface 324 and defined by an aperture edge. For example, baffle plate 300A may comprise first apertures 331 and second apertures 333. The apertures comprised in a baffle plate may be in any suitable aperture arrangement, such as the aperture arrangement of baffle plate 300A shown in FIG. 3A. As an example of an aperture arrangement of a baffle plate, the apertures may be spaced equidistant from other like apertures about a center of the baffle plate shape (e.g., the center of a circle). In various embodiments, the apertures of a baffle plate may be comprised in an aperture portion of the baffle plate. For example, aperture portion 325 of baffle plate 300A may be disposed on a radially-inward portion of the baffle plate, wherein the radially-outward portion of baffle plate 300A may not comprise an aperture. The portion of a baffle plate without an aperture may be a solid body portion (e.g., solid body portion 335 of baffle plate 300A).

With continued reference to FIGS. 3A, 3B and 4A, in various embodiments, a complementary baffle plate (e.g., complementary baffle plate 300B, which is an example of complementary baffle plate 134 in FIG. 2) may comprise a complementary top surface 352, a complementary bottom surface 354, a complementary baffle plate body therebetween, and a complementary baffle plate outer edge 356. A complementary baffle plate may comprise at least one complementary aperture disposed through the complementary baffle plate body between complementary baffle plate top surface 352 and bottom surface 354 and defined by a complementary aperture edge. For example, complementary baffle plate 300B may comprise first complementary apertures 361 and second complementary apertures 363. The complementary apertures comprised in a complementary baffle plate may be in any suitable complementary aperture arrangement, such as the complementary aperture arrangement of complementary baffle plate 300B shown in FIG. 3B. As an example of a complementary aperture arrangement of a complementary baffle plate, the complementary apertures may be spaced equidistant from other like complementary apertures about a center of the complementary baffle plate shape (e.g., the center of a circle). In various embodiments, the complementary apertures of a complementary baffle plate may be comprised in a complementary aperture portion of the complementary baffle plate. For example, aperture portion 355 of complementary baffle plate 300B may be disposed on a radially-outward portion of the complementary baffle plate, wherein the radially-inward portion of complementary baffle plate 300B may not comprise a complementary aperture. The portion of a complementary baffle plate without a complementary aperture may be a complementary solid body portion (e.g., complementary solid body portion 365 of complementary baffle plate 300B).

Complementary baffle plates (e.g., complementary baffle plates 300B) may be complementary to baffle plates (e.g., baffle plates 30A) because complementary baffle plates may comprise complementary apertures in portions of the plate which the baffles plates do not comprise apertures. As an example, discussed above, complementary baffle plates 300B comprise complementary apertures 361 and 363 in a radially outward portion thereof, while baffle plates 300A do not comprise apertures in a radially outward portion thereof.

In various embodiments, a baffle plate stack may comprise a coupling rod to which baffle plates and/or complementary baffle plates may couple. For example, baffle plate stack 400B in FIG. 4B may comprise coupling rod 450. The coupling rod may comprise any suitable shape, length, and/or cross-sectional shape. In various embodiments, the coupling rod may be configured to span between the first and second ends of trap housing 103. The coupling rod may be configured to engage and/or couple with other components of a baffle plate stack, such as baffle plates, complementary baffle plates, end plates, spacers, and/or the like. In various embodiments, at least a portion of a coupling rod may comprise threading, such as one or more of the ends of coupling rod 450 to engage with a fastener to secure the baffle plates, complementary baffle plates, end plates, and/or spacers together.

Figure 4B:
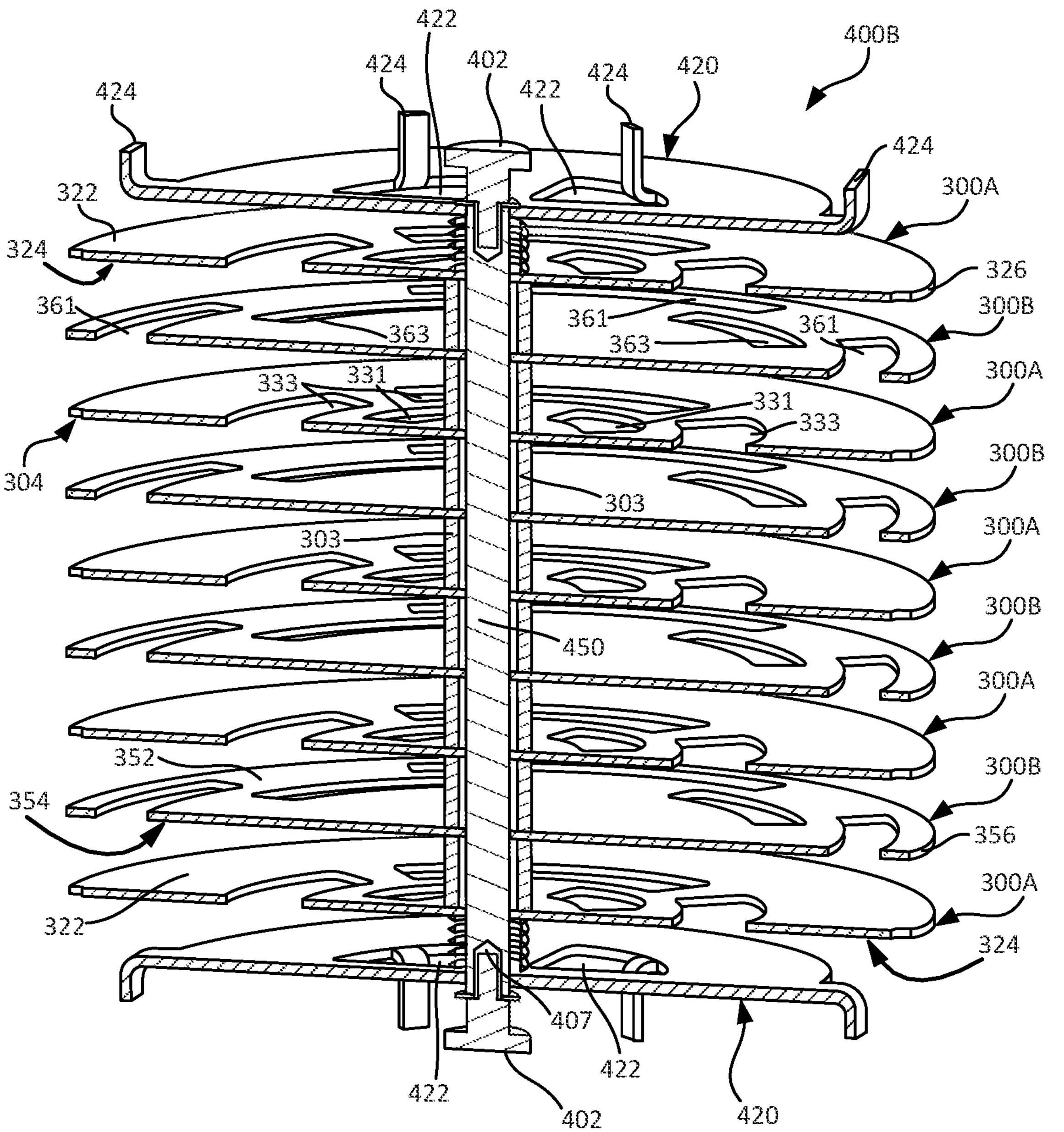
FIG. 4B illustrates a cross-sectional perspective view of an exemplary filter baffle plate stack of a contaminant trap system, in accordance with various embodiments.

For space and clarity purposes, the reference numbers and lead lines for specific baffle plate components and complementary baffle plate components in FIGS. 4A and 4B are included in one or more exemplary baffle plates or complementary baffle plates illustrated therein. However, such labeled components may apply to each similarly labeled baffle plate or complementary baffle plate, as appropriate.

In various embodiments, each baffle plate may comprise a coupling hole configured to receive and/or engage with the coupling rod. For example, baffle plate 300A may comprise a coupling hole 347 having a shape that is complementary to a cross-sectional shape of coupling rod 450. Therefore, coupling rod 450 may be inserted through coupling hole 347, and coupling hole 347 may engage with coupling rod 450.

In various embodiments, the coupling hole of a baffle plate may comprise a non-circular shape, such that the coupling rod may engage with the coupling hole and maintain the baffle plate a desired position (e.g., so baffle plate 300A does not rotate about coupling rod 450 within trap housing 103). In various embodiments, the coupling hole of a baffle plate may comprise a shape that is symmetrical about only one line passing through the coupling hole (e.g., through a center of the coupling hole). That way, the coupling hole may only engage with the coupling rod in a way that disposes the baffle plate in a desired orientation (a self-aligning feature). In various embodiments, to aid in disposing a baffle plate in a desired orientation about the coupling rod, the coupling hole may comprise a reference point which is disposed in a specific orientation or at a specific angle, and/or a specific position relative to the aperture(s) of the baffle plate. For example, coupling hole 347 may comprise reference point 348 which may be oriented at a specific angle (e.g., such that reference point 348 is aligned with a first aperture 331 and/or between two second apertures 333).

In various embodiments, each complementary baffle plate may comprise a complementary coupling hole configured to receive and/or engage with the coupling rod. For example, complementary baffle plate 300B may comprise a complementary coupling hole 367 having a complementary shape that is complementary to a cross-sectional shape of coupling rod 450. Therefore, that coupling rod 450 may be inserted through complementary coupling hole 367, and complementary coupling hole 367 may engage with coupling rod 450.

In various embodiments, the complementary coupling hole of a complementary baffle plate may comprise a non-circular shape, such that the coupling rod may engage with the complementary coupling hole and maintain the complementary baffle plate a desired position (e.g., so complementary baffle plate 300B does not rotate about coupling rod 450 within trap housing 103). In various embodiments, the complementary coupling hole of a complementary baffle plate may comprise a complementary shape that is symmetrical about only one line passing through the coupling hole (e.g., through a center of the complementary coupling hole). That way, the complementary coupling hole may only engage with the coupling rod in a way that disposes the complementary baffle plate in a desired orientation (a self-aligning feature). In various embodiments, to aid in disposing a complementary baffle plate in a desired orientation about the coupling rod, the complementary coupling hole may comprise a complementary reference point which is oriented in a specific complementary angle, and/or a specific position relative to the complementary aperture(s) of the complementary baffle plate. For example, complementary coupling hole 367 may comprise complementary reference point 368 which may be oriented at a specific complementary angle (e.g., such that complementary reference point 368 is aligned with a complementary second aperture 363 and/or between two complementary first apertures 361).

In various embodiments, the reference point of a coupling hole and the complementary reference point of a complementary coupling hole may dispose the baffle plate and the complementary baffle plate in an orientation such that an aperture of a baffle plate may be aligned along an axis with a complementary solid body portion (or radially proximate to space between complementary apertures) of an adjacent complementary baffle plate in the baffle plate order, wherein the axis spans along the baffle plate order. In various embodiments, the reference and the complementary reference point of a complementary coupling hole may dispose the baffle plate and the complementary baffle plate in an orientation such that a complementary aperture of a complementary baffle plate may be aligned along an axis with a solid body portion (or radially proximate a space between apertures) of an adjacent baffle plate in the baffle plate order, wherein the axis spans along the baffle plate order. For example, coupling hole 347 and reference point 348 may dispose baffle plate 300A, and complementary coupling hole 367 and complementary reference point 368 may dispose complementary baffle plate 300B, such that apertures 333 are aligned along an axis with space between complementary apertures 363, and such that complementary apertures 363 are aligned along an axis with space between apertures 333.

In various embodiments, the baffle plates and complementary baffle plates may be disposed in a certain baffle plate orientation to achieve desired fluid flow therethrough and contamination deposition thereon during contaminant trap system 100 operation. In various embodiments, the rotational position of the baffle plates and complementary baffle plates about a coupling rod in a baffle plate stack may be offset relative to one another (e.g., by the orientation of the coupling hole and reference point, and the orientation of the complementary coupling hole and complementary reference point) such that the apertures of a baffle plate are not in series and/or aligned with the complementary apertures of a complementary baffle plate along an axis spanning the baffle plate stack. Further, the apertures of a baffle plate may be in series and/or aligned with, along an axis spanning a baffle plate stack, at least a portion of the complementary solid body portion (or portions of the complementary baffle plate body, e.g., between complementary apertures) of an adjacent complementary baffle plate in the baffle plate stack. Further, the complementary apertures of a complementary baffle plate may be in series and/or aligned with, along an axis spanning a baffle plate stack, at least a portion of the solid body portion (or portions of the baffle plate body, e.g., between apertures) of an adjacent baffle plate in the baffle plate stack. In other words, in various embodiments, the reference point of a coupling hole may be aligned with an aperture of the baffle plate, and the complementary reference point of a complementary coupling hole may be aligned with a complementary solid body portion or a space between the complementary apertures of a complementary baffle plate; and/or, the reference point of a coupling hole may be aligned with a solid body portion or space between the apertures of a baffle plate, and the complementary reference point of a complementary coupling hole may be aligned with a complementary aperture of a complementary aperture of a complementary baffle plate. For example, reference point 348 may be aligned with an aperture of baffle plate 300A, and complementary reference point 368 may be aligned with a complementary solid body portion 365 of complementary baffle plate 300B. Accordingly, apertures 331 and 333 of baffle plate 300A may be in series and/or aligned with complementary solid body portion 365 and/or spaces between complementary apertures 361 and/or 363 of complementary baffle plate 300B, and complementary apertures 361 and/or 363 of complementary baffle plate 300B may be in series and/or aligned with solid body portion 335 and/or spaces between apertures 331 and/or 333 of baffle plate 300A.

Figure 5B:
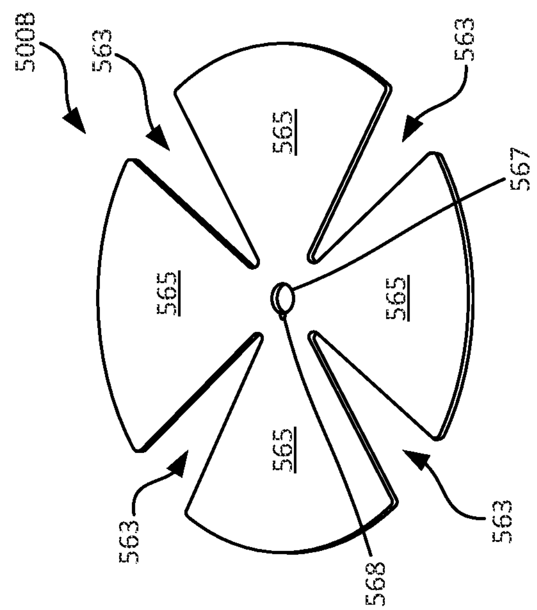
FIG. 5B illustrates another exemplary complementary baffle plate, in accordance with various embodiments.
Figure 5A:
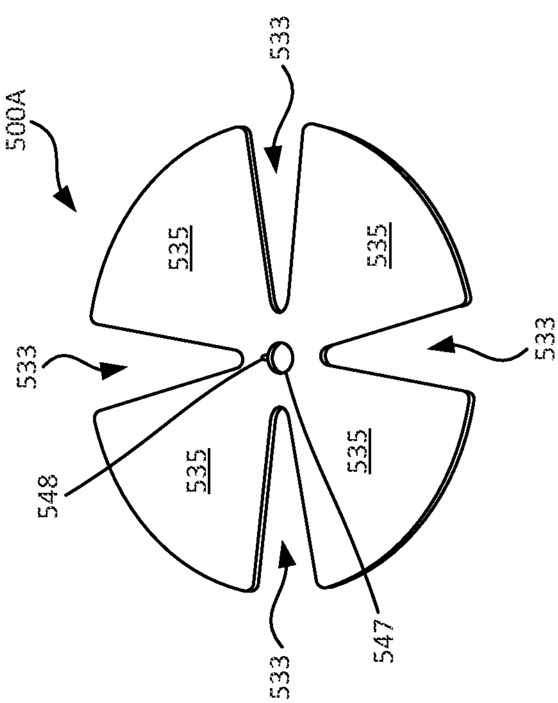
FIG. 5A illustrates another exemplary baffle plate, in accordance with various embodiments.

FIGS. 5A and 5B depict, in accordance with additional embodiments, a baffle plate 500A and a complementary baffle plate 500B. Baffle plate 500A may comprise apertures 533 and solid body portions 535. Baffle plate 500A may further comprise coupling hole 547 having a reference point 548. Reference point 548 may be oriented toward an aperture 533. Apertures 533 may be equidistant about center of baffle plate 500A.

Complementary baffle plate 500B may comprise complementary apertures 563 and complementary solid body portions 565. Complementary baffle plate 500B may further comprise complementary coupling hole 567 having a complementary reference point 568. Complementary reference point 568 may be oriented toward a complementary solid body portion 565. Complementary solid body portions 565 may be equidistant about center of complementary baffle plate 500B.

The coupling rod to which baffle plate 500A and complementary baffle plate 500B may couple may comprise a cross-sectional shape complementary to coupling hole 547 and complementary coupling hole 567. That is, the coupling rod may comprise a body and a protrusion complementary to reference point 548 and complementary reference point 568. The shape and orientation of coupling hole 547 and complementary coupling hole 567, and reference point 548 and complementary reference point 568, respectively, may offset the rotational position of the baffle plates and complementary baffle plates about a coupling rod in a baffle plate stack relative to one another. Accordingly, apertures 533 of baffle plate 500A may be in series and/or aligned with, along an axis spanning a baffle plate stack, complementary solid body portions 565 and/or spaces between complementary apertures 563 of complementary baffle plate 500B, and complementary apertures 563 of complementary baffle plate 500B may be in series and/or aligned with, along an axis spanning a baffle plate stack, solid body portion 535 and/or spaces between apertures 533 of baffle plate 500A.

Figure 6A:
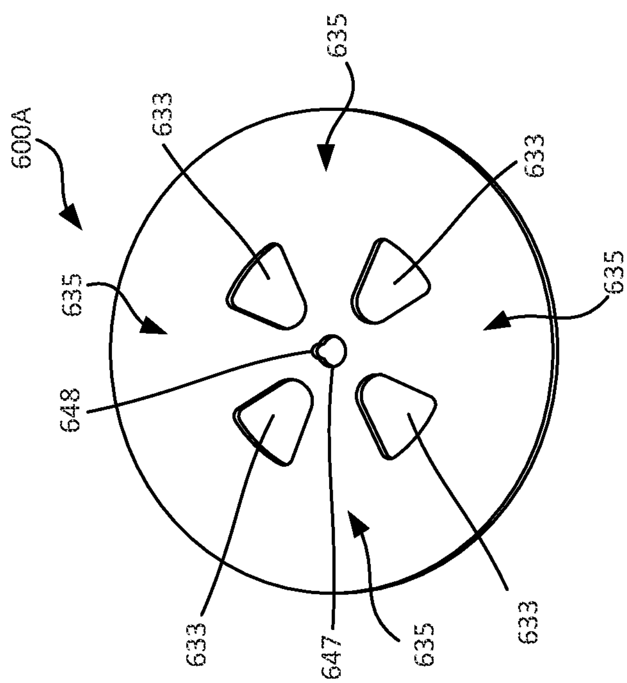
FIG. 6A illustrates yet another exemplary baffle plate, in accordance with various embodiments.
Figure 6B:
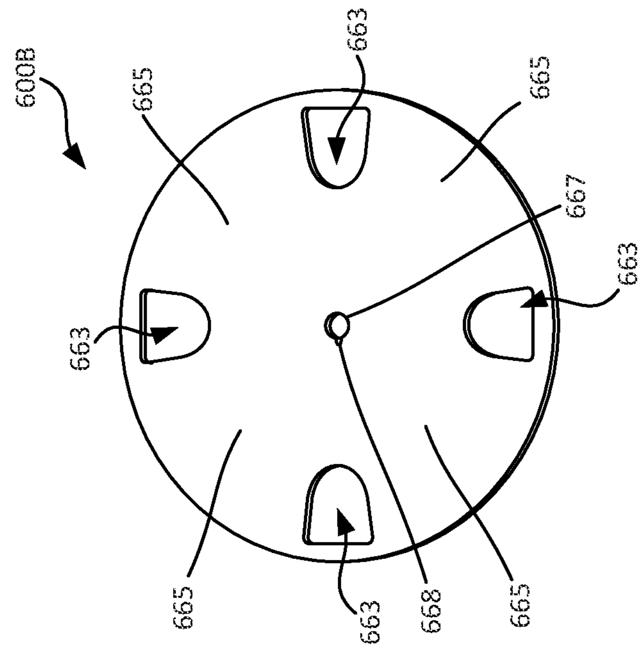
FIG. 6B illustrates yet another exemplary complementary baffle plate, in accordance with various embodiments.

FIGS. 6A and 6B depict, in accordance with further embodiments, a baffle plate 600A and a complementary baffle plate 600B. Baffle plate 600A may comprise apertures 633 and solid body portions 635. Baffle plate 600A may further comprise coupling hole 647 having a reference point 648. Reference point 648 may be oriented toward a solid body portion 635 and/or space between apertures 633. Apertures 633 may be equidistant about center of baffle plate 600A.

Complementary baffle plate 600B may comprise complementary apertures 663 and complementary solid body portions 665. Complementary baffle plate 600B may further comprise complementary coupling hole 667 having a complementary reference point 668. Complementary reference point 668 may be oriented toward a complementary aperture 663. Complementary apertures 663 may be equidistant about center of complementary baffle plate 600B.

The coupling rod to which baffle plate 600A and complementary baffle plate 600B may couple may comprise a cross-sectional shape complementary to coupling hole 647 and complementary coupling hole 667. That is, the coupling rod may comprise a body and a protrusion complementary to reference point 648 and complementary reference point 668. The shape and orientation of coupling hole 647 and complementary coupling hole 667, and reference point 648 and complementary reference point 668, respectively, may offset the rotational position of the baffle plates and complementary baffle plates about a coupling rod in a baffle plate stack relative to one another. Reference point 648 may be aligned with a solid body portion 635, and/or space between apertures 633, of baffle plate 600A, and complementary reference point 668 may be aligned with a complementary aperture 663 of complementary baffle plate 600B. Accordingly, apertures 633 of baffle plate 600A may be in series and/or aligned with, along an axis spanning a baffle plate stack, complementary solid body portions 665 and/or spaces between complementary apertures 663 of complementary baffle plate 600B, and complementary apertures 663 of complementary baffle plate 600B may be in series and/or aligned with, along an axis spanning a baffle plate stack, solid body portion 635 and/or spaces between apertures 633 of baffle plate 600A.

Figure 7B:
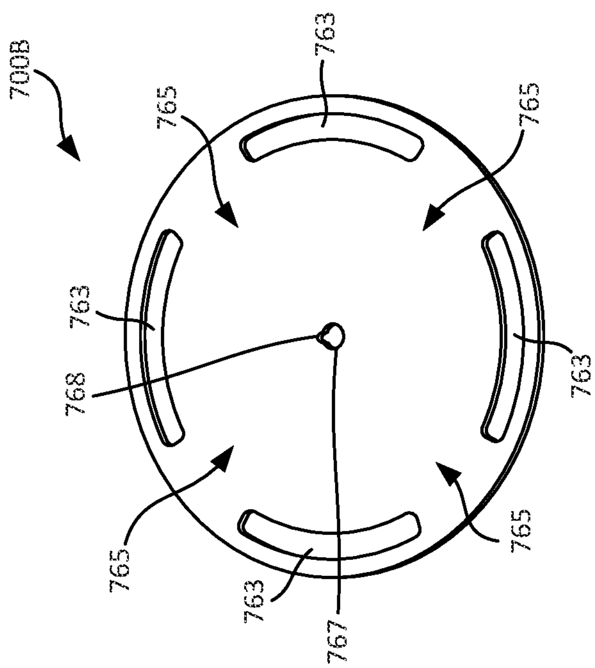
FIG. 7B illustrates yet another exemplary complementary baffle plate, in accordance with various embodiments.
Figure 7A:
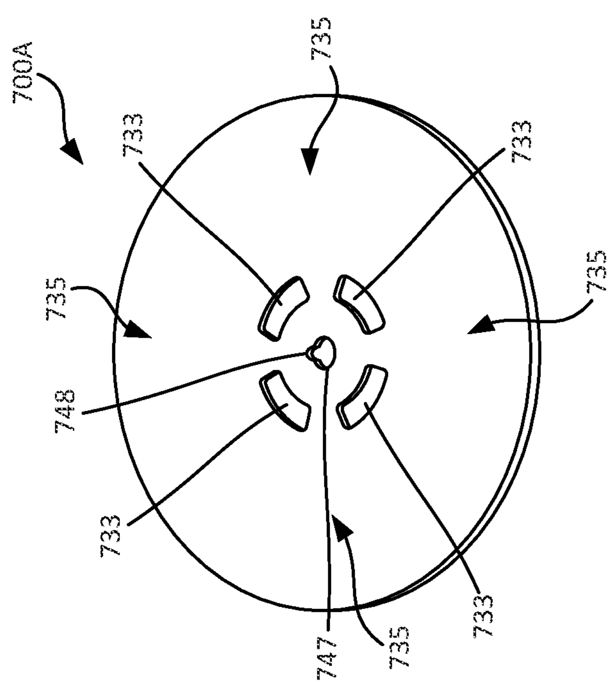
FIG. 7A illustrates yet another exemplary baffle plate, in accordance with various embodiments.

FIGS. 7A and 7B depict, in accordance with various embodiments, a baffle plate 700A and a complementary baffle plate 700B. Baffle plate 700A may comprise apertures 733 and solid body portions 735. Baffle plate 700A may further comprise coupling hole 747 having a reference point 748. Reference point 748 may be oriented toward a solid body portion 735 and/or space between apertures 733. Apertures 733 may be equidistant about center of baffle plate 700A.

Complementary baffle plate 700B may comprise complementary apertures 763 and complementary solid body portions 765. Complementary baffle plate 700B may further comprise complementary coupling hole 767 having a complementary reference point 768. Complementary reference point 768 may be oriented toward a complementary aperture 763. Complementary apertures 763may be equidistant about center of complementary baffle plate 700B.

The coupling rod to which baffle plate 700A and complementary baffle plate 700B may couple may comprise a cross-sectional shape complementary to coupling hole 747 and complementary coupling hole 767. That is, the coupling rod may comprise a body and a protrusion complementary to reference point 748 and complementary reference point 768. The shape and orientation of coupling hole 747 and complementary coupling hole 767, and reference point 748 and complementary reference point 768, respectively, may offset the rotational position of the baffle plates and complementary baffle plates about a coupling rod in a baffle plate stack relative to one another. Reference point 748 may be aligned with a solid body portion 735, or space between apertures 733, of baffle plate 700A, and complementary reference point 768 may be aligned with a complementary aperture 763 of complementary baffle plate 700B. Accordingly, apertures 733 of baffle plate 700A may be in series and/or aligned with, along an axis spanning a baffle plate stack, complementary solid body portions 765 and/or spaces between complementary apertures 763 of complementary baffle plate 700B, and complementary apertures 763 of complementary baffle plate 700B may be in series and/or aligned with, along an axis spanning a baffle plate stack, solid body portion 735 and/or spaces between apertures 733 of baffle plate 700A.

Any of the pairs of baffle plates and complementary baffle plates discussed herein (or individual plates) may be input into a baffle plate stack (e.g., to replace baffle plates 300A and complementary baffle plates 300B in baffle plate stack 400B).

In various embodiments, between each baffle plate and complementary baffle plate in a baffle plate stack, there may be a spacer configured to space the adjacent baffle plates and complementary baffle plates. For example, with reference to FIG. 4B, baffle plates 300A and complementary baffle plates 300B may be separated by spacers 303 (an example of spacers 133 in FIG. 2). A spacer may be disposed between every plate in a baffle stack (e.g., between baffle plates and complementary baffle plates, between end plates and baffle plates and/or complementary baffle plates, or the like), to achieve any desired spacing between two plates. Such spacing may achieve a desired pressure drop in the fluid airflow flowing through trap housing 103 and the apertures and complementary apertures in the baffle plates and complementary baffle plates comprised therein.

In various embodiments, a baffle plate stack may comprise at least one end plate disposed adjacent to a first and/or last baffle plate (or complementary baffle plate) in the baffle plate order. An end plate may have an end plate coupling hole similar to the coupling hole of a baffle plate and the complementary coupling hole of a complementary baffle plate, configured to engage with the coupling rod. An end plate may further comprise at least one end plate aperture disposed through an end plate body between a first and second surface of the end plate. For example, as shown in FIG. 4A, end plate 410 may comprise end plate apertures 412. End plate apertures may be disposed through an end plate in any suitable design or arrangement. In various embodiments, a portion of the end plate that does not comprise an aperture may be an end plate solid body portion (e.g., end plate solid body portion 414).

Figure 8:
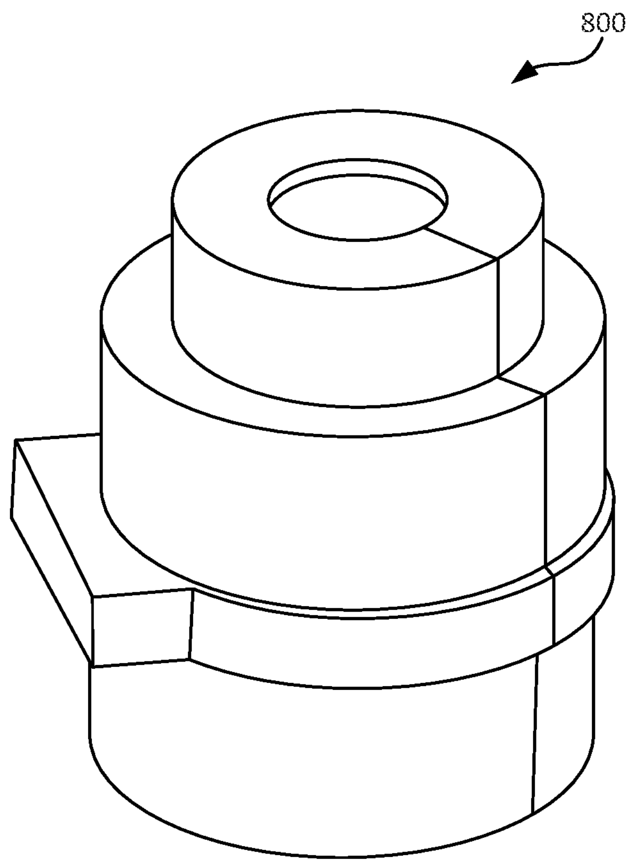
FIG. 8 illustrates a perspective view of a heater jacket for a contaminant trap system, in accordance with various embodiments.

In various embodiments, an end plate (e.g., end plate 410 in FIG. 4A) may be configured to be disposed adjacent to the internal surface of the first end or second end of trap housing 103, such that the outer surface of the end plate may be adjacent to and/or in contact with the internal surface of trap housing 103. Such a configuration may allow greater heat conductance into the baffle plate stack, e.g., from an external heat source, such as a heater jacket (e.g., heater jacket 800 depicted in FIG. 8) configured to be coupled around contaminant trap system 100 and/or trap housing 103. In various embodiments, an end plate (e.g., end plates 420 in FIG. 4B) may be configured to be spaced from the internal surface of the first end or second end of trap housing 103, such that there is a space between the outer surface of the end plate and the internal surface of trap housing 103. The space between the internal surface of trap housing 103 and an endplate may be achieved by an end plate comprising flanges (e.g., flanges 424), or a spacer disposed therebetween. Such a configuration may achieve a desired pressure drop of the fluid flow through trap housing 103, and/or provide greater area for contaminant deposition within trap housing 103 and the baffle plate stack (e.g., baffle plate stack 400B).

In various embodiments, an end plate may comprise an end plate aperture and/or end plate aperture arrangement that causes an end plate aperture to be in series and/or aligned with (e.g., along an axis spanning a baffle plate stack) an aperture disposed through the next adjacent plate in the baffle plate stack. For example, end plate apertures 422 of end plate 420 may be in series and/or aligned with, along an axis spanning a baffle plate stack, apertures 331 and/or 333 of baffle plate 300A. That way, fluid entering and flowing through trap housing 103 and baffle plate stack 400B will deposit less contaminants on plates more proximate to fluid inlet 101A, thus decreasing the risk of outgassing of contamination from contaminant trap system 100 to upstream components such as a reaction chamber.

In various embodiments, the plates in a baffle stack, including baffle plates, complementary baffle plates, and end plates, may be coupled to the coupling rod, and secured by a fastener. For example, fasteners 402 (e.g., a screw, nail, clamp, or the like) may engage with coupling rod 450 (e.g., via threading, force, and/or the like), and secure baffle plates 300A, complementary baffle plates 300B, end plates 420 and/or spacers 303.

In various embodiments, fastener 402 may be disposed in and/or coupled to a sleeve 407, which may be disposed in an end of coupling rod 450. Sleeve 407 may be configured to provide a buffer between fastener 402 and the adjacent surface of coupling rod 450 to avoid galling.

In various embodiments, one or more plates in the baffle plate stack may comprise an indicator to readily convey to a user or assembler of the baffle plate stack which plate is disposed in which baffle plate stack position. Therefore, in various embodiments, for example, baffle plates 300A may comprise indicator 304 (e.g., a notch) to readily indicate that the notched or otherwise marked plate is a baffle plate 300A. Accordingly, a user or assembler of the baffle plate stack may be able to readily discern whether the correct order of baffle plates and complementary baffle plates is achieved. Any of the plates of the baffle plate stacks discussed herein may comprise an indicator.

In various embodiments, a baffle plate stack may be palindromic, such that the order of components is the same from either end of the baffle plate stack. As illustrated in FIG. 4B, baffle plate stack 400B begins and ends with an end plate 420, and therebetween, an odd number of baffle plates 300A alternating in a baffle plate order with an even number of complementary baffle plates 300B such that the baffle plate order starts and ends with a baffle plate 300A. Accordingly, someone assembling a contaminant trap system may insert baffle plate stack 400B into trap housing 103 without worry about whether baffle plate stack 400B is right side up or upside down.

In various embodiments, any surface of a baffle plate stack or other contaminant trap system component that will interact with fluid flowing through a contaminant trap system may receive contaminant deposit (which is the objective of the methods and systems discussed herein, in order to remove the contaminant from the fluid to avoid contamination of downstream reactor system components). Therefore, to increase available surface area of the components, the surfaces may be textured (e.g., by bead blasting). For example, the surfaces of the baffle plates and complementary baffle plates (including the outer edges thereof), spacers, internal wall of the trap housing, the edges of the apertures and complementary apertures, and/or any other surface may be textured.

In various embodiments, the components of contaminant trap system 100 may be clamped and/or sealed together by clamping ring 144. A clamping ring 144 may be disposed around upper housing 103A and/or lower housing 103B, and may be configured to be tightened to hold components of contaminant trap system 100 together.

In various embodiments, a trap structure comprised in a contaminant trap system may comprise structures for trapping contaminants other than a baffle plate stack, discussed above. For example, with reference to FIGS. 10A and 10B, a contaminant trap system may comprise a trap structure 1000 disposed in the trap housing (e.g., trap housing 103 shown in FIG. 2) comprising a plurality of rods 1055. Rods 1055 may be arranged in an arrangement 1050 to direct fluid flowing between rods 1055 along a desired path. Rods 1055 may span between components which may provide stability for rods 1055 within trap structure 1000. For example, rods 1055 may be coupled to and/or span between a baffle plate 1010 and a base plate 1020. Rods 1055 may be substantially perpendicular to the baffle plate 1010 and/or base plate 1020, and/or substantially parallel to an axis spanning between the fluid inlet 101A and fluid outlet 101B of the trap housing 103 (shown in FIG. 2) (as used in this context, the term "substantially" means plus or minus 20 degrees from perpendicular or parallel, respectively). In various embodiments, the rods in the trap structure may be integral or monolithic with the baffle plate and/or base plate.

Figure 10A:
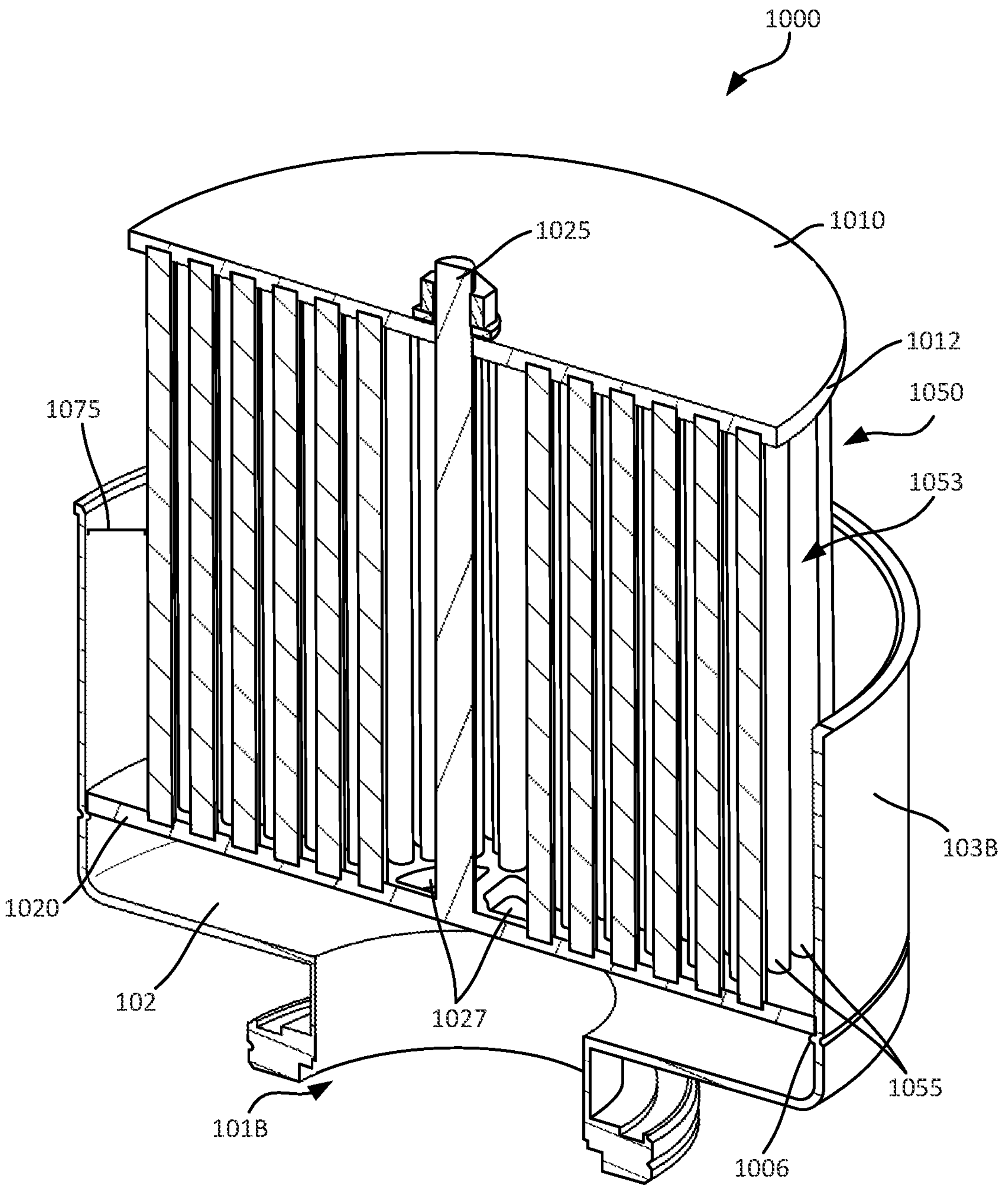
FIG. 10A illustrates a cross-sectional view of an exemplary trap structure, in accordance with various embodiments.
Figure 10B:
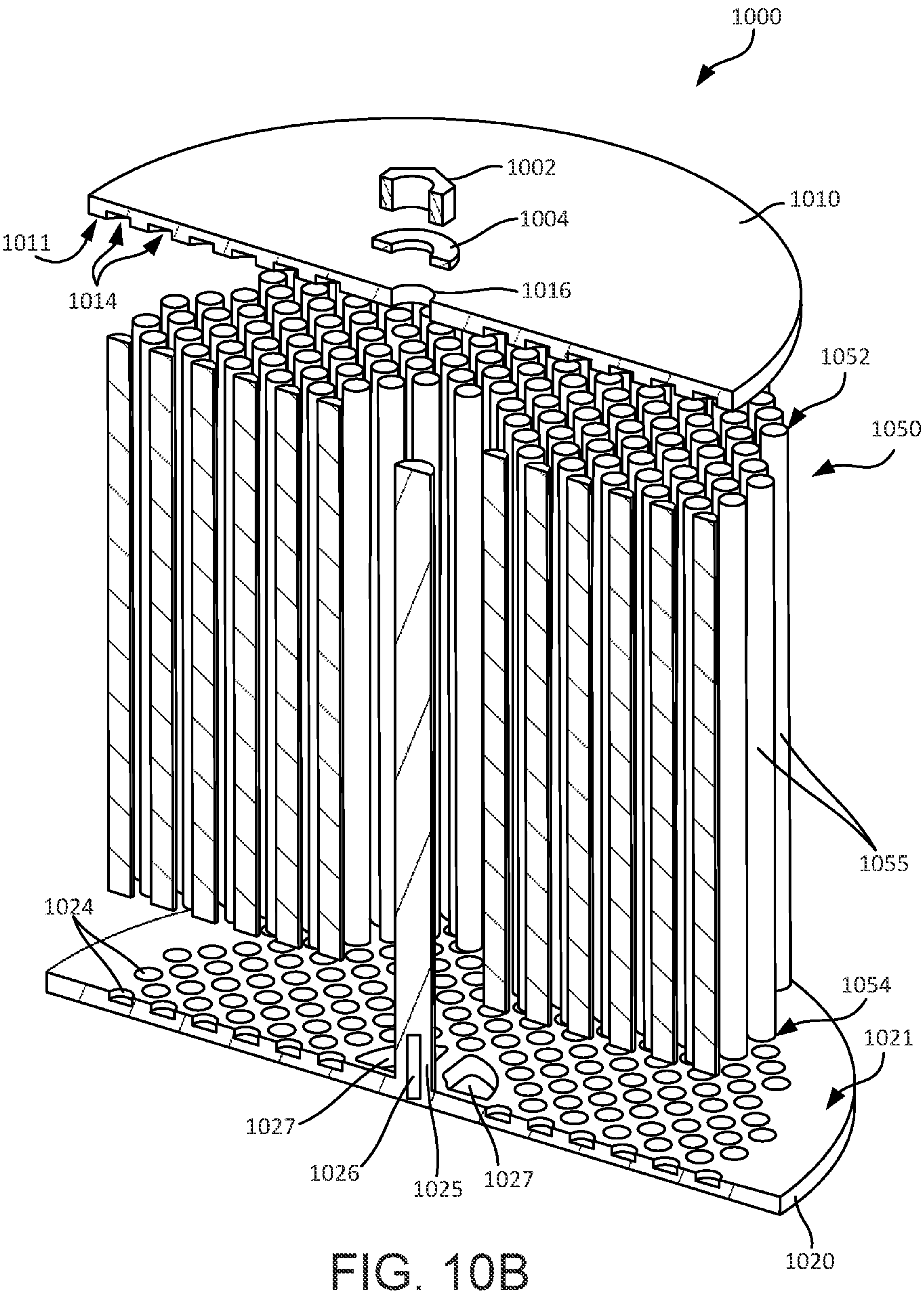
FIG. 10B illustrates an exploded view of the cross section of the trap structure of FIG. 10A, in accordance with various embodiments.

In various embodiments, as depicted in FIGS. 10A and 10B, baffle plate 1010 may comprise recesses 1014 disposed into an inner side 1011 of baffle plate 1010. Recesses 1014 may comprise a shape that is complementary to the cross-sectional shape of a respective rod 1055. A first end 1052 of each rod 1055 may be disposed into a respective recess 1014, thus coupling rods 1055 to baffle plate 1010. Similarly, in various embodiments, base plate 1020 may comprise recesses 1024 disposed into an inner side 1021 of base plate 1020 (inner side 1021 of base plate 1020 may face baffle plate 1010). Recesses 1024 may comprise a shape that is complementary to the cross-sectional shape of a respective rod 1055. A second end 1054 of each rod 1055 may be disposed into a respective recess 1024, thus coupling rods 1055 to base plate 1020. The rods of the trap structure may be coupled to a baffle plate and/or base plate by the rods resting in the respective recesses in the baffle plate and/or base plate, by tight fit within the respective recesses, threading on the base plate, baffle plate, and the rod ends to allow the rods to screw into the base plate and/or baffle plate, or the like.

In various embodiments, the rods may be coupled to a baffle plate and/or a base plate, whether or not the baffle plate and/or the base plate have recesses configured to receive the rods, in any suitable manner, for example, via welding, tightening between the baffle and base plates, adhesive, or the like.

In various embodiments, the trap structure may comprise a center support (e.g., center support 1025), which may be configured to couple two or more components of the trap structure. For example, center support 1025 of trap structure 1000 may couple baffle plate 1010 to base plate 1020, with rods 1055 disposed therebetween. Center support 1025 may be disposed through a support hole 1016 in baffle plate 1010 configured to receive center support 1025 therethrough. The shape of support hole 1016 may be complementary to the cross-sectional shape of center support 1025. Center support 1025 may be coupled and/or secured to baffle plate 1010 by a fastener (e.g., nut 1002 and/or seal 1004) disposed around center support 1025 and in contact with baffle plate 1010. In various embodiments, the fastener may comprise threading complementary to threading on the center support, such that the fastener is threaded onto the center support, and then tightened toward the base plate to push the baffle plate and base plate together. Thus, in various embodiments, rods 1055 disposed between baffle plate 1010 and base plate 1020 may be held in place by the force between baffle plate 1010 and base plate 1020 from center support 1025 and fastener 1002. The center support may be a separate component, or may be integral or monolithic with the baffle plate and/or base plate of the trap structure.

In various embodiments, rods 1055 may be disposed around (i.e., about) a center area of the base plate (e.g., the portion at or proximate center support 1025 of base plate 1020). The center area may not comprise any rods. The center area may comprise one or more flow holes (e.g., flow holes 1027) disposed through the base plate through which fluid flowing through the contaminant trap system and trap structure may flow. Thus, with airflow going through the trap housing (e.g., caused by vacuum pressure from vacuum pump 28, shown in FIG. 1), fluid flowing through the trap housing (including lower housing 103B) may be required to flow through arrangement 1050 of rods 1055, contacting rods 1055 while so doing, before exiting trap structure 1000 through flow holes 1027, and exiting the trap housing through fluid outlet 101B of the trap housing. The flow holes may be aligned and/or misaligned with fluid outlet 101B.

In various embodiments, rods in the trap structure may be disposed in any suitable arrangement. For example, rods 1055 may be disposed spaced apart (i.e., not contacting one another), or may be contacting one another, such that fluid may flow between rods 1055. The spacing of the rods may provide a convoluted path for fluid flowing through the trap structure, thus increasing the chances that the fluid will contact more surfaces and contaminants in the fluid will be deposited onto such surfaces within the trap. The rods may comprise any suitable shape or length. For example, the rods may comprise a circular cross-sectional shape (such as those shown in FIGS. 10A and 10B), or the rods may comprise, for example, a hexagonal, octagonal, triangular, or square cross-sectional shape, or any other suitable cross-sectional shape. As another example, the rods may have a cross-sectional length (e.g., the diameter of a circle) of approximately 2 millimeters (mm) ("approximately" as used in this context means plus or minus 0.5 mm). As another example, the rods may have a length (e.g., the distances spanning between the baffle plate and base plate) of approximately 20 centimeters (cm) ("approximately" as used in this context means plus or minus 5 cm). The rods may comprise a high surface-area-to-volume ratio, for example, a surface-area-to-volume ratio of at least 50:1, at least 100:1, at least 150:1, or at least 200:1. In various embodiments, the rods may comprise a textured outer surface, threading along the rods, or any other structure configured to increase the outer surface area of the rods for contaminant deposition thereon.

The rods in a trap structure may comprise any suitable material, such as steel, aluminum, or any other metal or alloy thereof, ceramic material, or the like.

In various embodiments, the base plate of a trap structure (e.g., base plate 1020) may be disposed in the trap housing and support other components of the trap structure. In various embodiments, an outer side of base plate 1020 (opposite of inner side 1021) may be disposed spaced from a housing bottom surface (housing bottom surface 102) of the trap housing. To support the base plate being spaced from the trap housing bottom surface, the trap housing may comprise a support (e.g., support 1006) protruding from the trap housing to hold the base plate in place. For example, support 1006 may protrude from the interior wall of the trap housing to support base plate 1020 in place, spaced from bottom surface 102 of the trap housing. In various embodiments, a support may protrude from another surface of the trap housing, for example, from the bottom surface, to hold the base plate in place. In various embodiments, the base plate outer surface may be disposed against or adjacent to the trap housing bottom surface.

In various embodiments, the baffle plate of a trap structure (e.g., baffle plate 1010) may cause fluid flow entering the trap housing to take a certain path (e.g., a path that will increase fluid flow around and in contact with rods 1055, and/or increase removal of contaminants from the fluid). Baffle plate 1010 may reduce or prevent fluid flow from traveling around first ends 1052 of rods 1055. That is, baffle plate 1010 may form at least a partial seal between baffle plate 1010 and the first ends 1052 of rods 1055. In various embodiments, the shape of baffle plate 1010 may be smaller than a cross-sectional shape of the trap housing such that baffle plate edge 1012 does not contact the interior wall of the trap housing. Thus, there may be a space between the baffle plate edge and the interior wall of the trap housing, and/or between the rods 1055 and the interior wall of the trap housing (e.g., space 1075 between the interior wall of lower housing 103B and baffle plate edge 1012 and/or rods 1055). Baffle plate 1010 may be configured to cause at least a portion of fluid flow within the trap housing to flow around baffle plate edge 1012 toward and through arrangement 1050 of rods 1055 (e.g., through space 1075), and toward flow holes 1027.

In various embodiments, the base plate may form at least a partial seal with the interior wall of the trap housing. For example, the outer edge of base plate 1020 may be disposed against or adjacent to the interior wall of lower housing 103B, such that little or no fluid may pass therebetween. Therefore, the fluid flowing through trap structure 1000 may be directed around baffle plate 1010 (and/or through a baffle plate comprising holes disposed therethrough) to flow through the arrangement 1050 of rods 1055, and exit trap structure 1000 through flow holes 1027. Thus, contaminants in the fluid may deposit on the surfaces of the trap structure (e.g., the outer surfaces 1053 of rods 1055, baffle plate 1010, base plate 1020, etc.) with little or no fluid flow between base plate 1020 and the interior wall of the trap housing.

The arrangement of components of trap structure 1000 may allow greater heat conductance therethrough. Heating a trap structure may allow for increased growth rates of contaminant films on the trap system components, and improved trapped contaminant film properties such as increased density and decreased flaking. Thermal energy may readily travel through the base plate, rods, and/or baffle plate, whether the thermal energy is provided externally and/or internally. In various embodiments, trap structure 1000 may be heated externally, for example by a heater jacket (e.g., heater jacket 800 depicted in FIG. 8) being coupled around the contaminant trap system and/or trap housing comprising trap structure 1000. In various embodiments, trap structure 1000 may be heated internally, for example by a heater (e.g., heater 1026 depicted in FIG. 10B) disposed in, or coupled to, a component of trap structure 1000 (e.g., in base plate 1020 and/or center support 1025 comprising a heater 1026). Especially in embodiments in which rods 1055 comprise a metal material, such as steel or aluminum (or alloys thereof), thermal energy would readily travel between base plate 1020 (receiving thermal energy from heater 1026 and/or from a heater jacket through the trap housing), rods 1055, and baffle plate 1010.

In various embodiments, a trap structure such as trap structure 1000 comprising rods 1055 disposed between a baffle plate 1010 and a base plate 1020, in addition to providing plentiful surface area on which contaminants may deposit, may also have the benefit of reusability and easy maintenance. In response to trap structure 1000 being used and/or saturated with contaminants, the components of trap structure 1000 (e.g., rods 1055, baffle plate 1010, and base plate 1020) may be disassembled (and/or removed from the trap housing), easily cleaned, and then reassembled for subsequent use. The trap structure may be disassembled, for example, by uncoupling the fastener 1002 from center support 1025. If one or more of the components are damaged or otherwise need replacement, such a replacement can easily be completed. Other pre-existing components for trap structures are one-time use items and/or difficult to clean.

In various embodiments, a trap structure comprised in a contaminant trap system may comprise a plurality of tubes through which a fluid may flow. Each tube may comprise a bore (e.g., bores 1157) disposed therethrough for the length of the tube, allowing contaminants to deposit on inner and outer surfaces of the tubes. For example, with reference to FIG. 11, trap structure 1100 may comprise an arrangement 1150 of tubes 1155. Trap structure 1100 may be disposed in a trap housing (e.g., trap housing 103 shown in FIG. 2) such that tubes 1155 span at least partially between a trap housing top surface and bottom surface (e.g., along the direction of fluid flow through the trap housing, and/or substantially parallel to an axis spanning between the fluid inlet 101A and fluid outlet 101B of the trap housing 103 (shown in FIG. 2) (as used in this context, the term "substantially" means plus or minus 20 degrees from parallel)). The arrangement of tubes in a trap structure may be complementary to the shape of the trap housing, such that the tubes on the outer perimeter of the tube arrangement may abut or be disposed adjacent to the interior wall of the trap housing. For example, arrangement 1150 of tubes 1155 may be configured to be disposed in a hexagonal trap housing. In various embodiments, the tubes of a tube arrangement for a trap structure may comprise a circular arrangement configured to be disposed into a circular trap housing (e.g., into lower trap housing 103B shown in FIG. 10A).

Figure 11:
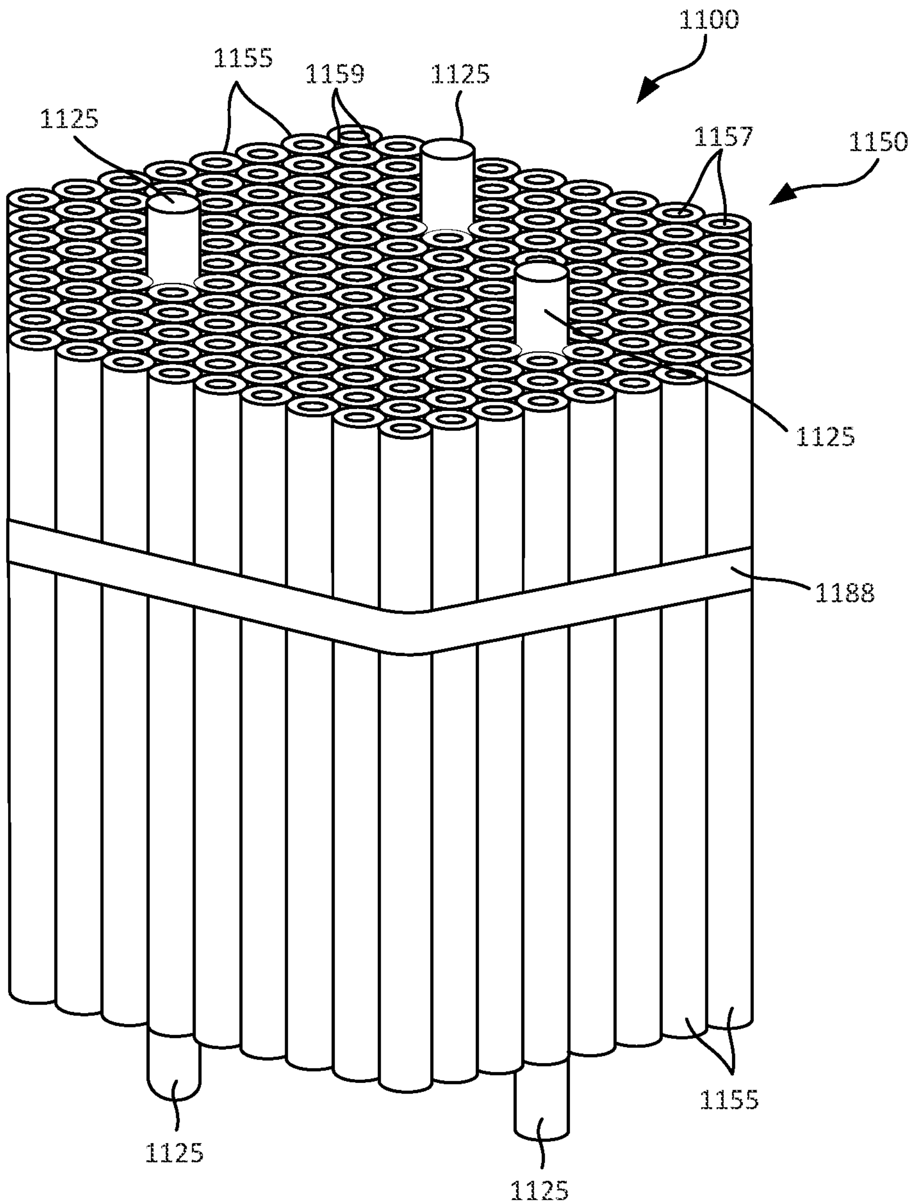
FIG. 11 illustrates an exemplary trap structure, in accordance with various embodiments.

The tubes may be arranged in any suitable manner relative to one another. The tube arrangement may be configured to limit or minimize the space between the tubes. For example, as shown in FIG. 11, in accordance with various embodiments, tubes 1155 may be packed hexagonally, such that each tube 1155 (except tubes on the outer perimeter) may be surrounded by six tubes 1155. Therefore, each tube 1155 (except tubes on the outer perimeter) may abut or be in contact with six other tubes 1155. This hexagonal packing allows uniform packing of tubes 1155 and limits the space therebetween, providing dense packing with circular tubes. Such dense packing prevents shifting of the tubes relative to one another. Also, the hexagonal packing of tubes forms triangular spaces (e.g., spaces 1159) having concave sides between the contacting tubes. These spaces between tubes allow for additional space for fluid to flow through and additional surface area (on the outside of the tubes) upon which contaminants may deposit. The hexagonal packing of tubes does not necessarily apply to the outer shape of the tube arrangement, and may be implemented in a tube arrangement having a circular outer shape.

The tubes in a trap structure may comprise any suitable shape or dimensions. In various embodiments, the tubes may comprise a circular cross-sectional outer shape (e.g., tubes 1155), or any other suitable cross-sectional shape configured to allow a desired arrangement of the tubes. In various embodiments, the tube bores may comprise a circular cross-sectional shape (e.g., bores 1157), or any other suitable cross-sectional bore shape. In various embodiments, the tubes may have a cross-sectional length (e.g., an outer diameter of tubes 1155) of approximately 2 millimeters (mm). In various embodiments, the tubes may have an inner diameter (e.g., the length across the bores, such as the diameter of bores 1157) of approximately 1 mm ("approximately" as used in this context means plus or minus 0.5 mm). In various embodiments, the tubes may have a length of approximately 20 centimeters (cm) ("approximately" as used in this context means plus or minus 5 cm). The tubes may comprise a high surface-area-to-volume ratio, for example, a surface-area-to-volume ratio of at least 50:1, at least 100:1, at least 150:1, or at least 200:1. For example, tubes in a hexagonal packing arrangement that are approximately 20 cm in length, having an outer diameter of about 2 mm and an inner diameter of 1 mm, filling a trap housing having a diameter of about 19 cm, provide significant surface area to receive contaminant deposition. The surface area of the tube bores in such an example would provide approximately six square meters of trapping surface, and the gaps between the tubes (e.g., spaces 1159) would provide slightly less than six square meters, for a total surface area of about twelve square meters. Assuming a typical deposition process in a reactor produces three square micrometers of contaminant deposit within a trap, the surface area provided by the trap structures comprising the tubes in the arrangement and dimensions discussed would allow the same trap structure to be used for numerous deposition cycles before needing maintenance or replacement.

In various embodiments, the outer and/or inner surfaces of the tubes may comprise a textured outer surface, threading along the outer and/or inner surfaces, or any other structure configured to increase the outer surface area of the tubes for contaminant deposition thereon.

In various embodiments, the tubes may be coupled in any suitable manner such as adhesive, welding, and/or tight fit within the trap housing. As shown in FIG. 11, tubes 1155 are coupled together to maintain arrangement 1150 by tensioning device 1188, which may be a clamping ring (similar to clamping ring 114), a belt, an elastic band, or the like.

In various embodiments, an arrangement 1150 of tubes 1155 may comprise at least one support 1125. A support 1125 may be a rod or other structure that protrudes at least outwardly from the bottom of arrangement 1150 (i.e., a support 1125 extends closer to a bottom surface of a trap housing than tubes 1155). In various embodiments, an arrangement of tubes may comprise more than one support (e.g., three supports 1125, as shown in FIG. 11). Supports 1125 may be configured to support the arrangement 1150 of tubes 1155 such that there is a space between the bottom of tubes 1155 and a bottom surface of the trap housing (e.g., bottom surface 102 if trap structure 1100 were disposed in lower trap housing 103B, shown in FIG. 10A). Similarly, when disposed in a trap housing, there may be a space between the tops of tubes 1155 and a top surface of the trap housing. For example, the tube arrangement 1150 may simply rest in a position within the trap housing that causes a space between the tops of tubes 1155 and a top surface of the trap housing (e.g., because of the way upper and lower housings of the trap housing fit together). As another example, supports 1125 may also protrude outwardly from the top of the arrangement 1150 (i.e., a support 1125 extends closer to a top surface of a trap housing than tubes 1155). Thus, if a lid or upper housing of a trap housing is placed on the trap structure, the lid or upper housing will come to rest against the tips of supports 125, thus allowing a space between the top surface of the trap housing and the tops of tubes 1155. Such a space would allow fluid flowing into a trap housing (e.g., through fluid inlet 101A, shown in FIG. 2) to disperse and utilize more of tubes 1155 to trap contaminants.

In various embodiments, a structure, such as a baffle plate with holes, showerhead, or the like may be disposed above the tube arrangement in a trap housing to disperse fluid flowing thereto in a desired manner to increase utilization of the surface area provided by the tubes.

The arrangement of components of trap structure 1100 may allow greater heat conductance therethrough. Heating a trap structure may allow for increased growth rates of contaminant films on the trap system components, and improved trapped contaminant film properties such as increased density and decreased flaking. Thermal energy may readily travel through the trap housing, supports 1125, and/or tubes, whether the thermal energy is provided externally and/or internally. In various embodiments, trap structure 1100 may be heated externally, for example by a heater jacket (e.g., heater jacket 800 depicted in FIG. 8) being coupled around the contaminant trap system and/or trap housing comprising trap structure 1100. In various embodiments, trap structure 1100 may be heated internally, for example by a heater being disposed in the arrangement 1150 of tubes 1155. For example, a tube within the tube arrangement (e.g., a tube at or close to the center of the arrangement) may be replaced by a heater, and/or a support 125 may be, or may comprise, a heater. Especially in embodiments in which tubes 1155 comprise a metal material, such as steel or aluminum (or alloys thereof), thermal energy would readily travel through tubes 1155 and/or supports 1125 (e.g., if receiving thermal energy from a heater jacket through the trap housing or from an internal heater).

In various embodiments, a trap structure such as trap structure 1100 comprising tubes 1155, in addition to providing plentiful surface area on which contaminants may deposit, may also have the benefit of reusability and easy maintenance. In response to trap structure 1100 being used and/or saturated with contaminants, the components of trap structure 1100 (e.g., tubes 1155, supports 1125, tensioning device 1188) may be easily removed from a trap housing and/or disassembled, cleaned, and then reassembled for subsequent use. The trap structure may be disassembled, for example, by uncoupling the tensioning device 1188 from tubes 1155. If one or more of the components are damaged or otherwise need replacement, such a replacement can easily be completed.

Figure 12:
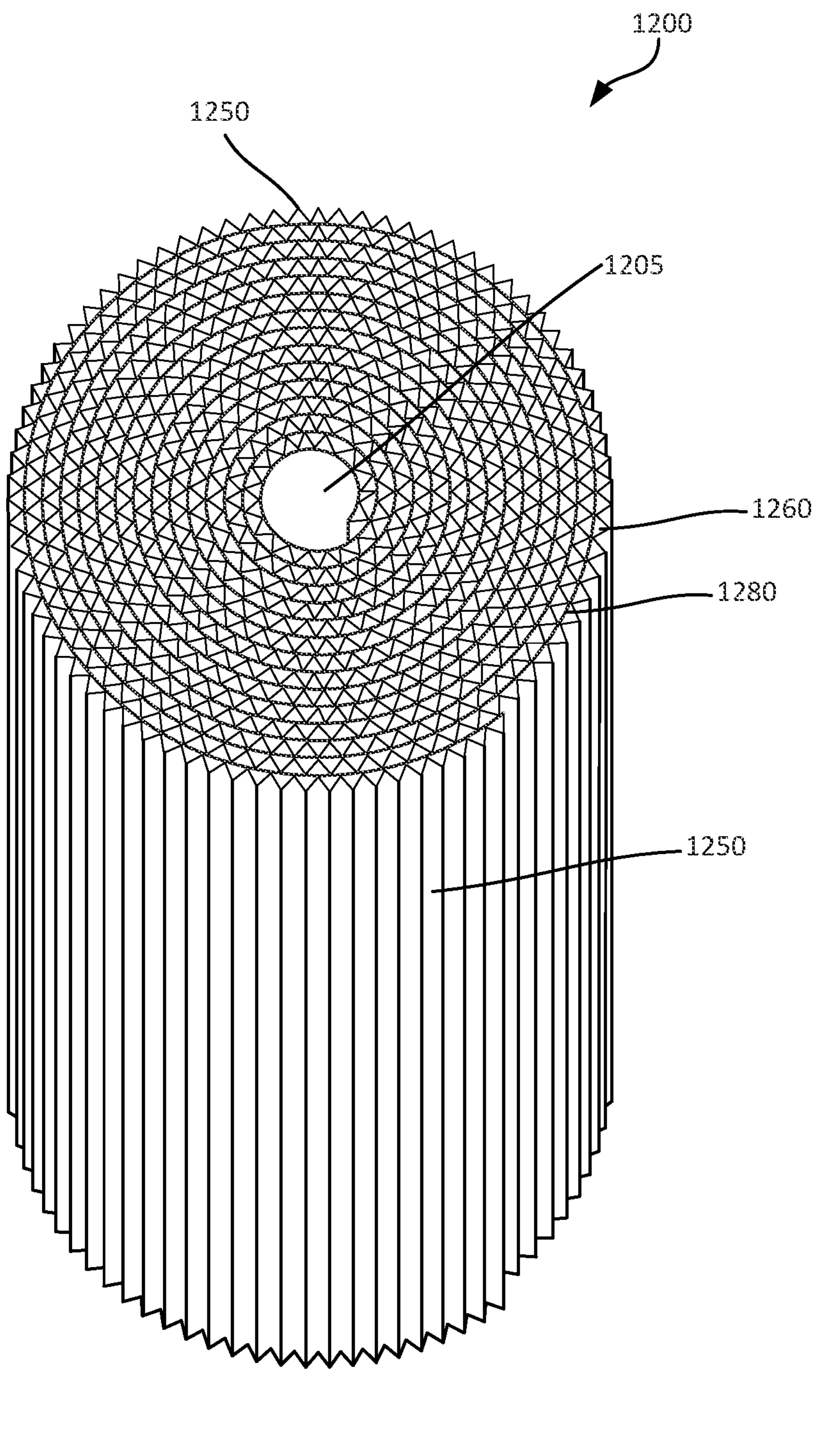
FIG. 12 illustrates an exemplary trap structure, in accordance with various embodiments.

In various embodiments, a trap structure comprised in a contaminant trap system may comprise a corrugated sheet through which fluid may flow and deposit contaminants thereon. With reference to FIG. 12, in accordance with various embodiments, a corrugated trap structure 1200 may comprise a corrugate sheet 1250 coupled to a noncorrugated sheet 1280. Spaces 1260 between corrugated sheet 1250 and noncorrugated sheet 1280 may allow fluid to flow therethrough and contaminants to deposit on the surface area provided therein by the sheets. Corrugated trap structure 1200 may be disposed in a trap housing (e.g., trap housing 103 shown in FIG. 2) such that spaces 1260 span at least partially between a trap housing top surface and bottom surface (e.g., along the direction of fluid flow through the trap housing). Sheets 1250 and 1280 may be spiraled in any suitable shape (e.g., in a circular shape, such as that shown in FIG. 12, or a square, triangular, rectangular, hexagonal, or octagonal shape). The outer shape of the spiraled sheets may be complementary to the shape of the trap housing in which the trap structure will be disposed. For example, corrugated trap structure 1200 may be configured to be disposed in a circular trap housing, such as trap housing 103 shown in FIG. 2. Thus, the corrugated sheet or noncorrugated sheet may abut or be disposed adjacent to the interior wall of the trap housing. The corrugated and noncorrugated sheets may be spiraled or arranged such that a middle void 1205 may be decreased or minimized to cause fluid flowing therethrough to flow through spaces 1260 as opposed to other paths through corrugated trap structure 1200.

In various embodiments, corrugated trap structure 1200 may comprise at least one support (e.g., support 1125 shown in FIG. 11). A support may be a rod or other structure that protrudes outwardly from the bottom and/or top of corrugated trap structure 1200. Such a support may be configured to support corrugated trap structure 1200 such that there is a space between the bottom and/or top of corrugated trap structure 1200 and a bottom and/or top surface of the trap housing. Therefore, a space may be created between the bottom of corrugated trap structure 1200 and a bottom surface of the trap housing and/or between the top of corrugated trap structure 1200 and a top surface of the trap housing. Such a space would allow fluid flowing into a trap housing (e.g., through fluid inlet 101A, shown in FIG. 2) to disperse and utilize (i.e., flow through) more of spaces 1260 to trap contaminants.

In various embodiments, a structure, such as a baffle plate with holes, showerhead, or the like may be disposed above the corrugated trap structure in a trap housing to disperse fluid flowing thereto in a desired manner to increase utilization of the surface area provided for contaminant deposition.

The arrangement of components of corrugated trap structure 1200 may allow greater heat conductance therethrough. Heating a trap structure may allow for increased growth rates of contaminant films on the trap system components, and improved trapped contaminant film properties such as increased density and decreased flaking. Thermal energy may readily travel through corrugated trap structure 1200, whether the thermal energy is provided externally and/or internally. In various embodiments, corrugated trap structure 1200 may be heated externally, for example by a heater jacket (e.g., heater jacket 800 depicted in FIG. 8) being coupled around the contaminant trap system and/or trap housing comprising corrugated trap structure 1200. In various embodiments, corrugated trap structure 1200 may be heated internally, for example by a heater being disposed through void 1205 or a heater comprised in a support disposed through void 1205. Especially in embodiments in which corrugated trap structure 1200 comprises a metal material, such as steel or aluminum (or alloys thereof), thermal energy would readily travel through corrugated trap structure 1200 (e.g., if receiving thermal energy from a heater jacket through the trap housing or from an internal heater).

In various embodiments, the contaminant trap systems, and components comprised therein, may comprise no adhesive or other coupling material to couple any components. The absence of an adhesive, epoxy, or other coupling material mitigates the risk of such a coupling material outgassing and traveling to the reaction chamber, acting as a contaminant therein. Additionally, without such a coupling material, components of the systems discussed herein may not be susceptible to degradation at elevated temperatures, for example, greater than 120° C. Therefore, a contaminant trap system (e.g., contaminant trap system 100 in FIG. 2) and trap structures comprised therein may be moved closer to a reaction chamber of a reactor system (e.g., reaction chamber 4 of reactor system 50 in FIG. 1) than a contaminant trap system comprising a coupling material. Accordingly, a reactor system having a contaminant trap system in accordance with the embodiments discussed herein may be more compact and/or have more feasible configurations and special arrangements.

The contaminant trap systems discussed herein are configured to increase the surface area with which a fluid flowing therethrough may contact to allow more opportunity for contaminant deposition on such surface area. Thus, for example, as discussed herein, the apertures of a baffle plate may not be aligned with and/or in series with the complementary apertures of an adjacent complementary baffle plate in the baffle plate stack. As another example, rods (e.g., rods 1055) may be arranged such that there is a nonlinear path from an outer perimeter of the arrangement of rods to the flow holes (e.g., flows holes 1027) allowing fluid to exit the trap structure. As yet another example, tubes (e.g., tubes 1155) and/or spaces (e.g., spaces 1260) through a corrugated trap structure (e.g., corrugated trap structure 1200) may allow contaminants within a fluid to deposit on surfaces within the tubes or paths through a corrugated trap structure.

Figure 9:
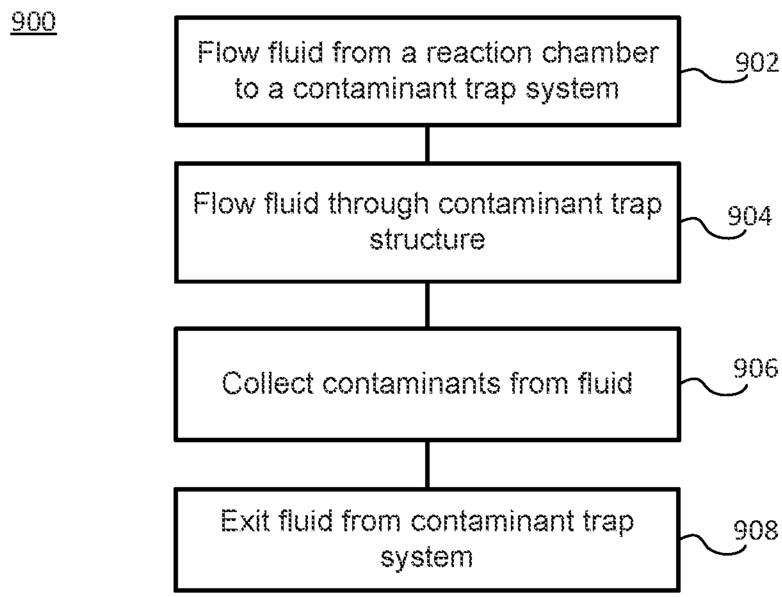
FIG. 9 illustrates a method of flowing fluid through a contaminant trap system of a reactor system, in accordance with various embodiments.

FIG. 9 illustrates a method 900 of flowing fluid through a contaminant trap system in a reaction system, in accordance with various embodiments. With additional reference to FIGS. 2 and 4B, a fluid may flow from a reaction chamber (e.g., reaction chamber 4 in FIG. 1) to a contaminant trap system (e.g., contaminant trap system 100 in FIG. 2) (step 902). Contaminant trap system 100 may comprise a fluid inlet 101A and a fluid outlet 101B of a trap housing 103. The fluid may flow into contaminant trap system 100 through fluid inlet 101A. The fluid may comprise materials which the contaminant trap system is configured to remove from the fluid (e.g., contaminants).

In various embodiments, the fluid may flow through the contamination trap structure (step 904) comprised in the contaminant trap system. The trap structure may comprise any suitable structural arrangement upon which to collect contaminants form the fluid, such as those discussed herein. In various embodiments, the trap structure in the contamination trap may comprise a baffle plate stack 400B (e.g., an example of baffle plate stack 130 in FIG. 2) in contaminant trap system 100. Therefore, the fluid may flow through a plurality of baffle plates 300A alternating positions in a baffle plate order with a plurality of complementary baffle plates 300B. The fluid may also flow through at least one end plate (e.g., end plate 420) comprised in the baffle plate stack on either end of the baffle plate stack. In various embodiments, the fluid may flow through trap structures comprising rods, tubes, and/or corrugated and noncorrugated sheets, as discussed herein.

To flow through the baffle plate stack 400B, the fluid may flow through a first end plate 420 via end plate apertures 422 and/or around the outer edge of end plate 420. In flowing through the baffle plate order of baffle plate stack 400B, the fluid may contact the top surface 322 and bottom surface 324 of baffle plates 300A, the complementary top surface 352 and complementary bottom surface 354 of complementary baffle plates 300B, and pass through apertures 331 and 333 of baffle plates 300A and complementary apertures 361 and 363 of complementary baffle plates 300B. Apertures 331 and 333 of baffle plates 300A may be disposed through baffle plates 300A and aligned with complementary baffle plates 300B such that apertures 331 and 333 may be aligned with complementary solid body portions 365 of complementary baffle plates 300B. Therefore, in response to flowing through apertures 331 and 333 of a baffle plate 300A, the fluid may contact complementary solid body portions 365 of a subsequent complementary baffle plate 300B in baffle plate stack 400B. In response to contacting complementary solid body portions 365 of the next complementary baffle plate 300B, the fluid may flow toward fluid outlet 101B and through complementary apertures 361 and 363 of such complementary baffle plate 300B. Complementary apertures 361 and 363 of complementary baffle plates 300B may be disposed through complementary baffle plates 300B and aligned with baffle plates 300A such that complementary apertures 361 and 363 may be aligned with solid body portions 335 of baffle plates 300A. Therefore, in response to flowing through complementary apertures 361 and 363 of a complementary baffle plate 300B, the fluid may contact solid body portions 335 of a subsequent baffle plate 300A in baffle plate stack 400B. In response to contacting solid body portions 335 of the next baffle plate 300A, the fluid may flow toward fluid outlet 101B and through apertures 331 and 333 of such baffle plate 300A.

The fluid flow will follow this flow pattern through the baffle plate order of baffle plates 300A and complementary baffle plates 300B, until the fluid has passed the final plate in the baffle plate order. The fluid may flow through an end plate 420 on a second end of the baffle plate stack 400B, contacting the surface of such end plate 420, and flowing through end plate apertures 422. The fluid, while flowing through baffle plate stack 400B, may additionally flow between the outer edges of baffle plates 300A and complementary baffle plates 300B and the interior wall surface of outer wall 105, interacting with and contacting those surfaces.

In various embodiments, to flow through a trap structure with rods (e.g., trap structure 1000), the fluid may contact and flow around baffle plate 1010 into space 1075. Then, the fluid may travel through the arrangement 1050 of rods 1055, contacting rods 1055 before exiting trap structure 1000 through flow holes 1027.

In various embodiments, to flow through a trap structure with tubes (e.g., trap structure 1100), the fluid may flow through tubes 1155 before exiting trap structure 1100.

In various embodiments, to flow through a corrugated trap structure (e.g., corrugated trap structure 1200), the fluid may flow through spaces 1260 before exiting corrugated trap structure 1200.

In response to the fluid contacting the surfaces described above (e.g., baffle plates, complementary baffle plates, end plates, interior wall surface of outer wall 105, rods 1055, tubes 1155, corrugated and noncorrugated sheets 1250 and 1280, etc.), contaminants comprised in the fluid may be deposited or collected from the fluid (step 906) on surfaces in contaminant trap system and the respective trap structure disposed therein. The surfaces and their positions relative to one another in the contaminant trap system provide increased surface area upon which such contaminant deposition may occur. Some of the surfaces may comprise texturing to provide further available surface area.

In various embodiments, the fluid may flow through fluid outlet 101B and exit from contaminant trap system (step 908).

The components of the systems discussed herein may be comprised of any suitable material such as metal or metal alloy (e.g., steel, aluminum, aluminum alloy, or the like).

Although exemplary embodiments of the present disclosure are set forth herein, it should be appreciated that the disclosure is not so limited. For example, although reactor and contaminant trap systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A contaminant trap system of a reactor system, comprising:

a trap housing comprising a housing outer wall;

a plurality of baffle plates disposed in the trap housing, wherein each baffle plate comprises a design comprising:

a first plurality of apertures spanning through a baffle plate body between a top baffle plate surface and a bottom baffle plate surface; and a solid body portion, wherein the design for each baffle plate is the same;

a plurality of complementary baffle plates disposed in the trap housing between a first end and a second end of the trap housing, wherein each complementary baffle plate comprises a complementary design comprising:

a first plurality of complementary apertures spanning through a complementary baffle plate body between a top complementary baffle plate surface and a bottom complementary baffle plate surface; and a complementary solid body portion, wherein the complementary design for each complementary baffle plate is the same, and wherein the complementary design is different than the design for each baffle plate, wherein the plurality of baffle plates and the plurality of complementary baffle plates are comprised in a baffle plate stack and disposed in a baffle plate order between a first end and a second end of the baffle plate stack in which the plurality of baffle plates alternates with the plurality of complementary baffle plates such that no two baffle plates from the plurality of baffle plates and no two complementary baffle plates from the plurality of complementary baffle plates are adjacent in the baffle plate order, wherein a first baffle plate and a second baffle plate, from the plurality of baffle plates, and a first complementary baffle plate, from the plurality of complementary baffle plates, are disposed in the baffle plate order in the trap housing such that the first baffle plate is adjacent to the first complementary baffle plate and the second baffle plate is adjacent to the first complementary baffle plate, and wherein the first baffle plate and the first complementary baffle plate are disposed in a baffle plate orientation such that at least a portion of a first aperture of the first baffle plate and at least a portion of the complementary solid body portion of the first complementary baffle plate are aligned along a first axis spanning between the first end and the second end of the trap housing, and such that at least a portion of the solid body portion of the first baffle plate and the second baffle plate, and at least a portion of a complementary aperture of the first plurality of complementary apertures of the first complementary baffle plate, are aligned along a second axis spanning between the first end and the second end of the trap housing, wherein the first plurality of apertures of each baffle plate is disposed on a radially inward portion of each baffle plate, and wherein the solid body portion is disposed on a radially outward portion of each baffle plate, wherein the radially outward portion of each baffle plate does not comprise an aperture, and wherein the first plurality of complementary apertures of each complementary baffle plate is disposed on a radially outward portion of each complementary baffle plate, and wherein the complementary solid body portion is disposed on a radially inward portion of each complementary baffle plate, wherein the radially inward portion of each complementary baffle plate does not comprise a complementary aperture.

2. The contaminant trap system of claim 1, further comprising a coupling rod disposed in the trap housing and spanning between the first end and the second end of the trap housing, wherein the first baffle plate comprises a first coupling hole disposed through the first baffle plate body, wherein the coupling rod is disposed through the first coupling hole, and wherein the first complementary baffle plate comprises a first complementary coupling hole disposed through the first complementary baffle plate body, wherein the coupling rod is disposed through the first complementary coupling hole.

3. The contaminant trap system of claim 2, wherein the coupling rod comprises a noncircular cross-section, wherein the first coupling hole of the first baffle plate and the first complementary coupling hole of the first complementary baffle plate each comprise a shape complementary to the noncircular cross-section of the coupling rod.

4. The contaminant trap system of claim 3, wherein a reference point of the first coupling hole is disposed in a first orientation, and a complementary reference point of the first complementary coupling hole is disposed in a first complementary orientation, wherein the first orientation and the first complementary orientation dispose the first baffle plate and the first complementary baffle plate about the coupling rod to achieve the baffle plate orientation.

5. The contaminant trap system of claim 4, further comprising a spacer between the first baffle plate and the first complementary baffle plate to provide a space therebetween.

6. The contaminant trap system of claim 1, wherein the baffle plate stack further comprises an end plate disposed such that, at least one of:

the first baffle plate is between the end plate and the first complementary baffle plate, or the first complementary baffle plate is between the end plate and the first baffle plate, wherein the end plate comprises an end plate aperture and an end plate solid body portion.

7. The contaminant trap system of claim 6, wherein the housing outer wall of the trap housing comprises an interior wall surface, wherein an outer edge of at least one of the first baffle plate and the first complementary baffle plate is disposed adjacent to the interior wall surface.

8. The contaminant trap system of claim 7, wherein at least one of the top baffle plate surface, the bottom baffle plate surface, the top complementary baffle plate surface, the bottom complementary baffle plate surface, the outer edge of at least one of the first baffle plate and the first complementary baffle plate, and the interior wall surface is textured.

9. The contaminant trap system of claim 6, further comprising a heater jacket coupled to the trap housing.

10. The containment trap system of claim 1, wherein the baffle plate order is palindromic between the first end and the second end of the baffle plate stack.

* * * * *